United States Patent
Yu et al.

(10) Patent No.: US 11,788,002 B2
(45) Date of Patent: Oct. 17, 2023

(54) FLUORESCENT CONJUGATED POLYMERS CONTAINING SEMI-LADDER UNITS FOR LIGHT-EMITTING FIELD-EFFECT TRANSISTORS

(71) Applicant: University of Chicago, Chicago, IL (US)

(72) Inventors: Luping Yu, Chicago, IL (US); Mohammad A. Awais, Chicago, IL (US); Valerii Sharapov, Chicago, IL (US); Dafei Yuan, Chicago, IL (US)

(73) Assignee: THE UNIVERSITY OF CHICAGO, Chicago, IL (US)

( * ) Notice: Subject to any disclaimer, the term of this patent is extended or adjusted under 35 U.S.C. 154(b) by 411 days.

(21) Appl. No.: 17/097,731

(22) Filed: Nov. 13, 2020

(65) Prior Publication Data

US 2021/0147747 A1    May 20, 2021

Related U.S. Application Data

(60) Provisional application No. 62/936,099, filed on Nov. 15, 2019.

(51) Int. Cl.
| | |
|---|---|
| C09K 11/07 | (2006.01) |
| H01L 51/00 | (2006.01) |
| H01L 51/50 | (2006.01) |
| H10K 85/60 | (2023.01) |
| H10K 50/16 | (2023.01) |
| H10K 50/17 | (2023.01) |

(52) U.S. Cl.
CPC ............ *C09K 11/07* (2013.01); *H10K 85/615* (2023.02); *H10K 85/6572* (2023.02); *C09K 2211/104* (2013.01); *C09K 2211/1011* (2013.01); *H10K 50/16* (2023.02); *H10K 50/171* (2023.02)

(58) Field of Classification Search
CPC .. H10K 85/111; H10K 85/113; H10K 85/151; H10K 85/154; C09K 11/07; C09K 2211/1475; C09K 2211/1483
See application file for complete search history.

(56) References Cited

FOREIGN PATENT DOCUMENTS

| | | |
|---|---|---|
| CN | 104211926 A * | 12/2014 |
| JP | 2014237733 A * | 12/2014 |

OTHER PUBLICATIONS

Machine-generated English-language translation of CN-104211926-A.*
Berlman, Empirical study of heavy-atom collisional quenching of the fluorescence state of aromatic compounds in solution, J. Phys. Chem., 1973, 77, 562-567.
Birks et al., Excimer Fluorescence Spectra of Pyrene Derivatives. Spectrochim. Acta 1963, 19, 401-410.

(Continued)

*Primary Examiner* — Vu A Nguyen
(74) *Attorney, Agent, or Firm* — Armstrong Teasdale LLP

(57) ABSTRACT

Materials are provided for use as active emissive layers in organic electronic devices such as light-emitting filed effect transistors. Light-emitting transistors (LET) are an alternative to light-emitting diodes and have several important benefits, however, materials developed specifically for LET are quite scarce. Herein a new family of materials is disclosed that has been developed specifically for LET.

20 Claims, 105 Drawing Sheets
(105 of 105 Drawing Sheet(s) Filed in Color)

(56) References Cited

OTHER PUBLICATIONS

Deng et al., H- and J-Aggregation of Fluorene-Based Chromophores, J. Phys. Chem. B, 2014, 118, 14536-14545.

Dreeskamp et al., Fluorescence of bromoperylenes and the requirements of heavy-atom quenching, Chem. Phys. Lett., 1975, 31, 251-253.

Facchetti et al., Building Blocks for n-Type Molecular and Polymeric Electronics. Perfluoroalkyl—versus Alkyl-Functionalized Oligothiophenes (nT; n=2-6). Systematics of Thin Film Microstructure, Semiconductor Performance, and Modeling of Majority Charge Injection in Field-Effect Transistors, J. Am. Chem. Soc., 2004, 126, 13859-13874.

Gwinner et al., Highly Efficient Single-Layer Polymer Ambipolar Light-Emitting Field-Effect Transistors. Adv. Mater. 2012, 24, 2728-34.

Hepp et al., Light-Emitting Field-Effect Transistor Based on a Tetracene Thin Film. Phys. Rev. Lett. 2003, 91, 157406. Sundar et al., Elastomeric Transistor Stamps: Reversible Probing of Charge Transport in Organic Crystals. Science 2004, 303, 1644-6.

Hu et al., Symmetrical Carbazole-Fluorene-Carbazole Nematic Liquid Crystals as Electroluminescent Organic Semiconductors. Liq. Cryst. 2018, 45, 965-979.SPANO, The Spectral Signatures of Frenkel Polarons in H- and J-Aggregates. Acc. Chem. Res. 2010, 43, 429-39.

Hu et al., Stepwise Folding and Self-Assembly of a Merocyanine Folda-Pentamer, J. Am. Chem. Soc., 2020, 142, 3321-3325.

Jung et al., Development and Structure/Property Relationship of New Electron Accepting Polymers Based on Thieno[2',3':4,5]pyrido[2,3-g]thieno[3,2-c]quinoline-4,10-dione for All-Polymer Solar Cells, Chem. Mater., 2015, 27, 5941-5948.

Kelley et al., Solution-Phase Structure of an Artificial Foldamer: X-ray Scattering Study, J. Am. Chem. Soc., 2007, 129, 4114-4115.

Koopman et al., Charge-Exciton Interaction Rate in Organic Field-Effect Transistors by Means of Transient Photoluminescence Electromodulated Spectroscopy. ACS Photonics 2017, 4, 282-291.

Li et al., Aromatic Extension at 2,6-Positions of Anthracene toward an Elegant Strategy for Organic Semiconductors with Efficient Charge Transport and Strong Solid State Emission. J. Am. Chem. Soc. 2017, 139, 17261-17264.

Liao et al., Donor-Acceptor Conjugated Polymers Based on a Pentacyclic Aromatic Lactam Acceptor Unit for Polymer Solar Cells. Phys. Chem. Chem. Phys. 2013, 15, 19990-3.

Liu et al., Organic Light-Emitting Field-Effect Transistors: Device Geometries and Fabrication Techniques. Adv. Mater. 2018, 30, No. 1802466.

Liu et al., Organic Laser Molecule with High Mobility, High Photoluminescence Quantum Yield, and Deep-Blue Lasing Characteristics. J. Am. Chem. Soc. 2020, 142, 6332-6339.

Muccini et al., The photonic perspective of organic light-emitting transistors, Laser Photonics Rev., 2012, 6, 258-275.

Park et al., Highly Luminescent 2d-Type Slab Crystals Based on a Molecular Charge-Transfer Complex as Promising Organic Light-Emitting Transistor Materials. Adv. Mater. 2017, 29, 1701346.

Park et al., Hybrid Znon-Organic Light Emitting Transistors with Low Threshold Voltage <5 V. Adv. Optical Mater. 2019, 7. 1801290.

Poduval et al., Novel Thiophene-Phenylene—Thiophene Fused Bislactam-Based Donor-Acceptor Type Conjugate Polymers: Synthesis by Direct Arylation and Properties. Macromolecules 2013, 46, 9220-9230.

Qin et al., High-Efficiency Single-Component Organic Light-Emitting Transistors. Adv. Mater. 2019, 31, No. 1903175.

Seo et al., Solution-Processed Organic Light-Emitting Transistors Incorporating Conjugated Polyelectrolytes. Adv. Funct. Mater. 2011, 21, 3667-3672.

Sundar et al., Elastomeric Transistor Stamps: Reversible Probing of Charge Transport in Organic Crystals. Science 2004, 303, 1644-6.

Terenziani et al., Charge Instability in Quadrupolar Chromophores: Symmetry Breaking and Solvatochromism. J. Am. Chem. Soc. 2006, 128, 15742-55.

Toffanin et al., Organic Light-Emitting Transistors with Voltage-Tunable Lit Area and Full Channel Illumination. Laser Photonics Rev., 2013, 7, 1011-1019.

Usluer et al., Fluorene-Carbazole Dendrimers: Synthesis, Thermal, Photophysical and Electroluminescent Device Properties, Adv. Funct. Mater., 2010, 20, 4152-4161.

Usta et al., n-Channel Semiconductor Materials Design for Organic Complementary Circuits, Acc. Chem. Res., 2011, 44, 501 510.

Usta et al., Perfluoroalkyl-Functionalized Thiazole-Thiophene Oligomers as N-Channel Semiconductors in Organic Field-Effect and Light-Emitting Transistors. Chem. Mater. 2014, 26, 6542-6556.

Wasielewski, Self-Assembly Strategies for Integrating Light Harvesting and Charge Separation in Artificial Photosynthetic Systems, Acc. Chem. Res., 2009, 42, 1910-1921.

Wurthner et al., Perylene Bisimide Dye Assemblies as Archetype Functional Supramolecular Materials, Chem. Rev., 2016, 116, 962-1052.

Xie et al., Recent Advances on High Mobility Emissive Anthracene-Derived Organic Semiconductors. Chem. J. Chin. Univ. 2020, 20190650.

Yang et al., Control of Cationic Conjugated Polymer Performance in Light Emitting Diodes by Choice of Counterion, J. Am. Chem. Soc., 2006, 128, 14422-14423.

Zaumseil et al., Efficient Top-Gate, Ambipolar, Light-Emitting Field-Effect Transistors Based on a Green-Light-Emitting Polyfluorene. Adv. Mater. 2006, 18, 2708-2712.

Zhang et al., Organic Light-Emitting Transistors: Materials, Device Configurations, and Operations. Small, 2016, 12, 1252-1294.

Zhang et al., Organic Semiconductor Single Crystals for Electronics and Photonics. Adv. Mater. 2018, 30, No. 1801048.

Zhang et al., Emerging Self-Emissive Technologies for Flexible Displays. Adv. Mater. 2020, 32, No. 1902391.

Zhao et al., 25th Anniversary Article: Recent Advances in N-Type and Ambipolar Organic Field-Effect Transistors. Adv. Mater. 2013, 25, 5372-91.

Zheng et al., Non-Kasha Behavior in Quadrupolar Dye Aggregates: The Red-Shifted H-Aggregate. J. Phys. Chem. C 2019, 123, 3203-3215.

Ahmad et al., High-Speed Oleds and Area-Emitting Light-Emitting Transistors from a Tetracyclic Lactim Semiconducting Polymer. Adv. Optical Mater. 2018, 6. 1800768.

Bisri et al., Outlook and Emerging Semiconducting Materials for Ambipolar Transistors, Adv. Mater., 2014, 26, 1176-1199.

Cai et al., Exploration of Syntheses and Functions of Higher Ladder-Type Π-Conjugated Heteroacenes. Chem. 2018, 4, 2538-2570.

Capelli et al., Organic Light-Emitting Transistors with an Efficiency That Outperforms the Equivalent Light-Emitting Diodes. Nat. Mater., 2010, 9, 496-503.

Chaudhry et al., Nano-Alignment in Semiconducting Polymer Films: A Path to Achieve High Current Density and Brightness in Organic Light Emitting Transistors. ACS Photonics 2018, 5, 2137-2144.

Chen et al., Highly Efficient Flexible Organic Light Emitting Transistor Based on High-K Polymer Gate Dielectric. Adv. Opt. Mater., 2020, 8, 1901651.

Dadvand et al., Maximizing Field-Effect Mobility and Solid-State Luminescence in Organic Semiconductors, Angew. Chem., Int. Ed., 2012, 51, 3837-3841.

Enriquez-Cabrera et al., Comparison of Carbazole and Fluorene Donating Effects on the Two-Photon Absorption and Nitric Oxide Photorelease Capabilities of a Ruthenium-Nitrosyl Complex. Eur. J. Inorg. Chem., 2018, 531-543.

Fauvell et al., Photophysical and Morphological Implications of Single-Strand Conjugated Polymer Folding in Solution, Chem. Mater., 2016, 28, 2814-2822.

Hamai, Internal Heavy Atom Effects on the Exciplex Fluorescence: Anthracene-N,N-Dimethylaniline System Bull. Chem. Soc. Jpn., 1984, 57, 2700-2702.

Heeger, Semiconducting and Metallic Polymers: The Fourth Generation of Polymeric Materials J. Phys. Chem. B, 2001, 105 (36), 8475-8491.

Hou et al., Optically Switchable Organic Light-Emitting Transistors. Nat. Nanotechnol. 2019, 14, 347-353.

(56) References Cited

OTHER PUBLICATIONS

Li et al., A stable solution-processed polymer semiconductor with record high-mobility for printed transistors, Sci. Rep., 2012, 2, 754.
Li et al., Small Angle X-ray Scattering for Nanoparticle Research, Chem. Rev., 2016, 116, 11128-11180.
Liu et al., High mobility emissive organic semiconductor, Nat. Commun., 2015, 6, 10032.
Lu et al., Recent Advances in Bulk Heterojunction Polymer Solar Cells, Chem. Rev., 2015, 115, 12666-12731.
Ostroverkhova, Organic Optoelectronic Materials: Mechanisms and Applications, Chem. Rev., 2016, 116, 13279-13412.
Prosa et al., Organic Light-Emitting Transistors with Simultaneous Enhancement of Optical Power and External Quantum Efficiency via Conjugated Polar Polymer Interlayers, ACS Appl. Mater. Interfaces, 2018, 10, 25580-25588.
Putnam et al., X-ray solution scattering (SAXS) combined with crystallography and computation: defining accurate macromolecular structures, conformations and assemblies in solution, Q. Rev. Biophys., 2007, 40, 191-285.
Ren et al., Recent Advances in Ambipolar Transistors for Functional Applications. Adv. Funct. Mater. 2019, 29, 1902105.
Sandanayaka et al., Indication of Current-Injection Lasing from an Organic Semiconductor.Appl. Phys. Express, 2019, 12, 061010.
Sirringhaus, 25th Anniversary Article: Organic Field-Effect Transistors: The Path Beyond Amorphous Silicon. Adv. Mater. 2014, 26, 1319-35.
Spano et al., H- and J-Aggregate Behavior in Polymeric Semiconductors, Annu. Rev. Phys. Chem., 2014, 65, 477-500.
Tomkeviciene et al., Structure-Properties Relationship of Carbazole and Fluorene Hybrid Trimers: Experimental and Theoretical Approaches. Phys. Chem. Chem. Phys. 2014, 16, 13932-42.
Ullah et al., Defining the Light Emitting Area for Displays in the Unipolar Regime of Highly Efficient Light Emitting Transistors. Sci. Rep. 2015, 5, 8818.
Ullah et al., Uv-Deep Blue-Visible Light-Emitting Organic Field Effect Transistors with High Charge Carrier Mobilities. Adv. Opt. Mater. 2017, 5, 1600973.
Wong et al., Purely Organic Thermally Activated Delayed Fluorescence Materials for Organic Light-Emitting Diodes, Adv. Mater., 2017, 29, 1605444.
Xu et al., Soluble Electrochromic Polymers Incorporating Benzoselenadiazole and Electron Donor Units (Carbazole or Fluorene): Synthesis and Electronic-Optical Properties. Polymers (Basel, Switz. ), 2018, 10, 450.
Yashima et al., Supramolecular Helical Systems: Helical Assemblies of Small Molecules, Foldamers, and Polymers with Chiral Amplification and Their Functions, Chem. Rev., 2016, 116, 13752-13990.
Yuan et al., Design of High-Performance Organic Light-Emitting Transistors. ACS Omega, 2020, 5, 68-74.
Zaumseil, Recent Developments and Novel Applications of Thin Film, Light-Emitting Transistors. Adv. Funct. Mater. 2020, 30, 1905269.

* cited by examiner

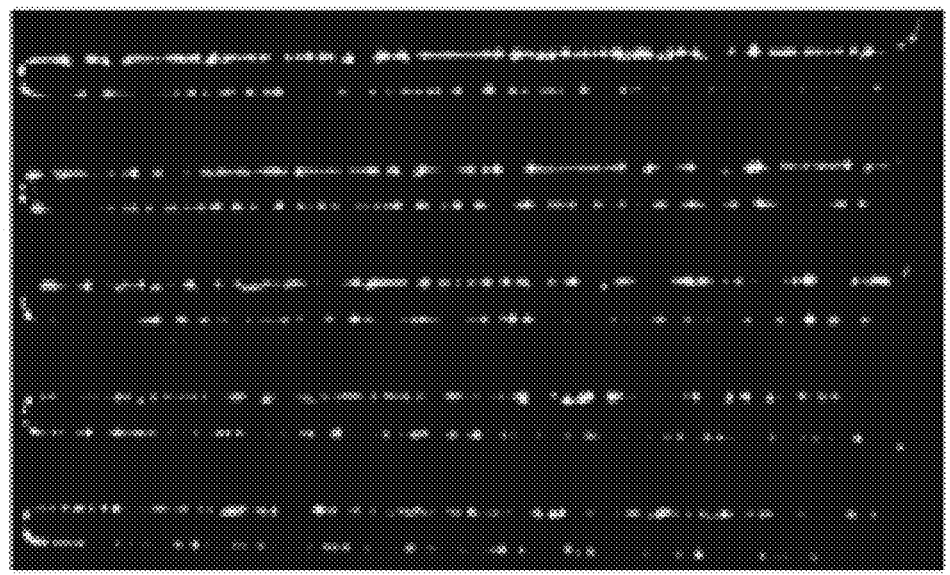
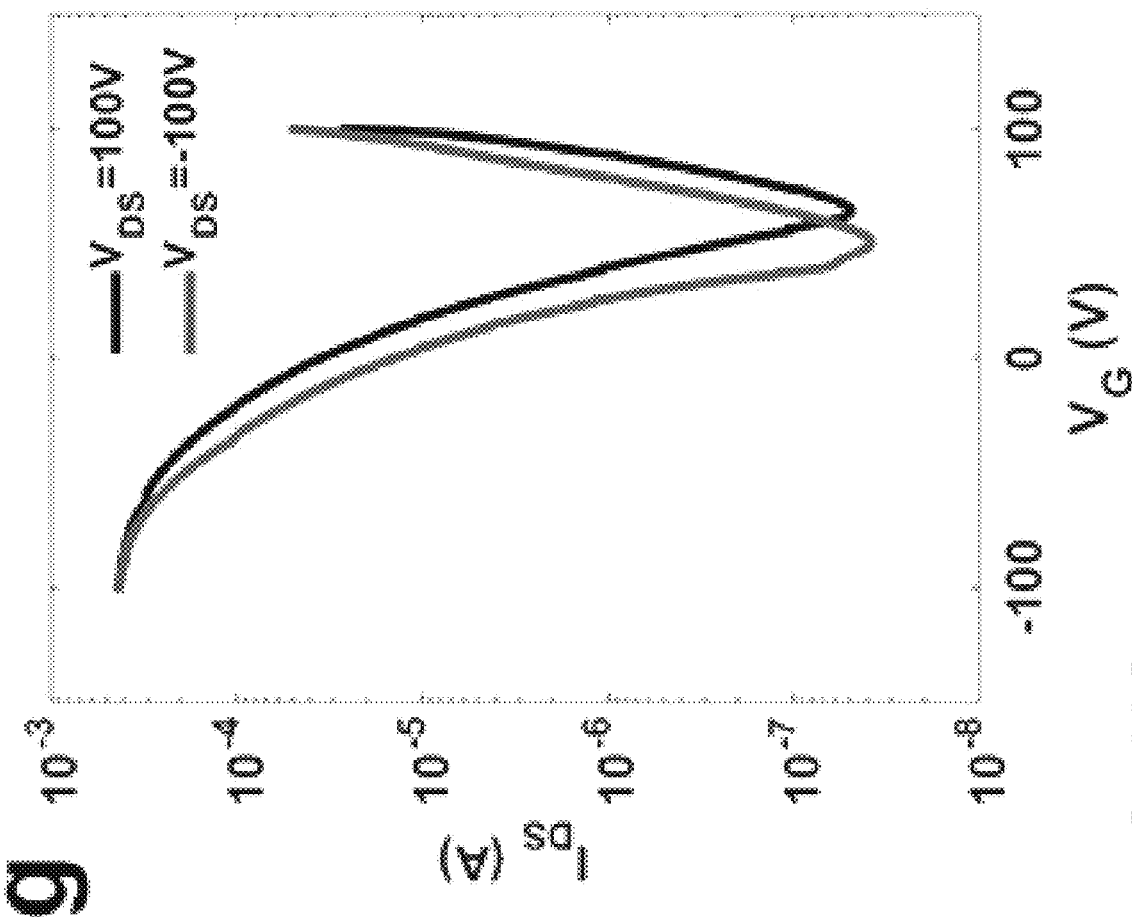
FIG. 11G
FIG. 11H a

FLUORESCENT CONJUGATED POLYMERS CONTAINING SEMI-LADDER UNITS FOR LIGHT-EMITTING FIELD-EFFECT TRANSISTORS

CROSS-REFERENCE TO RELATED APPLICATION

This application claims priority to U.S. Provisional Application No. 62/936,099, filed Nov. 15, 2019, the content of which is incorporated herein by reference in its entirety.

GOVERNMENT SUPPORT CLAUSE

This invention was made with government support under grant numbers 1802274, 1834750, and 1420709 awarded by the National Science Foundation, and grant number DE-AC02-06CH11357 awarded by the Department of Energy. The government has certain rights in the invention.

FIELD OF THE DISCLOSURE

The field of the disclosure relates generally to novel semi-ladder, luminescent polymers. More specifically, the field of the disclosure relates to organic electronic devices and organic light-emitting transistors comprising the novel semi-ladder luminescent polymers.

BACKGROUND OF THE DISCLOSURE

A promising field of organic optoelectronics is that of organic field-effect transistors (OFETs) which have the potential to morph into flexible devices, as well as the interconversion of light and electricity in the area of organic conjugated polymers and organic light-emitting diodes (OLED), which have been commercialized and are widely used in lighting and display applications. Organic light-emitting transistor (OLET) combines both the electrical switching capability of OFETs and the light-generation capability of OLEDs in a single device, in which the intensity and recombination zone of electroluminescence (EL) can be effectively tuned by applying gate voltage. A successful development of OLET technology can greatly simplify the display fabrication process and lead to new applications in electrically pumped organic lasers and smart displays. An efficient OLET should exhibit a large $I_{on/off}$ ratio, a high charge mobility, a low applied voltage, a high external quantum efficiency (EQE), and tunable recombination zone. Further, the requirements of organic semiconductors for OLET based applications are more stringent than those of OLED active materials. They include balanced high ambipolar mobility and high photoluminescent quantum yield (PLQY) simultaneously in the same material, which are usually not compatible and difficult to realize. Current OLET devices are based on the traditional fluorescent semiconductors already used in OLEDs or OFETs. Their performances are relatively poor as they do not satisfy the stringent requirements as mentioned above.

To address these issues, multi-layer devices that delegate different functions such as charge transport, charge injection, and emission into different materials can be introduced. In these multi-layer devices, a high charge carrier mobility is not essential in the emissive layer provided that the energy levels are properly aligned and the solid-state emission quantum yield is high. Though, these methods are not capable of, which greatly limit their future. However, the fabrication of multi-layer devices requires solution-processability in the form of sophisticated vacuum deposition of multiple layers of small-molecule materials and is not compatible with polymeric materials in electronics printing applications. In other words, the requirement of avoiding re-dissolution during the fabrication process significantly limits the choice of available materials and thus the performance of resulting OLETs to date has been relatively poor (EQE<1%). New material systems for high-performance OLETs require not only suitable energy levels, luminescent quantum yields and charge mobility, but also the correct aggregation state. Consequently, the development of new materials exhibiting proper energy level alignment, high PLQY, and solution-processed property has become critical for further progress in this area.

BRIEF DESCRIPTION OF THE DISCLOSURE

In one aspect, the present disclosure is directed to a semi-ladder, luminescent polymer comprising: an electron-accepting organic chromophore selected from the group consisting of thieno [2',3':5,6] pyrido [3,4-g] thieno [3,2-c]-isoquinoline-5,11(4H,10H)-dione (TPTI), 5,11-bis(2-butyloctyl)-dihydrothieno[2',3':4,5]pyrido[2,3-g]thieno[3,2-c] quinoline-4,10-dione (TPTQ), and furo[3,2-c]furo[2',3':4,5]pyrido[2,3-g]quinoline-4,10-dione (TPTQF); and an electron-donating co-monomer.

In another aspect, the present disclosure is directed to an organic electronic device comprising at least one emissive layer, wherein the at least one emissive layer comprises a semi-ladder, luminescent polymer comprising an electron-accepting organic chromophore and an electron-donating co-monomer.

In yet another aspect, the present disclosure is directed to a multi-layer organic light-emitting transistor comprising: at least one dielectric layer; at least one self-assembled monolayer; and at least one emissive layer comprising a semi-ladder, luminescent polymer, wherein the polymer comprises: an electron-accepting organic chromophore selected from the group consisting of TPTI (thieno [2',3' :5,6] pyrido [3,4-g] thieno [3,2-c]-isoquinoline-5,11(4H,10H)-dione), TPTQ (5,11-bis(2-butyloctyl)-dihydrothieno[2',3':4,5] pyrido[2,3-g]thieno[3,2-c] quinoline-4,10-dione), and TPTQF (furo[3,2-c]furo[2',3':4,5]pyrido[2,3-g]quinoline-4, 10-dione); and an electron-donating co-monomer selected from the group consisting of carbazole and fluorene.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The drawings described below illustrate various aspects of the disclosure.

FIG. 11G is an exemplary embodiment of characteristic transfer curves of TPTI-C in accordance with the present disclosure. FIG. 11H is an exemplary embodiment of characteristic emission images of TPTI-C in accordance with the present disclosure. In BGTC OLET with optimized device configuration as shown in FIG. 9A (OTS as modification layer). Channel length, L=50 ism; channel width, W=18 mm.

DETAILED DESCRIPTION OF THE DISCLOSURE

Figure 1:
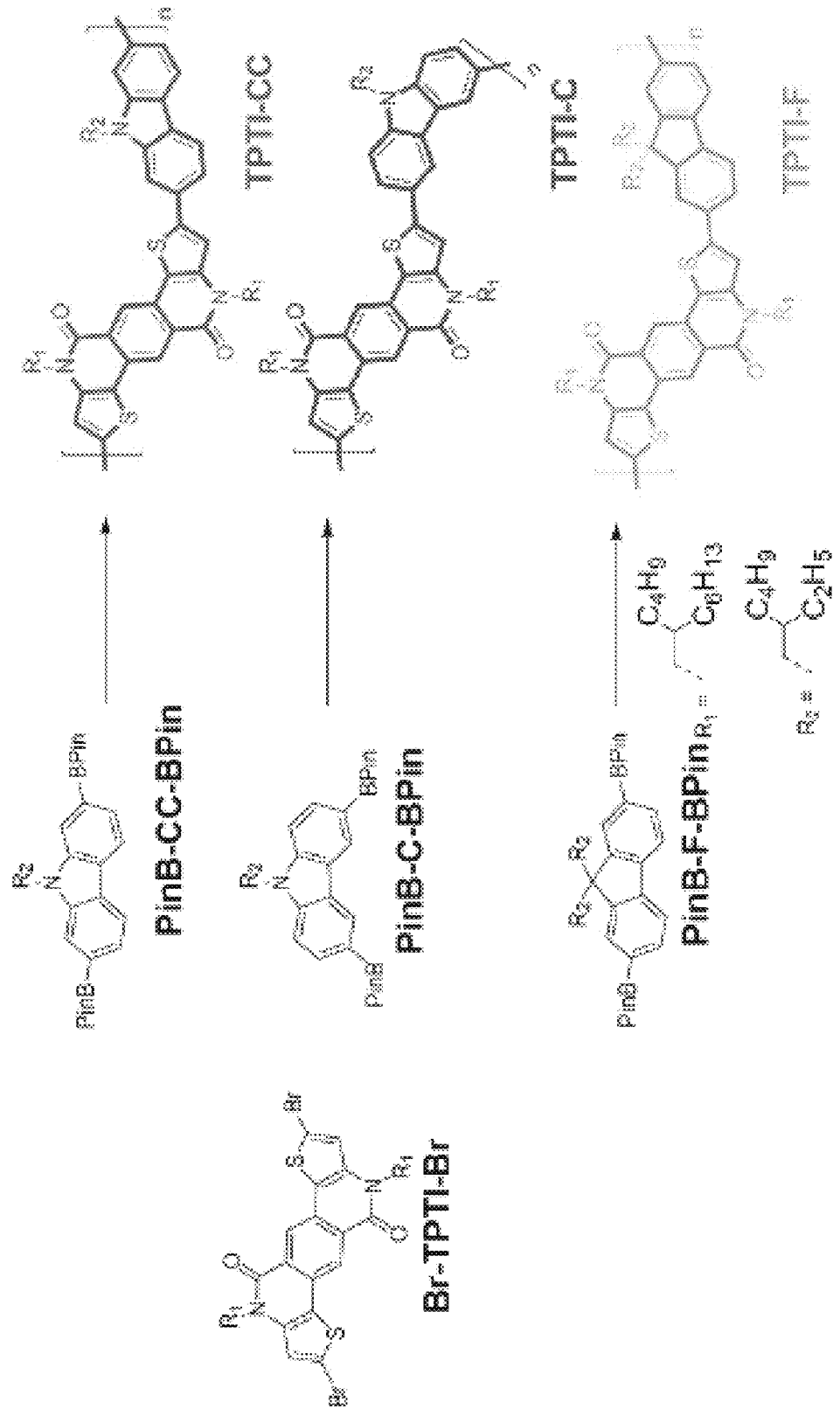
FIG. 1 is an exemplary embodiment of a reaction scheme illustrating synthesis of ladder-type copolymers, TPTI-CC, TPTI-C, and TPTI-F in accordance with the present disclosure.

In some embodiments of the present disclosure, a semi-ladder, luminescent polymer is disclosed comprising: an electron-accepting organic chromophore selected from the group consisting of thieno [2',3' :5,6] pyrido [3,4-g] thieno [3,2-c]-isoquinoline-5,11(4H,10H)-dione (TPTI), 5,11-bis (2-butyloctyl)-dihydrothieno[2',3':4,5]pyrido[2,3-g]thieno [3,2-c] quinoline-4,10-dione (TPTQ), and furo[3,2-c]furo [2',3':4,5]pyrido[2,3-g]quinoline-4,10-dione (TPTQF); and an electron-donating co-monomer.

In some embodiments, the chromophore is TPTI and wherein the co-monomer is carbazole such that the polymer is a cross-conjugated polymer (TPTI-C). In some embodiments, the chromophore is TPTI and the co-monomer is carbazole such that polymer is a fully-conjugated polymer (TPTI-CC). In some embodiments, the chromophore is TPTI and the co-monomer is fluorene such that polymer is a fully-conjugated polymer (TPTI-F). In some embodiments, the chromophore is TPTQ and the co-monomer is carbazole such that the polymer is a cross-conjugated polymer (TPTQ-C). In some embodiments, the chromophore is TPTQ and the co-monomer is carbazole such that the polymer is a fully-conjugated polymer (TPTQ-CC). In some embodiments, the chromophore is TPTQF, and the co-monomer is carbazole such that the polymer is a cross-conjugated polymer (TPTQF-C). In some embodiments, the chromophore is TPTQF, and the co-monomer is carbazole such that the polymer is a cross-conjugated polymer (TPTQF-CC).

In some embodiments of the present disclosure, an organic electronic device is disclosed comprising at least one emissive layer, wherein the at least one emissive layer comprises a semi-ladder, luminescent polymer comprising an electron-accepting organic chromophore and an electron-donating co-monomer.

In some embodiments, the device is a light-emitting transistor. In some embodiments, the chromophore is TPTI (thieno [2',3' :5,6] pyrido [3,4-g] thieno [3,2-c]-isoquinoline-5,11(4H,10H)-dione) and the co-monomer is carbazole such that the polymer is a cross-conjugated polymer TPTI-C. In some embodiments, the chromophore is TPTI (thieno [2',3' :5,6] pyrido [3,4-g] thieno [3,2-c]-isoquinoline-5,11(4H, 10H)-dione) and the co-monomer is carbazole such that polymer is a fully-conjugated polymer TPTI-CC. In some embodiments, the chromophore is TPTI (thieno [2',3' :5,6] pyrido [3,4-g] thieno [3,2-c]-isoquinoline-5,11(4H,10H)-dione) and the co-monomer is fluorene such that the polymer is a fully-conjugated polymer TPTI-F.

In some embodiments, the chromophore is TPTQ (5,11-bis(2-butyloctyl)-dihydrothieno[2',3':4,5]pyrido[2,3-g]thieno[3,2-c] quinoline-4,10-dione) and the co-monomer is carbazole such that the polymer is selected from the group consisting of TPTQ-C and TPTQ-CC.

In some embodiments, the chromophore is TPTQF (furo[3,2-c]furo[2',3':4,5]pyrido[2,3-g]quinoline-4,10-dione) and the co-monomer is carbazole such that the polymer is selected from the group consisting of TPTQF-C and TPTQF-CC.

In some embodiments of the present disclosure, a multi-layer organic light-emitting transistor is disclosed comprising: at least one dielectric layer; at least one self-assembled monolayer; and at least one emissive layer comprising a semi-ladder, luminescent polymer, wherein the polymer comprises: an electron-accepting organic chromophore selected from the group consisting of TPTI (thieno [2',3' :5,6] pyrido [3,4-g] thieno [3,2-c]-isoquinoline-5,11 (4H,10H)-dione), TPTQ (5,11-bis(2-butyloctyl)-dihydrothieno[2',3':4,5]pyrido[2,3-g]thieno[3,2-c] quinoline-4,10-dione), and TPTQF (furo[3,2-c]furo[2',3':4,5]pyrido[2,3-g]quinoline-4,10-dione); and an electron-donating co-monomer selected from the group consisting of carbazole and fluorene.

In some embodiments, the at least one dielectric layer silicon dioxide. In some embodiments, the at least one self-assembled monolayer is n-octadecyltrichlorosilane. In some embodiments, the transistor further comprises at least one transporting layer. In some embodiments, the transistor further comprises at least one electron injection layer.

EXAMPLES

The following examples illustrate various aspects of the disclosure.

Example 1: Highly Emissive Semi-Ladder-Type Copolymers, Aggregation State, and Solution-Processed Organic Light-Emitting Transistor An organic light-emitting transistor (OLET) integrates the logic function of a field-effect transistor (FET) with electro-luminescence of a light-emitting diode (LED) into a single device. This has the potential to play an important role in smart displays, electrically pumped organic laser, and other flexible electronic devices. For achieving high-performance solution-processed OLET, three semi-ladder copolymers—TPTI-CC, TPTI-C, and TPTI-F—were developed. It was found that variation in the chemical structure lead to significant differences in energy level, emission color, and intermolecular aggregation. High photoluminescence quantum yields (PLQY) was obtained in these three polymers. Solution-processed tri-layered OLET devices were fabricated, which exhibited strong electro-luminescence, balanced charge mobility, and external quantum efficiency (EQE) of 2.8%.

Introduction

One of the success stories in the field of organic opto-electronics is that of the organic light-emitting diode which has already percolated from research laboratories to household electronics. Another promising field is that of organic field-effect transistors (OFETs), which has the potential to morph into flexible devices. Organic light-emitting transistor (OLET) combines both the electrical switching capability of OFETs and the light-generation capability of organic light-emitting diodes (OLEDs) in a single device, in which the intensity and recombination zone of electroluminescence (EL) can be effectively tuned by applying gate voltage. A successful development of OLET technology can greatly simplify the display fabrication process and lead to new applications in electrically pumped organic lasers and smart displays. An efficient OLET should exhibit the following characteristics: a large $I_{on/off}$ ratio, a high charge mobility, a low applied voltage, a high external quantum efficiency (EQE), and tunable recombination zone. However, accomplishing all of the above remains a formidable task as current materials lack simultaneous ambipolar charge transport and strong luminescence in the solid-state. Moreover, effective ambipolar charge transport requires materials with highly ordered intermolecular stacking and proper matching of the highest occupied molecular orbital (HOMO) and lowest unoccupied molecular orbital (LUMO) energy levels with the Fermi energy level of metal electrodes. Unfortunately, strong intermolecular π-π stacking will likely quench luminescence in the solid-state. Thus, organic systems with high solid-state emission quantum yields generally exhibit less planar, but rigid structures, which necessarily impede charge transport and result in low charge carrier mobility.

To address this key issue, different types of materials have been developed, including small-molecules, polymers, single-crystals, as well as charge-transfer (CT) co-crystals. A bottom gate bottom contact (BGBC) device architecture has been employed to fabricate a tetracene based OLET device and observed light-emission. Unfortunately, their device exhibited a very low EQE due to high charge injection energy barrier and low photoluminescent quantum yield (PLQY) of tetracene. A fluorescent ambipolar semiconductor F8BT (PLQY=60%) has been used to fabricate asymmetric bottom contact top gate (BCTG) OLET device and achieved an impressive EQE of over 8%.[19,20] By precisely controlling the growth of single-crystals, both high PLQY, as well as high charge carrier mobility, can be achieved simultaneously in single-crystal devices. Ambipolar semiconductors DPA and dNaAnt have been synthesized, exhibiting a balanced electron/hole mobility of over $10^{-1}$ $cm^2$ $V^{-1}$ $s^{-1}$ and an EQE as high as 1.75% in single-crystal OLET devices with asymmetric electrodes. A 2D slab CT co-crystal composed of 2MDCS ($D_{CT3}$) and CN-TFPA (Am) has been developed and achieved an EQE of 1.5% in a simple BGBC OLET device with symmetric electrodes. However, the performance of OLET achieved up to date is still very low when in comparison with OLED. Moreover, the efficiency has recently plateaued due to a lack of high-performance fluorescent semiconductors that surpass F8BT.

An alternative approach is to prepare multilayer devices, in which chare injection and charge-transporting layers are introduced. In these multilayer devices, a high charge carrier mobility is not essential in the emissive layer provided that the energy levels are properly aligned and the solid-state emission quantum yield is high. This strategy has been applied in a tri-layered vacuum-deposition OLET device which exhibited balanced electron/hole mobility of 0.01 $cm^2$ $V^{-1}$ $s^{-1}$ and an EQE of 5%, more than 100 times higher than that of the equivalent OLED. Thermally activated delayed fluorescence (TADF) small-molecule materials and the hole transporting small-molecule C8-BTBT have been used to construct tri-layered OLET devices by vacuum-deposition, in which a peak EQE of 9.01% was achieved. Though, these methods are not capable of solution-processability, which greatly limit their future application in printing electronics.

Thus, the development of new materials exhibiting proper energy level alignment, high PLQY, and solution-processed property has become critical for further progress in this area. As disclosed herein, three weak donor-weak acceptor copolymers were developed TPTI-CC, TPTI-C, and TPTI-F based on electron-deficient thieno [2',3' :5,6] pyrido [3,4-g] thieno [3,2-c]-isoquinoline-5,11(4H,10H)-dione (TPTI) and electron-rich fluorene and carbazoles. Here, carbazole (C) and fluorene (F) are weak electron-donating units and their homo/copolymers are highly fluorescent materials. Ladder-type building block, TPTI, is a fluorescent and weak electron-withdrawing group with good planarity and rigidity. It was found that the resulting three copolymers exhibit high PLQY and moderate charge carrier mobility. Moreover, solution-processed tri-layered OLET devices based on these polymers were fabricated and exhibited high ambipolar charge mobility and strong electroluminescence. An excellent EQE of 2.8% was achieved in TPTI-F device, which is one of the highest among solution-processed OLETs (Table 1).

TABLE 1

EQE of TPTI-F and reported solution-processed OLETs.

| | EQE | Ref. |
|---|---|---|
| F8BT | >8% | Adv. Mater. 2012, 24, 2728-2734 |
| Super yellow (SY) | $10^{-3}$% | Adv. Funct. Mater. 2011, 21, 3667-3672 |
| SY | 1% | Sci. Rep. 2015, 5, 8818 |
| PTNT | 0.25% | Adv. Optical Mater. 2018, 6, 1800768 |
| SY | 0.4% | ACS Photonics 2018, 5, 2137-2144 |
| SY | 0.1% | Adv. Optical Mater. 2019, 7, 1801290 |
| TPTI-F | 2.8% | present disclosure |

Results and Discussion

Figure 2A:
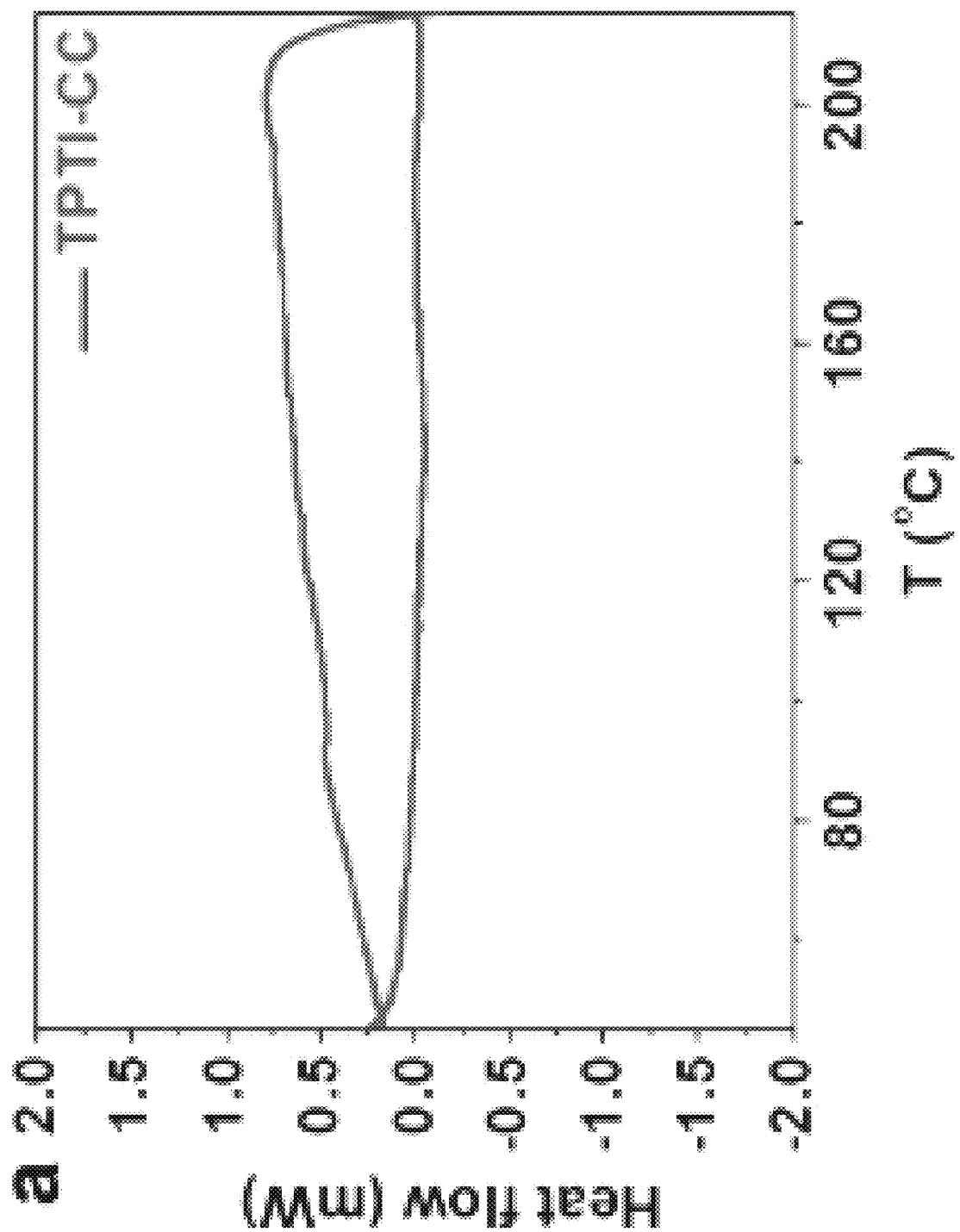
FIG. 2A is an exemplary embodiment of DSC analysis of TPTI-CC in accordance with the present disclosure.
Figure 2B:
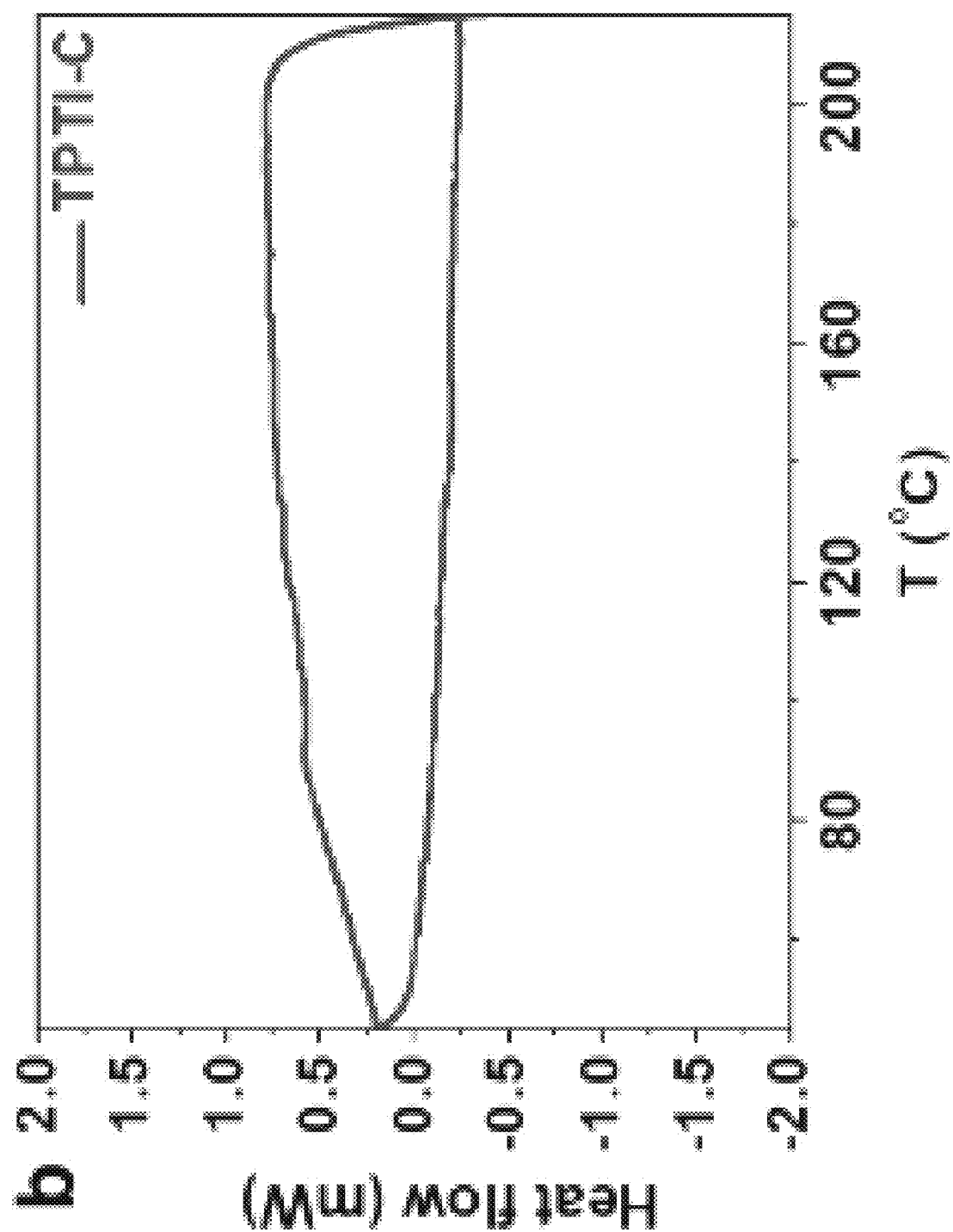
FIG. 2B is an exemplary embodiment of DSC analysis of TPTI-C in accordance with the present disclosure.
Figure 2C:
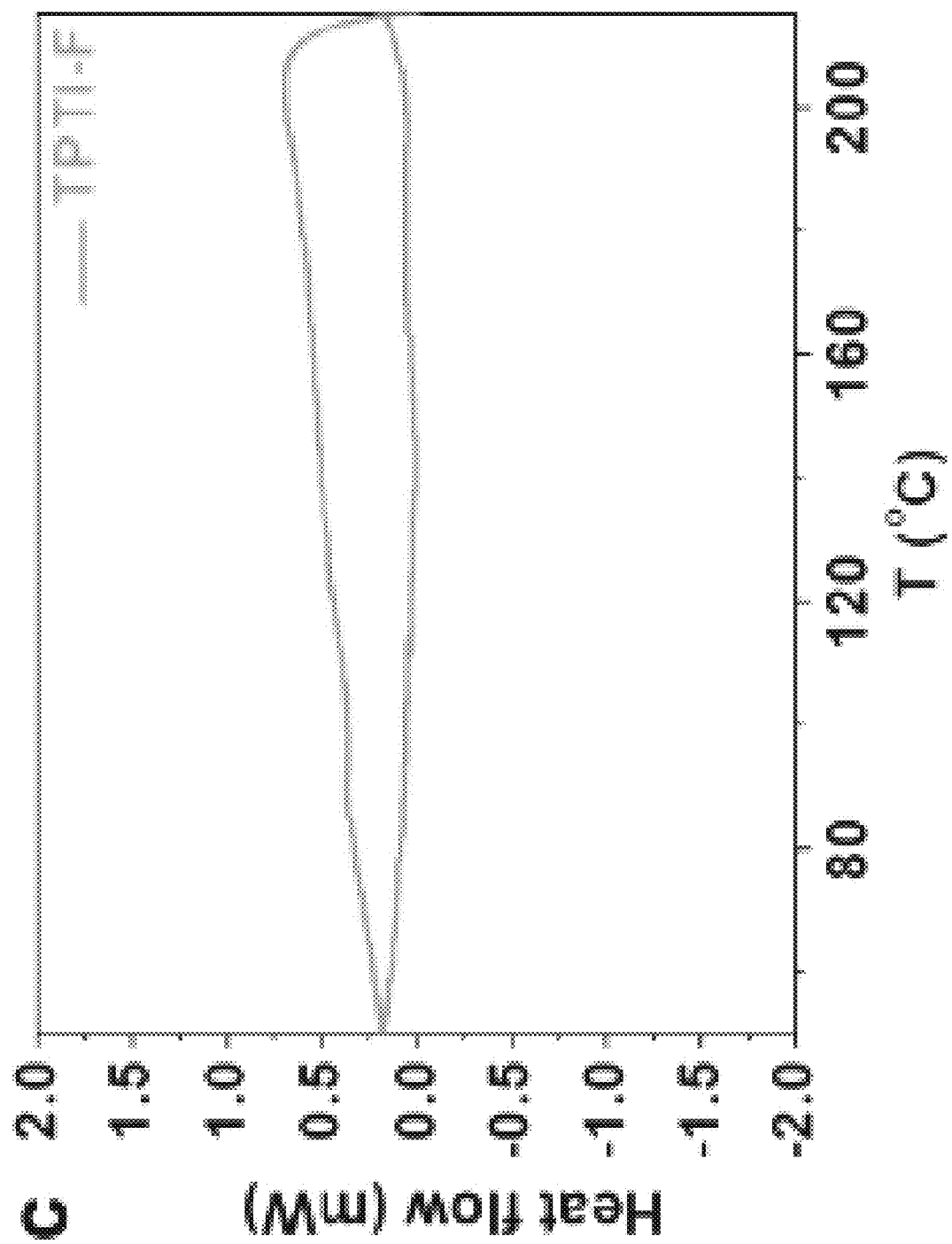
FIG. 2C is an exemplary embodiment of DSC analysis of TPTI-F in accordance with the present disclosure.
Figure 3:
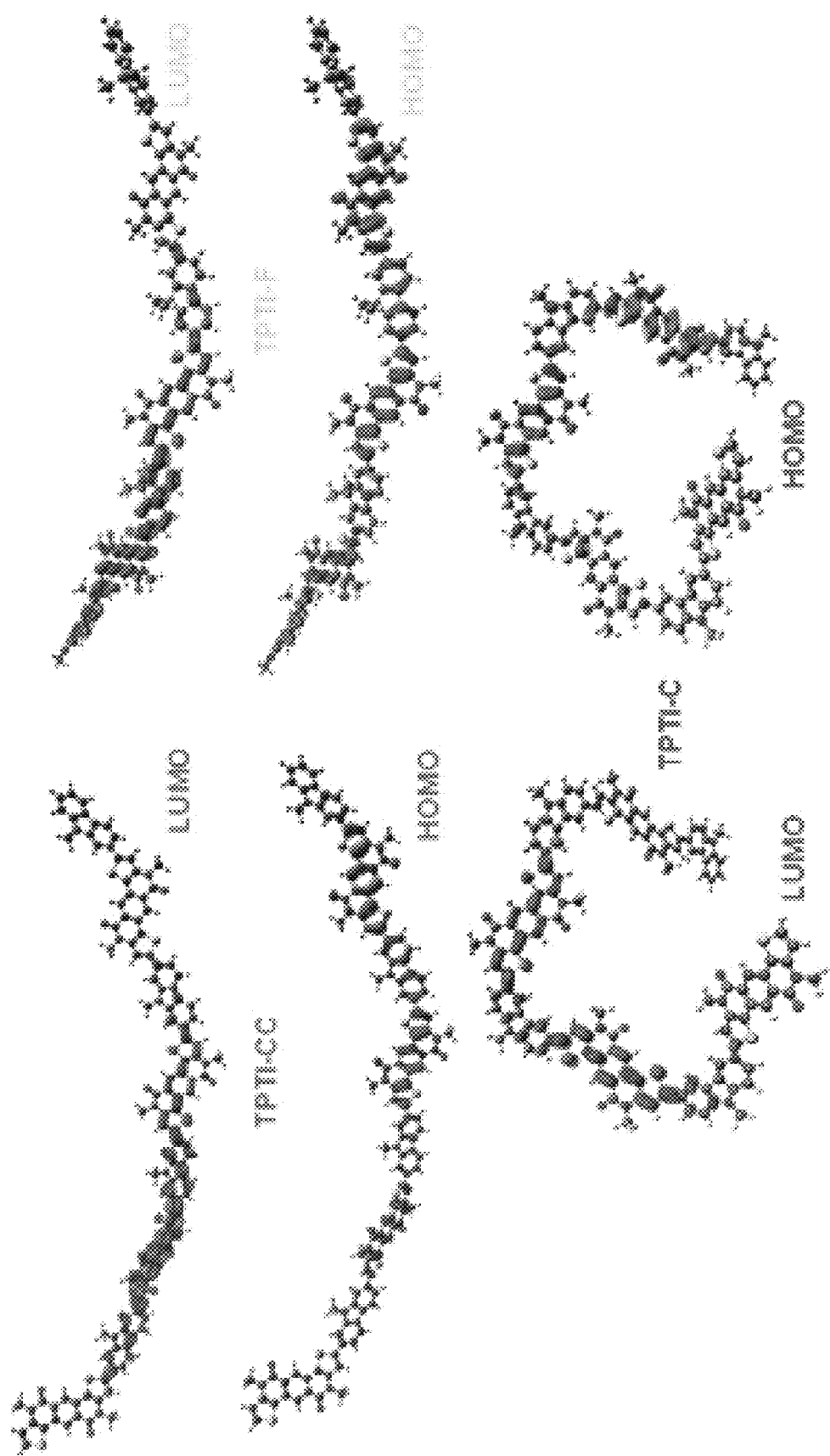
FIG. 3 is an exemplary embodiment of calculated HOMO and LUMO molecular orbital distribution of TPTI-CC, TPTI-C, and TPTI-F in accordance with the present disclosure.
Figure 4A:
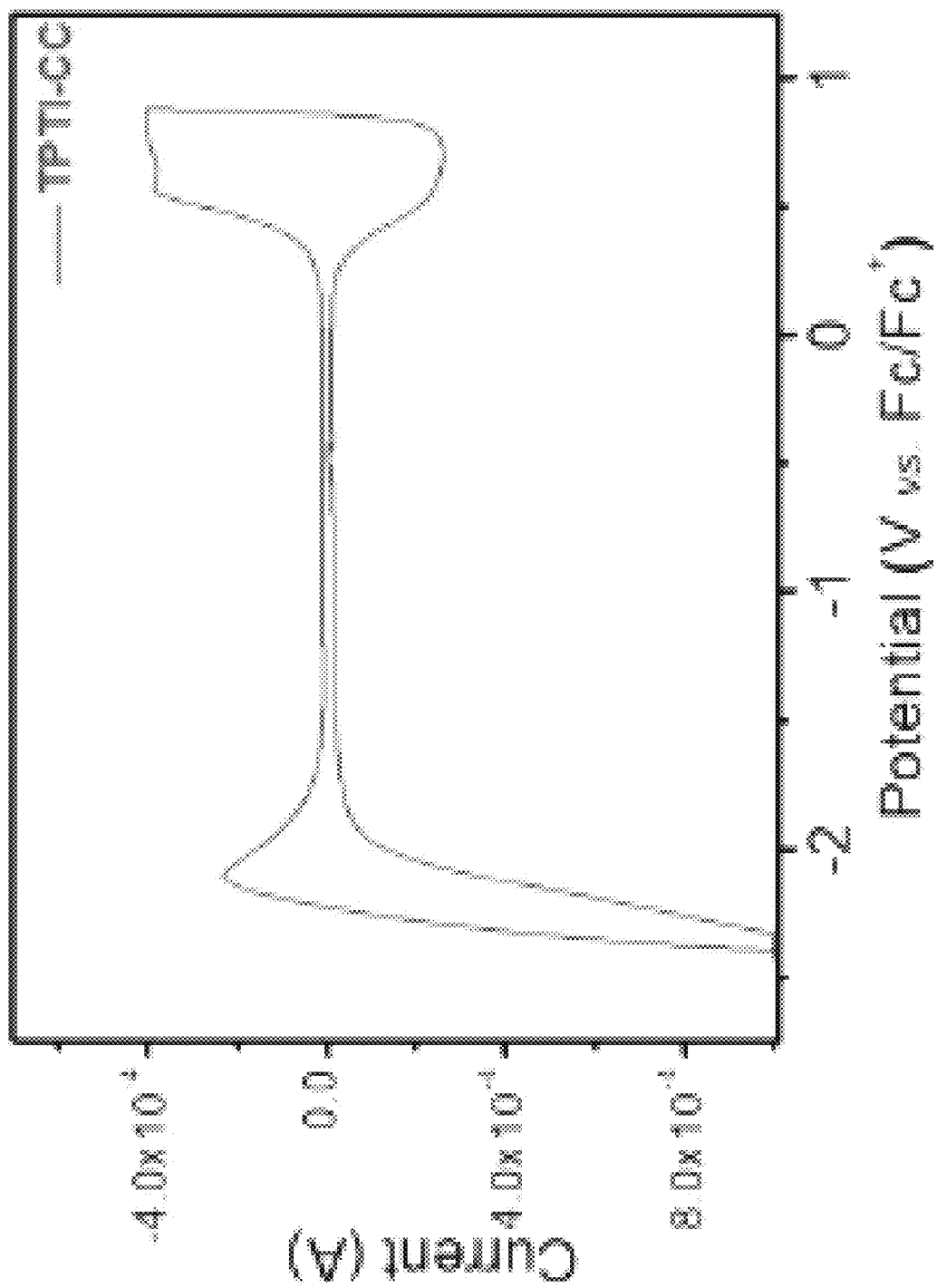
FIG. 4A is an exemplary embodiment of cyclic voltammetry (CV) curves of TPTI-CC in accordance with the present disclosure.
Figure 4B:
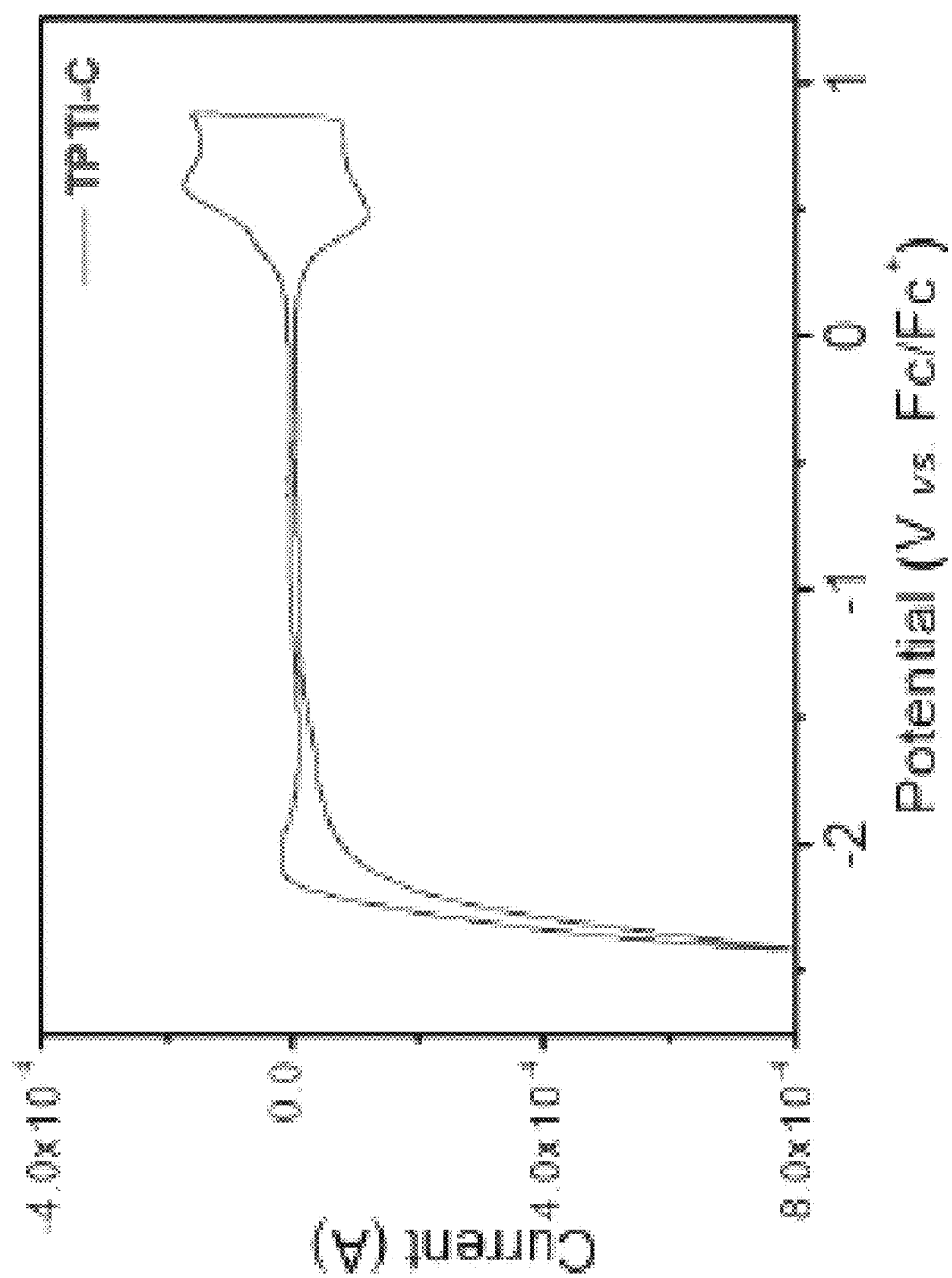
FIG. 4B is an exemplary embodiment of cyclic voltammetry (CV) curves of TPTI-C in accordance with the present disclosure.
Figure 4C:
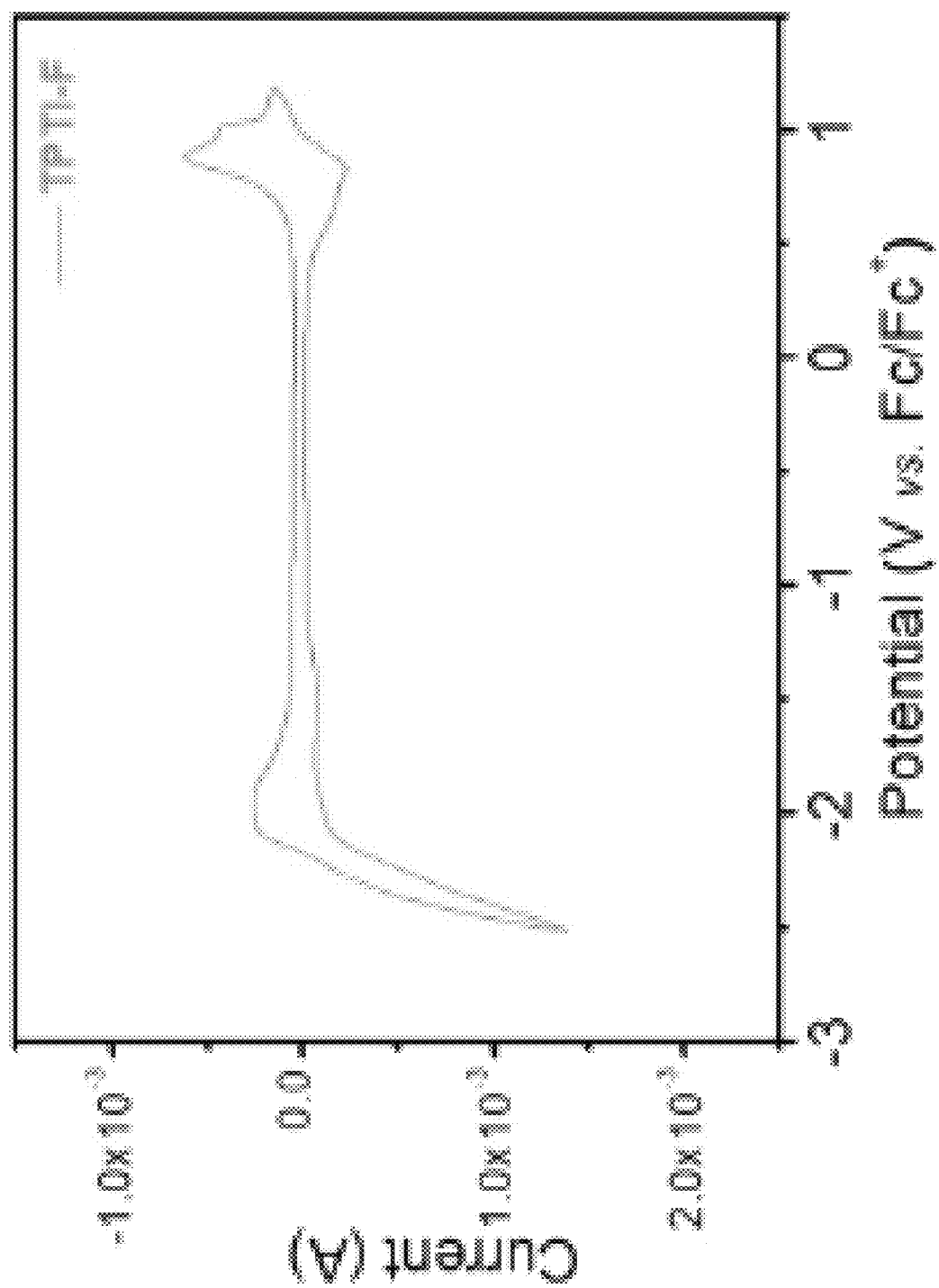
FIG. 4C is an exemplary embodiment of cyclic voltammetry (CV) curves of TPTI-F in accordance with the present disclosure.

The three copolymers (TPTI-CC, TPTI-C, and TPTI-F) were synthesized via the Suzuki coupling reaction as shown in Scheme 1. Here, TPTI-C is a cross-conjugated polymer while TPTI-F and TPTI-CC are fully conjugated. Thermogravimetric analysis (TGA) show high thermal stability in the three copolymers (Table 2). There is no peak observed in the DSC analysis indicating that no phase transition happens during thermal-annealing (FIG. 2). Molecular weights ($M_W$) and the distribution are determined with gel permeation chromatography (GPC) as summarized in Table 2. All three polymers have good solubility in common organic solvents such as toluene, xylene, and chlorobenzene. DFT calculations at B3LYP level of theory using 6-31G** basis set indicated a HOMO of −4.91 eV and a LUMO of −2.17 eV for TPTI-CC, which is slightly upshifted than the corresponding TPTI-F polymer (−4.93/−2.25 eV). TPTI-C exhibits a HOMO of −4.77 eV and a LUMO of −1.78 eV which is slightly higher than that of TPTI-CC. A molecular geometry simulation clearly shows that TPTI-CC and TPTI-F exhibit linear polymer backbones (FIG. 3). A coiled molecular backbone is formed in TPTI-C due to angled interconnection. From the cyclic voltammetry (CV) measurements (FIG. 4), HOMO/LUMO energy levels of TPTI-CC, TPTI-C and TPTI-F were determined to be −5.20 eV/−3.20 eV, −5.11 eV/−3.09 eV, and −5.48 eV/−3.15 eV, respectively (Table 2). The slightly higher HOMO energy levels on TPTI-CC and TPTI-C should be attributed to the stronger electron-donating ability of carbazole than that of fluorene in TPTI-F.

TABLE 2

Chemical Property of TPTI-CC, TPTI-C, and TPTI-F.

| | HOMO (eV) | LUMO (eV) | $E_g^{film}$ (eV) | $E_g^{solution}$ (eV) | PLQY (%) | $M_w$ | $M_n$ | PDI | $T_d$(° C.)[d] |
|---|---|---|---|---|---|---|---|---|---|
| TPTI-CC | −5.20[b] (−4.91)[a] | −3.20[c] (−2.17)[a] | 2.00 | 2.11 | 23 | 32 428 | 23 471 | 1.38 | 340 |
| TPTI-C | −5.11[b] (−4.77)[a] | −3.09[c] (−1.78)[a] | 2.02 | 2.14 | 21 | 17 797 | 14 070 | 1.26 | 320 |
| TPTI-F | −5.48[b] (−4.93)[a] | −3.15[c] (−2.25)[a] | 2.33 | 2.43 | 59 | 11 963 | 9421 | 1.27 | 370 |

[a]Calculated from DFT.
[b]Calculated from oxidation onset of CV spectra.
[c]$E_{LUMO} = E_{HOMO} + E_g^{film}$.
[d]TGA data showing the temperature for onset of 5% mass loss.

Figure 5A:
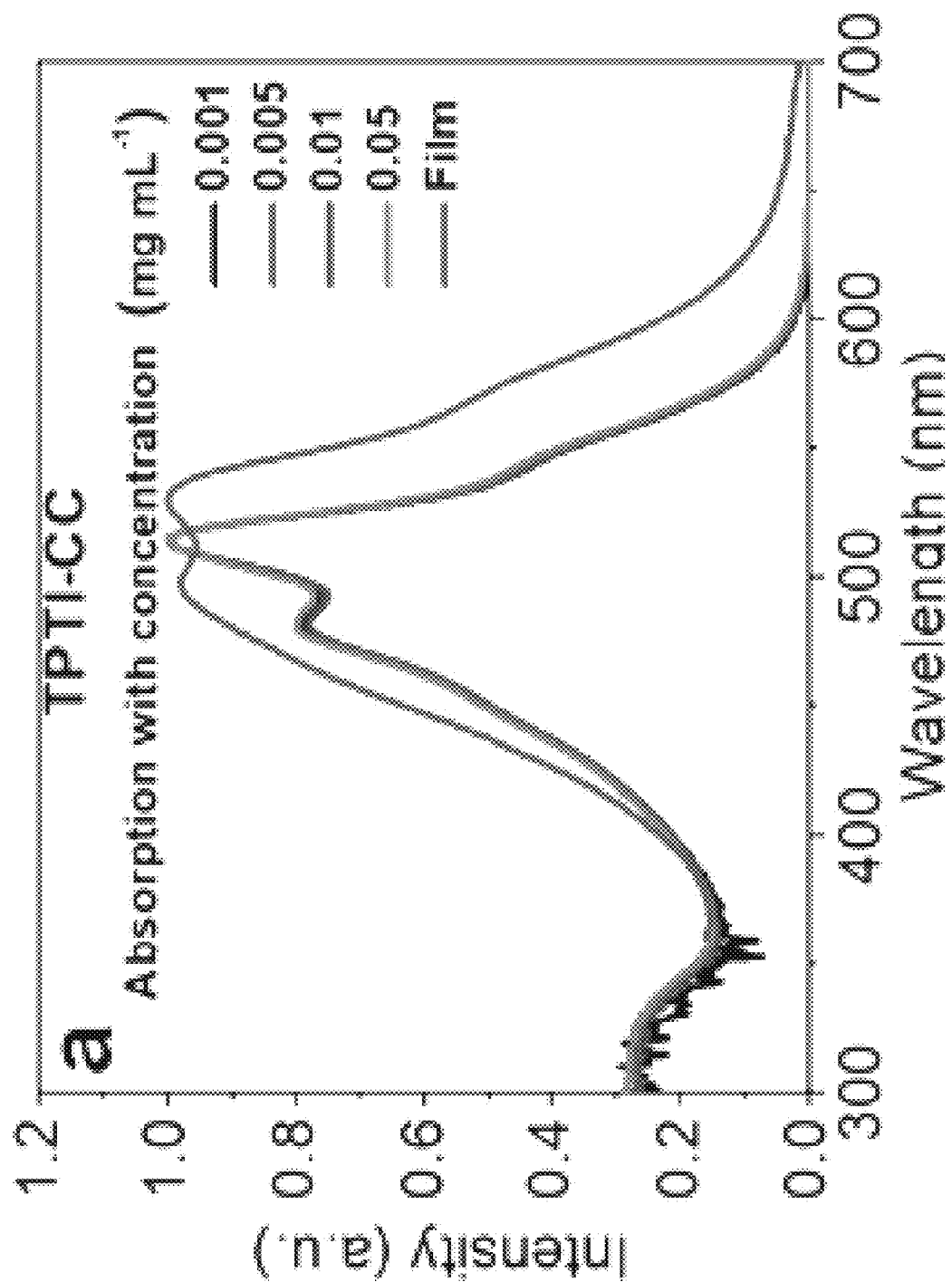
FIG. 5A is an exemplary embodiment of concentration-dependent UV-vis absorption spectra of TPTI-CC in chloroform solution and thin film in accordance with the present disclosure.
Figure 5B:
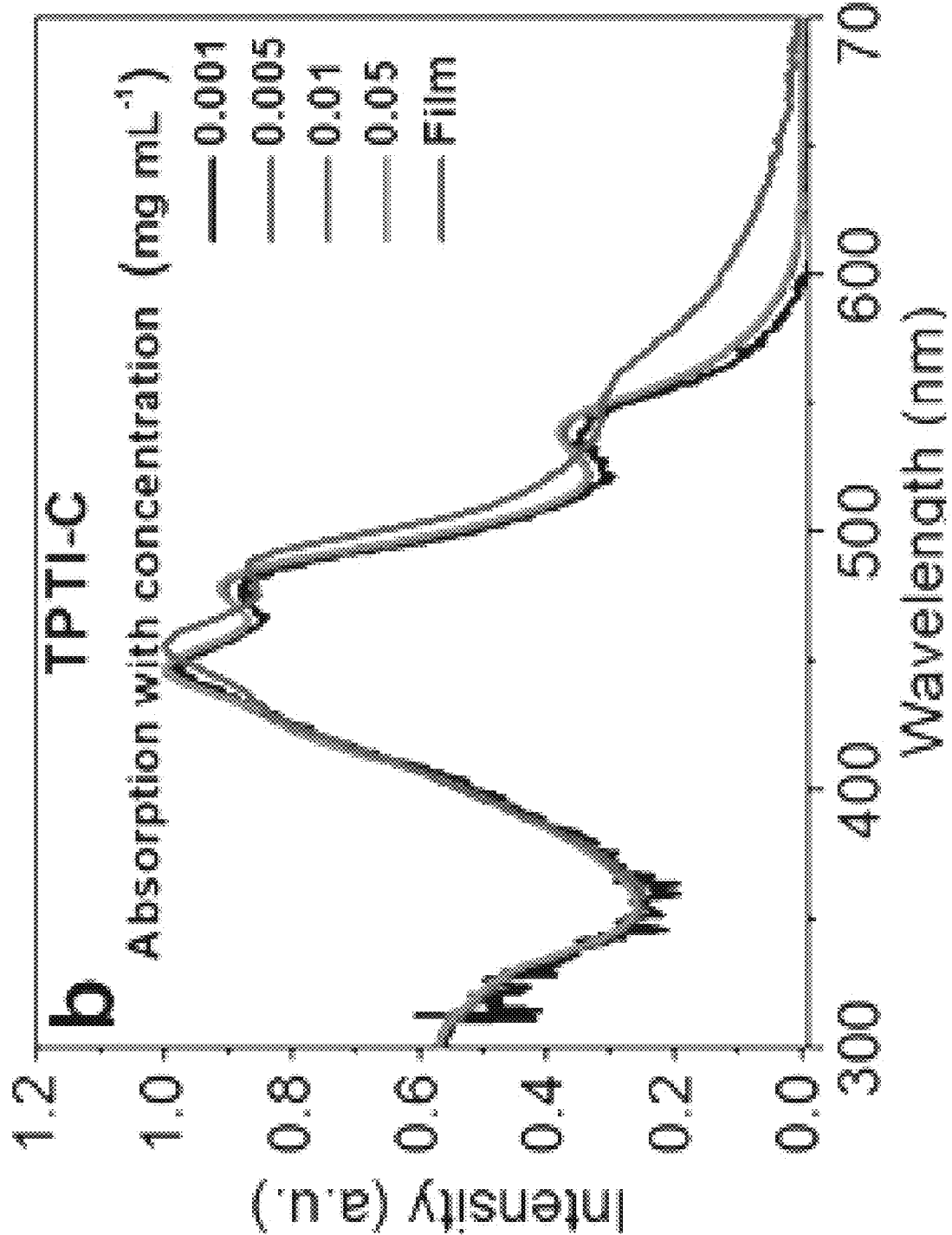
FIG. 5B is an exemplary embodiment of concentration-dependent UV-vis absorption spectra of TPTI-C in chloroform solution and thin film in accordance with the present disclosure.
Figure 5C:
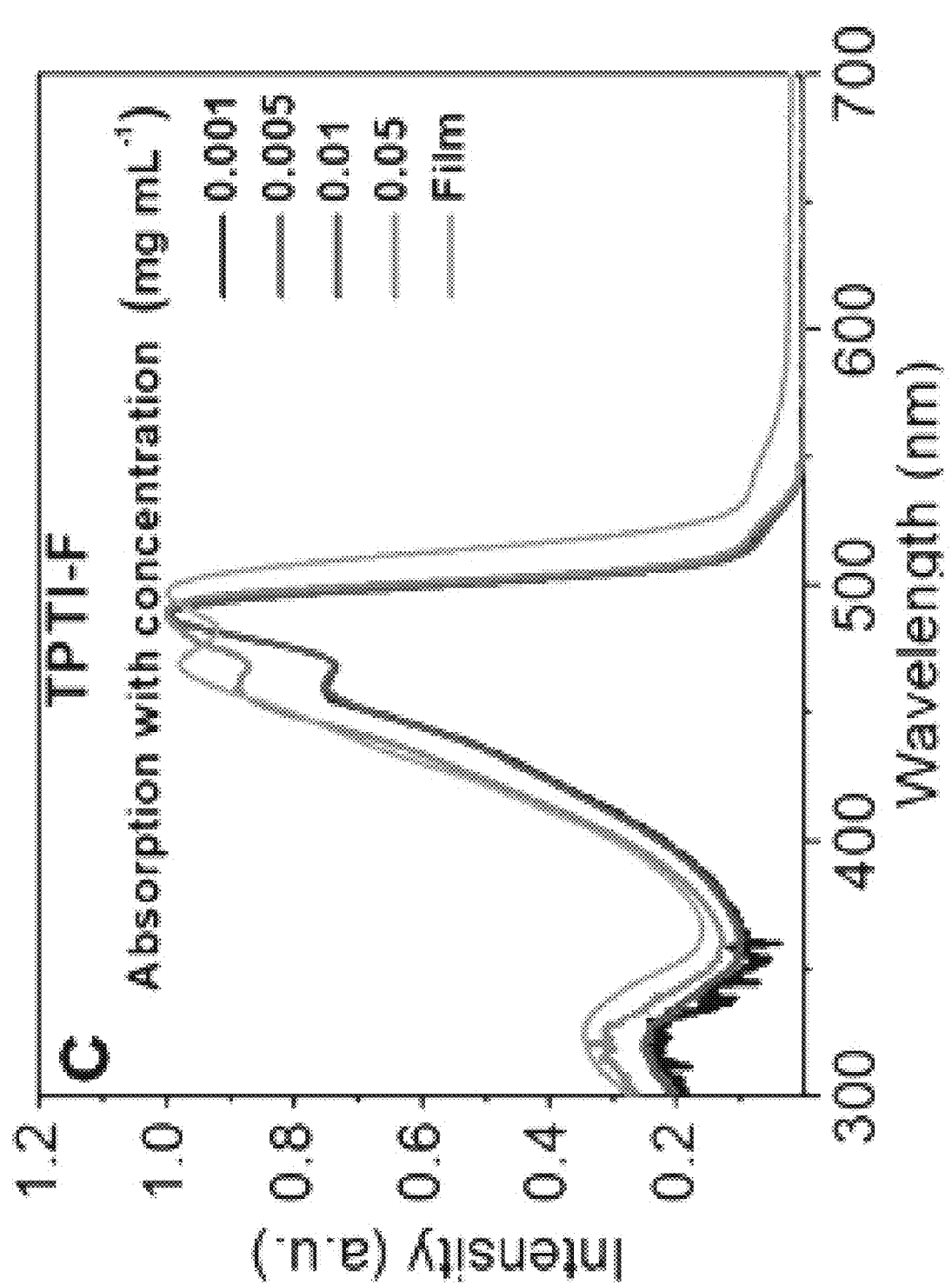
FIG. 5C is an exemplary embodiment of concentration-dependent UV-vis absorption spectra of TPTI-F in chloroform solution and thin film in accordance with the present disclosure.

The concentration-dependent UV-vis absorption spectra of TPTI-CC, TPTI-C, and TPTI-F are shown in FIG. 5A-C. The three main absorption peaks at 480 nm (0-2), 514 nm (0-1) and 544 nm (0-0) are observed in the spectrum of TPTI-CC, which do not change with increasing concentration. In TPTI-CC thin film, the relative intensity of $I_A^{0-1}/I_A^{0-2}$ decreases and the three peaks are significantly red-shifted to 496, 530, and 574 nm respectively. In the spectrum of TPTI-C, however, the solution absorption peaks at 447 nm (0-2), 478 nm (0-1), and 539 nm (0-0) remained unchanged with increasing concentration and are slightly red-shifted to 455, 486, and 554 nm in thin film. The relative peak intensity $I_A^{0-0}/I_A^{0-1}$, shows no change, while the intensity ratio $I_A^{0-1}/I_A^{0-2}$ decreases in solid-state. Moreover, for TPTI-F, there exist two main peaks at wavelengths of 460 (0-1) and 488 nm (0-0) and a minor shoulder peak in the solution absorption spectrum. The relative ratio of peak intensity $I_A^{0-0}/I_A^{0-1}$ remained unchanged until the concentration reaches 0.05 mg/mL when $I_A^{0-0}/I_A^{0-1}$ ratio decreases. The thin film spectrum, however, is red-shifted to 468 and 498 nm, respectively.

Figure 5D:
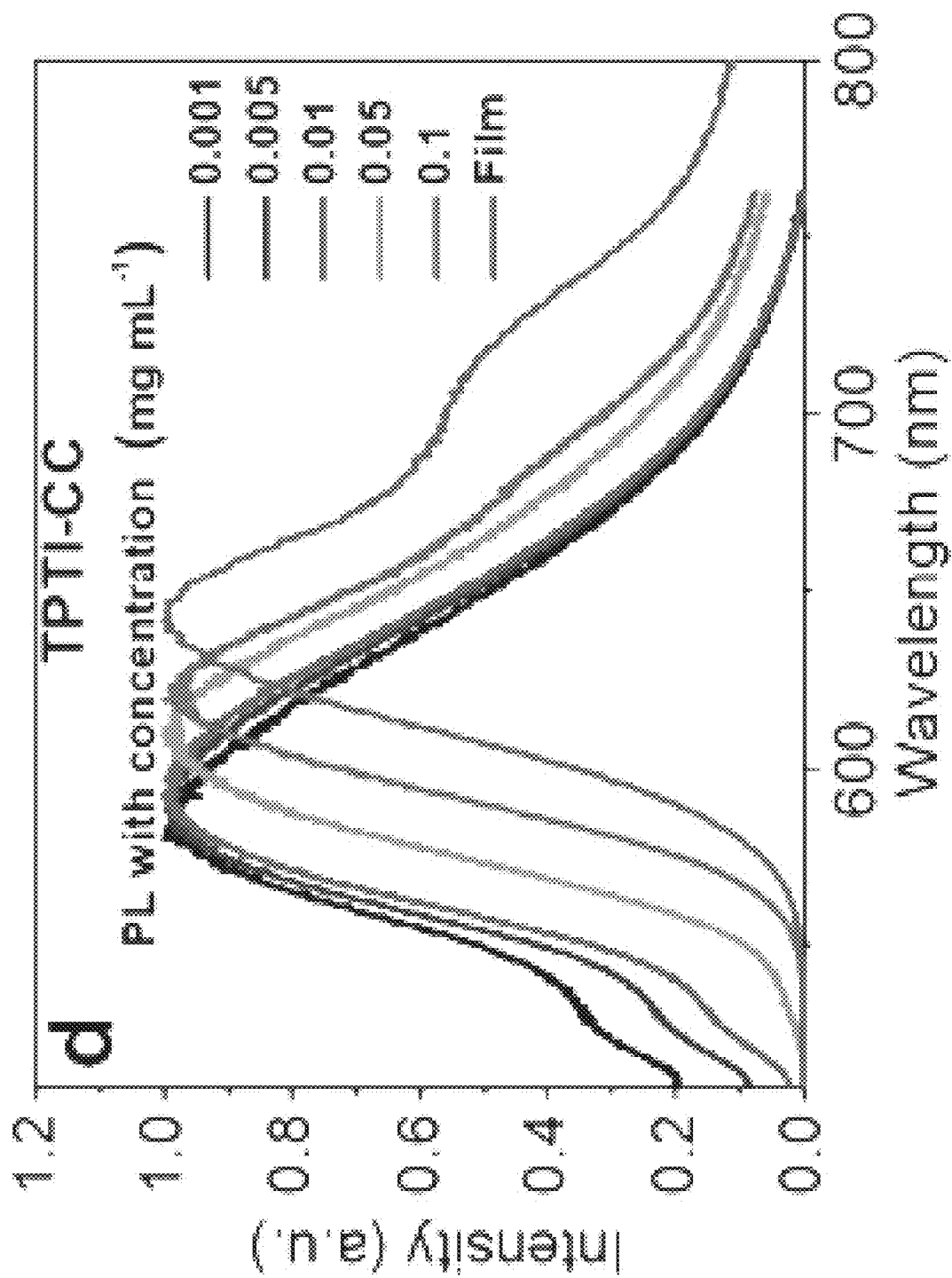
FIG. 5D is an exemplary embodiment of photoluminescence (PL) spectra of TPTI-CC in chloroform solution and thin film in accordance with the present disclosure.
Figure 5E:
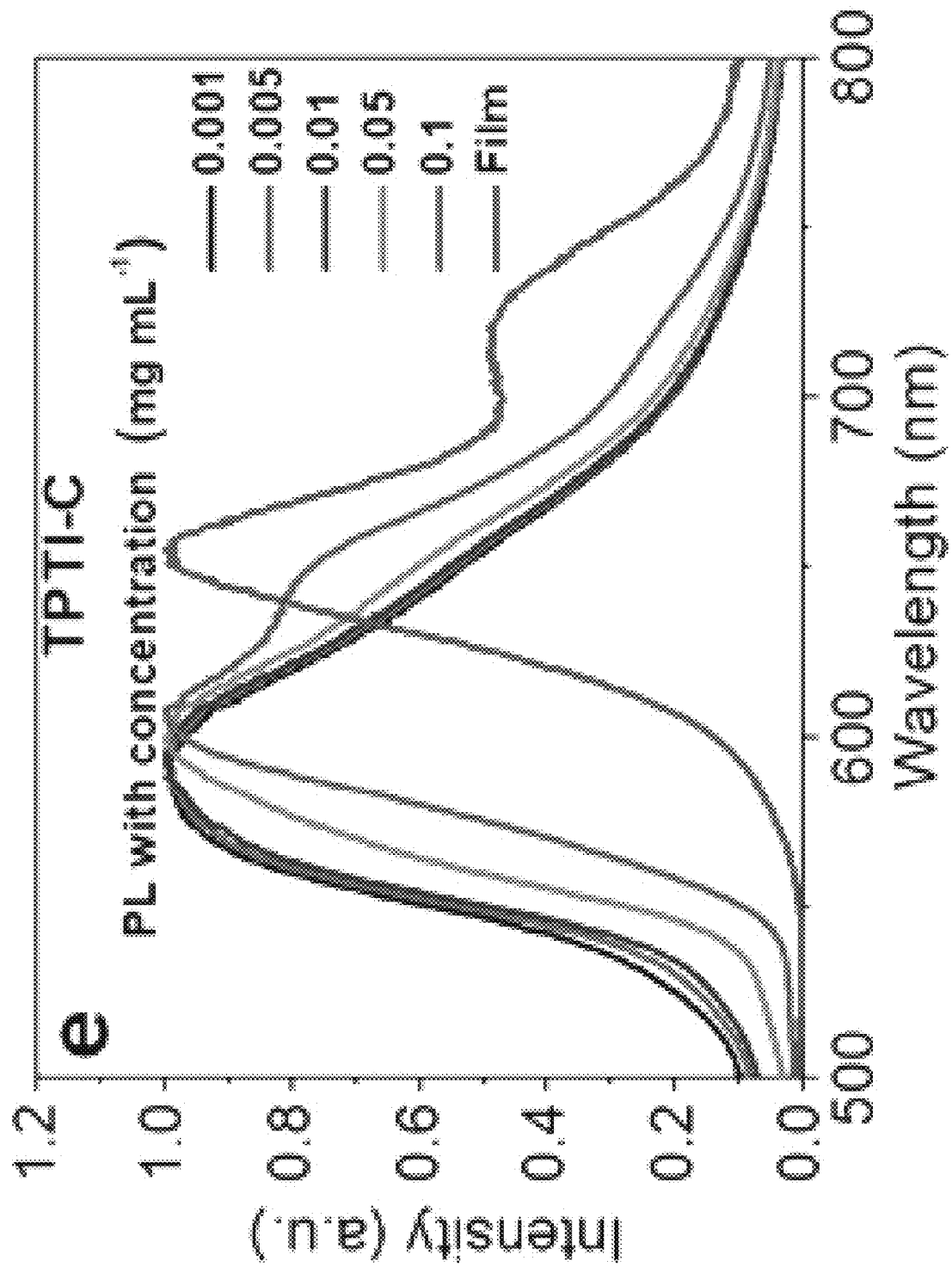
FIG. 5E is an exemplary embodiment of photoluminescence (PL) spectra of TPTI-C in chloroform solution and thin film in accordance with the present disclosure.
Figure 5F:
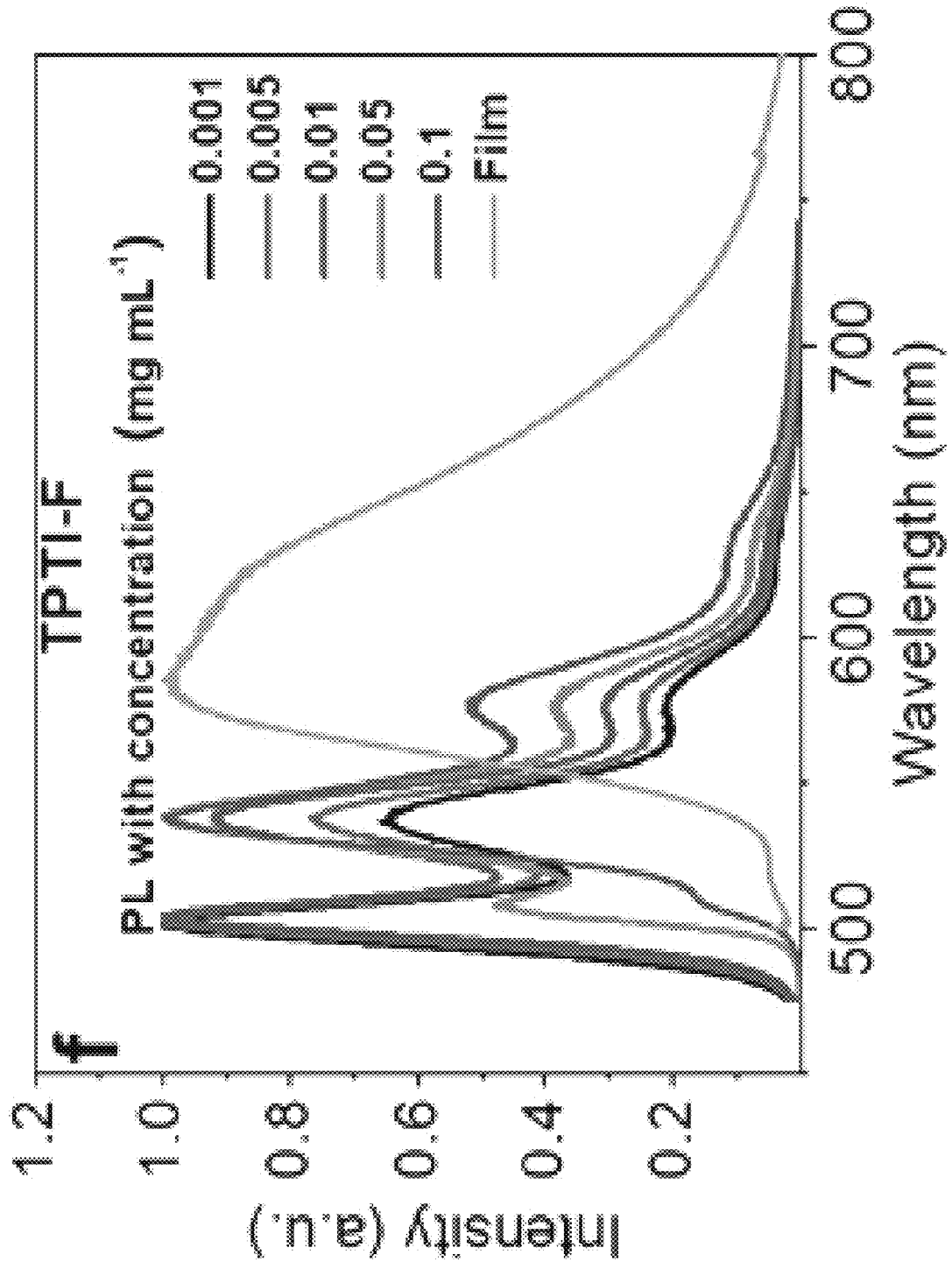
FIG. 5F is an exemplary embodiment of photoluminescence (PL) spectra of TPTI-F in chloroform solution and thin film in accordance with the present disclosure.

Photoluminescence measurements provide further information to elucidate molecular aggregation. The emission spectrum of TPTI-CC film (FIG. 5D) exhibits two peaks at 642 (0-0) and 712 nm (0-1) which are red-shifted from that of dilute solution (586 and 665 nm). Although the ratio of emission peak intensity (0-0)/(0-1) decreases as concentration increases, the 0-0 transition is still the dominant emission peak. This is consistent with the formation of J-aggregates in TPTI-CC. In the emission spectrum of TPTI-C (FIG. 5E), the emission peaks in dilute solution (0.001 mg/mL) are slightly red-shifted to 605 and 647 nm at higher concentration (0.1 mg/mL). The (0-0)/(0-1) ratio decreases gradually with increasing concentration and the 0-0 transition is almost totally suppressed in the solid-state, which may be attributed to H-aggregation. As shown in the emission spectrum of TPTI-F (FIG. 5F), the intensity of 0-0 (500 nm) emission decreases significantly with increasing concentration and nearly vanishes in thin film. The prevention of 0-0 emission and decreased $I_A^{0-0}/I_A^{0-1}$ ratio in absorption imply strong H-aggregation in TPTI-F films. The thin-film photoluminescence spectra of TPTI-F (FIG. 5F) shows a major emission peak at 582 nm and a shoulder peak at around 619 nm which is significantly red-shifted from that in dilute solution. The red-shifted H-aggregates of TPTI-F and TPTI-C are similar to quadrupolar dyes. Besides, the 0-0 and 0-1 emission peaks in solution are almost completely suppressed in thin film. The large redshift and almost featureless shape in solid-state photoluminescent spectra seems to indicate the formation of excimer due to strong interchain interaction in TPTI-F.[39] Interestingly, TPTI-CC and TPTI-C showed only moderate PLQY of 23% and 21% respectively in chloroform solution with a concentration of 0.001 mg/mL (Table 2), while TPTI-F exhibited PLQY of 59% which was nearly three times higher. To gain more insight into the photophysical properties, time-resolved fluorescence decay is measured for polymer solutions (Table 3). Fluorescence decay curves are fitted with exponential decay equation and fluorescence lifetimes were calculated. It is found that polymer TPTI-F exhibits the longest fluorescence lifetime of 1.06 ns at the highest concentration with a single exponential decay behavior. TPTI-C and TPTI-CC exhibit double exponential decay which may indicate the presence of different relaxation pathways.

TABLE 3

Concentration-dependent fluorescence lifetimes of TPTI-CC, TPTI-C, and TPTI-F in chloroform solutions.

| C (mg/mL) | | TPTI-F Time (ns) | Fraction | TPTI-C Time (ns) | Fraction | TPTI-CC Time (ns) | Fraction |
|---|---|---|---|---|---|---|---|
| 0.001 | $\tau_1$ | 0.602 | | 1.4 | 67.8% | 1.33 | 83% |
| | $\tau_2$ | | | 0.53 | 32.2% | 0.43 | 17% |
| 0.005 | $\tau_1$ | 0.605 | | 1.41 | 72% | 1.32 | 85.3% |
| | $\tau_2$ | | | 0.49 | 28% | 0.39 | 14.7% |
| 0.01 | $\tau_1$ | 0.621 | | 1.42 | 74% | 1.33 | 86.1% |
| | $\tau_2$ | | | 0.48 | 26% | 0.38 | 13.9% |
| 0.05 | $\tau_1$ | 0.753 | | 1.47 | 79% | 1.32 | 88.3% |
| | $\tau_2$ | | | 0.49 | 21% | 0.34 | 11.7% |
| 0.1 | $\tau_1$ | 1.06 | | 1.56 | 87% | 1.35 | 89.8% |
| | $\tau_2$ | | | 0.42 | 13% | 0.32 | 10.2% |

Figure 6A:
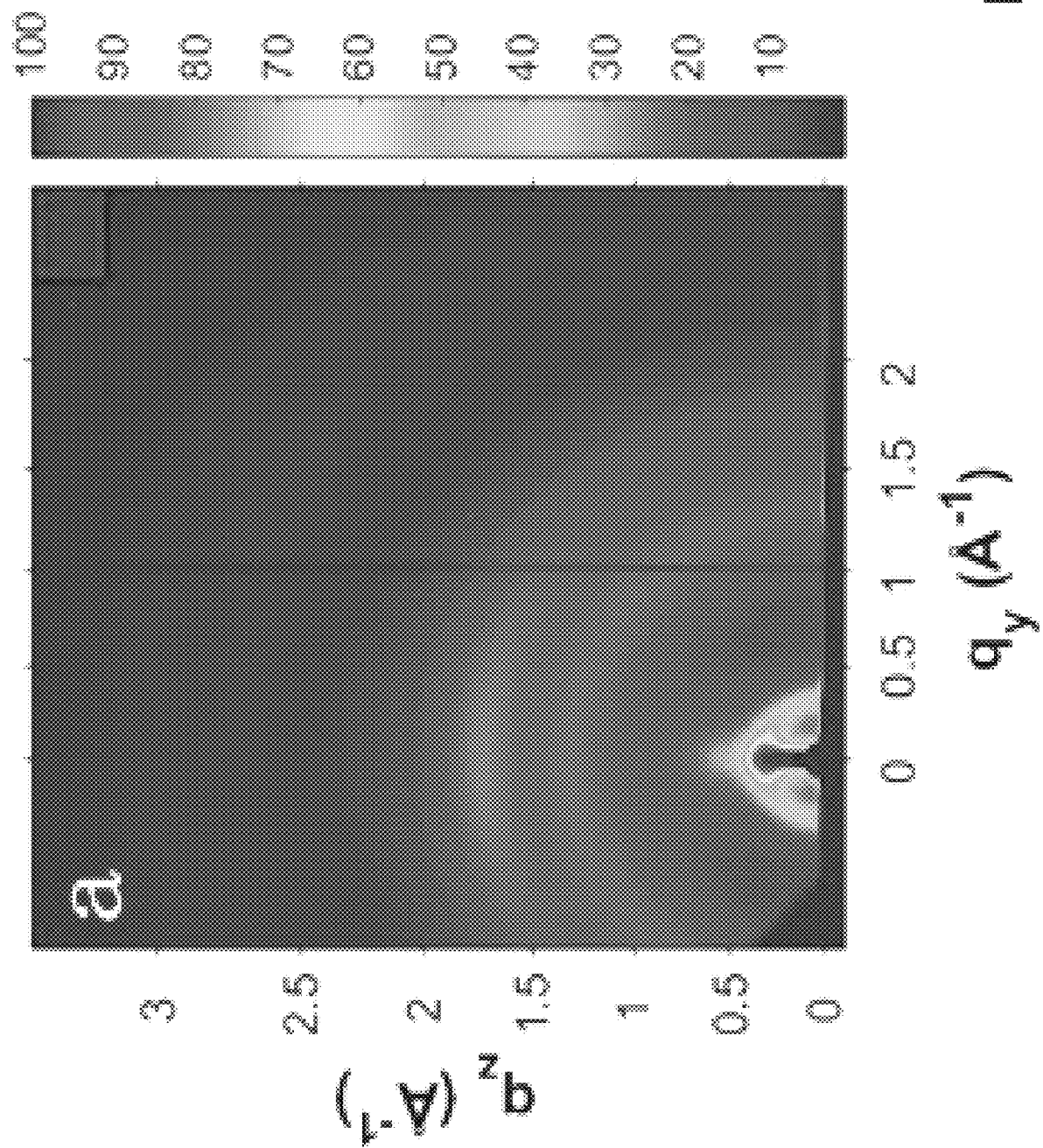
FIG. 6A is an exemplary embodiment of 2D GIWAXS images of TPTI-CC in accordance with the present disclosure.
Figure 6B:
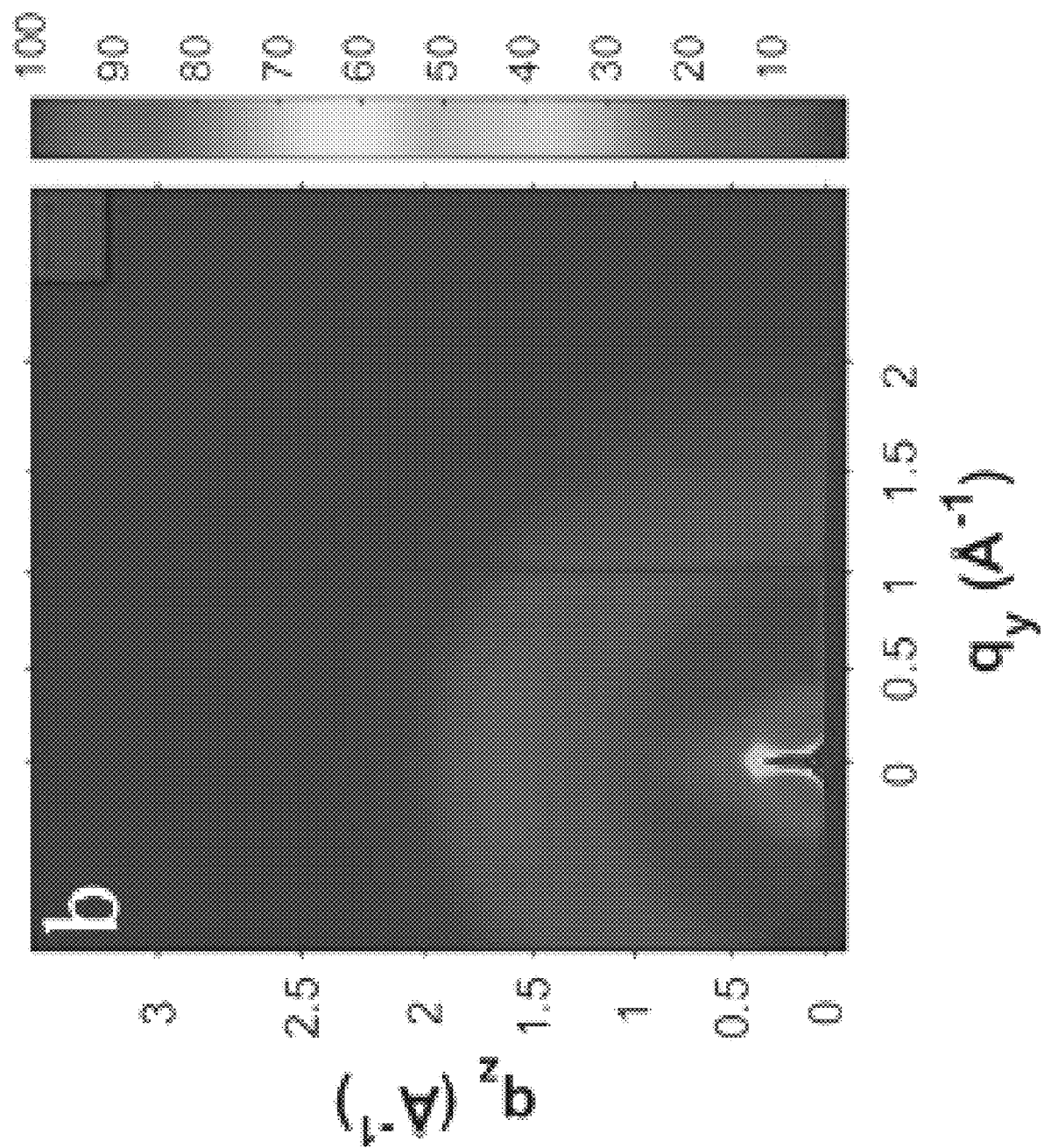
FIG. 6B is an exemplary embodiment of 2D GIWAXS images of TPTI-C in accordance with the present disclosure.
Figure 6C:
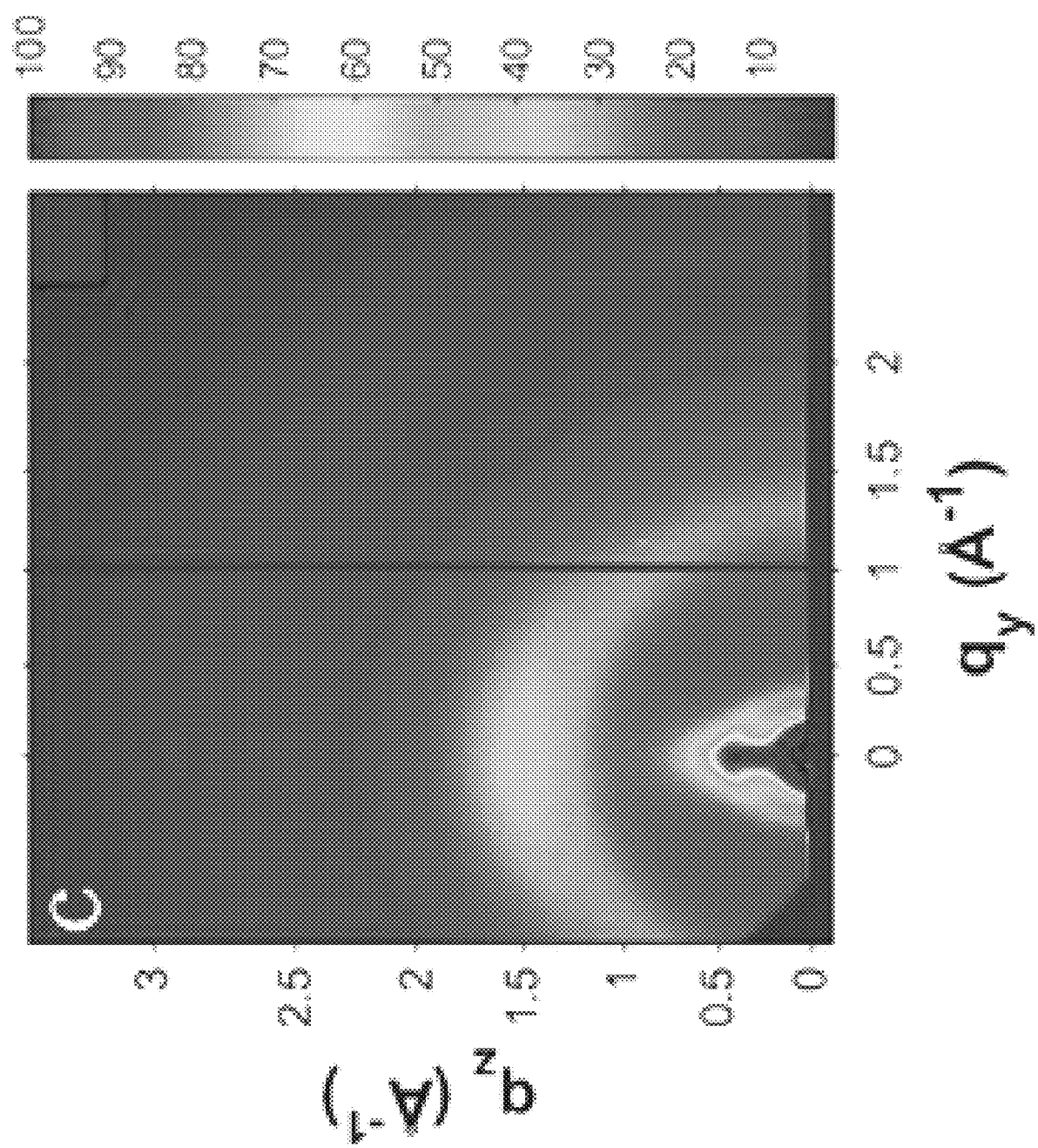
FIG. 6C is an exemplary embodiment of 2D GIWAXS images of TPTI-F in accordance with the present disclosure.
Figure 6D:
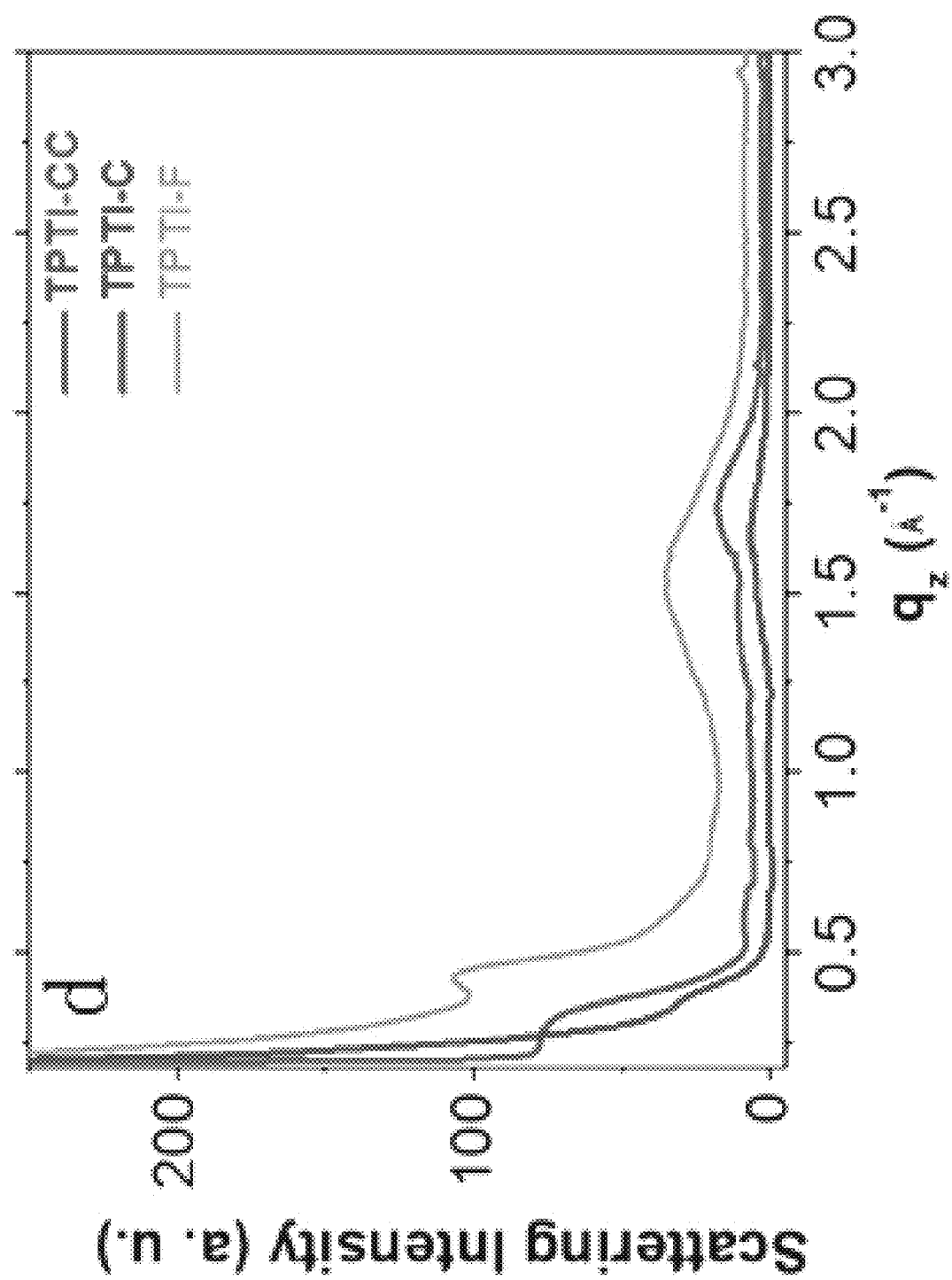
FIG. 6D is an exemplary embodiment of a 1D GIWAXS line cut along out-of-plane directions in accordance with the present disclosure.
Figure 6E:
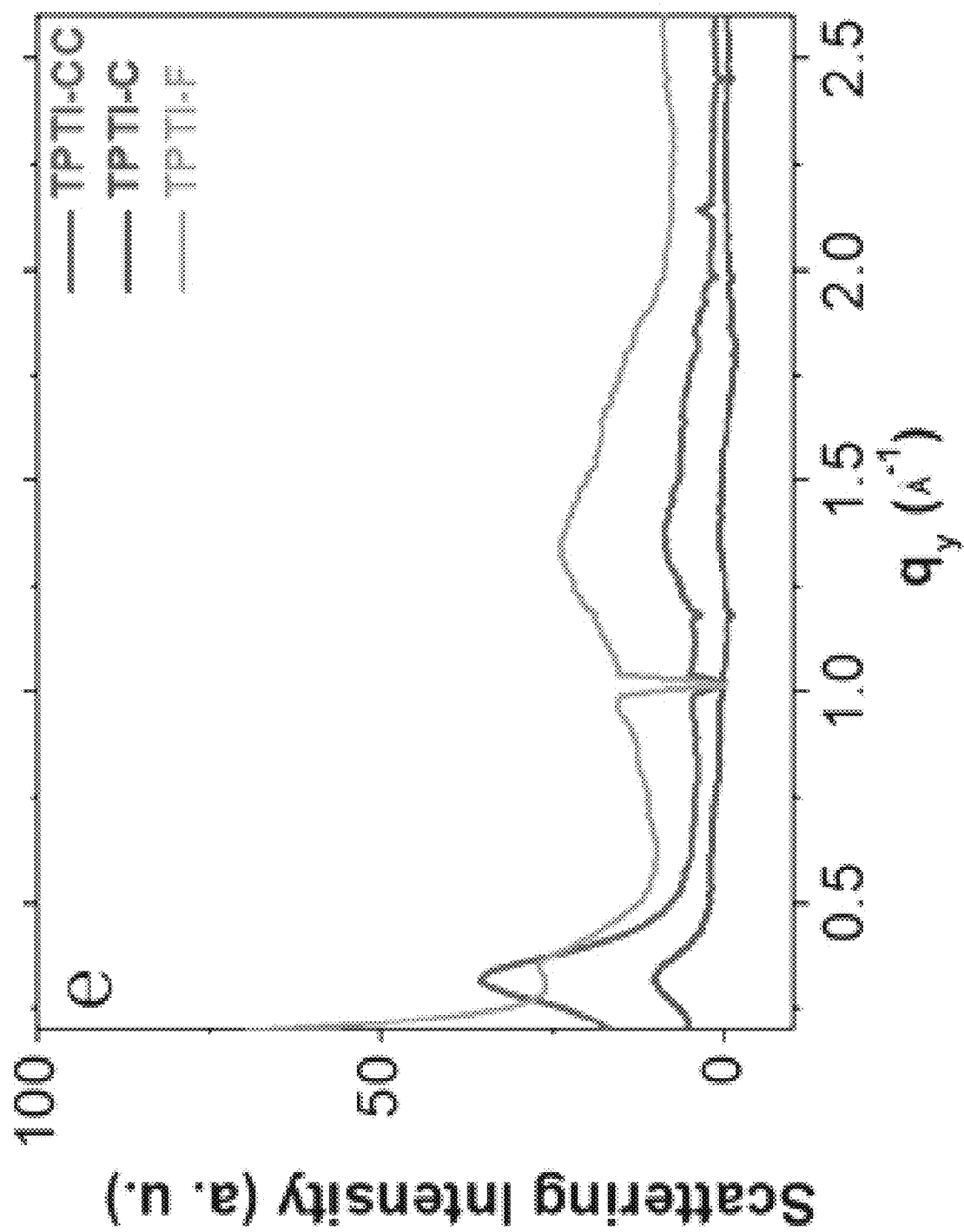
FIG. 6E is another exemplary embodiment of a 1D GIWAXS line cut along out-of-plane directions in accordance with the present disclosure.

Grazing-incidence wide-angle X-ray scattering (GI-WAXS) studies indicated that TPTI-C and TPTI-F exhibit weak crystallinity with less tight molecular packing ($d_{\pi-\pi}$=3.9 Å in TPTI-C; $d_{\pi-\pi}$=4.1 Å in TPTI-F). This is consistent with H-aggregation in which branched alkyl chains on TPTI moiety closely contact (FIG. 6B-E). TPTI-CC, however, exhibits enhanced lamellar stacking along the in-plane direction (FIG. 6E) and more tightly π-π stacking ($d_{\pi-\pi}$=3.6 Å; FIGS. 6A and 6D). This is consistent with its more planar molecular backbone, higher $M_W$ and J-aggregation.

Figure 7A:
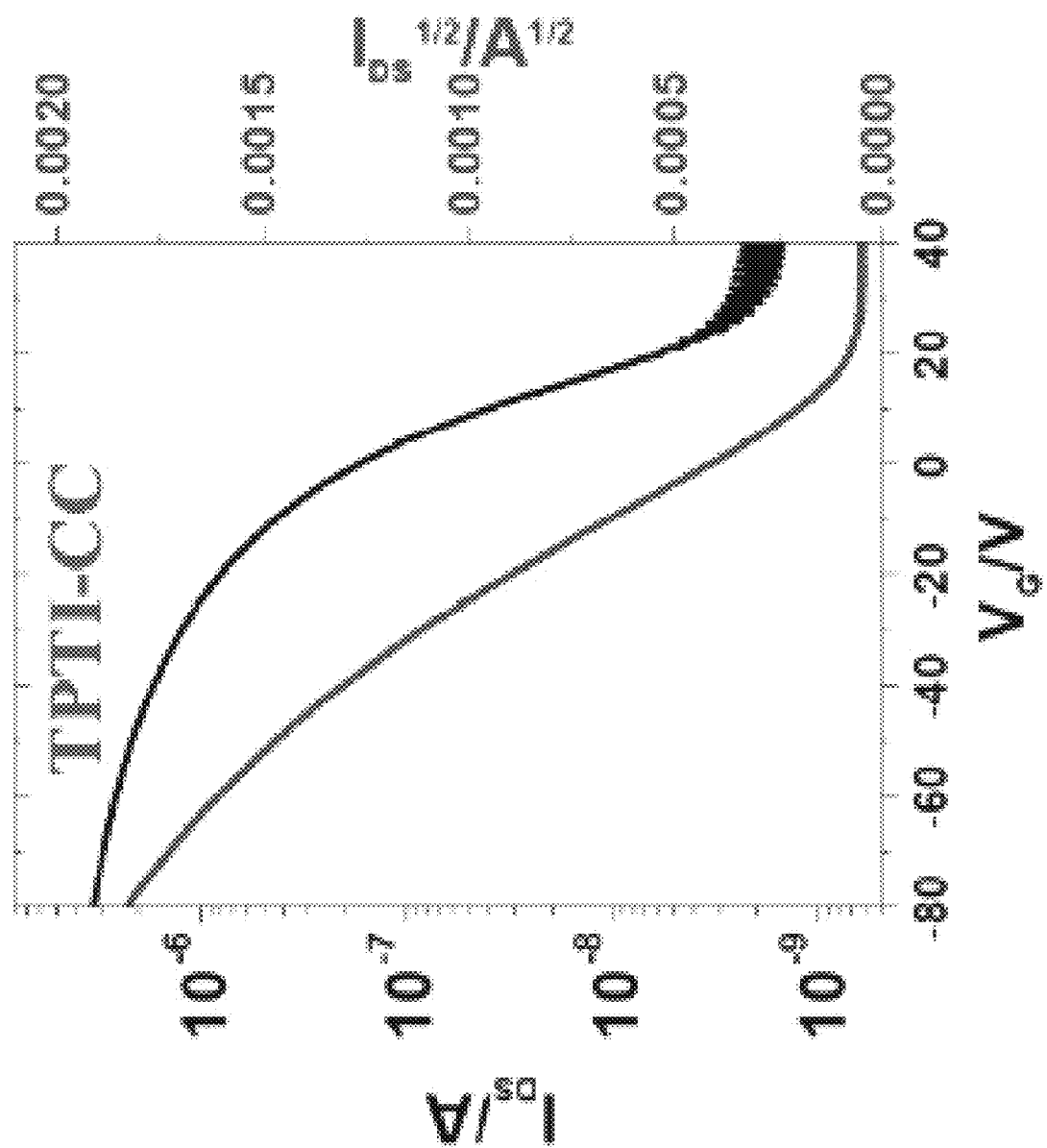
FIG. 7A is an exemplary embodiment of characteristic transfer curves of TPTI-CC in accordance with the present disclosure.
Figure 7B:
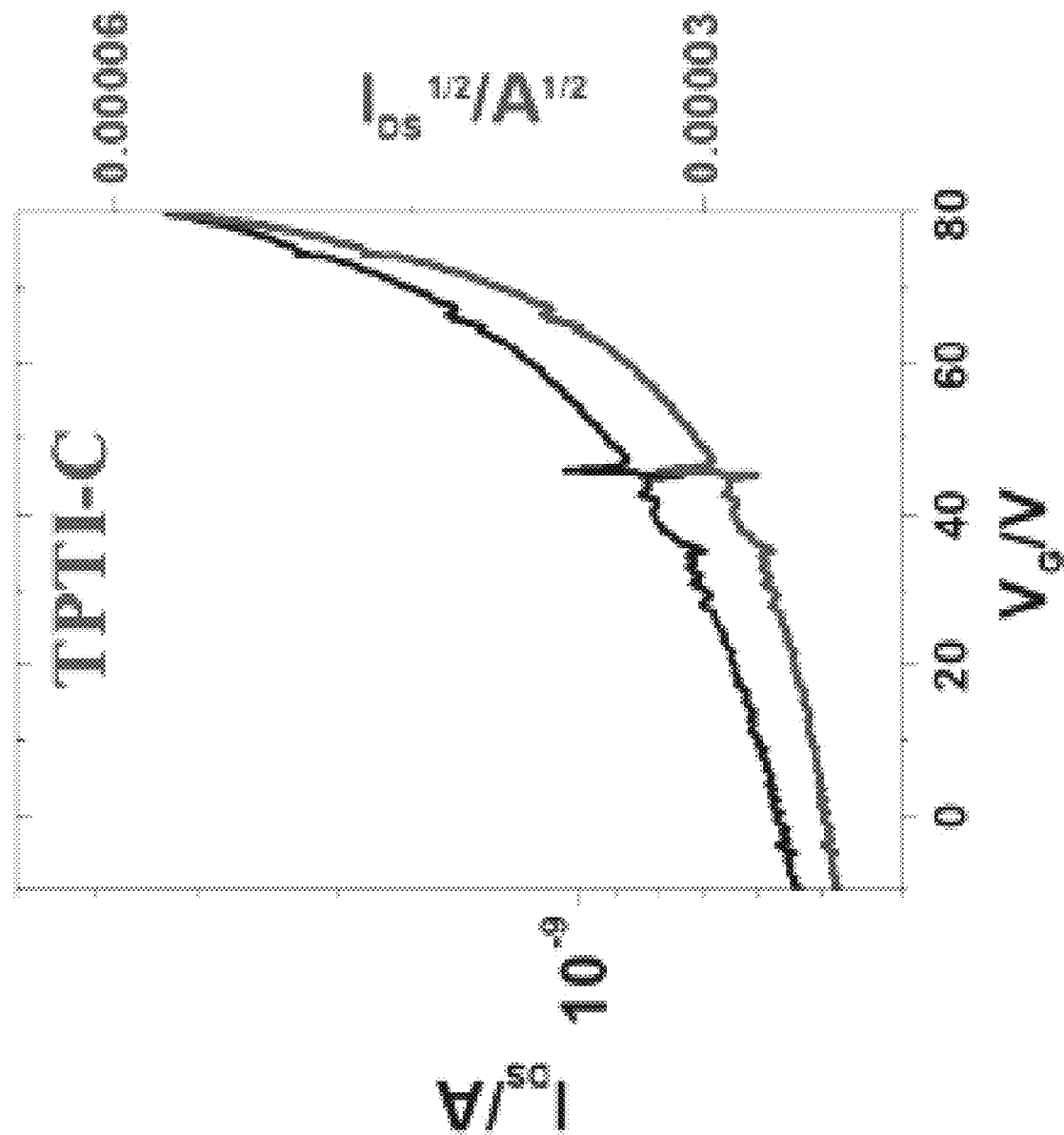
FIG. 7B is an exemplary embodiment of characteristic transfer curves of TPTI-C in accordance with the present disclosure.
Figure 7C:
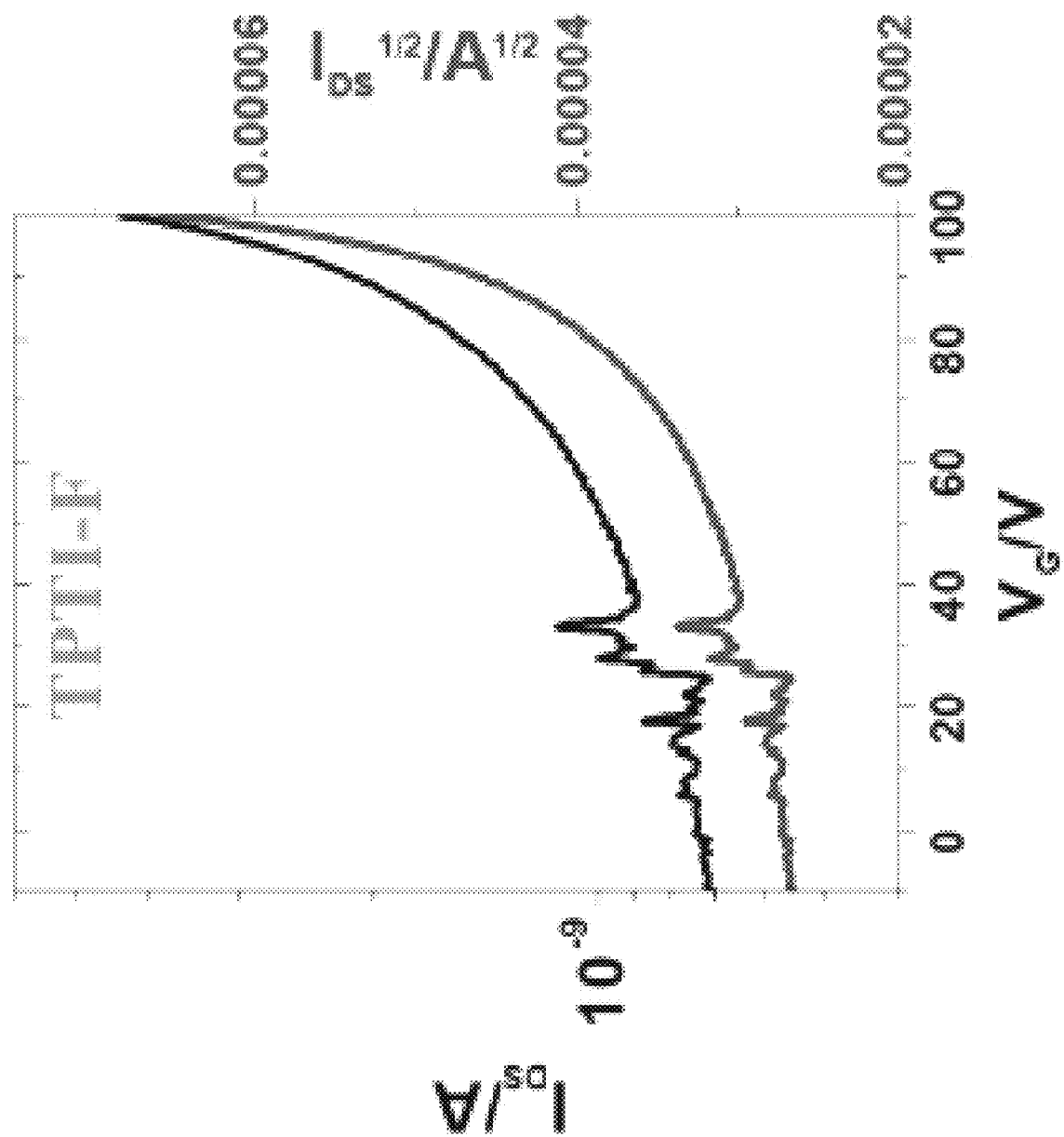
FIG. 7C is an exemplary embodiment of characteristic transfer curves of TPTI-F in accordance with the present disclosure. In bottom gate top contact (BGTC) field effect transistor (FET). Channel length, L=50 μm; Channel width, W=18 mm.

To investigate the electronic properties of the three polymers, bottom gate top contact (BGTC) FET devices were fabricated. Silicon dioxide (SiO$_2$) with a thickness of ~300 nm was used as the dielectric layer, on which a self-assembled n-octadecyltrichlorosilane (OTS) monolayer was immobilized to reduce charge trapping caused by the surface hydroxyl groups. After coating the polymer solutions on the substrate under N$_2$ atmosphere, the films were thermally annealed for half an hour on a hot-plate at an optimized temperature of 120° C. Gold (Au) was then vacuum deposited on the active layers as drain and source electrodes through a mask with the channel length of 50 μm and channel width of 18 mm. FET devices for TPTI-CC show unipolar transport behavior with moderate hole mobility of $3.1 \times 10^{-4}$ cm$^2$ V$^{-1}$ s$^{-1}$ and $I_{on/off}$ ratio of $10^2$ (FIG. 7A-C and Table 4). Much lower electron mobility of $1.5 \times 10^{-6}$ cm$^2$ V$^{-1}$ s$^{-1}$ and a small $I_{on/off}$ of $10^1$ is obtained for TPTI-C with coiled structure (FIG. 7B). FET devices for TPTI-F, however, were unipolar in which only n-type transfer curves were observed. Low electron mobility of $1.8 \times 10^{-6}$ cm$^2$ v$^{-1}$ s$^{-1}$ and a small $I_{on/off}$ of $10^1$ was obtained (Table 4). The relatively higher charge carrier mobility of TPTI-CC is consistent with J-aggregation as well as enhanced lamellar stacking and more tightly π-π stacking as shown in GIWAXS (FIG. 6A-E). Although both FET charge transport, as well as high PLQY, were achieved in TPTI-CC, TPTI-C, and TPTI-F, no electroluminescence was observed in these single-layered OFET devices. This might be related to the high injection energy barrier and low charge mobility that limits the hole and electron recombination in the emissive layer as a consequence of long channel length (50 μm).

TABLE 4

Electrical Property Measured from FET and OLET Devices of TPTI-CC, TPTI-C and TPTI-F.

| | $\mu_h$ (cm$^2$ V$^{-1}$ s$^{-1}$) [max (avg)] | $\mu_e$ (cm$^2$ V$^{-1}$ s$^{-1}$) [max (avg)] | $I_{on/off}$ [max (avg)] |
|---|---|---|---|
| TPTI-CC[a] | $3.1 \times 10^{-4}$ ($2.7 \times 10^{-4}$) | | $10^2$ ($10^2$) |
| TPTI-C[a] | | $1.9 \times 10^{-6}$ ($1.5 \times 10^{-6}$) | $10^1$ ($10^1$) |
| TPTI-F[a] | | $1.8 \times 10^{-6}$ ($1.1 \times 10^{-6}$) | $10^1$ ($10^1$) |
| TPTI-CC[b] | 0.041 (0.036) | 0.059 (0.053) | $10^3/10^2$ ($10^3/10^2$) |
| TPTI-C[b] | 0.39 (0.30) | 0.23 (0.18) | $10^4/10^4$ ($10^4/10^3$) |
| TPTI-F[b] | 0.051 (0.046) | 0.014 (0.011) | $10^4/10^4$ ($10^4/10^3$) |
| TPTI-CC[c] | 0.26 (0.22) | 0.024 (0.018) | $10^5/10^4$ ($10^4/10^3$) |
| TPTI-C[c] | 0.024 (0.018) | 0.016 (0.013) | $10^4/10^3$ ($10^3/10^3$) |
| TPTI-F[c] | 0.044 (0.038) | 0.046 (0.040) | $10^5/10^4$ ($10^4/10^4$) |
| DPP-DTT[b] | 0.086 (0.074) | 0.048 (0.043) | $10^3/10^3$ ($10^3/10^2$) |
| DPP-DTT[c] | 0.96 (0.80) | 0.34 (0.25) | $10^6/10^4$ ($10^6/10^4$) |

[a]Mobility calculated from OTS modified OFET devices.
[b]Mobility calculated from OLET devices with PMMA as modification layer.
[c]Mobility calculated from OTS modified OLET devices.

Figure 8A:
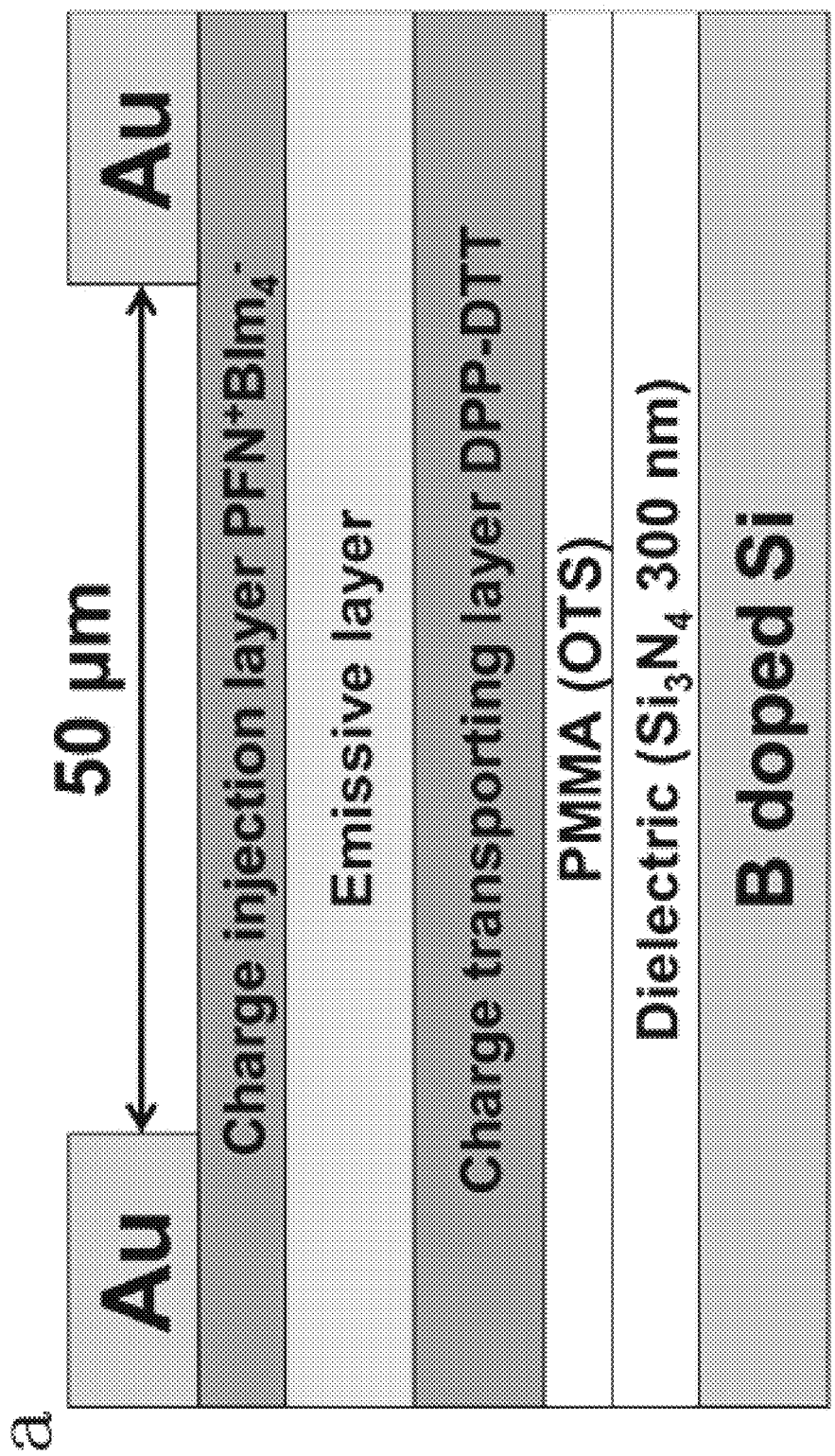
FIG. 8A is an exemplary embodiment of a device configuration of OLET: B doped Si as gate electrode, $Si_3N_4$ as dielectric layer, a thick poly(methyl methacrylate) (PMMA) film or self-assemble monolayer OTS as modification layer on $Si_3N_4$; DPP-DTT work as transporting layer; PFN+ $BIm_4^-$ as electron injection layer, symmetric gold electrode as drain and source, in accordance with the present disclosure.
Figure 8B:
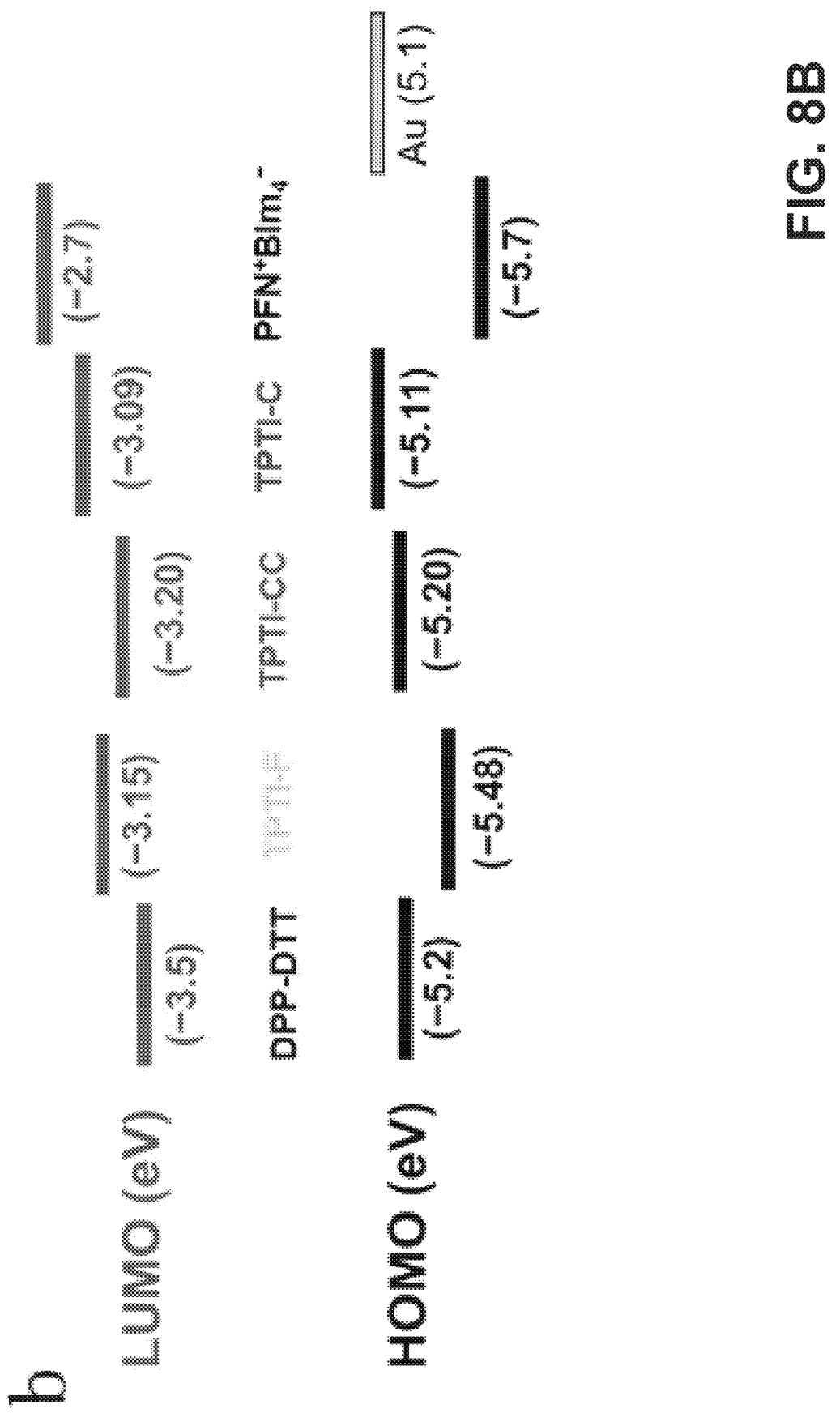
FIG. 8B is an exemplary embodiment of an energy diagram for OLET devices in accordance with the present disclosure.
Figure 8C:
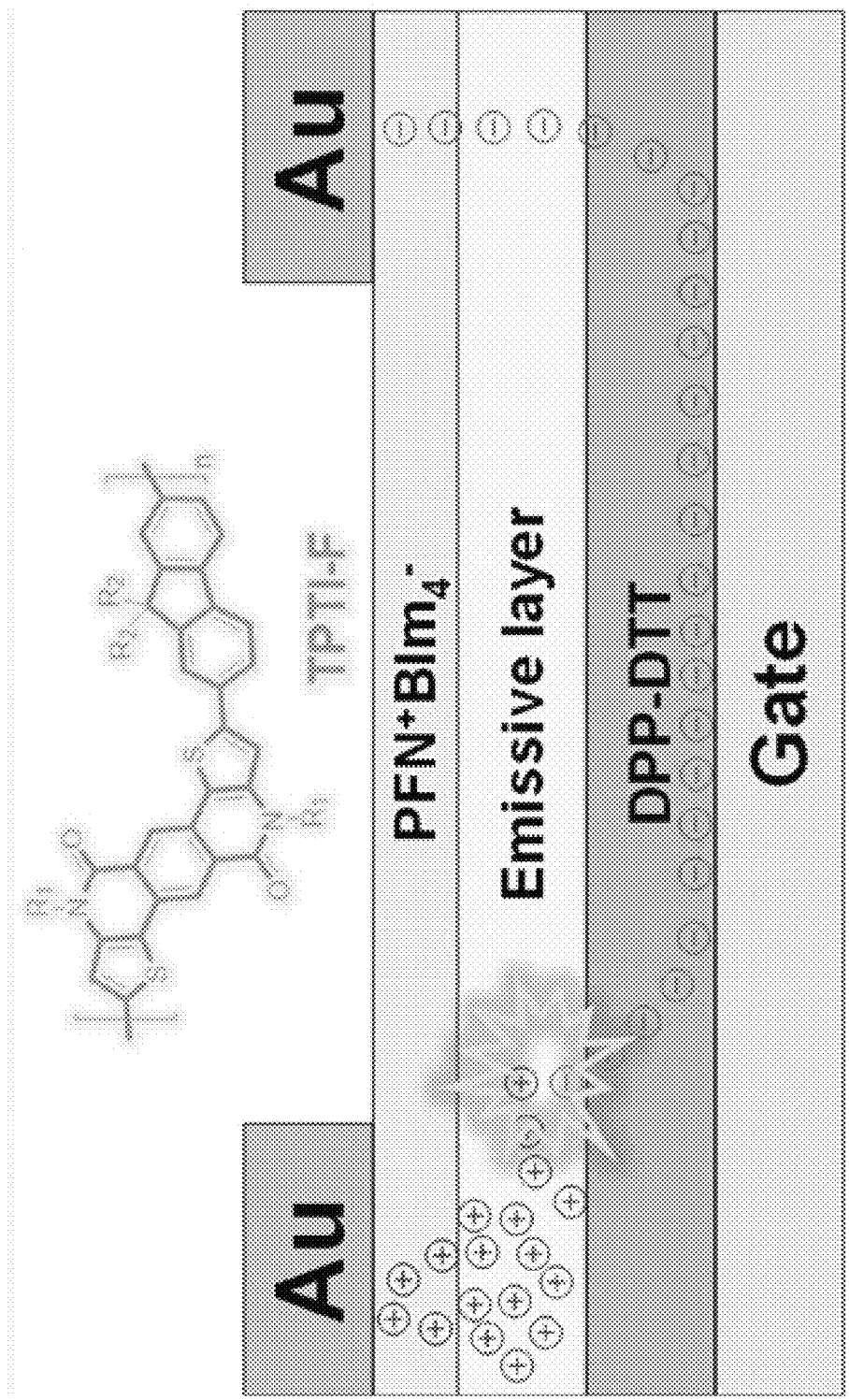
FIG. 8C is an exemplary embodiment of a generalized device configuration including TPTI-F in accordance with the present disclosure.

To address the issue of charge injection and low charge mobility, solution processed tri-layered OLET devices were fabricated as shown in FIG. 8A-C. Poly(methyl methacrylate) (PMMA) in propyl acetate with a concentration of 30 mg/mL was spin-coated on top of Si$_3$N$_4$, with a thickness of around 120-150 nm, to reduce charge trapping. The commercially available semiconducting polymer DPP-DTT in chloroform solution (5 mg/mL) was spin-coated on PMMA as the charge transporting layer. DPP-DTT exhibited both high electron and high hole mobility (Table 4). As shown in FIG. 8B, the high-lying HOMO (−5.2 eV) and low-lying LUMO (−3.5 eV) on DPP-DTT match well with the emissive layer, which should facilitate the hole or electron transport from DPP-DTT to the emissive layer. DPP-DTT has poor solubility in xylene or toluene, which makes it feasible to fabricate the whole OLET device through solution-processing. The emissive polymer in xylene solution (12 mg/mL) was deposited on the top of DPP-DTT by spin-coating. From the energy level diagram (FIG. 8B), the LUMO of TPTI-CC, TPTI-C, and TPTI-F was found to align rather high relative to the work function ($W_F \approx 5.1$ eV) of Au, which will impede electron injection. Therefore, conjugated polyelectrolyte (CPE), PFN$^+$ BI$_4$ was used as the electron-injection layer because its unique ionic effect can lower the electron injection energy barrier. Methanol was used as the solvent for PFN$^+$ BI$_4$ to avoid dissolution of the emissive layer underneath. As demonstrated before, the thickness of PFN$^+$ BI$_4$ plays an important role in the performance of OLET. After both the concentration and the spin-rate of PFN$^+$ BI$_4$ were optimized, it was found that PFN$^+$ BI$_4^-$ with a thickness lower than 10 nm is optimal in the presently disclosed OLET devices. Then, Au with a thickness of 30 nm were deposited on top of PFN$^+$ BI$_4$ as symmetric drain-source electrodes. At least ten OLET devices were fabricated and tested for each emissive polymer.

Figure 9B:
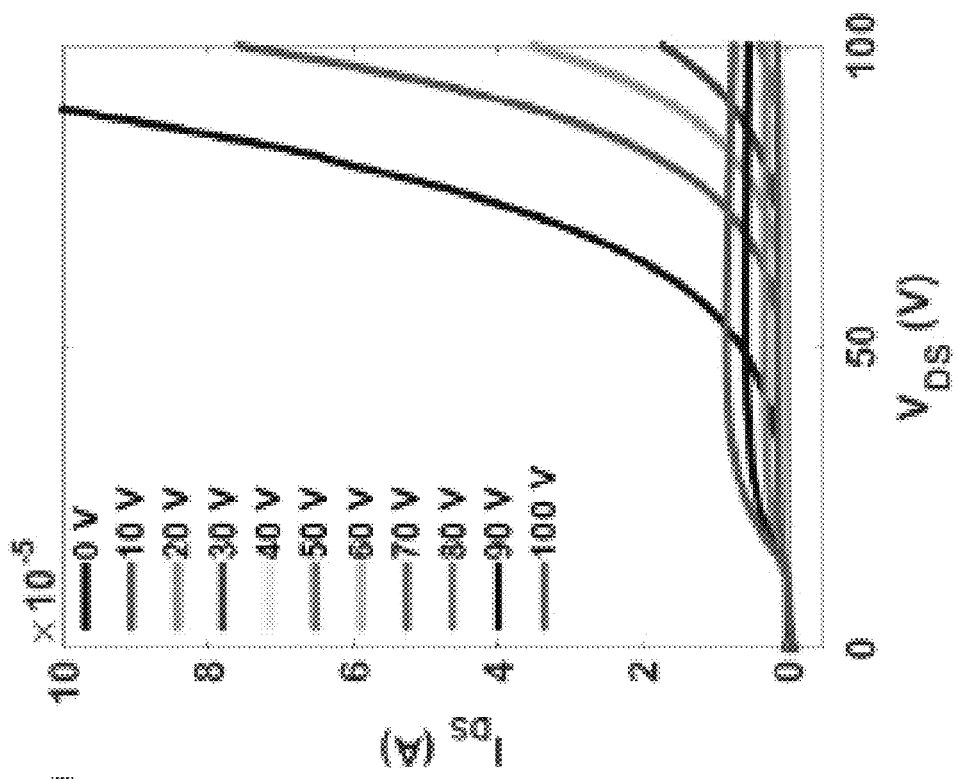
FIG. 9B is another exemplary embodiment of characteristic output curves of TPTI-CC in accordance with the present disclosure.
Figure 9A:
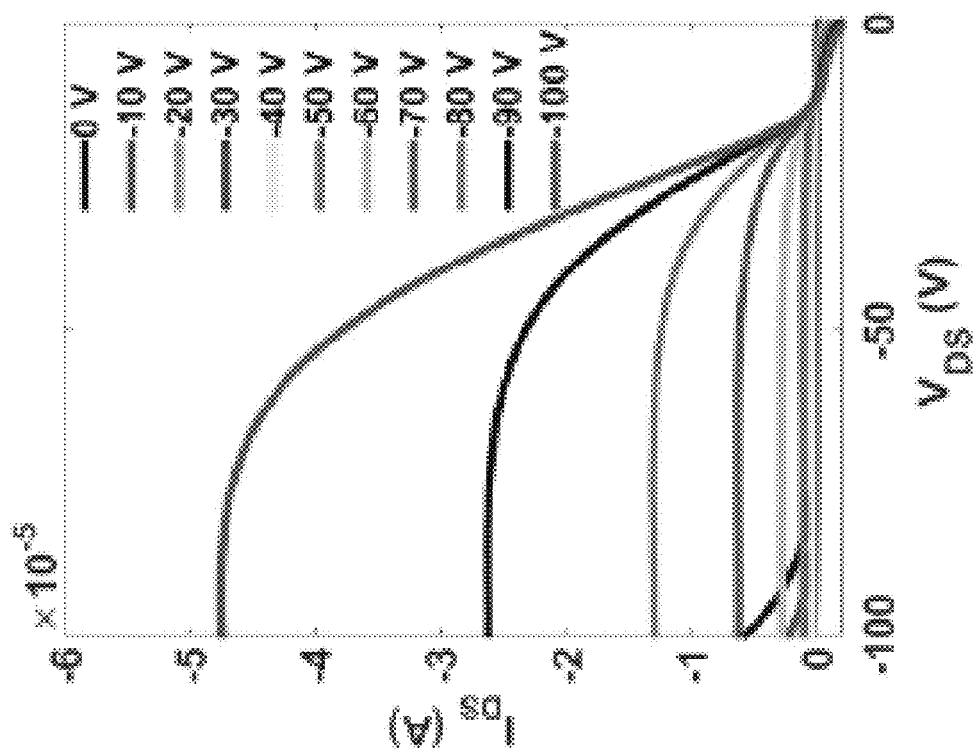
FIG. 9A is an exemplary embodiment of characteristic output curves of TPTI-CC in accordance with the present disclosure.
Figure 9C:
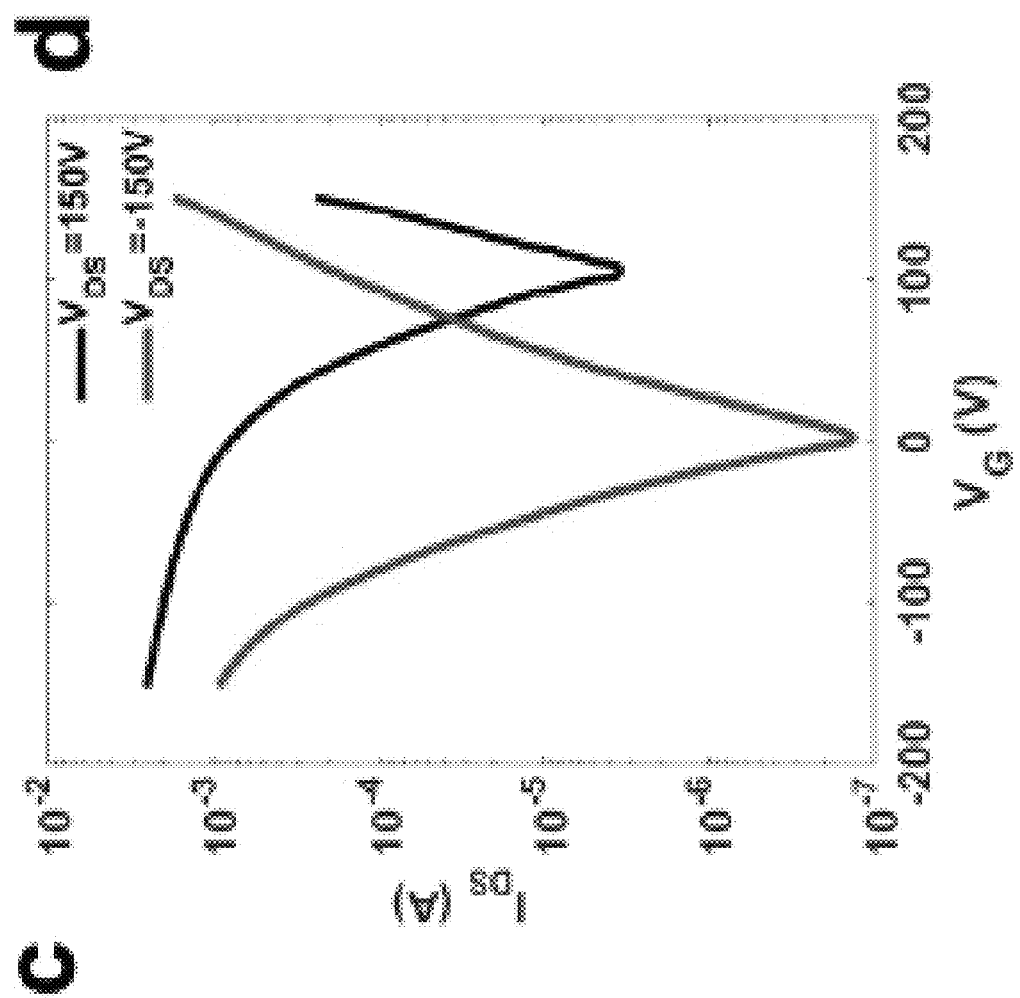
FIG. 9C is an exemplary embodiment of characteristic transfer curves of TPTI-CC in accordance with the present disclosure.
Figure 9D:
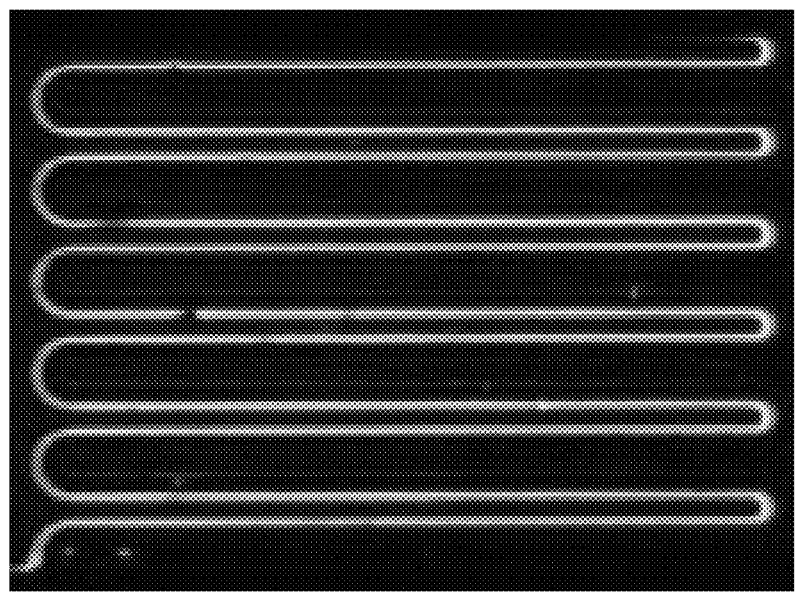
FIG. 9D is an exemplary embodiment of characteristic emission images of TPTI-CC in accordance with the present disclosure. In bottom gate top contact (BGTC) organic light-emitting transistor (OLET) with device configuration as shown in FIG. 9A (PMMA as modification layer) in accordance with the present disclosure. Channel length, L=50 μm; Channel width, W=18 mm.
Figure 9F:
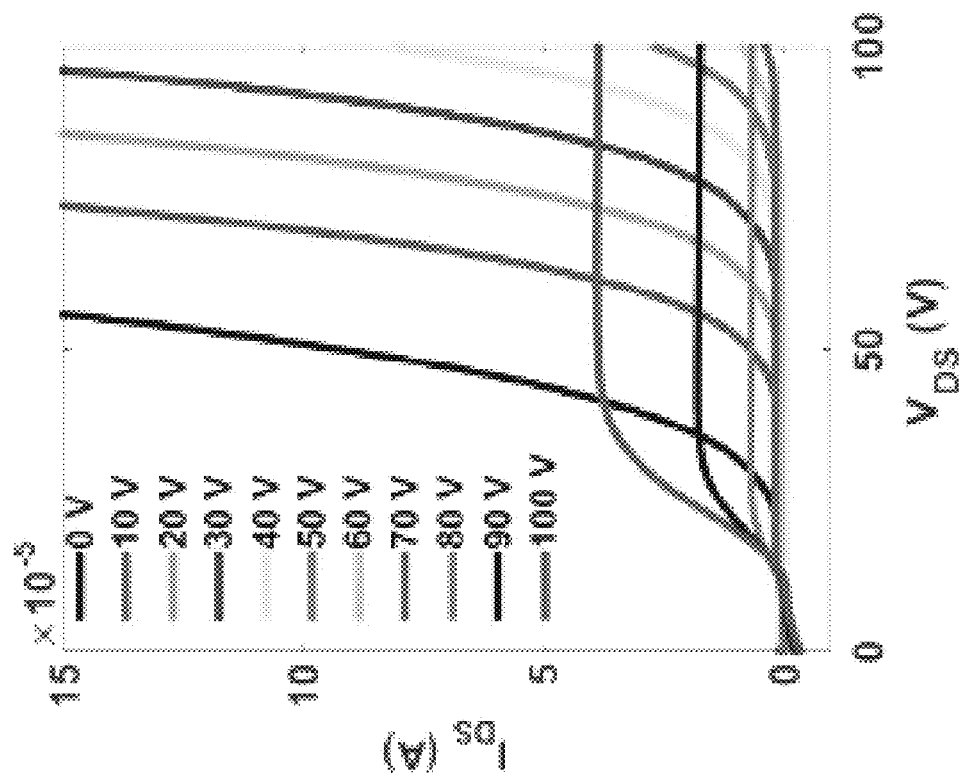
FIG. 9F is another exemplary embodiment of characteristic output curves of TPTI-C in accordance with the present disclosure.
Figure 9E:
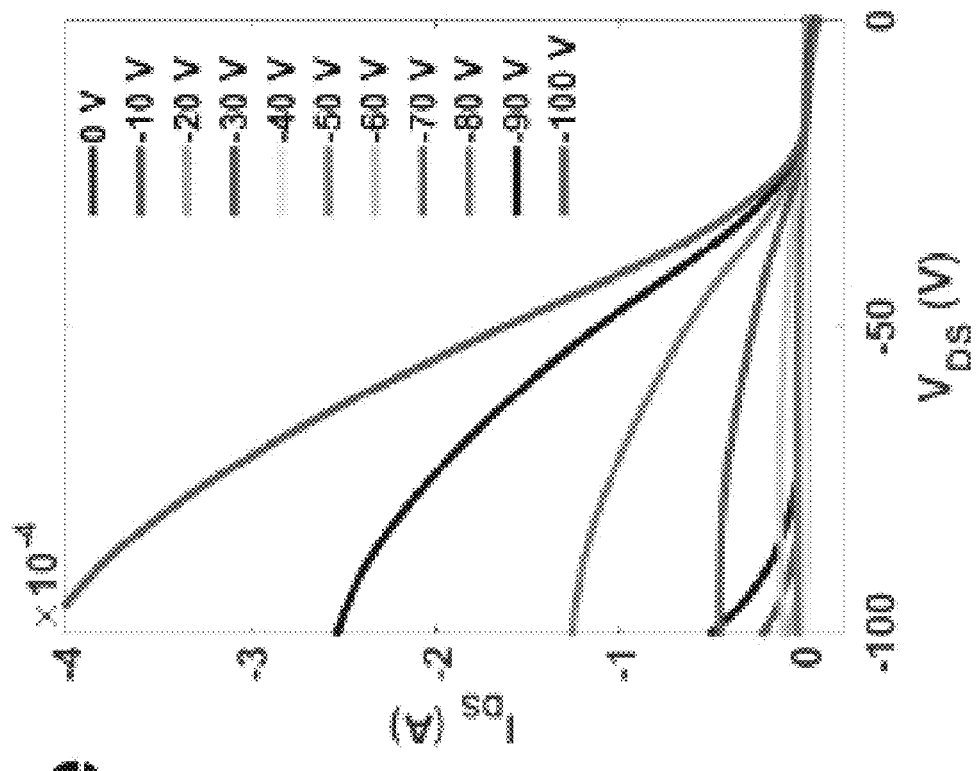
FIG. 9E is an exemplary embodiment of characteristic output curves of TPTI-C in accordance with the present disclosure.
Figure 9G:
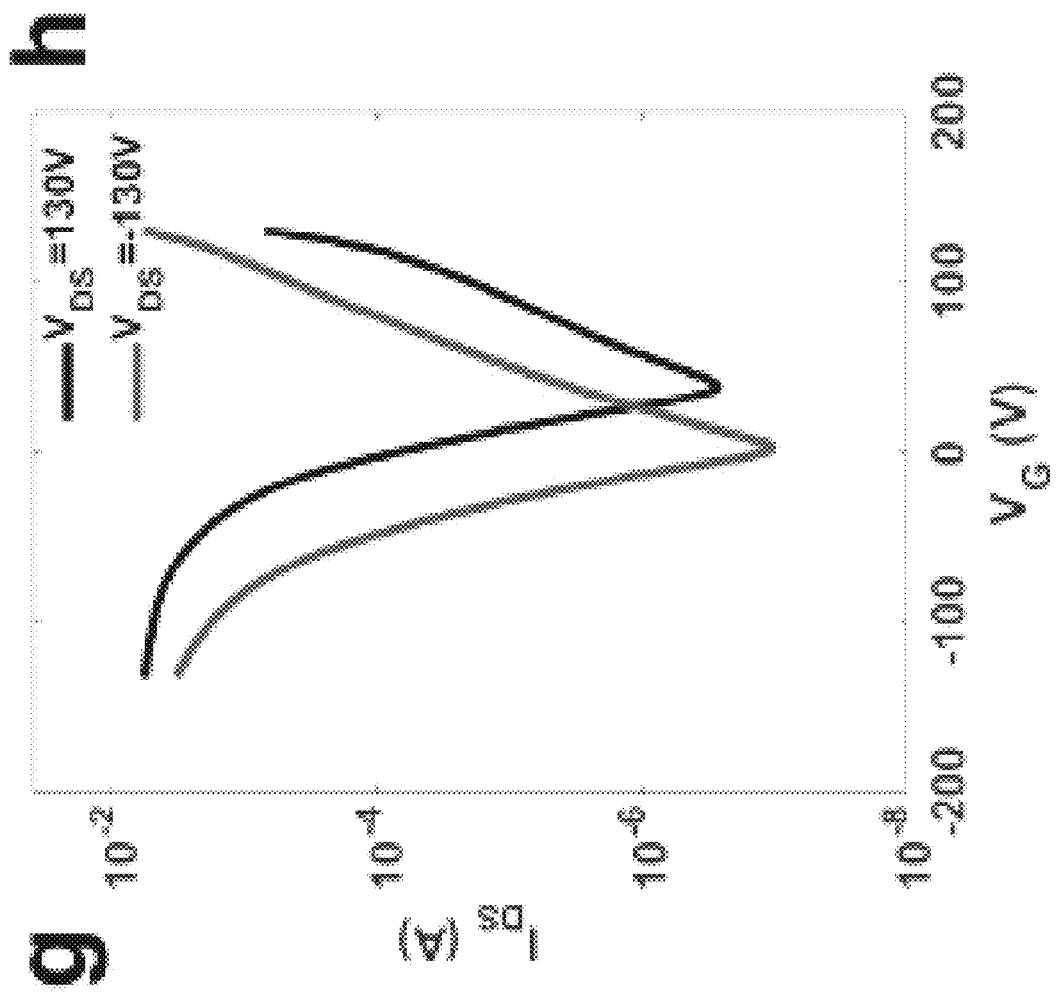
FIG. 9G is an exemplary embodiment of characteristic transfer curves of TPTI-C in accordance with the present disclosure.
Figure 9H:
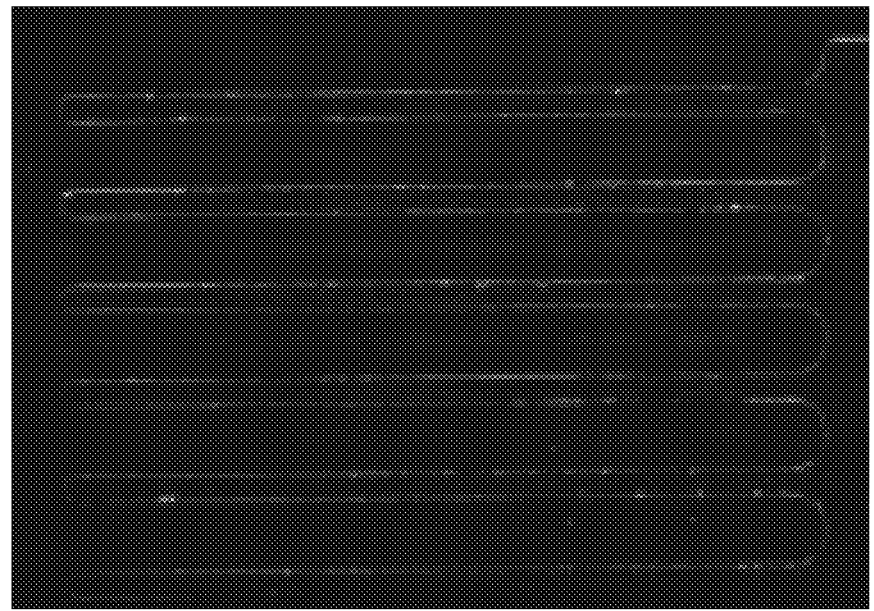
FIG. 9H is an exemplary embodiment of characteristic emission images of TPTI-C in accordance with the present disclosure. In bottom gate top contact (BGTC) organic light-emitting transistor (OLET) with device configuration as shown in FIG. 9A (PMMA as modification layer) in accordance with the present disclosure. Channel length, L=50 μm; Channel width, W=18 mm.
Figure 9J:
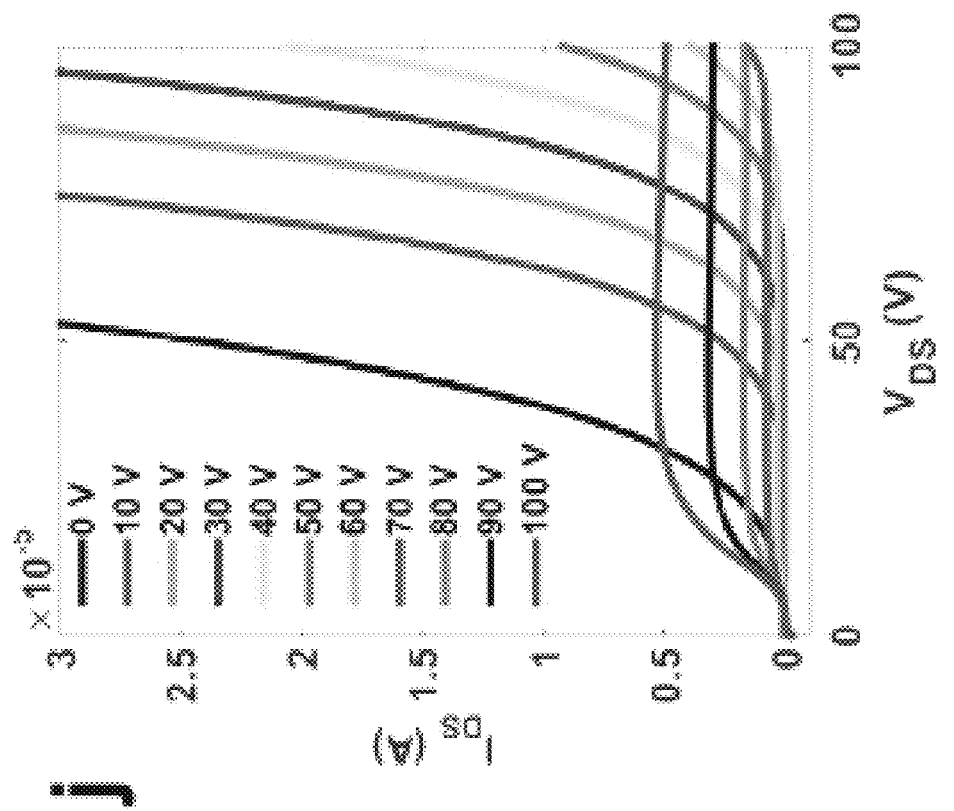
FIG. 9J is another exemplary embodiment of characteristic output curves of TPTI-F in accordance with the present disclosure.
Figure 9I:
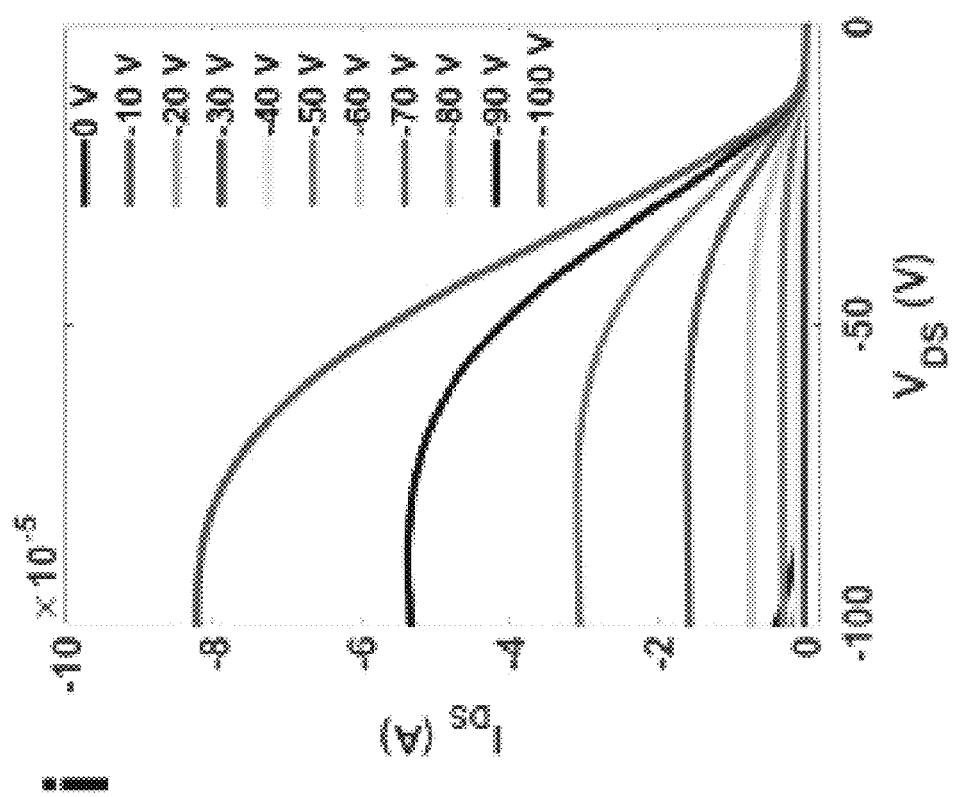
FIG. 9I is an exemplary embodiment of characteristic output curves of TPTI-F in accordance with the present disclosure.
Figure 9K:
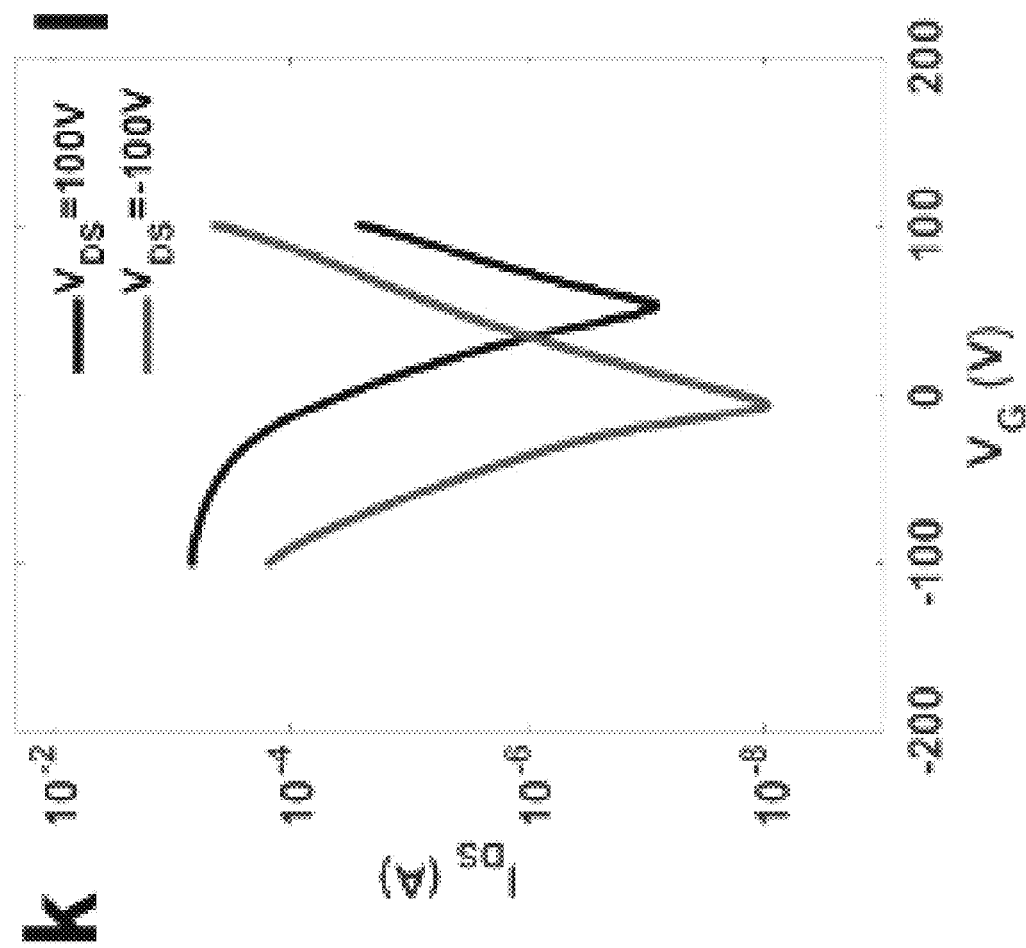
FIG. 9K is an exemplary embodiment of characteristic transfer curves of TPTI-F in accordance with the present disclosure.
Figure 9L:
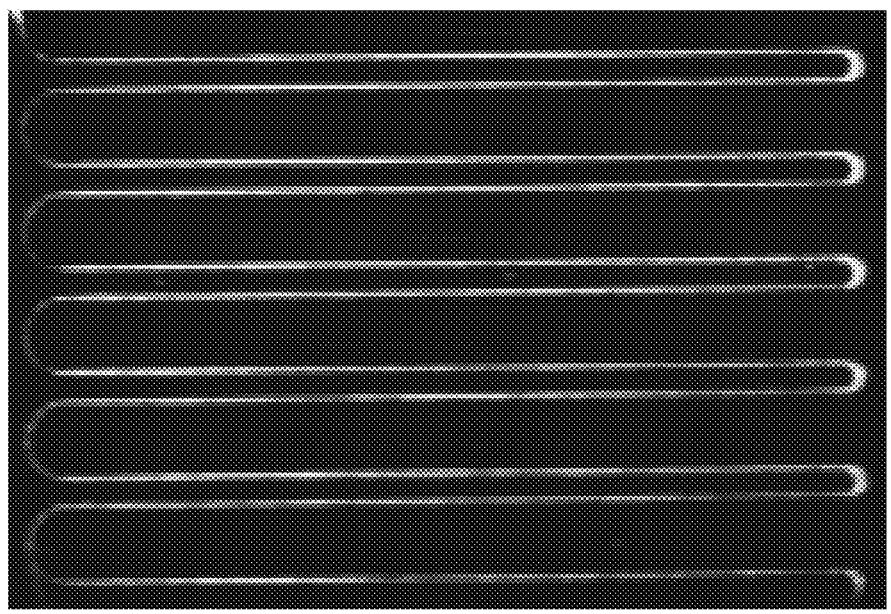
FIG. 9L is an exemplary embodiment of characteristic emission images of TPTI-F in accordance with the present disclosure. In bottom gate top contact (BGTC) organic light-emitting transistor (OLET) with device configuration as shown in FIG. 9A (PMMA as modification layer) in accordance with the present disclosure. Channel length, L=50 μm; Channel width, W=18 mm.
Figure 10A:
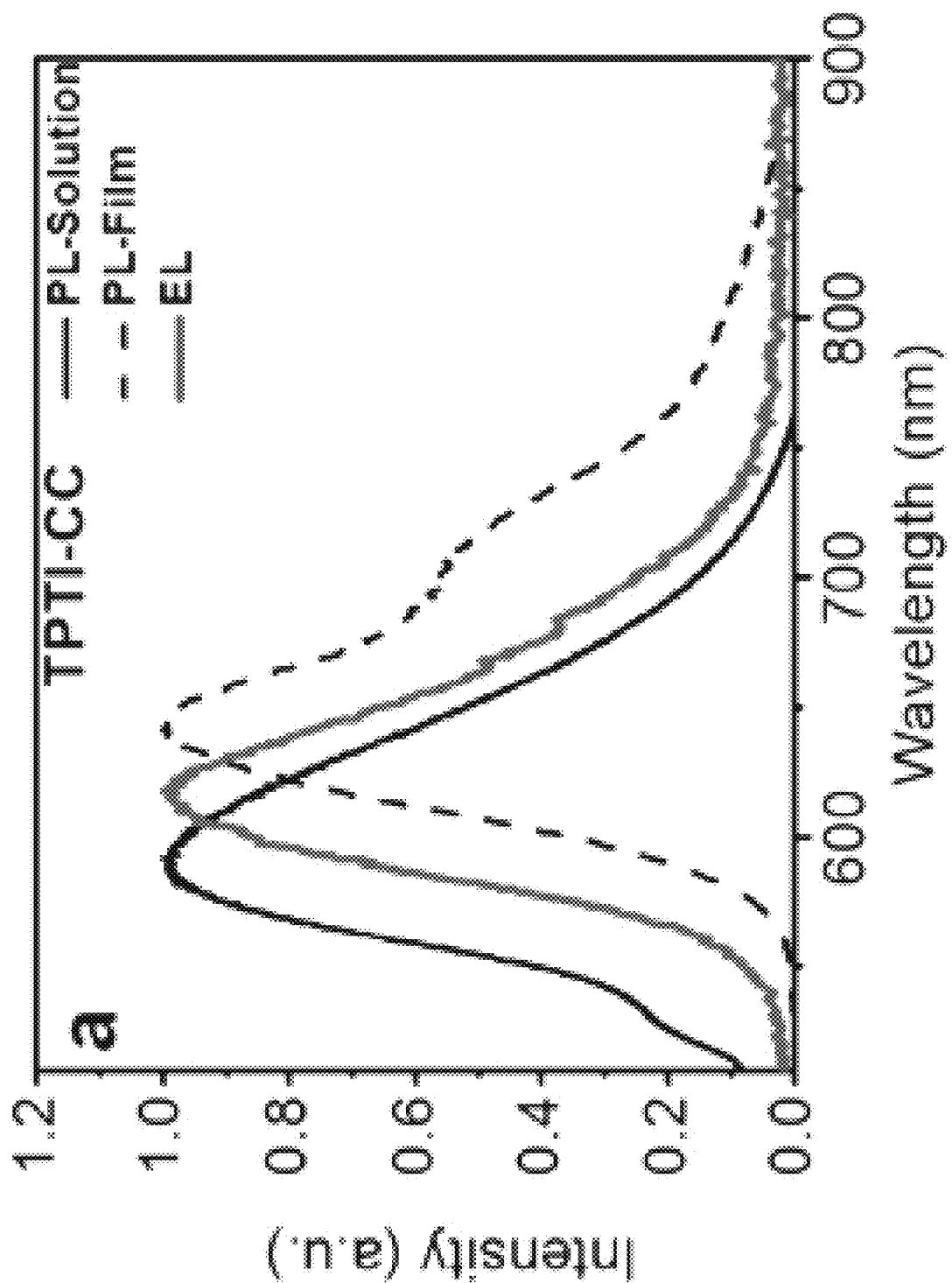
FIG. 10A is an exemplary embodiment of electroluminescent (EL) and photoluminescent (PL) spectra of TPTI-CC in accordance with the present disclosure.
Figure 10B:
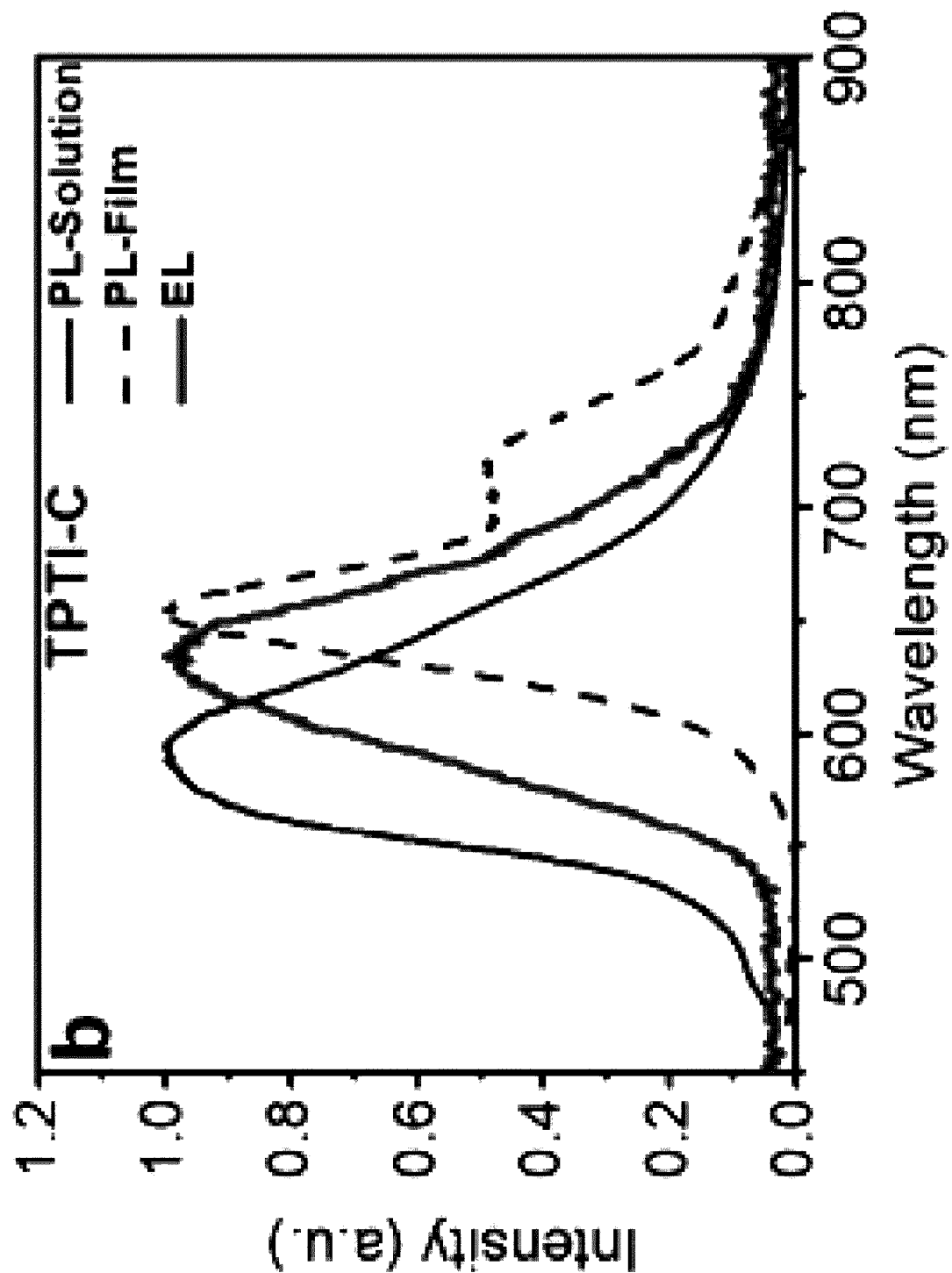
FIG. 10B is an exemplary embodiment of electroluminescent (EL) and photoluminescent (PL) spectra of TPTI-C in accordance with the present disclosure.
Figure 10C:
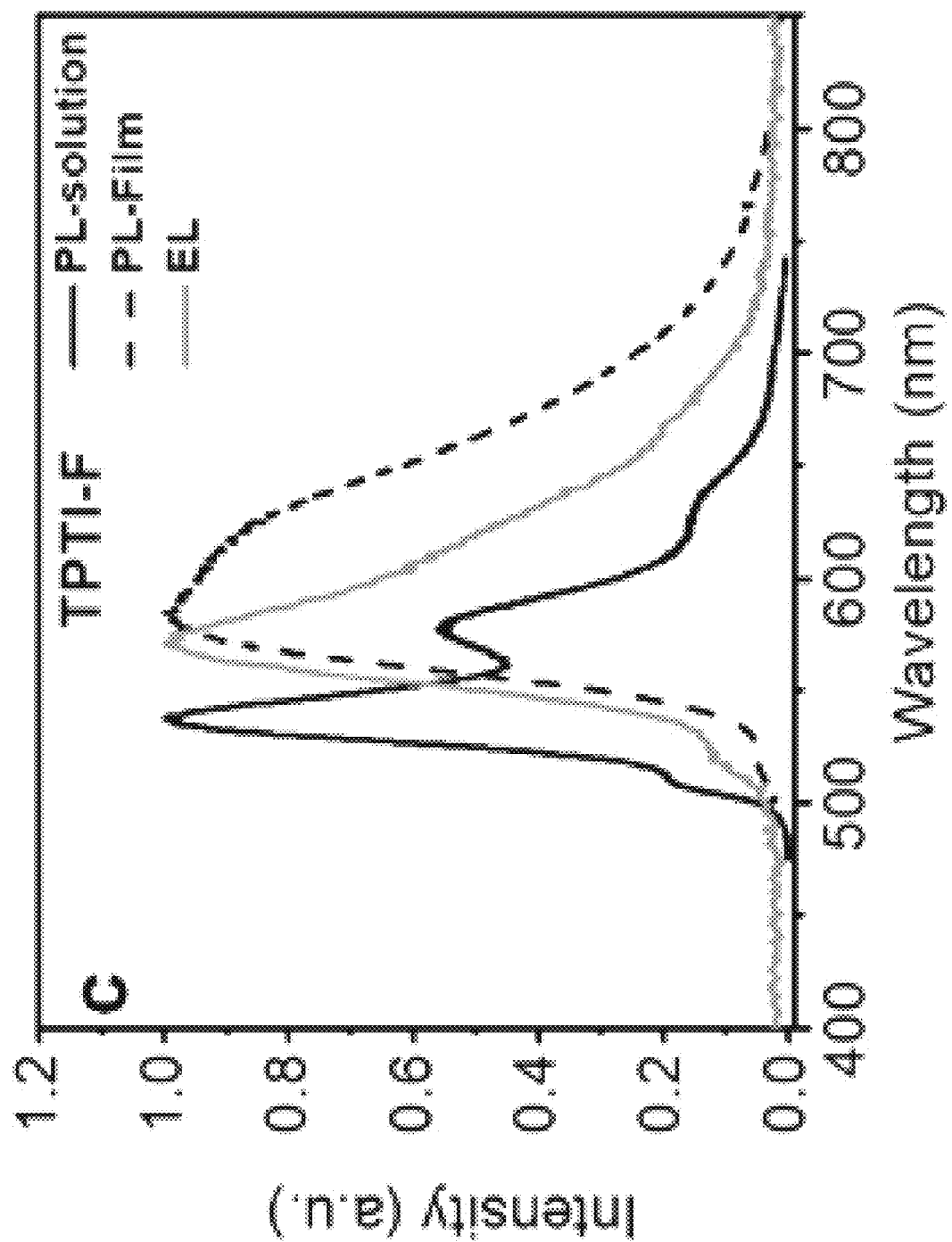
FIG. 10C is an exemplary embodiment of electroluminescent (EL) and photoluminescent (PL) spectra of TPTI-F in accordance with the present disclosure. (FIG.), (FIG.), and (FIG.)
Figure 11B:
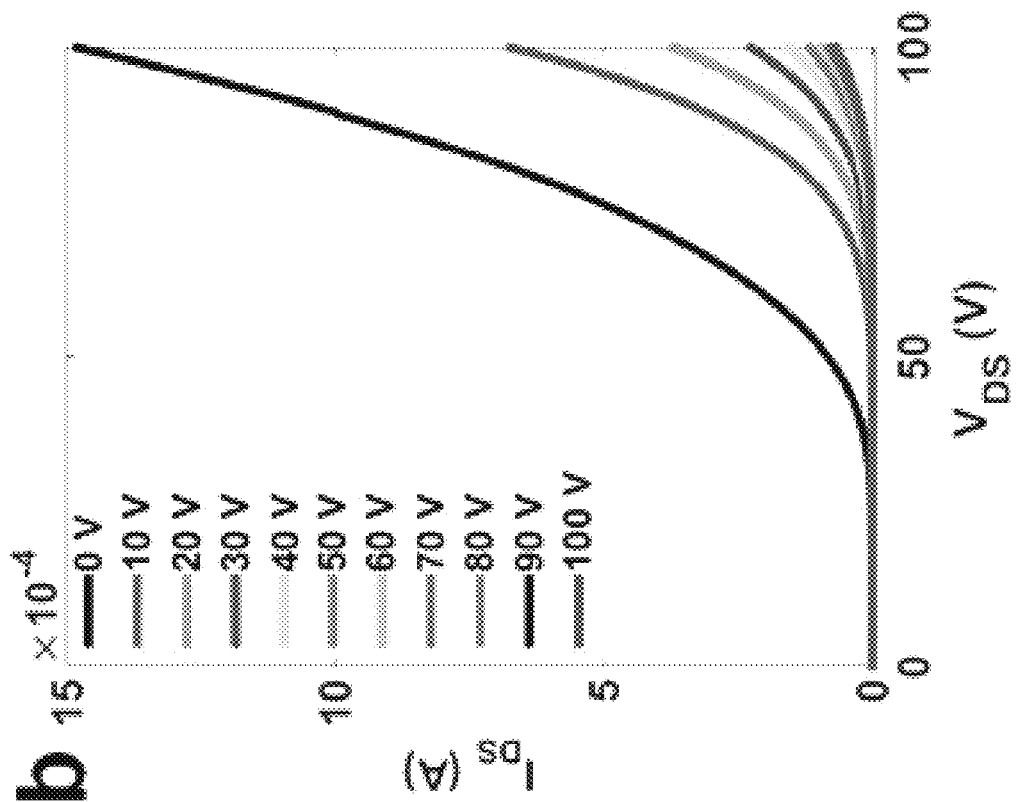
FIG. 11B is another exemplary embodiment of characteristic output curves TPTI-CC in accordance with the present disclosure.
Figure 11A:
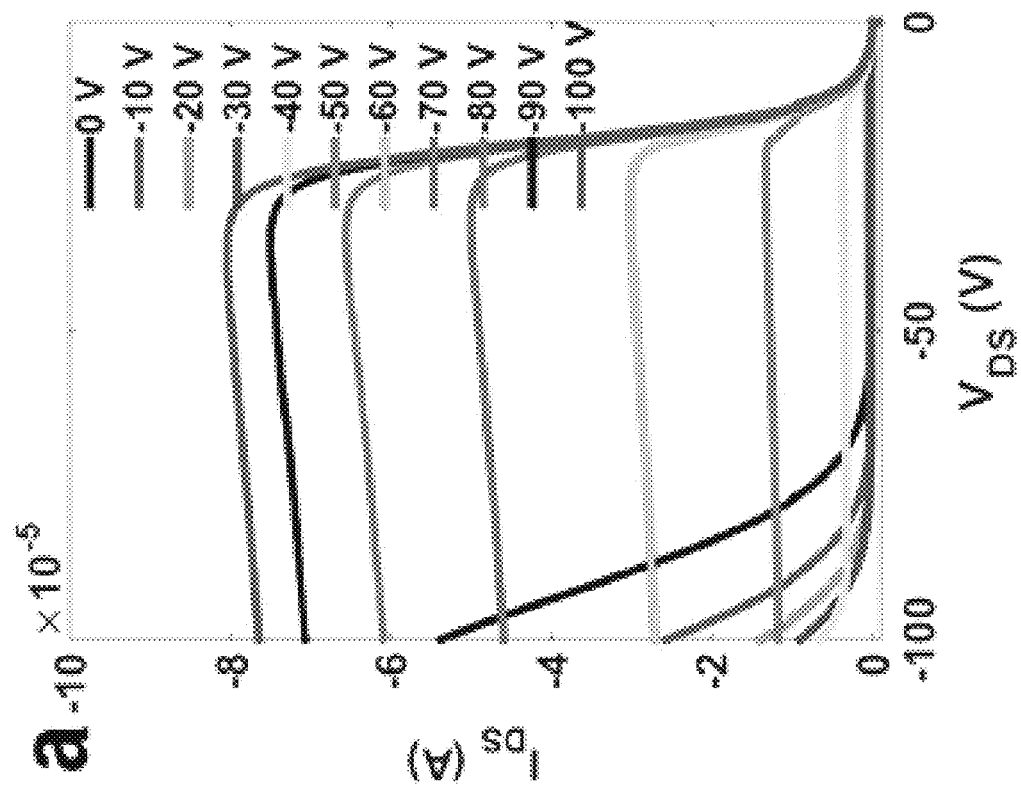
FIG. 11A is an exemplary embodiment of characteristic output curves of TPTI-CC in accordance with the present disclosure.
Figures 11C, 11D:
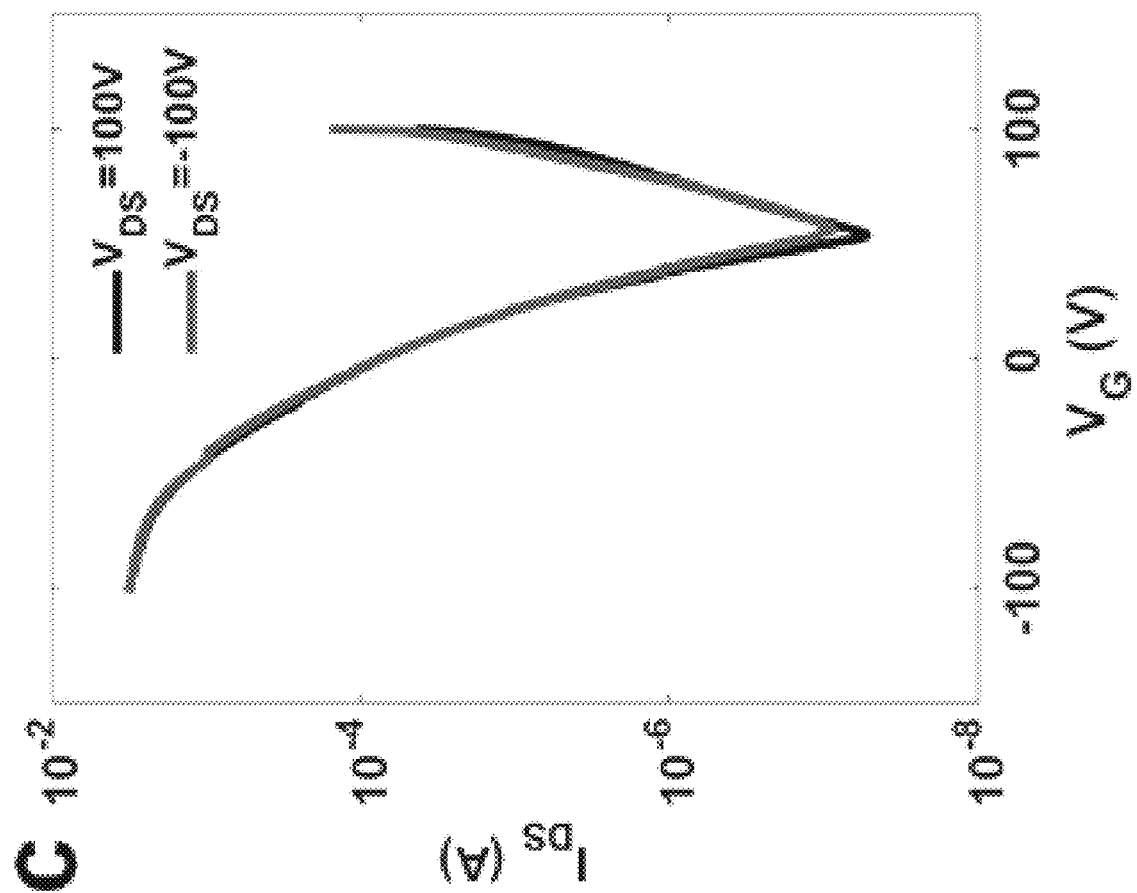
FIG. 11C is an exemplary embodiment of characteristic transfer curves of TPTI-CC in accordance with the present disclosure.
FIG. 11D is an exemplary embodiment of characteristic emission images of TPTI-CC in accordance with the present disclosure. In BGTC OLET with optimized device configuration as shown in FIG. 9A (OTS as modification layer). Channel length, L=50 ism; channel width, W=18 mm.
Figure 11F:
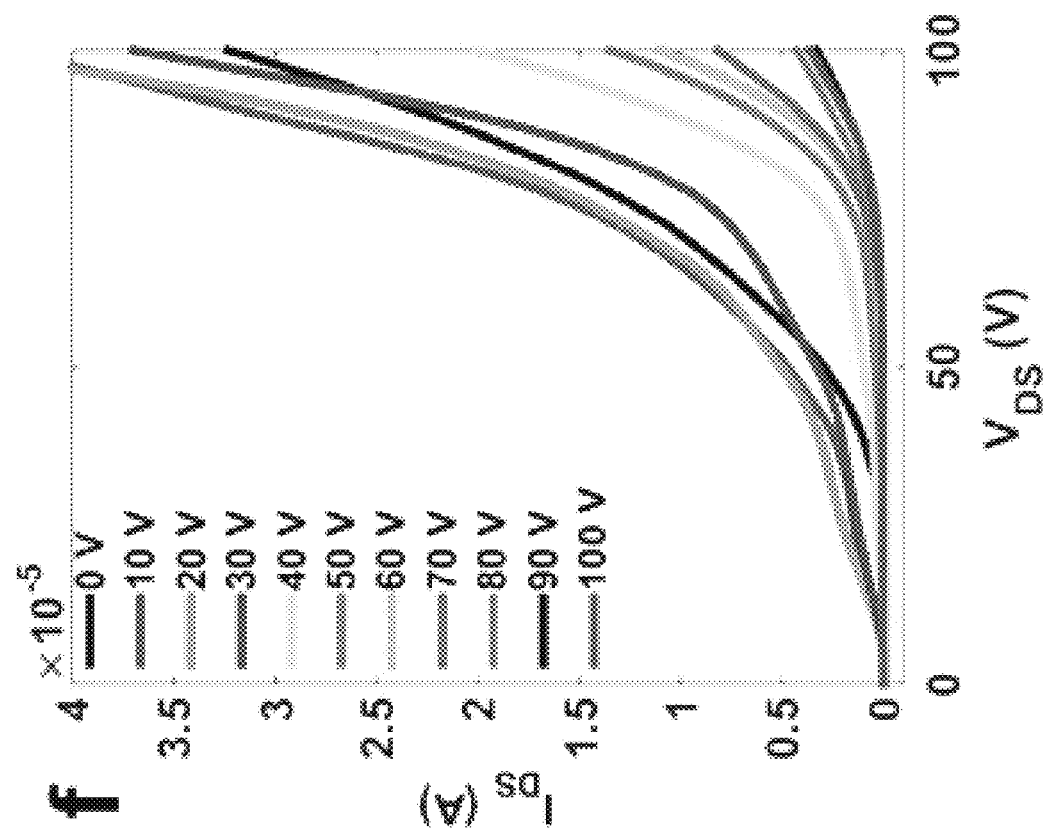
FIG. 11F is another exemplary embodiment of characteristic output curves of TPTI-C in accordance with the present disclosure.
Figure 11E:
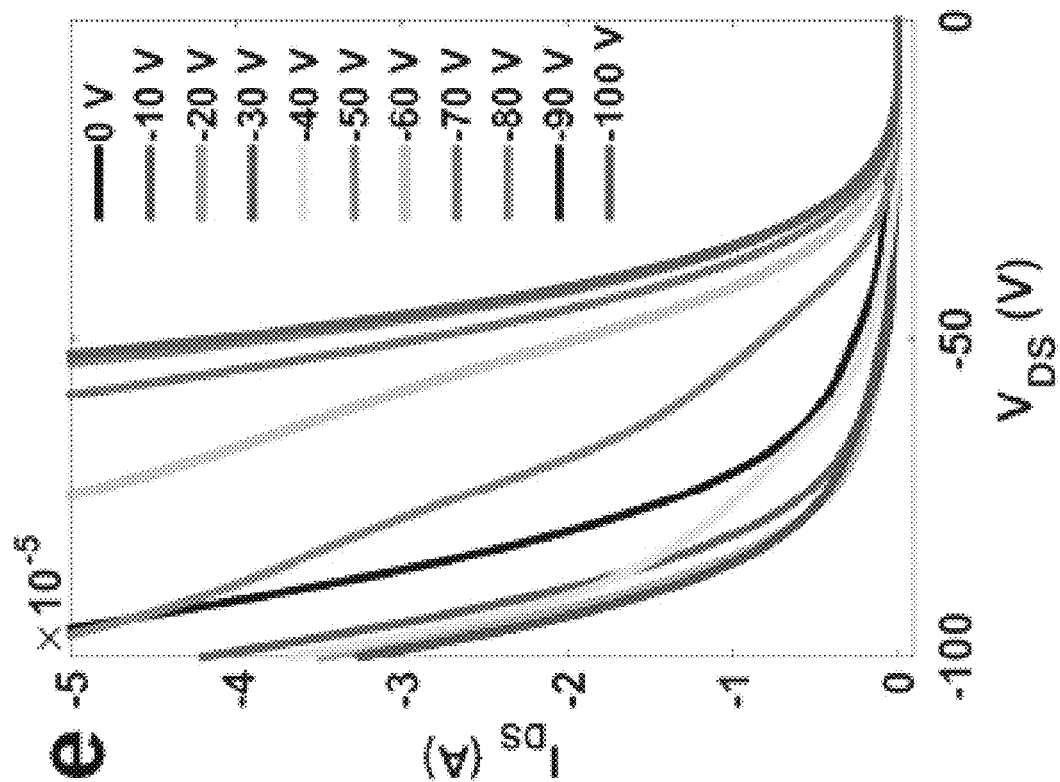
FIG. 11E is an exemplary embodiment of characteristic output curves of TPTI-C in accordance with the present disclosure.
Figure 11J:
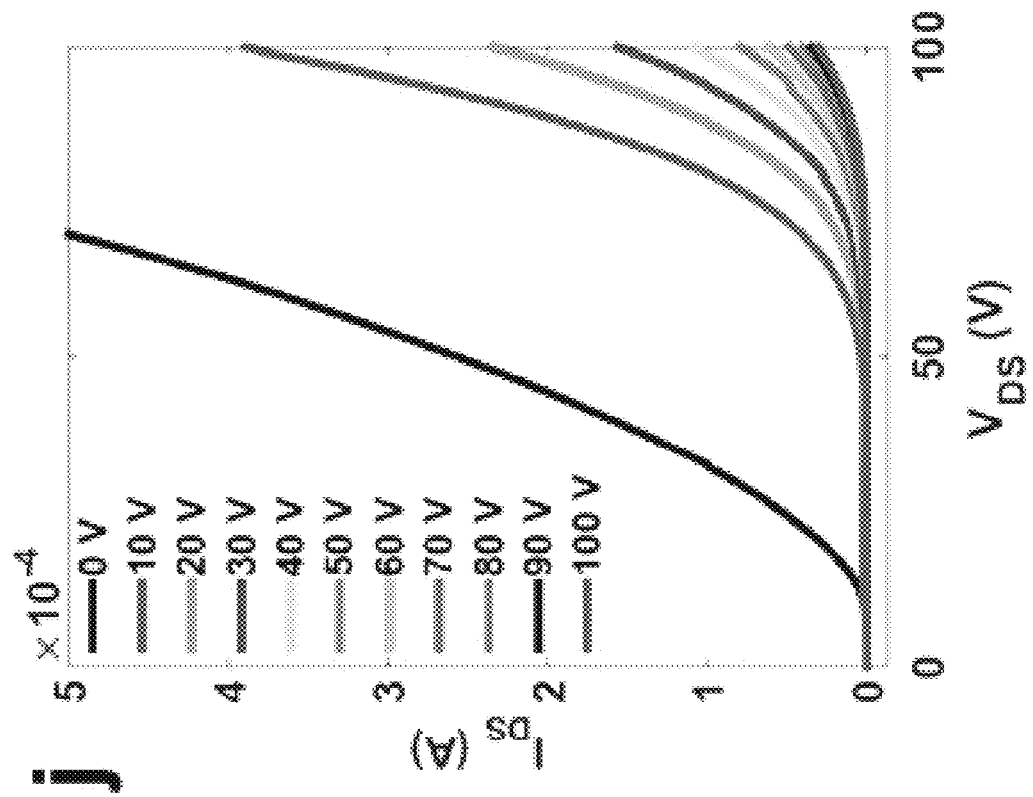
FIG. 11J is another exemplary embodiment of characteristic output curves of TPTI-F in accordance with the present disclosure.
Figure 11I:
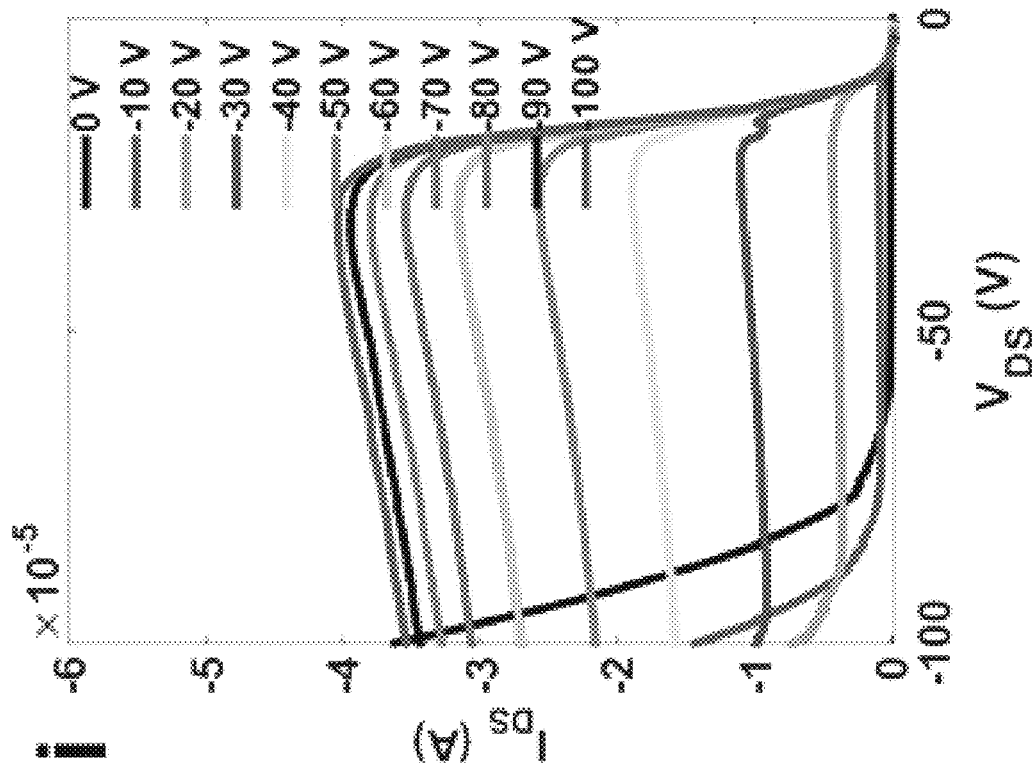
FIG. 11I is an exemplary embodiment of characteristic output curves of TPTI-F in accordance with the present disclosure.
Figure 11K:
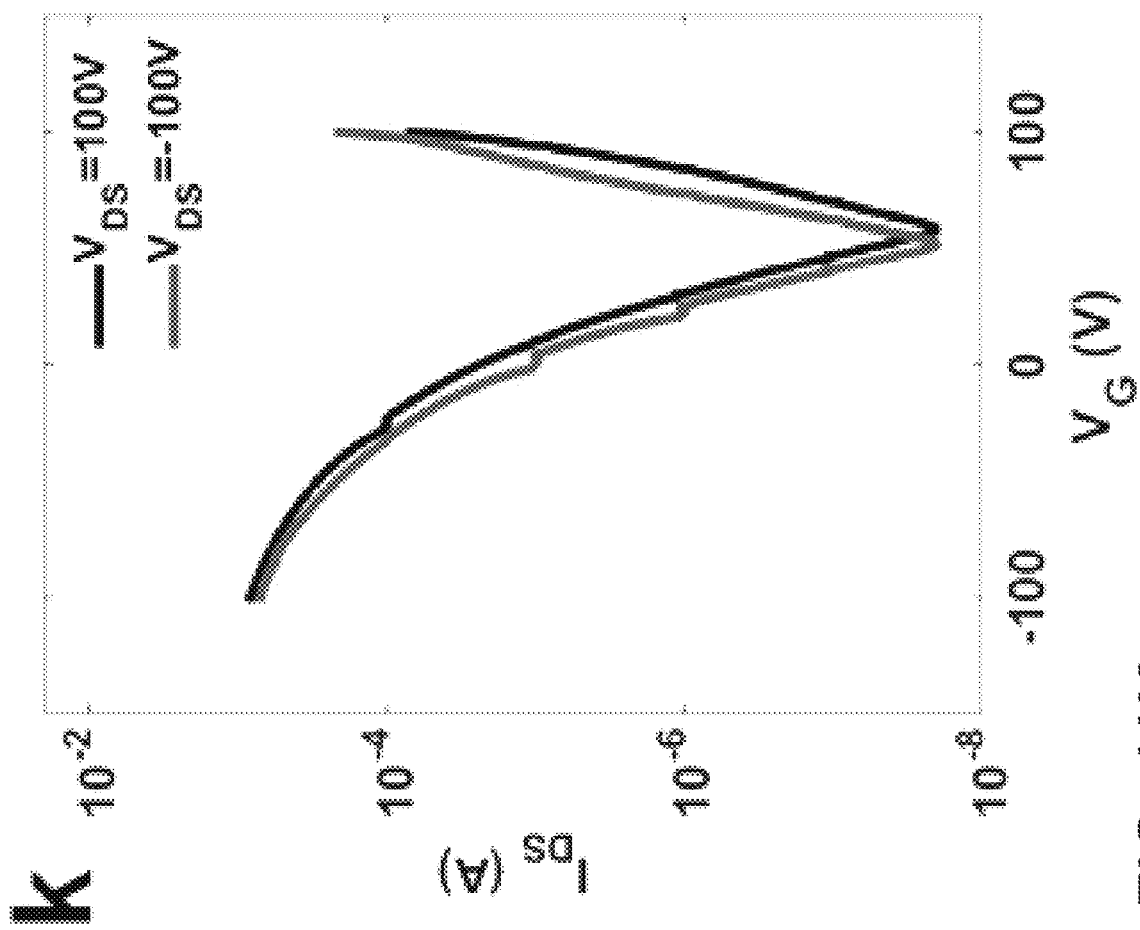
FIG. 11K is an exemplary embodiment of characteristic transfer curves of TPTI-F in accordance with the present disclosure.
Figure 11L:
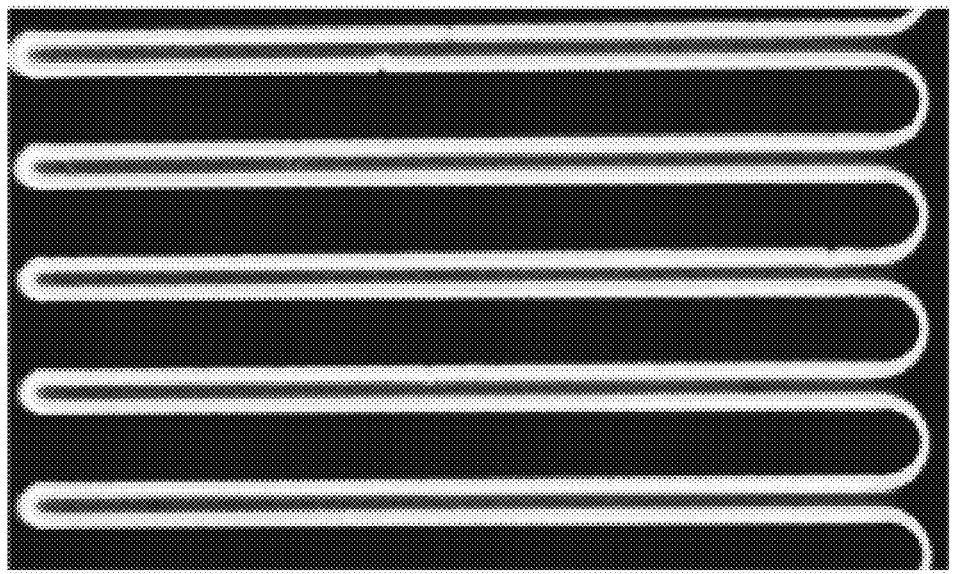
FIG. 11L is an exemplary embodiment of characteristic emission images of TPTI-F in accordance with the present disclosure. In BGTC OLET with optimized device configuration as shown in FIG. 9A (OTS as modification layer). Channel length, L=50 ism; channel width, W=18 mm.
Figure 12A:
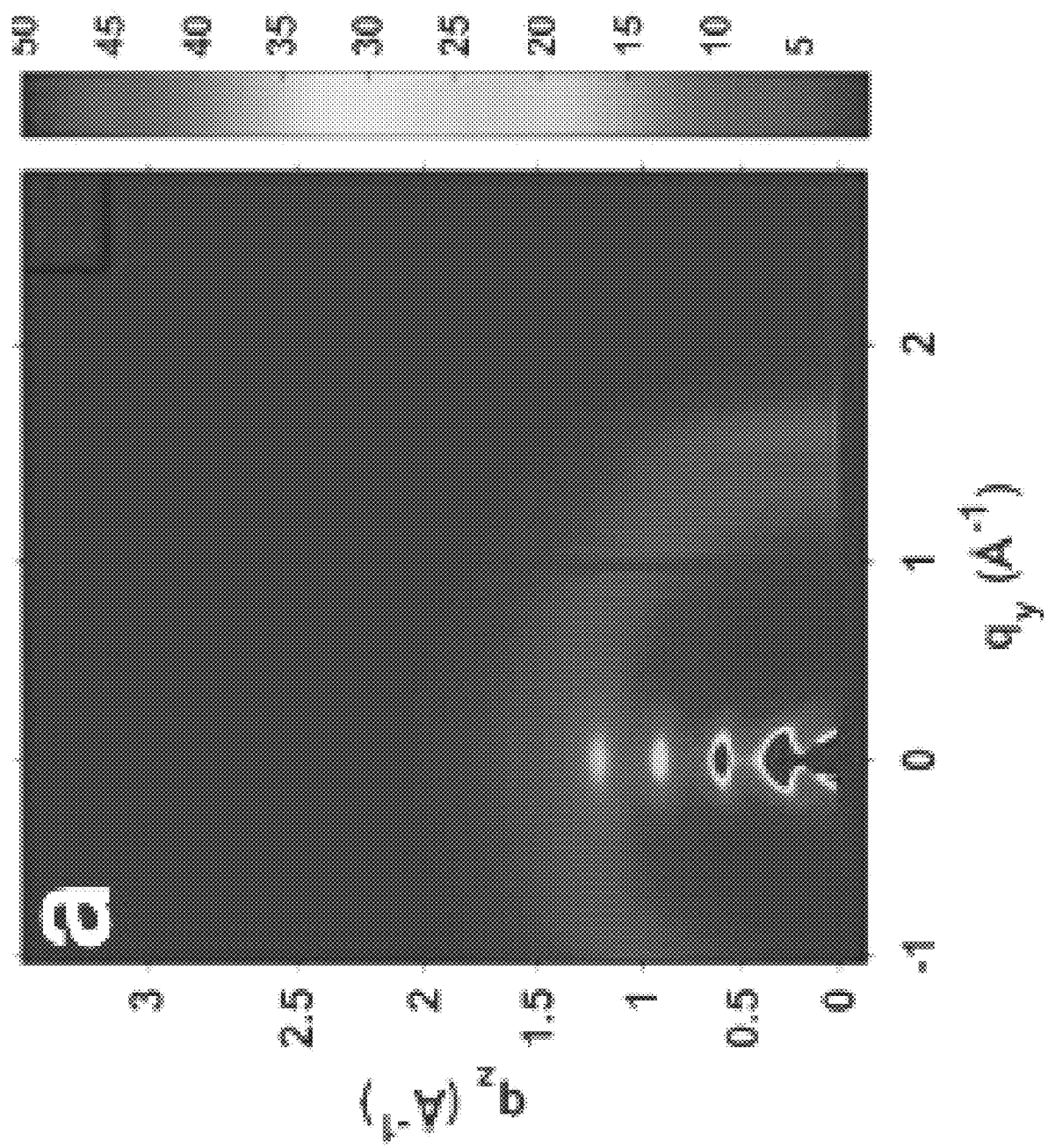
FIG. 12A is an exemplary embodiment of 2D GIWAXS scattering patterns of DPP-DTT on OTS in accordance with the present disclosure.
Figure 12B:
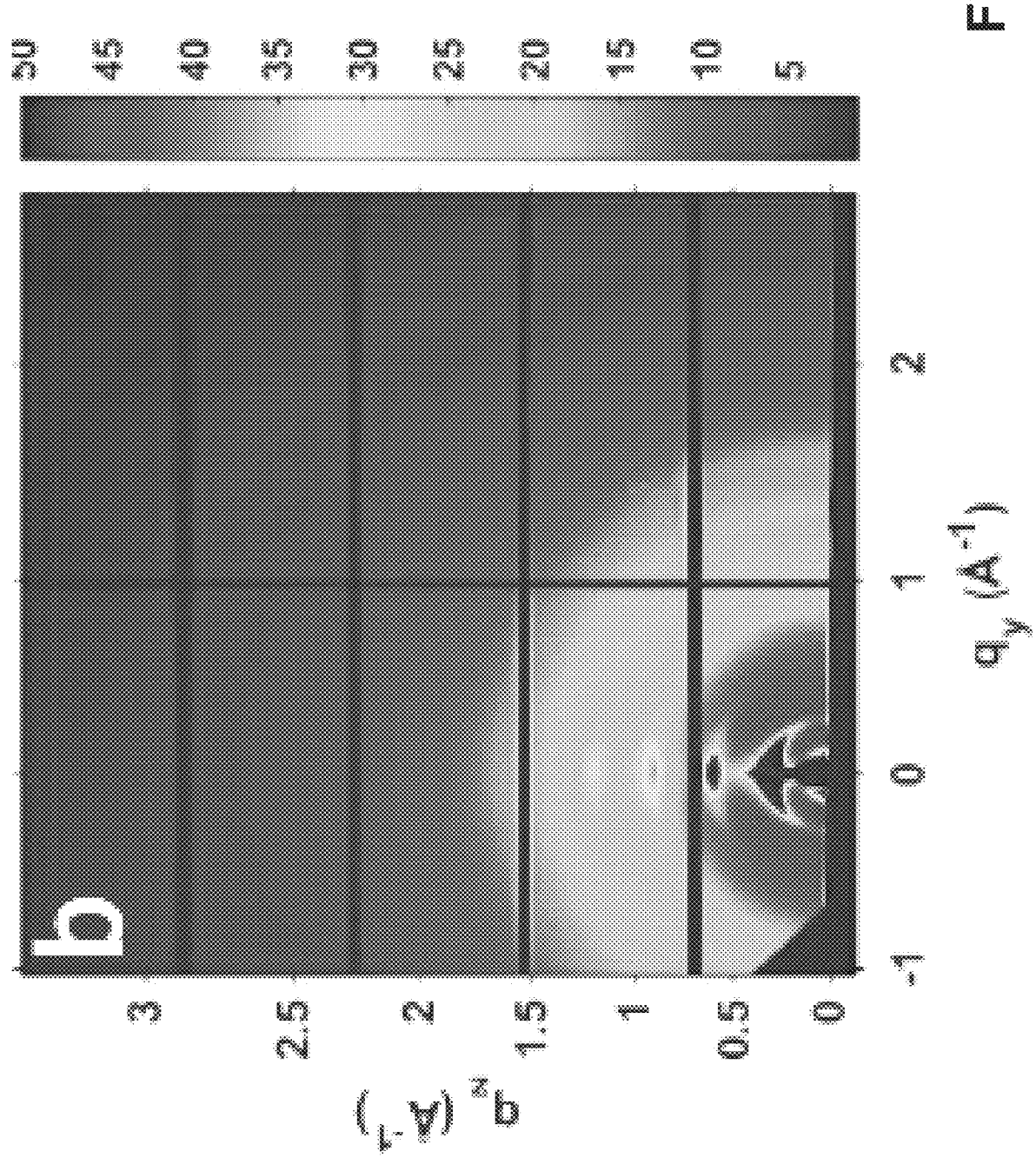
FIG. 12B is an exemplary embodiment of 2D GIWAXS scattering patterns of DPP-DTT on PMMA in accordance with the present disclosure.
Figure 12C:
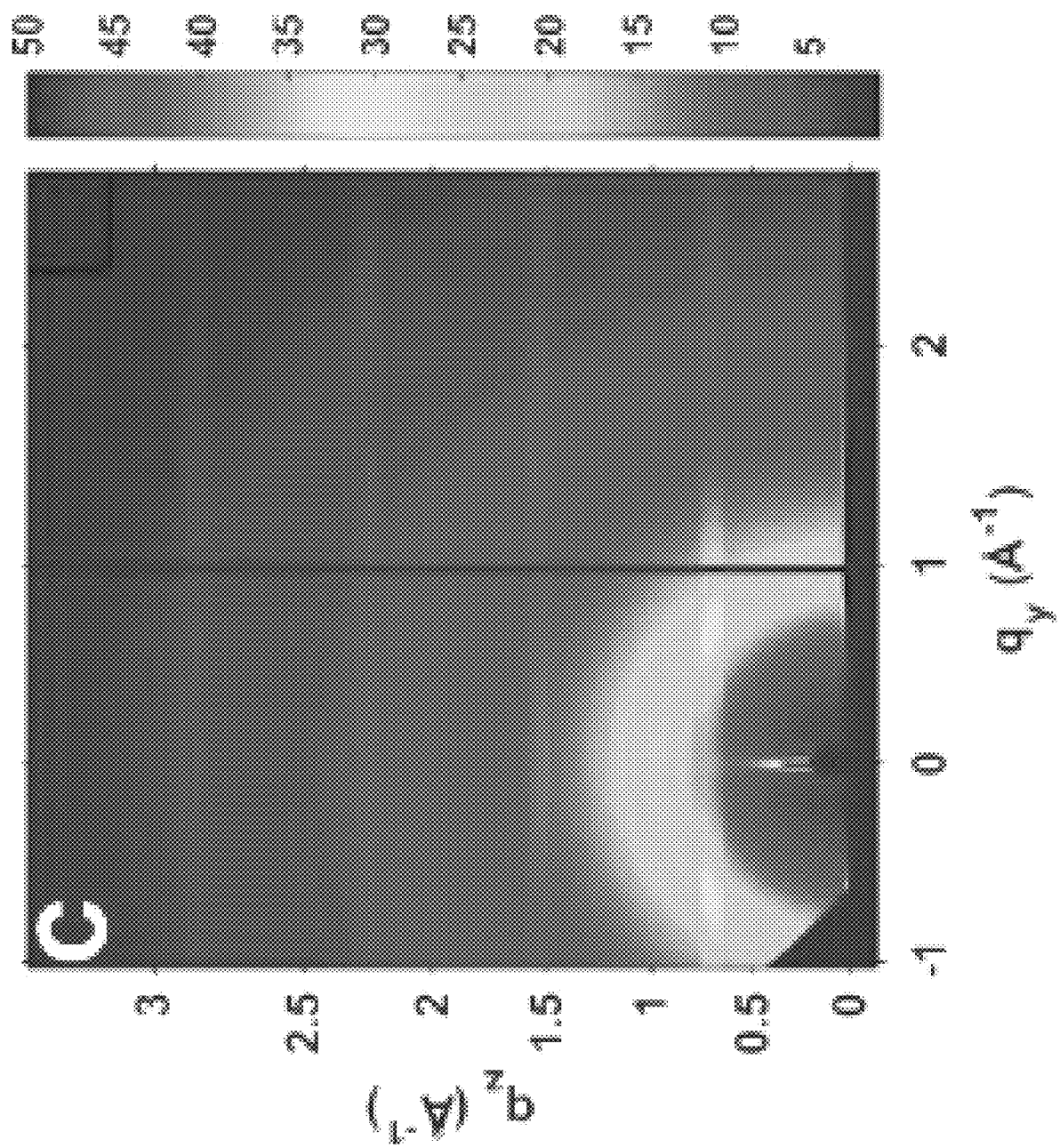
FIG. 12C is an exemplary embodiment of 2D GIWAXS scattering patterns of DPP-DTT on PMMA thin film only in accordance with the present disclosure.
Figure 12D:
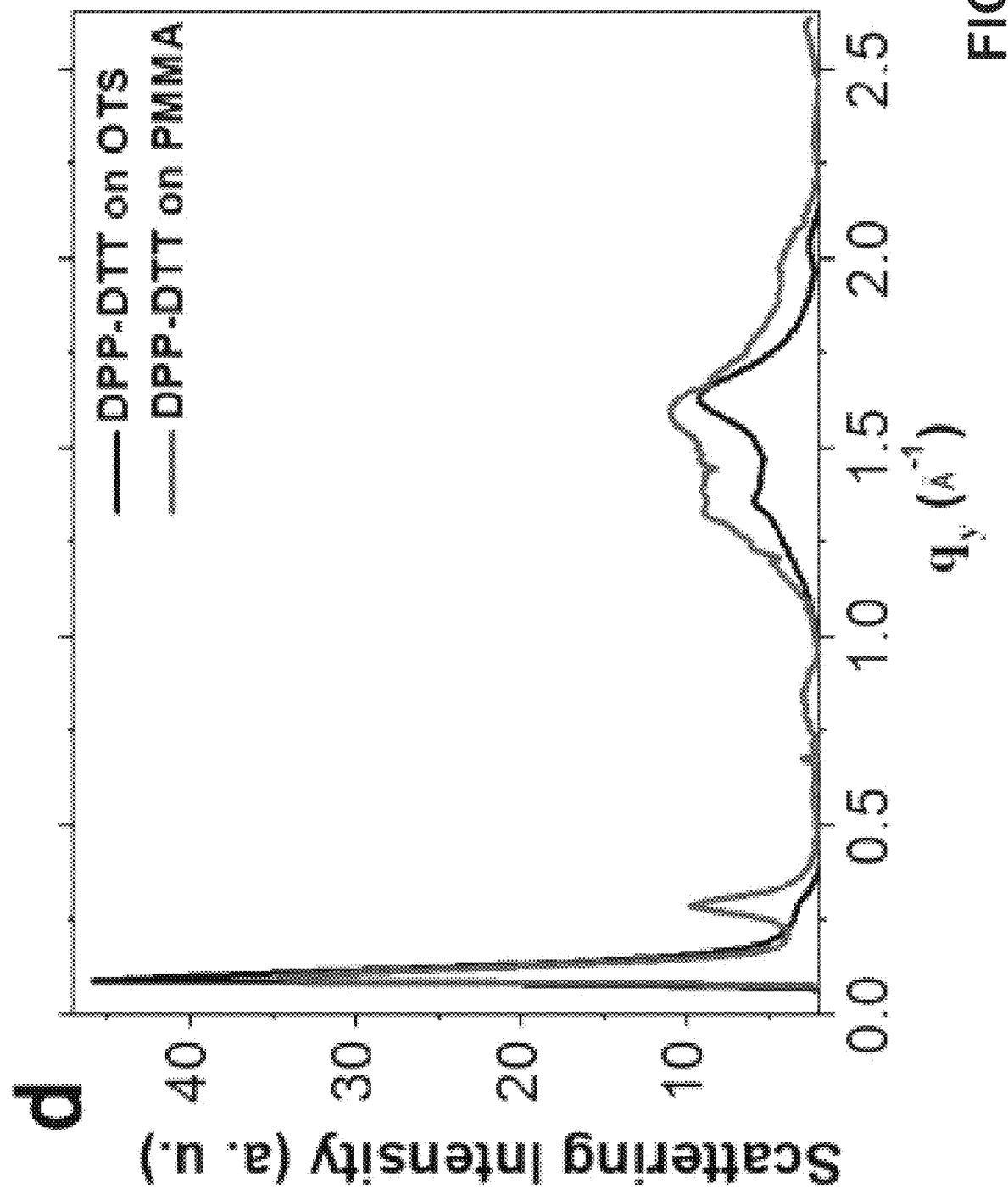
FIG. 12D is an exemplary embodiment of GIWAXS linecuts in in-plane directions in accordance with the present disclosure.
Figure 12E:
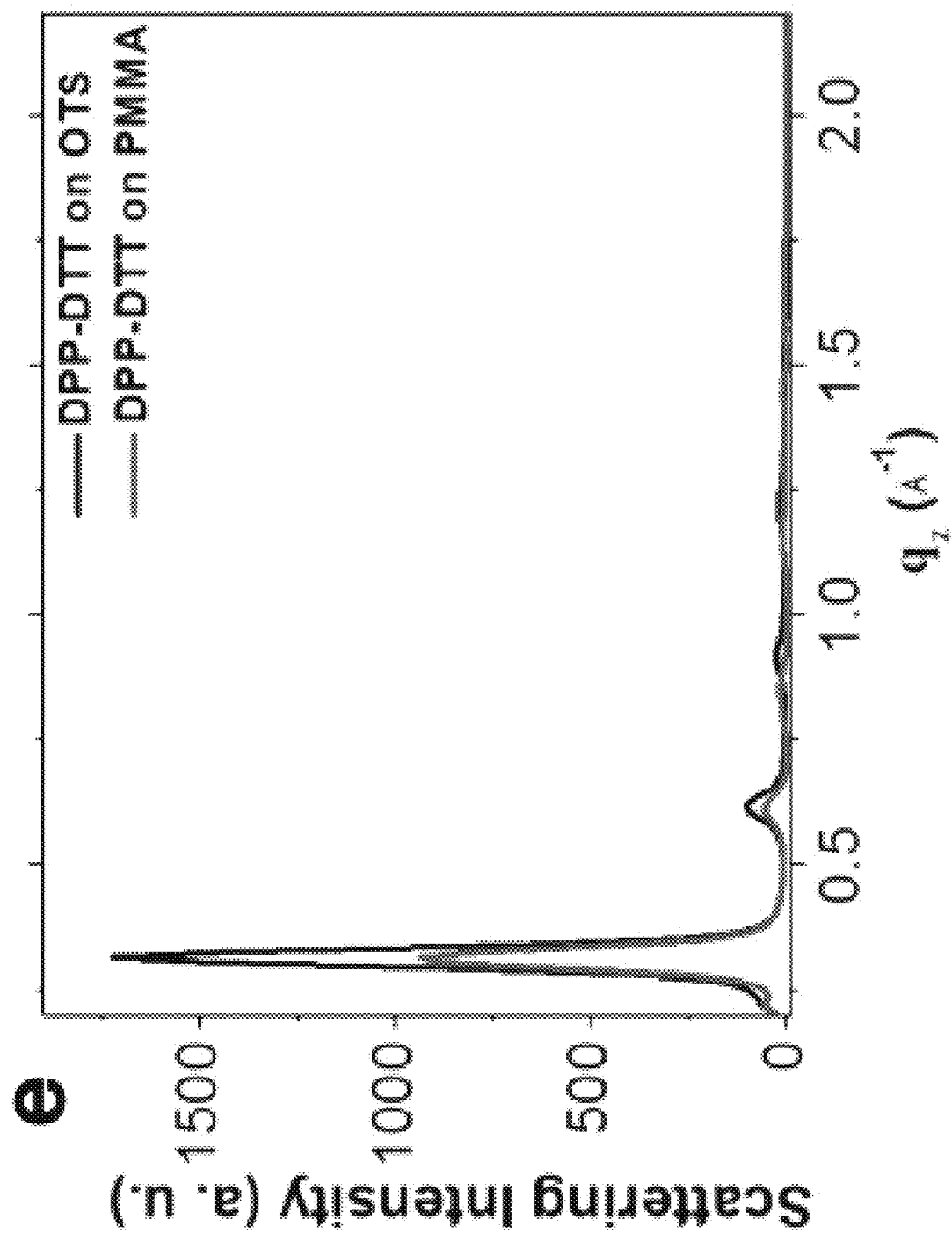
FIG. 12E is an exemplary embodiment of GIWAXS linecuts in out-of-plane directions in accordance with the present disclosure.
Figure 13A:
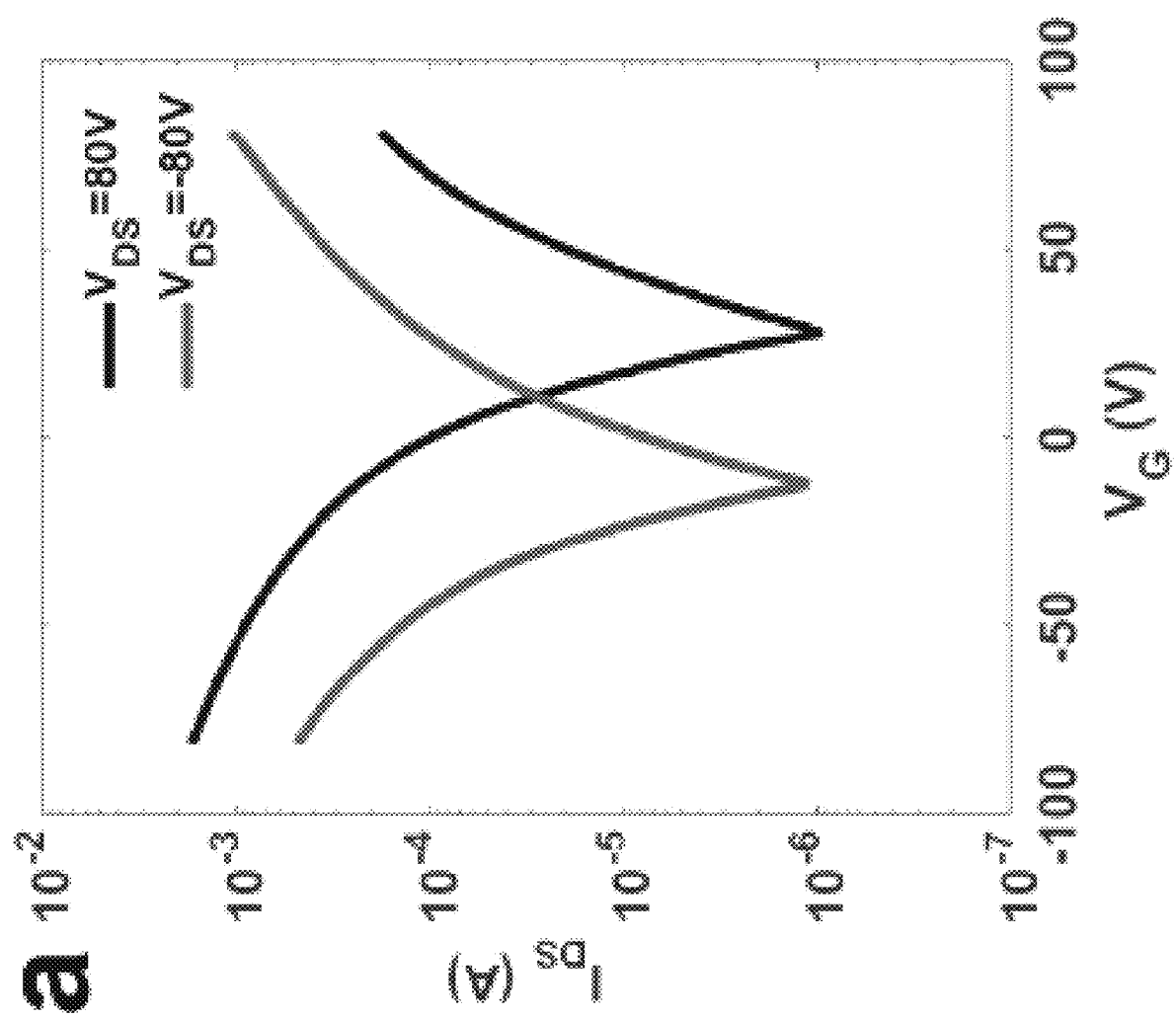
FIG. 13A is an exemplary embodiment of transfer curves of transporting layer, DPP-DTT on PMMA modified OFET devices in accordance with the present disclosure.
Figure 13B:
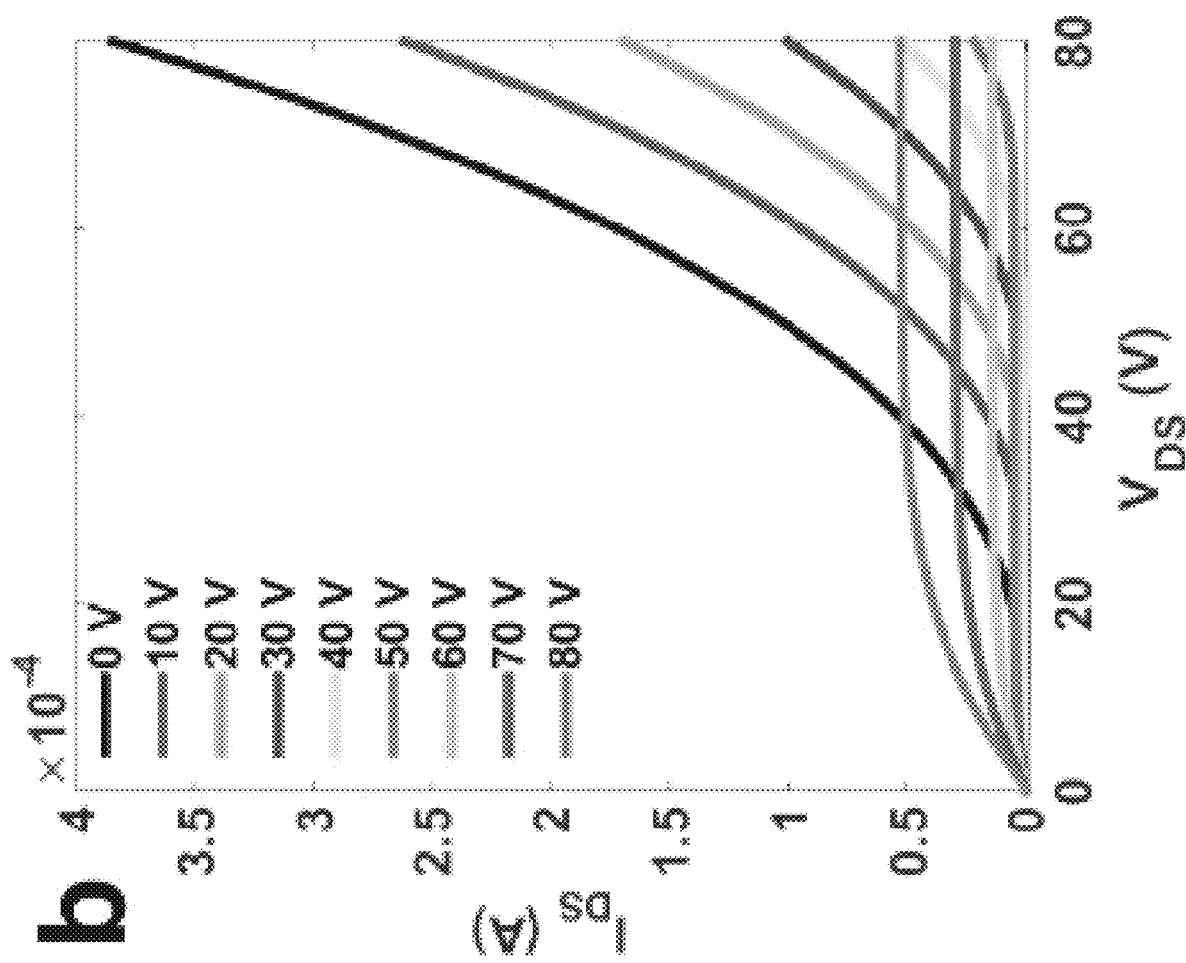
FIG. 13B is an exemplary embodiment of output curves of transporting layer, DPP-DTT on PMMA modified OFET devices in accordance with the present disclosure.
Figure 13C:
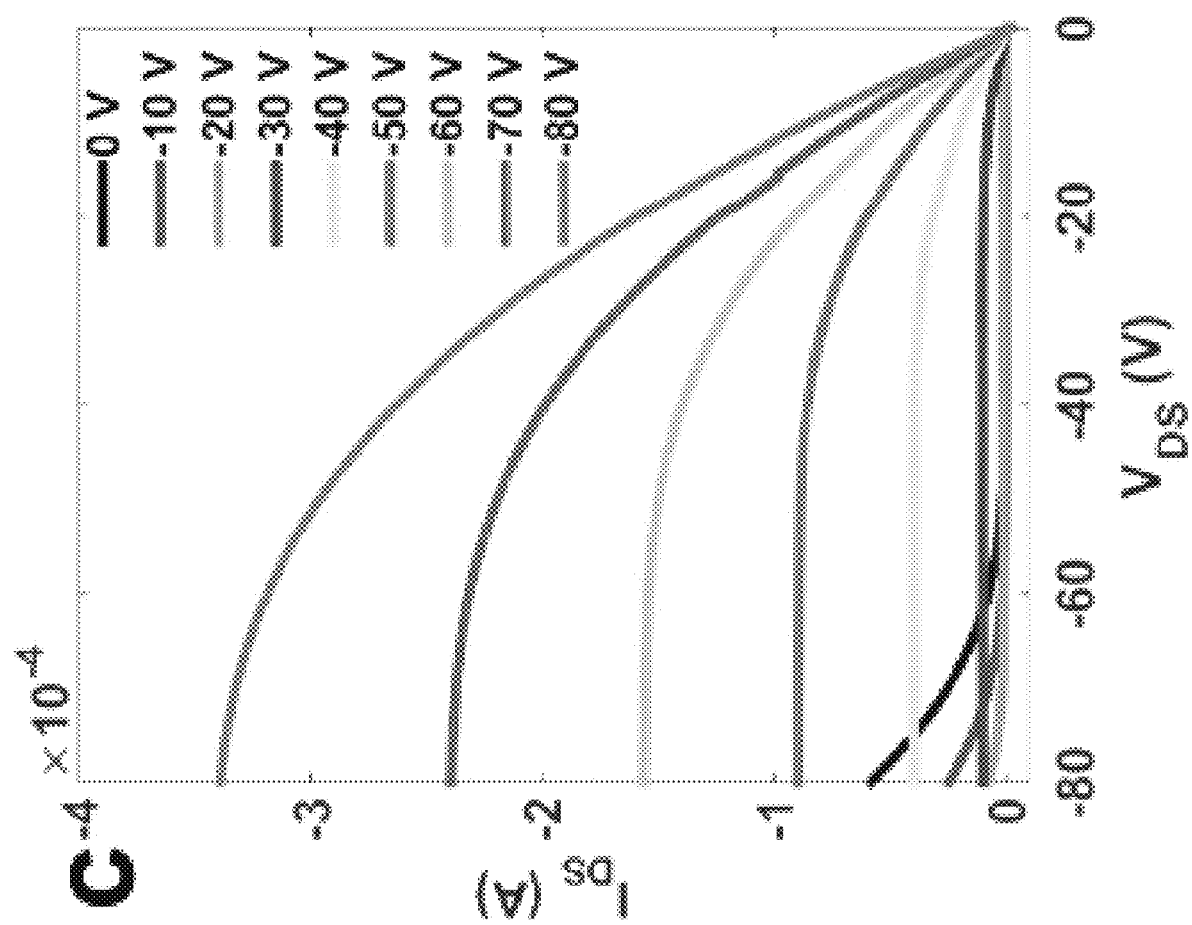
FIG. 13C is another exemplary embodiment of output curves of transporting layer, DPP-DTT on PMMA modified OFET devices in accordance with the present disclosure.
Figure 14A:
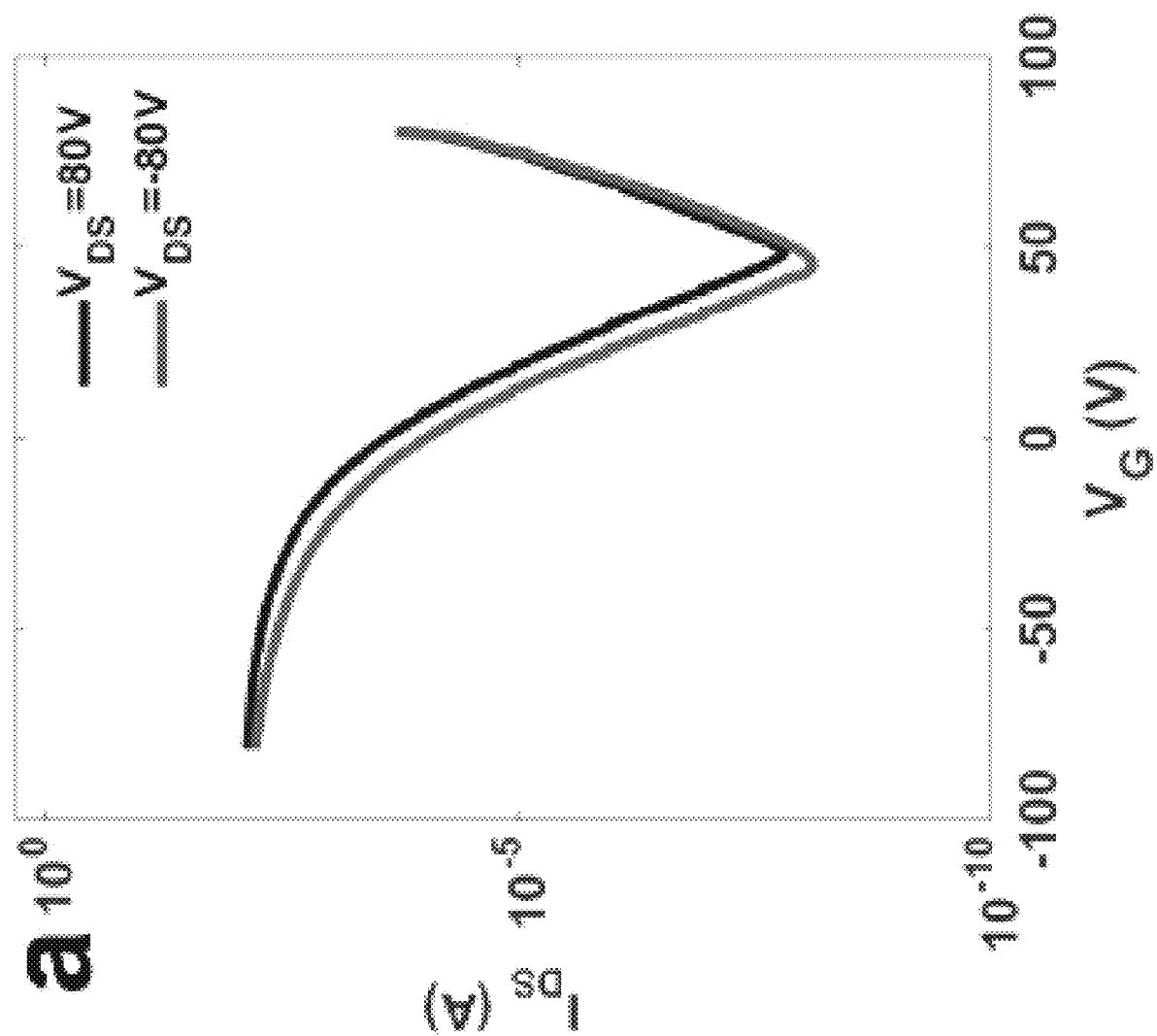
FIG. 14A is an exemplary embodiment of transfer curves of transporting layer, DPP-DTT on OTS modified OFET devices in accordance with the present disclosure.
Figure 14B:
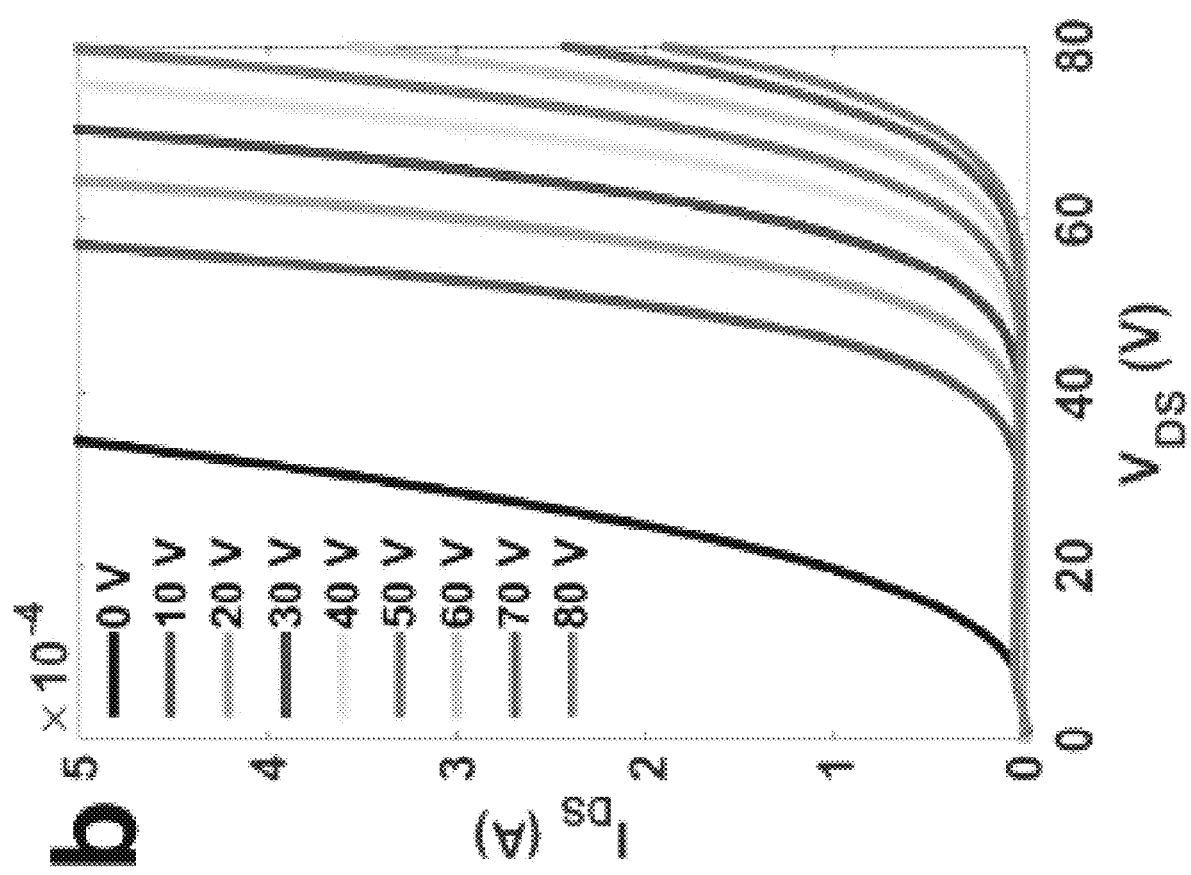
FIG. 14B is an exemplary embodiment of output curves of transporting layer, DPP-DTT on OTS modified OFET devices in accordance with the present disclosure.
Figure 14C:
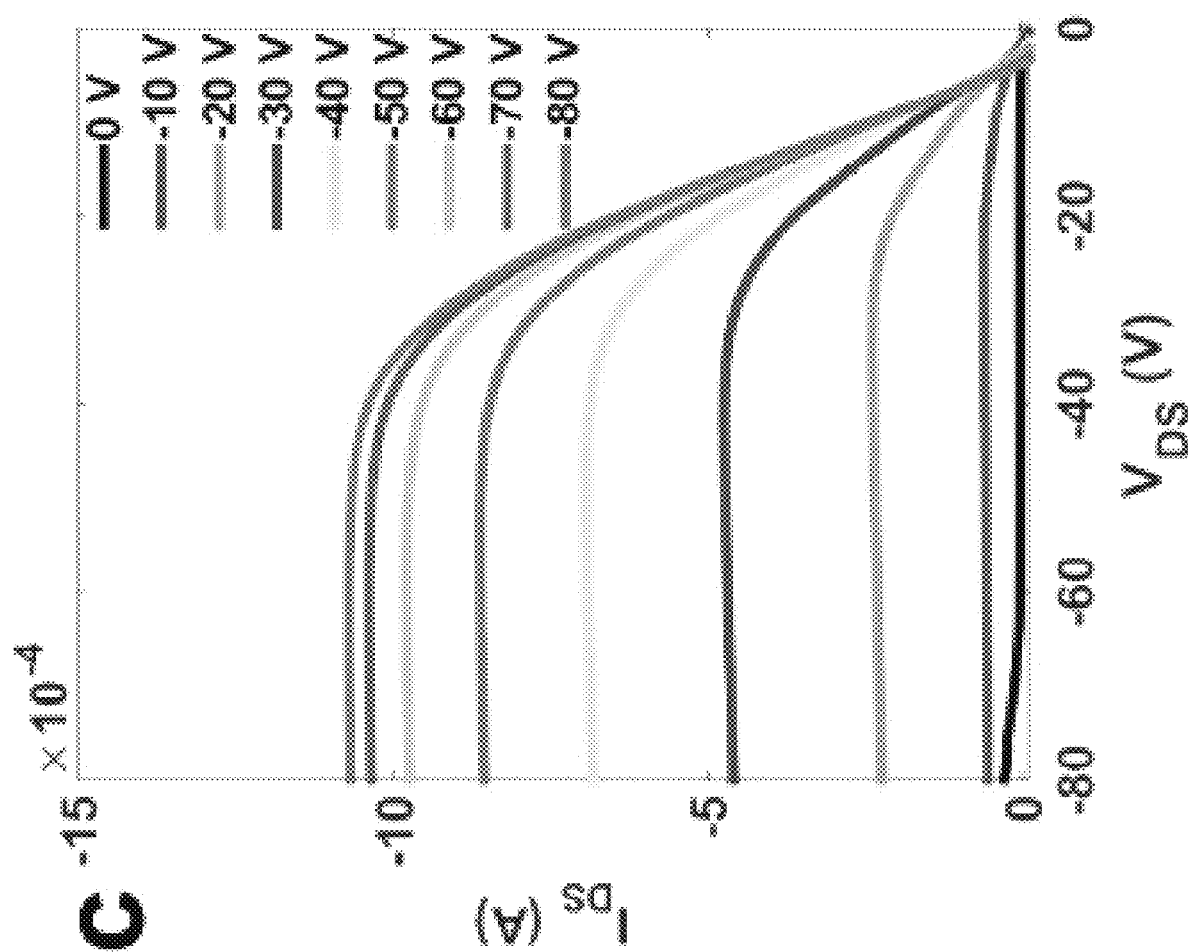
FIG. 14C is another exemplary embodiment of output curves of transporting layer, DPP-DTT on OTS modified OFET devices in accordance with the present disclosure.

As shown in FIG. 9A-L, the presently disclosed OLET devices of TPTI-CC, TPTI-C, and TPTI-F exhibit ambipolar FET behavior with hole/electron mobility of 0.041/0.059, 0.39/0.23, and 0.051/0.014 cm$^2$ V$^{-1}$ s$^{-1}$ respectively (Table 4). The I$_{on/off}$ ratio of TPTI-C and TPTI-F are significantly improved from 10$^1$ to 10$^4$. This greatly improved FET property should be attributed to the incorporation of DPP-DTT as a charge transporting layer. Yellow-orange, orange, and yellow emission were observed for TPTI-CC, TPTI-C, and TPTI-F respectively, as shown in FIGS. 9D, 9H, AND 9L. The EL spectra of TPTI-CC and TPTI-C were blue-shifted relative to PL spectra in solid-state, which might imply that the EL came from relatively less aggregated emissive centers (FIGS. 10A and 10B). The electro-luminescent spectra of TPTI-F exhibited a main peak at around 572 nm (FIG. 10C) which was close to the PL spectra in film (582 nm). Although large drain-source and gate voltages were applied, the performances of OLET with this architecture was still poor. The low intensity and narrow emission zone may be attributed to the poor FET transporting property of DPP-DTT on PMMA (Table 4).

In order to further improve device performances, a self-assembled OTS monolayer was employed to replace the thick insulating PMMA layer (FIG. 8A). As shown in FIG. 11A-L, emission from these devices is significantly stronger than the emission from PMMA modified ones. Interestingly, the emission regions of TPTI-CC and TPTI-F are extending further from electrodes than that of TPTI-C under the same gate voltage.

The emissions are still fixed near the electrodes, which are possibly attributed to the poor charge transporting property of PFN$^+$ BI$_4^-$ and emissive layer, and OLED-like working mode. Moreover, the I$_{on/off}$ ratio of TPTI-CC and TPTI-F OLET devices increases significantly than before as shown in Table 4. These improvements may be partially attributed to the enhancement of charge transport in the OLET devices of TPTI-CC and TPTI-F. GIWAXS studies indicate significantly enhanced diffraction peak intensity at q=0.3 and 0.6 Å$^{-1}$ along the out-of-plane direction and q=0.1 Å$^{-1}$ along the in-plane direction of DPP-DTT films on OTS modified devices in comparison with those on PMMA (FIG. 12A-E). As shown in Table 4, FIG. 13A-C, and FIG. 14A-C, both charge carrier mobility and I$_{on/off}$ ratio of DPP-DTT on OTS modified FET devices were enhanced significantly in comparison with that on PMMA.

Figure 15A:
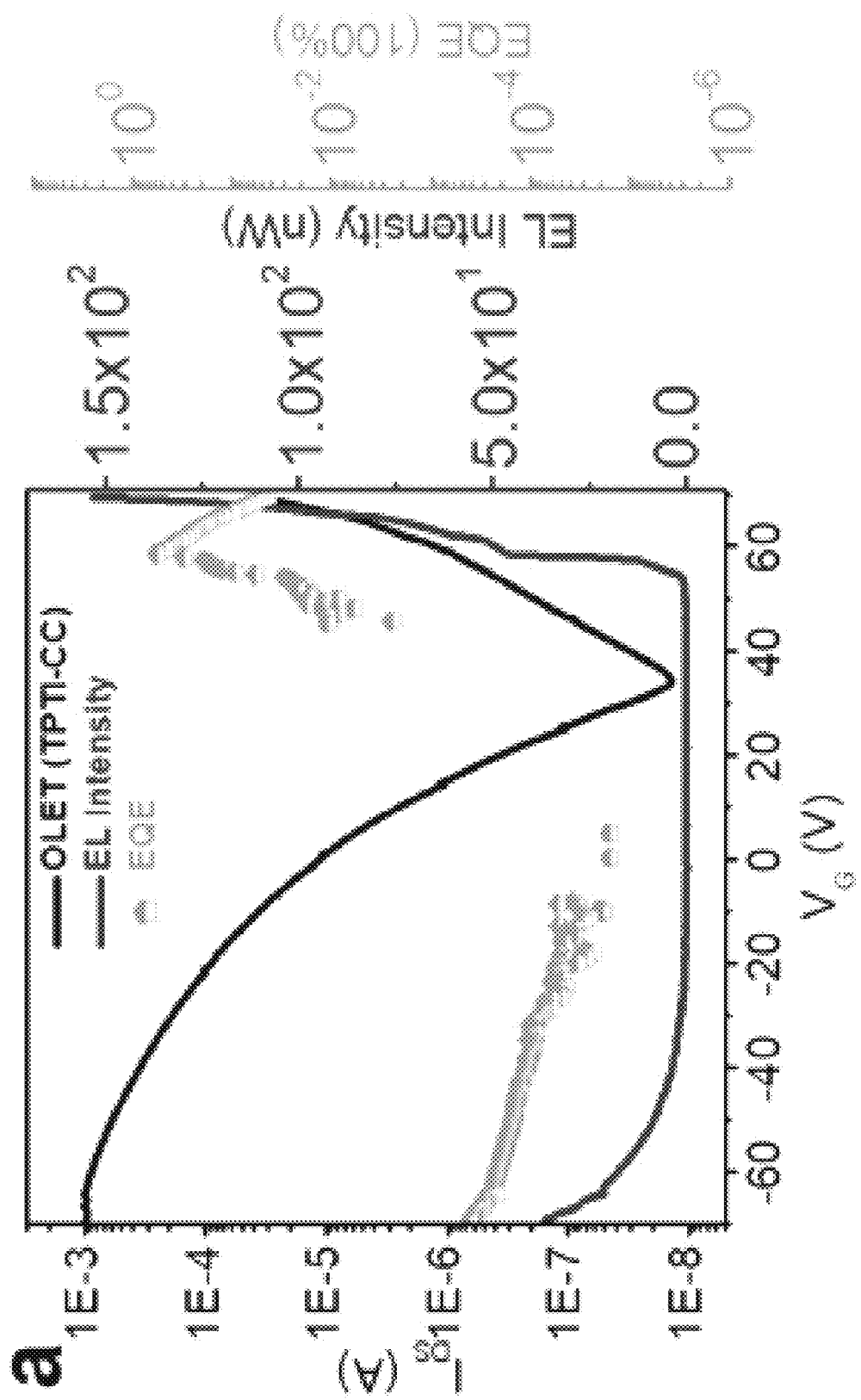
FIG. 15A is an exemplary embodiment of source-drain current, $I_{DS}$ (black), electroluminescent (EL) intensity (blue), and EQE (orange) change with gate voltages of OTS modified OLET devices: TPTI-CC, $V_{DS}$=70 V in accordance with the present disclosure.
Figure 15B:
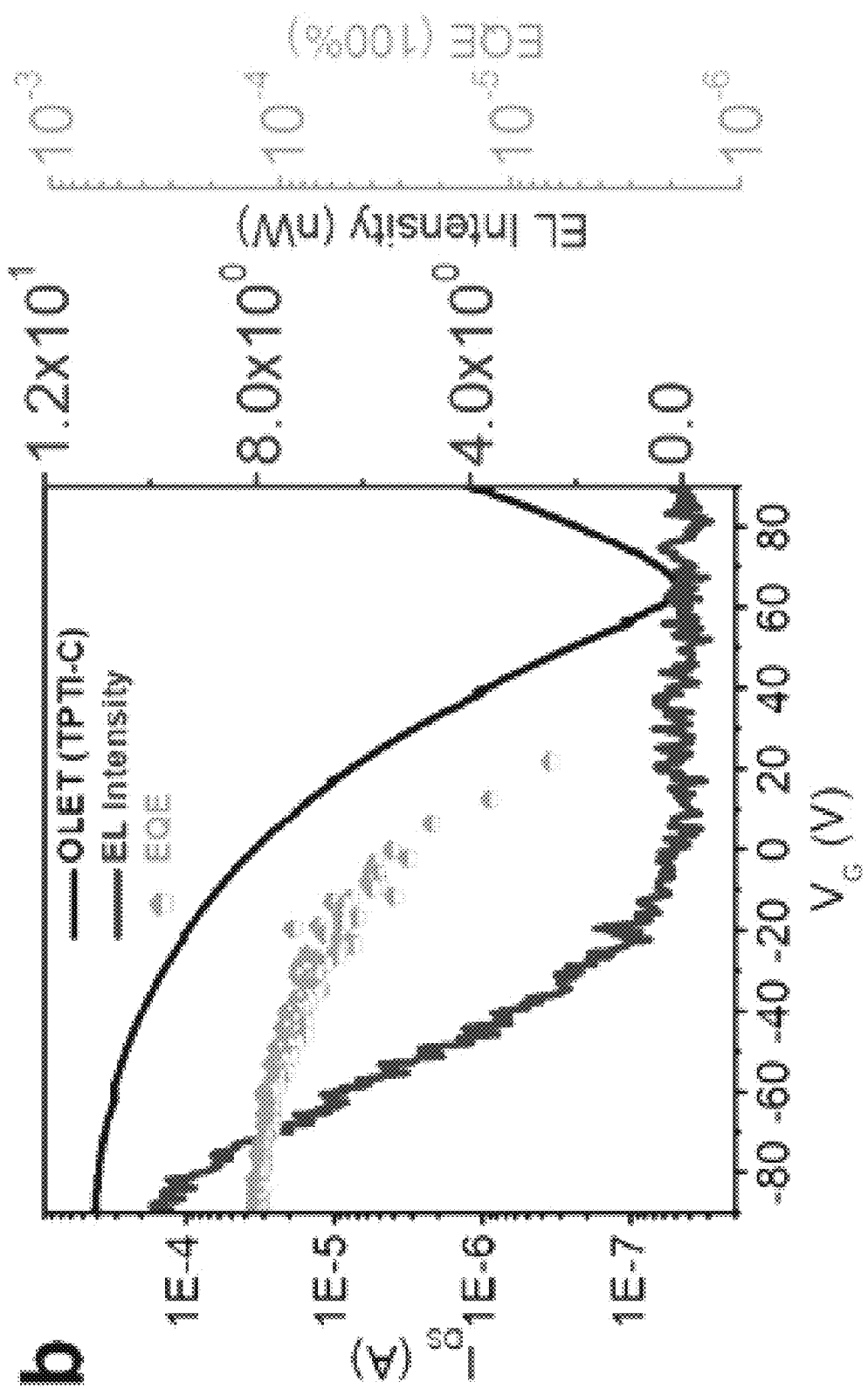
FIG. 15B is an exemplary embodiment of source-drain current, $I_{DS}$ (black), electroluminescent (EL) intensity (blue), and EQE (orange) change with gate voltages of OTS modified OLET devices: TPTI-C, Vps=90 V in accordance with the present disclosure.
Figure 15C:
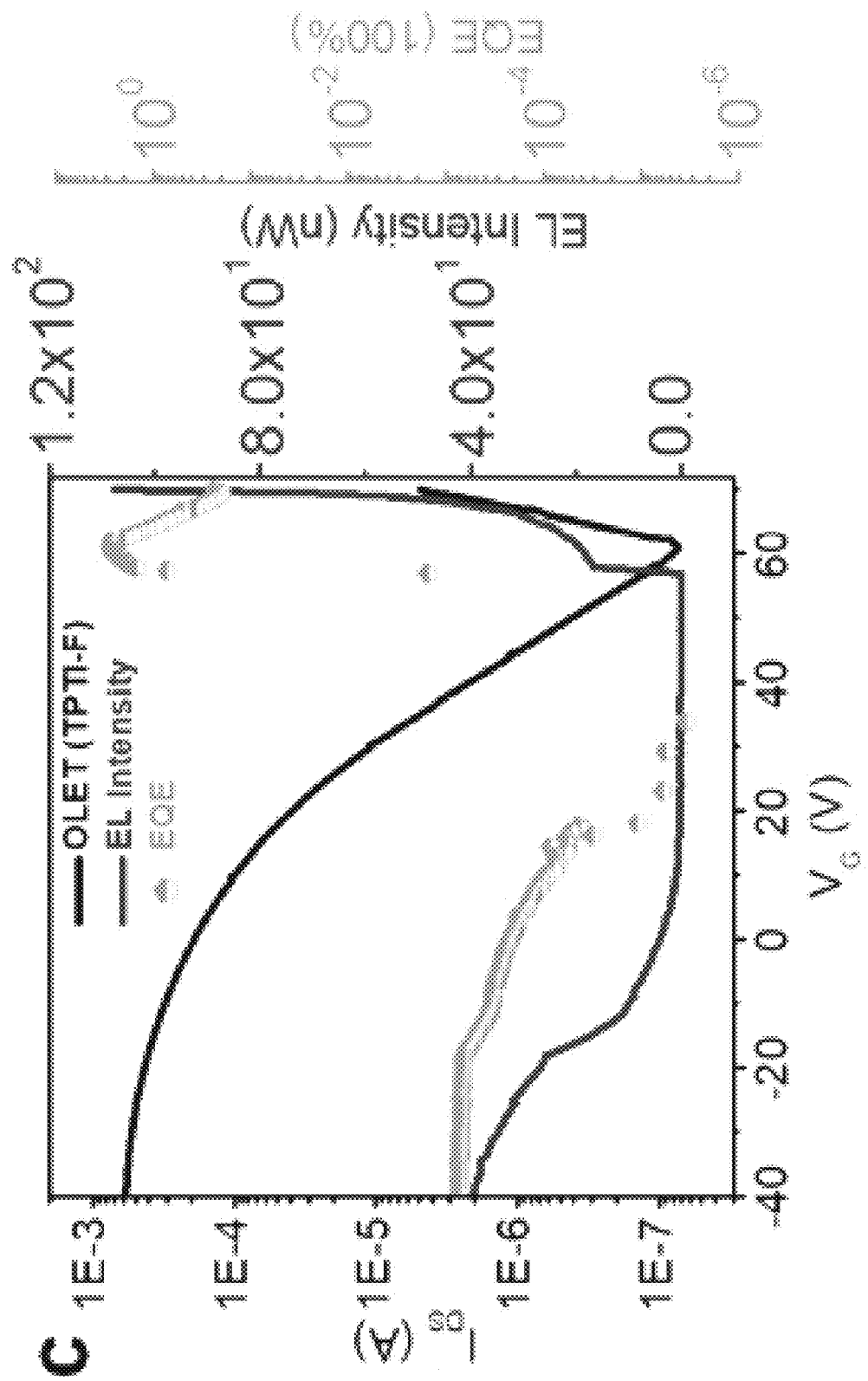
FIG. 15C is an exemplary embodiment of source-drain current, $I_{DS}$ (black), electroluminescent (EL) intensity (blue), and EQE (orange) change with gate voltages of OTS modified OLET devices: TPTI-F, $V_{DS}$=70 V in accordance with the present disclosure.
Figure 16A:
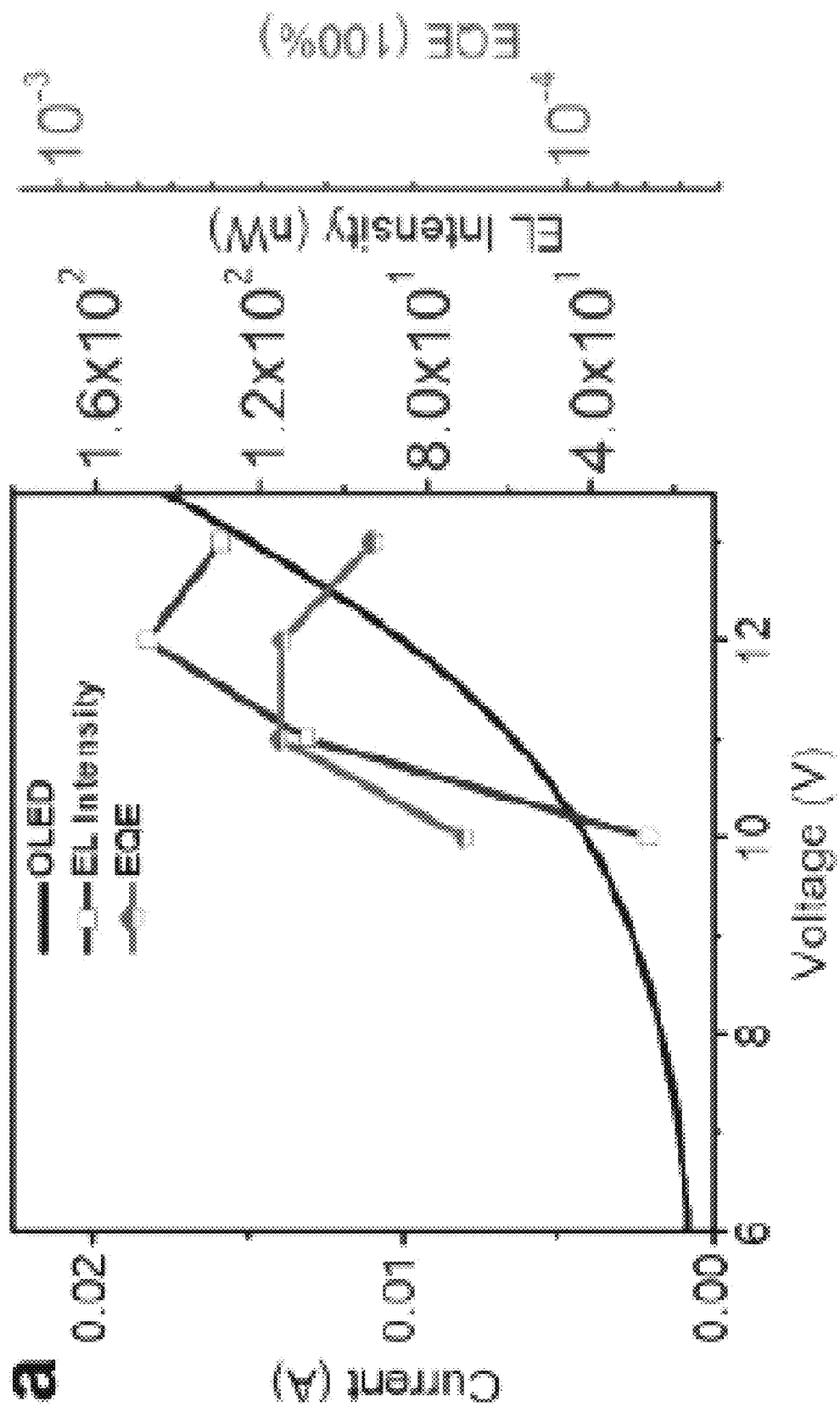
FIG. 16A is an exemplary embodiment of the tri-layer OLED I-V current, electroluminescent output power (EL intensity) and EQE change with voltage TPTI-CC in accordance with the present disclosure.
Figure 16B:
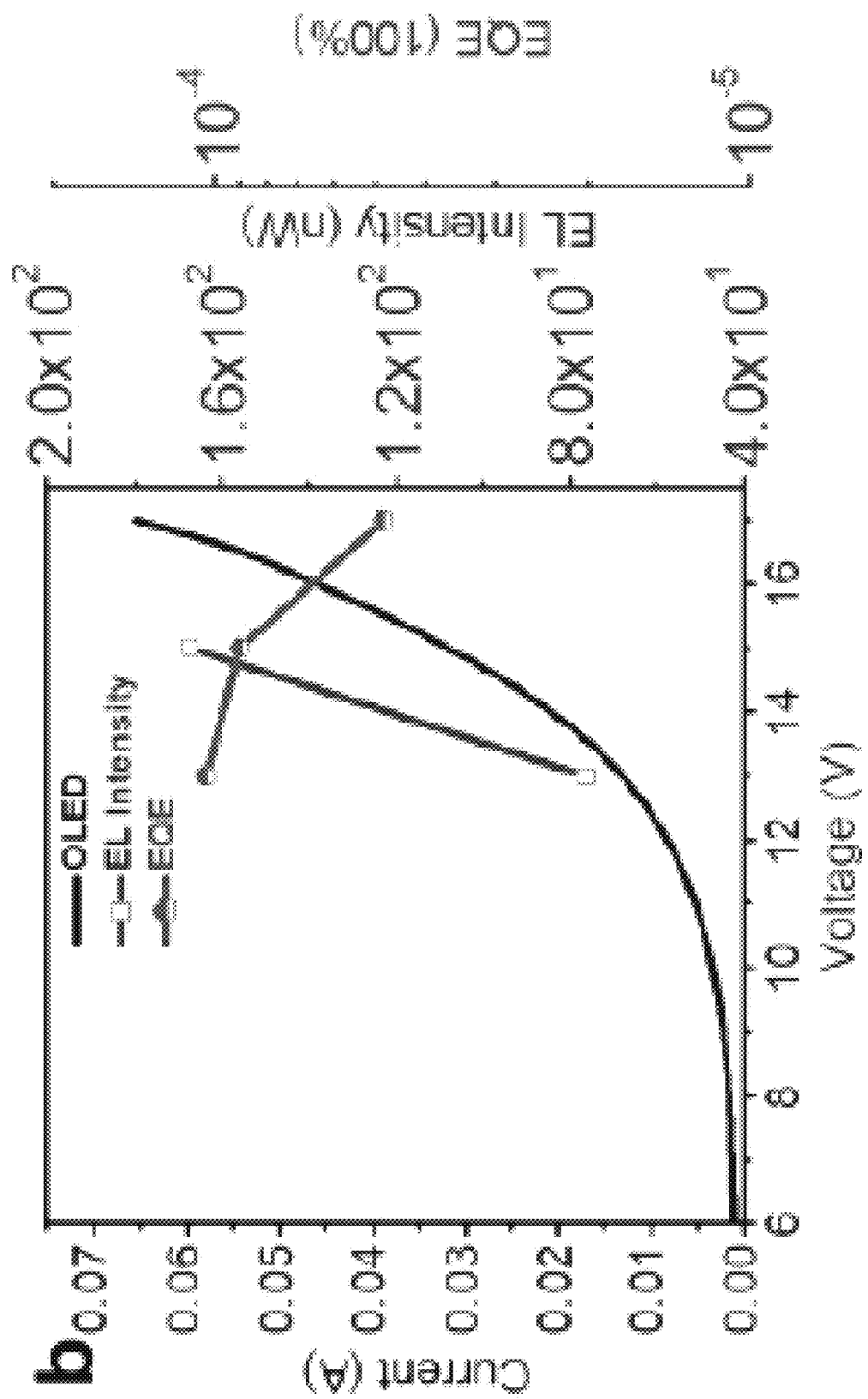
FIG. 16B is an exemplary embodiment of the tri-layer OLED I-V current, electroluminescent output power (EL intensity) and EQE change with voltage TPTI-C in accordance with the present disclosure.
Figure 16C:
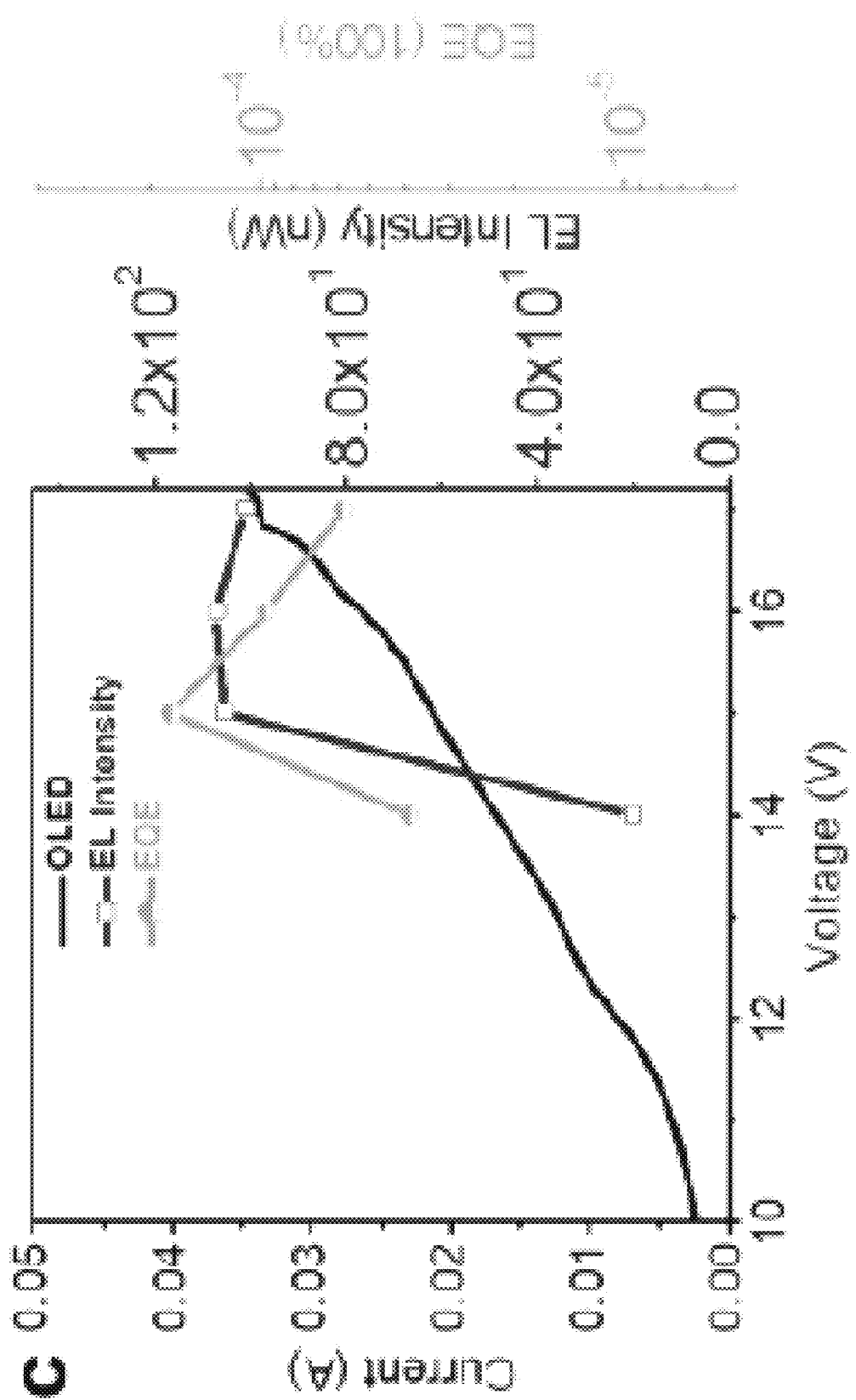
FIG. 16C is an exemplary embodiment of the tri-layer OLED I-V current, electroluminescent output power (EL intensity) and EQE change with voltage TPTI-F in accordance with the present disclosure.

A photodetector was used to measure the photocurrent and calculated the electroluminescent outpower (EL intensity) and EQE of these OLET devices, after calibrating with OLED of the same material.[20,24] As shown in FIG. 15A, the EL intensity for TPTI-CC increase from 0.5 nW (V$_G$=-20 V) to 26 nW (V$_G$=-65 V), which is consistent with device switching-on at -20 V and increased emission intensity as V$_G$ is increased. From V$_G$=55 to 70 V, the EL intensity increases significantly from 4 to 153 nW, which is comparable to the vacuum-deposited tri-layered OLET device.[24] Based on the number of photons and electrons from drain-source current, the EQE of TPTI-CC was calculated, as shown in FIG. 15A as a function of V$_G$. The highest EQE was determined to be 0.56% at low applied voltages: V$_G$=59 V and VD$_{DS}$=70 V. In contrast with TPTI-CC, a relatively lower EL intensity (9 nW at V$_G$=-80 V) is obtained in TPTI-C (FIG. 15B), though a larger voltage is applied. The large drain-source current and a lower photon count makes the EQE of TPTI-C (0.00013%) at V$_G$=-80 V and V$_{DS}$=90 V, 3 orders of magnitude lower than that of TPTI-CC. As shown in FIG. 15C, the EL intensity of TPTI-F increases from 0.07 nW (V$_G$=35 V) to 40 nW (V$_G$=-40 V). From V$_G$=58 to 70 V, the EL intensity increased significantly from 16.9 to 108 nW. The EQE of TPTI-F was calculated as shown in FIG. 15C. The highest EQE was determined to be 2.8% at low applied voltages: V$_G$=62 V and V$_{DS}$=70 V, which is five times higher than that of TPTI-CC. Notably, more than 1000 times higher EQE are achieved in OLET in comparison with the corresponding tri-layer OLED (ITO/PEDOT:PSS/DPP-DTT/emissive layer/PFN$^+$ BIm$_4^-$ Ca/Al) as shown in FIG. 16A-C, which demonstrate the great potential in tri-layered OLETs for flexible organic electronic devices.

The low performance of TPTI-C may be attributed to the weak crystallinity and poor charge transporting property due to its coiled structure, which limits the transport and recombination of charge carriers in the TPTI-C emissive layer. Moreover, significantly low PLQY in TPTI-C also results in low EQE. In comparison, the planar molecular backbone, strong crystallinity and matched energy level of TPTI-CC will facilitate the injection of charge carriers from the electrodes and allow their recombination in the emissive layer. However, the intrinsically low PLQY in TPTI-CC and unbalanced charge mobility on OTS modified OLET devices leads to the relatively lower EQE in comparison with TPTI-F.

Conclusions

Three semi-ladder-type copolymers were designed and synthesized: TPTI-CC, TPTI-C, and TPTI-F. The structural variations in TPTI-CC, TPTI-C, and TPTI-F dictates their different aggregation states and electronic effects. These three polymers exhibit good emission, suitable energy levels, and decent FET behavior. By carefully selecting the electron injection, charge transporting and modification layers, high-performance solution-processed tri-layered OLETs were prepared. The high PLQY in TPTI-F and balanced electron and hole mobility of 0.046 and 0.044 cm$^2$ V$^{-1}$ s$^{-1}$ obtained in TPTI-F based tri-layered OLET devices, contribute to an EQE as high as 2.8% even at a relatively low voltages (V$_G$=62 V and V$_{DS}$=70 V). Further improvement of the intrinsically charge mobility in TPTI-F without sacrifice of PLQY through molecular engineering, should lead to higher device performance.

Exemplary Materials and Methods

The following materials and methods are exemplary in nature, and the present disclosure is not limited the specific materials and methods described in this section.

Fabrication of OLET Devices. Devices were assembled in bottom gate top contact (BG-TC) configuration. B doped silicon wafers with 300 nm silicon nitride were purchased from University Wafers and used as substrates. Wafers were cut into 14×19 mm slides and ultrasonicated in acetone and isopropanol for 15 min each. After that they were dried using compressed dry nitrogen. Silicon wafers were modified with octadecyltrichlorosilane (OTS). For OTS modification, silicon wafers were put in glass Petri dish and one drop of OTS were added. It was kept in vacuum oven at 120° C. for 1 h. The solution of DPP-DTT was spin-coated on rotating substrate at 1500 rpm/60 s and annealed at 120° C. for 30 min in glovebox. Active layer polymers were dissolved in p-xylene with the concentration 10 mg mL$^{-1}$ and spin-coated on DPP-DTT at 2000 rpm for 40 s. Polymer films were annealed at 120° C. for 30 min in glovebox. PFN$^+$BIm$_4$ was dissolved in methanol with the concentration of 2 mg mL$^{-1}$. After filtration, PFN$^+$ BIm$_4$- was spin-coated on active layer at 7000 rpm for 30 s. Polymer films were annealed at 60° C. for 20 min in air and transferred back to glovebox for thermal deposition of source-drain electrodes. Thirty nm of gold was deposited in vacuum chamber under pressure <10$^{-6}$ Torr through a shadow mask purchased from Ossila Ltd.

Characterization of OLET Devices. All devices were tested in nitrogen glovebox in dark. Two-channel SMU Keithley 2612A was used to test output and transfer characteristics of devices. Electro-luminescence spectra of emissive polymers were obtained from OLED devices. The structure of the OLED devices was ITO/PEDOT:PSS/DPP-DTT/emissive layer/PFN+BIm4−/Ca/Al. ITO glasses were ultrasonicated in chloroform, acetone and isopropanol for 15 min each and dried using compressed nitrogen. Glasses were leaned in UV/ozone for 20 min. PEDOT:PSS from Heraeus was spin-coated on ITO at 6000 rpm for 60 s and annealed in vacuum oven at 95° C. A solution of emissive layer in p-xylene with the concentration 12 mg mL$^{-1}$ was spin-coated on PEDOT:PSS at 1500 rpm for 30 s and annealed at 100° C. for 30 min in glovebox. Then 20 nm calcium and 80 nm aluminum were thermally evaporated in vacuum chamber under pressure <10$^{-6}$ Ton through a shadow mask that defined the device area of 3.14 mm2. Electroluminescence spectra of these OLEDs were measured using a calibrated integrating sphere AvaSphere-50-IRRAD and AvaSpec-ULS2048 spectrometer from Avantes and source meter unit Keithley 2420 to drive OLED.

EQE Measurements. In order to measure EQE of OLET devices a modified method was used as previously described elsewhere. The photodiode FDS100-CAL purchased from Thorlabs was calibrated with OLED of known irradiance based on the same emissive layer as OLET. The irradiance of OLED was measured using calibrated integrating sphere AvaSphere-50-IRRAD and AvaSpec-ULS2048 spectrometer. Photocurrent from the calibrated photodiode placed right in front of the operating device was used to calculate brightness of OLET devices and based on it calculate photon flux. Lambertian emission was assumed. The number of electrons injected in the device was calculated from source drain current. EQE was calculated as the ratio of photon flux to the number of injected electrons per second.

GIWAXS Analysis. The GIWAXS measurements were performed at 8ID-E beamline of Advanced Photon source Argonne National Laboratory with the radiation wavelength 1.1354 A. Samples were prepared on polished silicon wafer covered with PEDOT: PSS. The same solvent and annealing mode were used as in the actual device fabrication process.

Synthesis of Semiladder Copolymers

General Procedure—A mixture of Br-TPTI-Br monomer (1 equiv) and carbazole/fluorene co-monomer (1 equiv), K$_2$CO$_3$ (4 equiv), Aliquat 336 (3 drops), and Pd(PPh$_3$)$_4$ (0.05 equiv) were dissolved in 4 mL of toluene/H$_2$O (10:1). The mixture was degassed for 30 min and then refluxed for 72 h. After cooling to room temperature, the mixture was passed through Celite and precipitated in methanol. The polymer fibers were then washed by Soxhlet extraction with methanol, acetone, hexanes, and chloroform. The final polymer was obtained after re-precipitation of chloroform fraction in methanol.

TPTI-CC—A mixture of Br-TPTI-Br (0.200 g, 0.244 mmol), PinB-CC-BPin (0.130 g, 0.244 mmol), K$_2$CO$_3$ (0.135 g, 0.977 mmol), Aliquat 336 (3 drops), and Pd(PPh$_3$)4 (0.014 g, 0.012 mmol) were dissolved in 6 mL of toluene/H$_2$O (10:1). The mixture was degassed for 30 min and then refluxed for 72 h. After cooling to room temperature, the mixture was added to methanol. The precipitate was dissolved in chloroform and filtered with Celite. The polymer fibers were then washed by Soxhlet extraction with methanol, acetone, hexanes, and chloroform. The final polymer was obtained after re-precipitation in methanol as red solid. Yield: 89%. $^1$H NMR (500 MH$_Z$, C$_2$D$_2$Cl$_4$): δ (ppm) 6.6-9.0 (br, 10H), 3.60-4.85 (br, 6H), 2.0-2.35 (br, 3H), 1.15-1.75 (m, 40H), 0.72-1.11 (m, 18H). Elemental Analysis calculated for [C$_{60}$H$_{79}$N$_3$O$_2$S$_2$]n: C: 76.79; H: 8.49; N: 4.48. Found: C: 75.39; H: 8.17; N: 4.13.

TPTI-C—A mixture of Br-TPTI-Br (0.200 g, 0.244 mmol), PinB-C-BPin (0.130 g, 0.244 mmol), K2CO3 (0.135 g, 0.977 mmol), Aliquat 336 (3 drops), and Pd(PPh$_3$)$_4$ (0.014 g, 0.012 mmol) were dissolved in 6 mL of toluene/H$_2$O (10:1). The mixture was degassed for 30 min and then refluxed for 72 h. After cooling to room temperature, the mixture was added to methanol. The precipitate was dissolved in chloroform and filtered with Celite. The polymer fibers were then washed by Soxhlet extraction with methanol, acetone, hexanes, and chloroform. The final polymer was obtained after re-precipitation in methanol as red solid. Yield: 88%. $^1$H NMR (500 MH$_Z$, C$_2$D$_2$Cl$_4$): (ppm) 6.6-9.0 (br, 10H), 3.50-5.20 (br, 6H), 1.98-2.34 (br, 3H), 1.16-1.74 (m, 40H), 0.72-1.11 (m, 18H). Elemental Analysis calculated for [C$_{60}$H$_{29}$N$_3$O$_2$S$_2$]n: C: 76.79; H: 8.49; N: 4.48. Found: C: 75.46; H: 8.47; N: 4.28.

TPTI-F—A mixture of Br-TPTI-Br (0.200 g, 0.244 mmol), PinB-F-BPin (0.157 g, 0.244 mmol), K$_2$CO$_3$ (0.135 g, 0.977 mmol), Aliquat 336 (3 drops), and Pd(PPh$_3$)$_4$ (0.014 g, 0.012 mmol) were dissolved in 6 mL of toluene/H$_2$O (10:1). The mixture was degassed for 30 min and then refluxed for 72 h. After cooling to room temperature, the mixture was added to methanol. The precipitate was dissolved in chloroform and filtered with Celite. The polymer fibers were then washed by Soxhlet extraction with methanol, acetone, hexanes, and chloroform. The final polymer was obtained after re-precipitation in methanol as orange solid. (yield: 82%). $^1$H NMR (500 MH$_Z$, CDCl$_3$): δ (ppm) 8.92 (s, 2H) 7.30-8.01 (br, 8H), 4.33 (br, 4H), 2.14 (br, 6H), 1.20-1.51 (m, 32H), 0.61-1.05 (m, 42H). Elemental Analysis calculated for [C$_{69}$H$_{96}$N$_2$O$_2$S$_2$]n: C: 78.96; H: 9.22; N: 2.67. Found: C: 77.63; H: 9.06; N: 2.69.

Example 2: Foldable Semi-Ladder Polymers: Novel Aggregation Behavior and High-Performance Solution-Processed Organic Light-Emitting Transistors A critical issue in developing high-performance organic light-emitting transistors (OLETs) is to balance the trade-off between charge transport and light emission in a semiconducting material. Although traditional materials for organic light-emitting diodes (OLEDs) or organic field-effect transistors (OFETs) have shown modest performance in OLET devices, design strategies towards high-performance OLET materials and the crucial structure—performance relationship remain unclear. Developing cross-conjugated weak acceptor-weak donor copolymers for luminescent properties as disclosed herein lead to an unintentional discovery that these copolymers form coiled foldamers with intramolecular H-aggregation, leading to their exceptional OLET properties. An impressive external quantum efficiency (EQE) of 6.9% in solution-processed multi-layer OLET devices was achieved.

Introduction

Great research efforts have been shown in the interconversion of light and electricity in the area of organic conjugated polymers. The conversion of photons to electrons takes place in photovoltaic devices and photodetectors, and have been actively pursued. The reverse process, converting electrons to photons, occurs in organic light-emitting diodes (OLED), which have been commercialized and are now widely used in lighting and display applications. Accompanying the development of OLEDs, organic light-emitting transistors (OLET) emerged as a new class of organic optoelectronic devices that combine both the electrical switching functionality of organic field-effect transistors (OFETs) and the light-generation capability of OLEDs in a single device. The OLETs, therefore, offer the potential for simplifying circuit design in the electro-luminescent displays, electrically pumped organic lasers, and digital displays. However, the requirements of organic semiconductors for OLET based applications are more stringent than those of OLED active materials. They include balanced high ambipolar mobility and high photoluminescent quantum yield (PLQY) simultaneously in the same material, which are usually not compatible and difficult to realize. Current OLET devices are based on the traditional fluorescent semiconductors already used in OLEDs or OFETs. Their performances are relatively poor as they do not satisfy the stringent requirements as mentioned above.

To address this issue, multi-layer OLET devices that delegate different functions such as charge transport, charge injection, and emission into different materials are being developed. p-type small-molecule semi-conductor, 5,5'''-dihexyl-2,2':5',2'':5'',2'''-quaterthiophene (DH-4T) and n-type fluorine-substituted DFH-4T have been used as transporting layers, and host tris(8-hydroxyquinolinato)aluminum ($Alq_3$) and guest 4-(dicyanomethylene)-2-methyl-6-(p-dimethylaminos-tyryl)-4H-pyran (DCM) as emissive layer. This tri-layered OLET device showed a good match of energy levels and balanced charge mobility, which resulted in external quantum efficiency (EQE) as high as 5%, nearly 100 times higher than the corresponding OLED. A thermally activated delayed fluorescence small-molecule semiconductor and high-k polymer-based dielectric layer have also been used to construct a tri-layered OLET through vacuum-deposition in which an impressive EQE of 9.01% was obtained.

However, the fabrication of devices mentioned above require sophisticated vacuum deposition of multiple layers of small-molecule materials and is not compatible with polymeric materials and the modern printing electronics industry. Multiple layers formed in solution-processed tri-layered OLETs are obtained by spin-coating, in which materials used must be soluble in orthogonal solvents to avoid re-dissolution. This requirement significantly limits the choice of available materials and thus the performance of resulting OLETs is relatively poor (EQE<1%).18 Detailed studies lead us to realize that new material systems for high-performance OLETs require not only suitable energy levels, luminescent quantum yields and charge mobility, but also the correct aggregation state. A semi-ladder polymer system is described herein aimed at addressing these issues and obtaining efficient solution-processed multi-layered OLETs. These polymers are designed based on the idea that ring fusion in ladder building block can enhance rigidity in the molecular system, which will minimize the non-radiative decay and thus improve PLQY. Detailed studies demonstrated that semi-ladder polymers forming H-aggregated and folded structures can balance the PLQY and charge transport. The H-aggregation exhibit limited p-p inter-action between chromophores, yet enough to achieve effective charge transport. The resulting OLETs thus outperform those fabricated from traditional linear conjugated polymers.

Results and Discussion

Figure 17A:
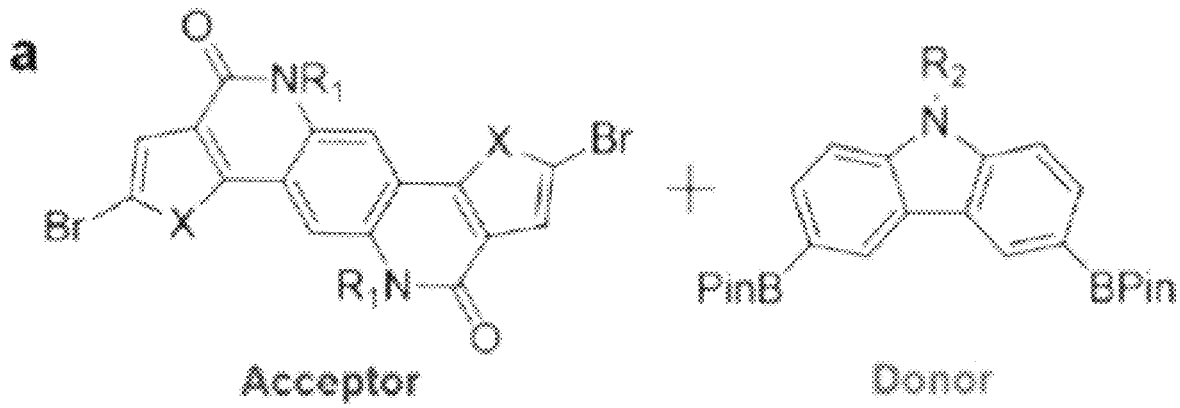
FIG. 17A is an exemplary embodiment of donor-acceptor building blocks, polymerization method, and electron resonant structures in accordance with the present disclosure.
Figure 17A:
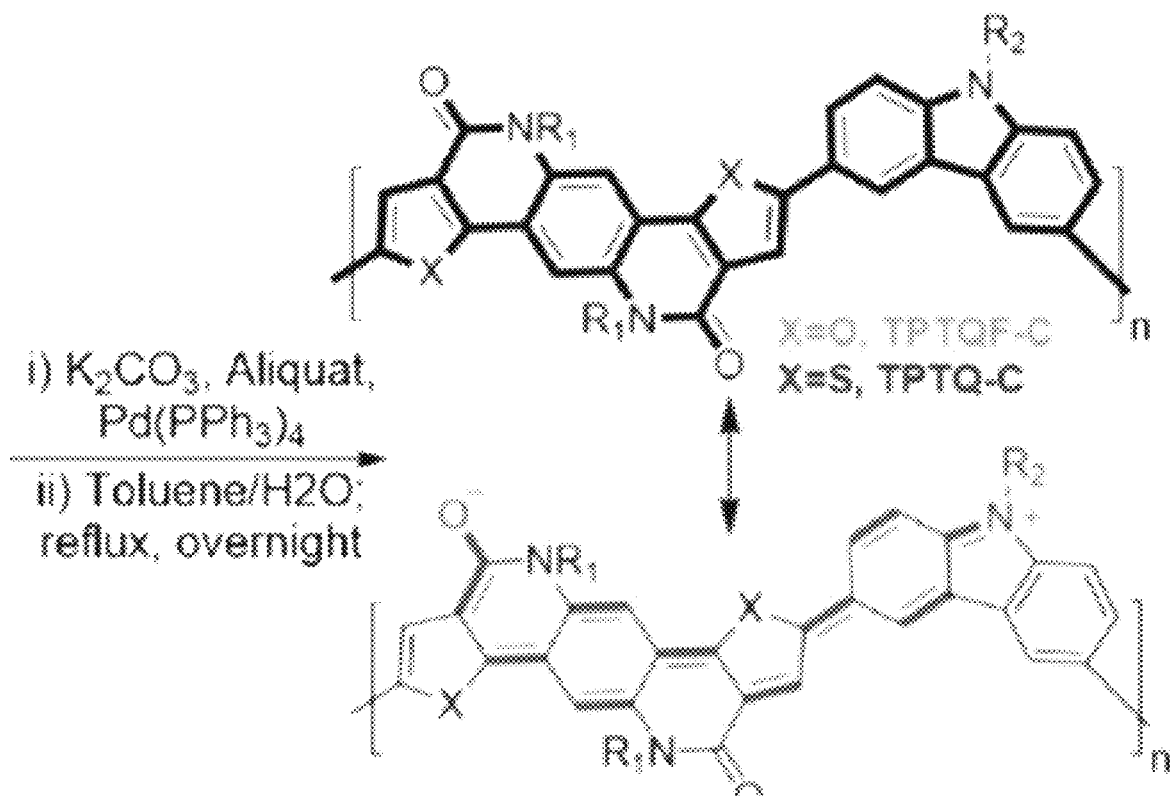
Figure 17B:
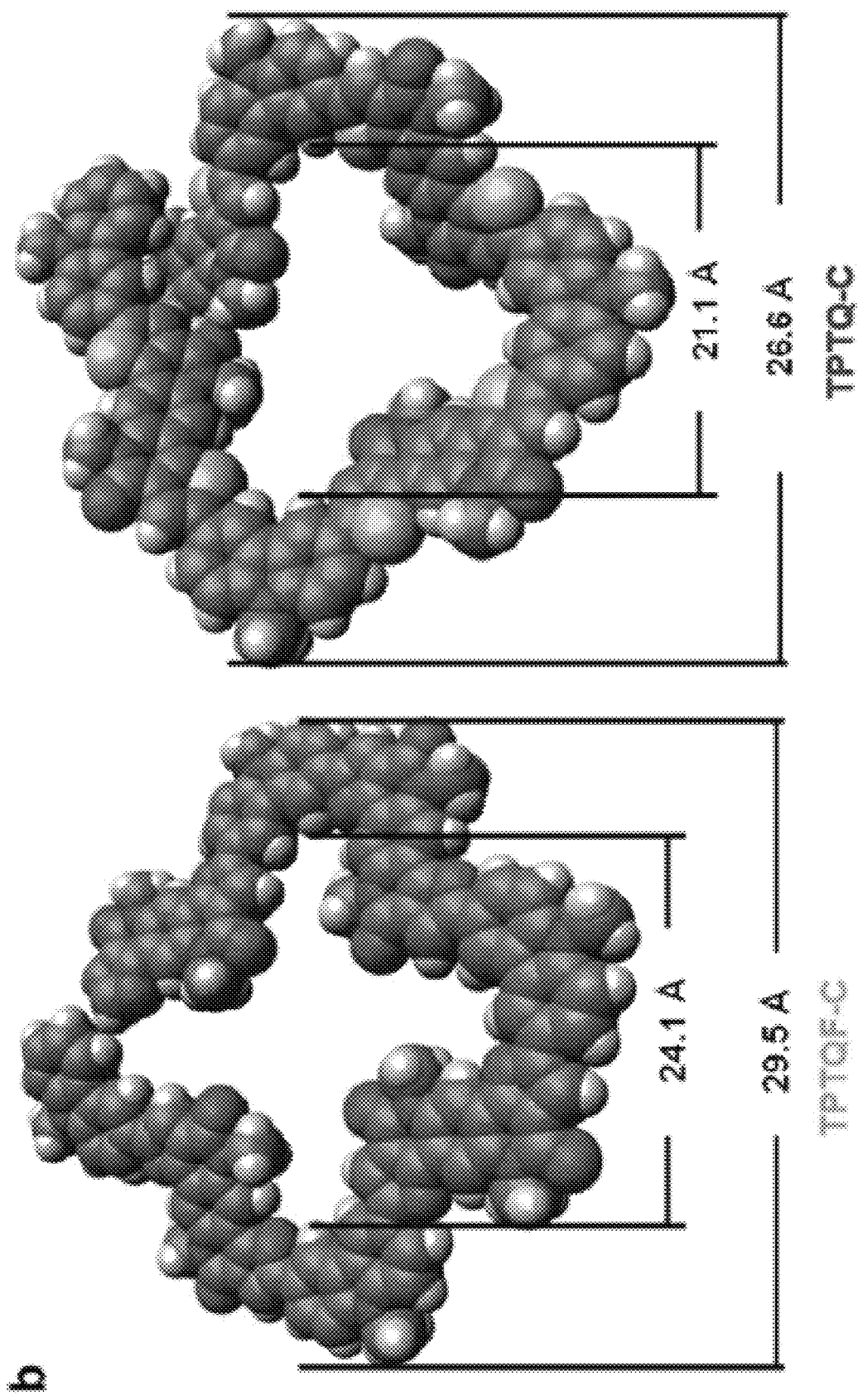
FIG. 17B is an exemplary embodiment of optimized molecular structures and size of the two coiled semi-ladder polymers in accordance with the present disclosure. DFT calculation B3LYP method, 6-31g** basis set.
Figure 18:
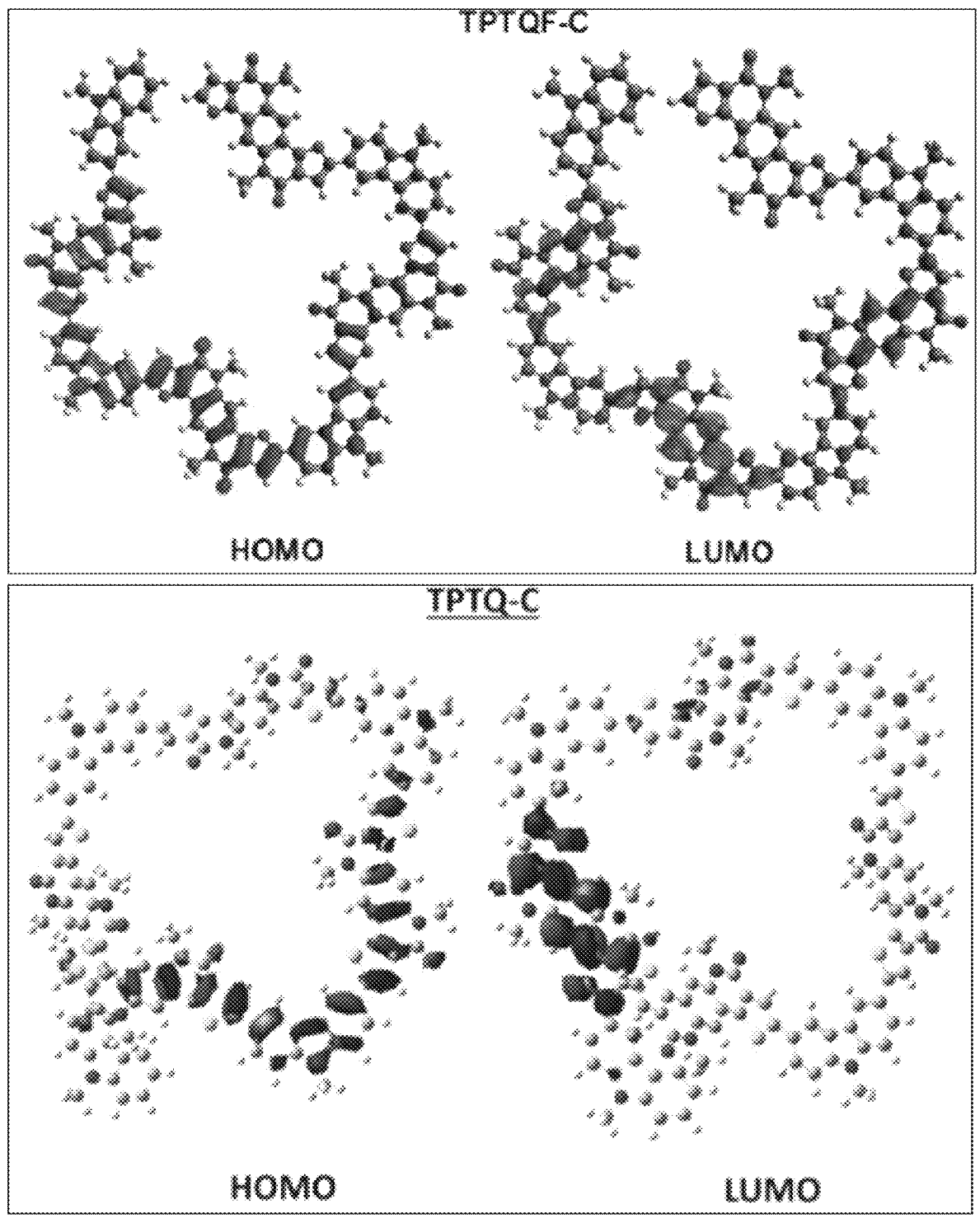
FIG. 18 is an exemplary embodiment of HOMO/LUMO energy level for the cross conjugated semi-ladder polymers (DFT optimized geometries with four repeating units) in accordance with the present disclosure.
Figure 19:
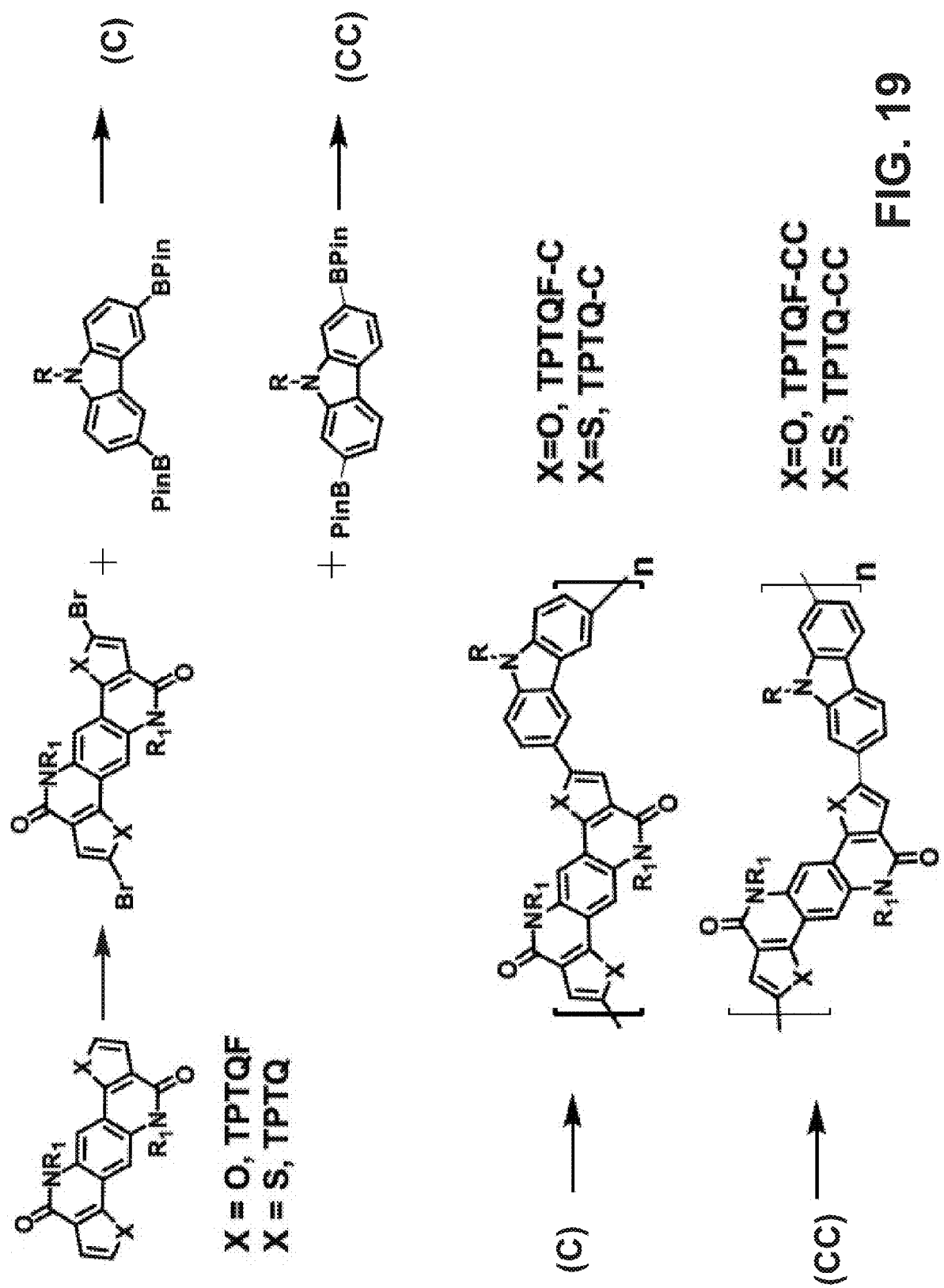
FIG. 19 is an exemplary embodiment of a reaction scheme illustrating synthesis of monomers and polymers in accordance with the present disclosure.
Figure 20A:
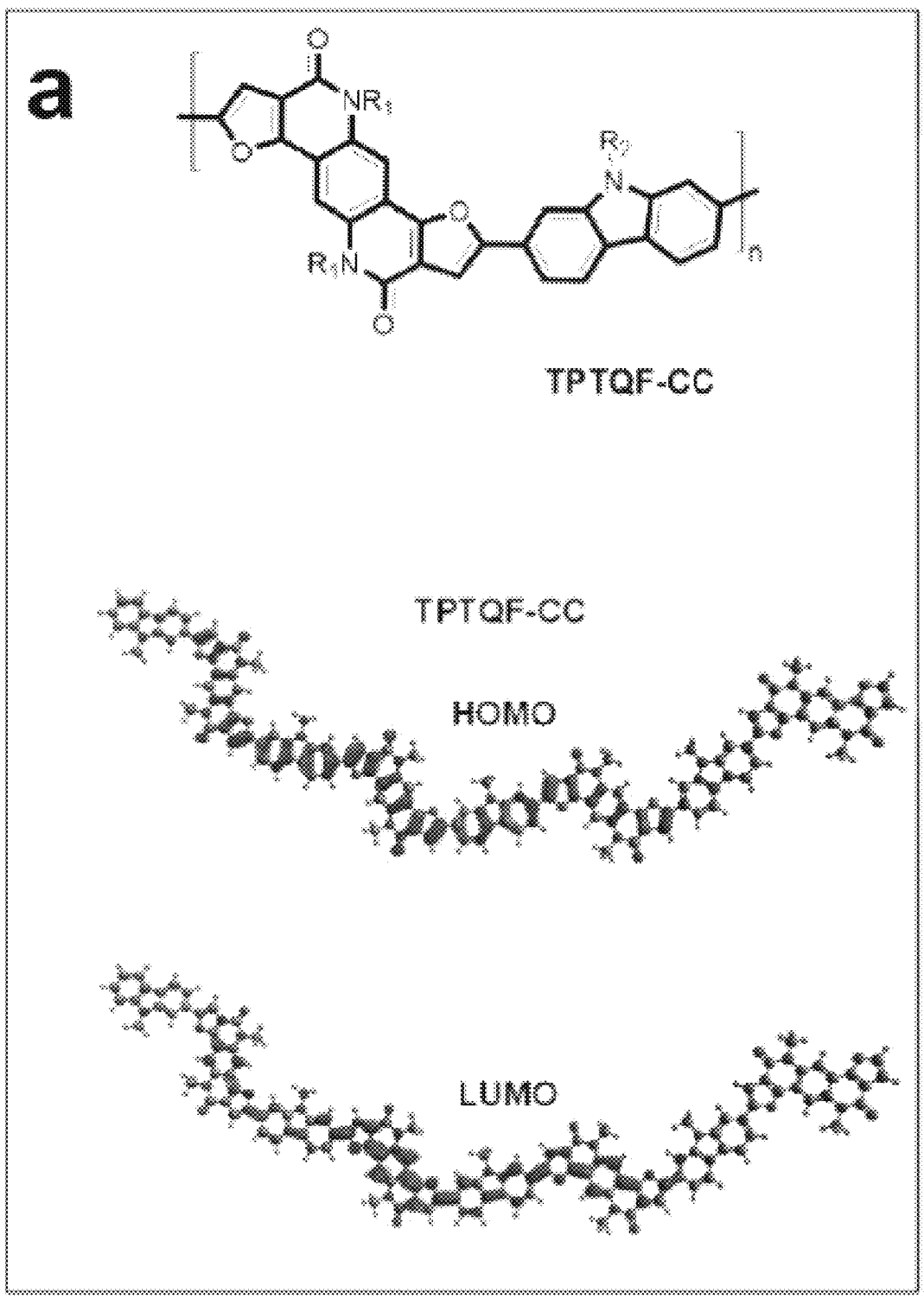
FIG. 20A is an exemplary embodiment of chemical structures and HOMO/LUMO energy levels of the linear polymers for TPTQF-CC in accordance with the present disclosure.
Figure 20B:
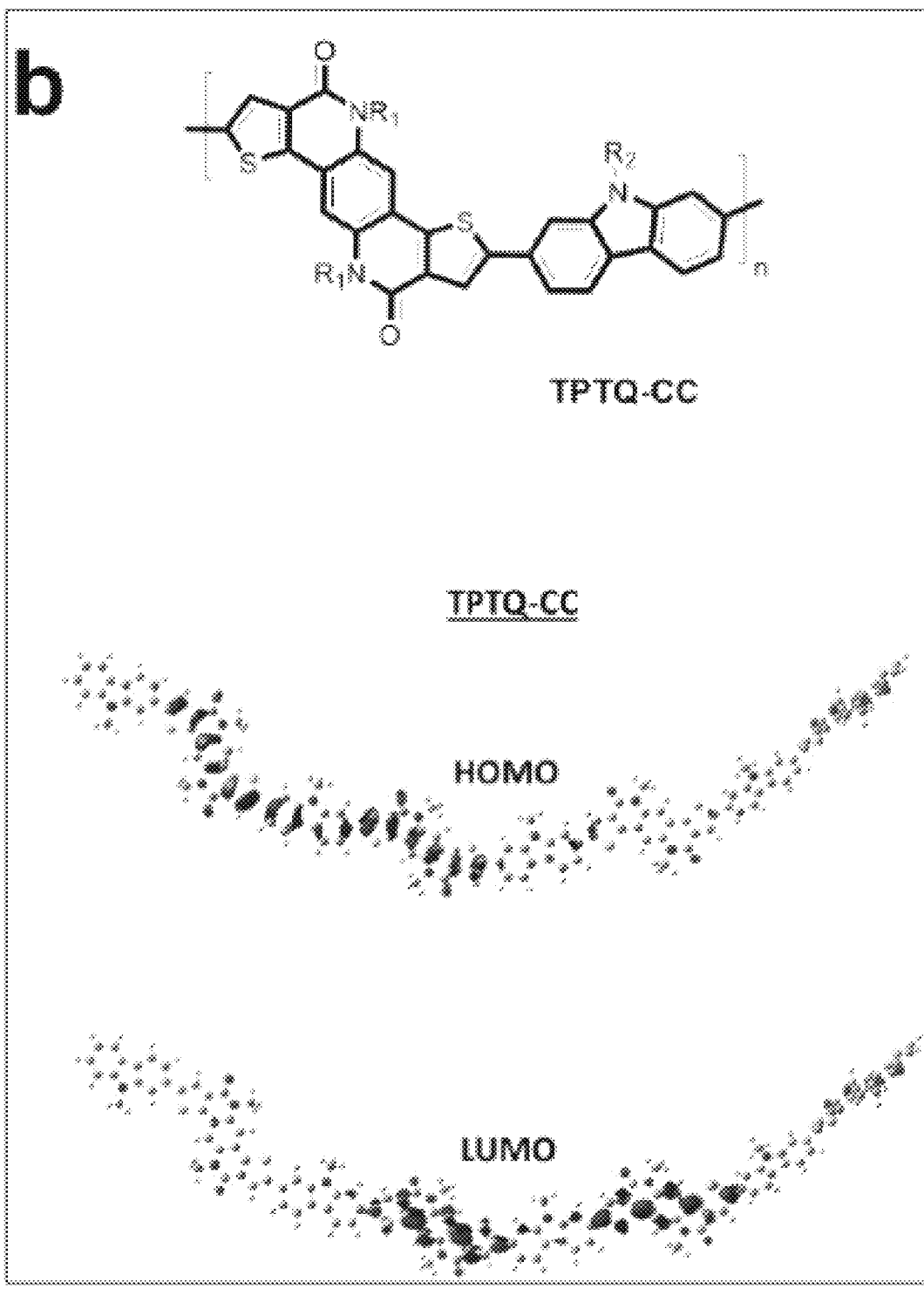
FIG. 20B is an exemplary embodiment of chemical structures and HOMO/LUMO energy levels of the linear polymers for TPTQ-CC in accordance with the present disclosure. B3LYP method, 6-31g** basis set.

Synthesis and Chemical Properties. The semi-ladder polymers were synthesized via Suzuki coupling polymerization of electron-accepting monomer 5,11-bis(2-butyloctyl)-dihydrothieno[2',3':4,5]pyrido[2,3-g]thieno[3,2-c] quinoline-4,10-dione (TPTQ) or furo[3,2-c]furo[2',3':4,5]pyrido[2,3-g]quinoline-4,10-dione (TPTQF) dibromide with electron-donating chromophore carbazole (C) monomer containing bis(pinacolato)di-boron (BPin) moieties. The resulting polymers are cross-conjugated and exhibit excellent fluorescent properties (FIG. 17A). General synthetic procedures of the polymers is described herein below. These polymers exhibited sizable molecular weights and generally narrow polydispersity indices (PDI) as summarized in Table 5. TPTQ-C and TPTQF-C were soluble in common organic solvents such as p-xylene or chlorobenzene. The HOMO and LUMO energy levels of the polymers were calculated from the oxidation onset of cyclic voltammetry (CV) measurements and optical bandgap of thin films (Table 5). The replacement of thiophene on TPTQ with furan (TPTQF) leads to slightly higher HOMO and LUMO energy levels and larger bandgaps. TPTQF-C and TPTQ-C exhibit $E_{HOMO}/E_{LUMO}$ of −5.42/−3.04 eV, and −5.44/−3.19 eV, respectively. These energy levels are consistent with the energy levels calculated from the density functional theory (DFT) (B3LYP method, 6-31g** basis set) as shown in FIG. 18. Notably, TPTQ-C exhibited a lower PLQY (30%) than TPTQF-C (50%) which may be attributed to the heavy atom effect (sulfur versus oxygen) and will play an important role on device performance. For comparison, linear semi-ladder polymers, TPTQF-CC and TPTQ-CC were also synthesized as shown in FIG. 19 and their chemical properties were summarized in Table 5 and FIG. 20A-B. The optimized geometry obtained from DFT calculations indicated that the cross-conjugated connection makes both TPTQF-C and TPTQ-C coiled with sizes of cross-section around 24.1 Å/29.5 Å and 21.1 Å/26.6 Å respectively (FIG. 17B).

TABLE 5

Properties of the cross conjugated and linear semi-ladder polymers.

| Polymer | HOMO (eV) | LUMO (eV) | $E_g$ (eV) | PLQY (%) | $M_w$ | $M_n$ | PDI |
|---|---|---|---|---|---|---|---|
| TPTQF-C  | −5.42[a]/−4.90[b] | −3.04[c]/−1.92[b] | 2.98[b]/2.38[d] | 50 | 50863 | 28835 | 1.76 |
| TPTQ-C   | −5.44[a]/−5.03[b] | −3.19[c]/−2.41[b] | 2.62[b]/2.25[d] | 30 | 91767 | 32823 | 2.80 |
| TPTQF-CC | −5.48[a]/−5.06[b] | −3.07[c]/−1.92[b] | 2.83[b]/2.41[d] | 73 | 20407 | 14634 | 1.39 |
| TPTQ-CC  | −5.65[a]/−5.18[b] | −3.30[c]/−2.41[b] | 2.77[b]/2.35[d] | 15 | 9045  | 8764  | 1.03 |

[a] Calculated from oxidation onset of CV spectra.
[b] Calculated from DFT.
[c] $E_{LUMO} = E_{HOMO} + E_g^{film}$.
[d] Bandgap $E_g$ calculated from the onset of the film absorption spectra.

Figure 21A:
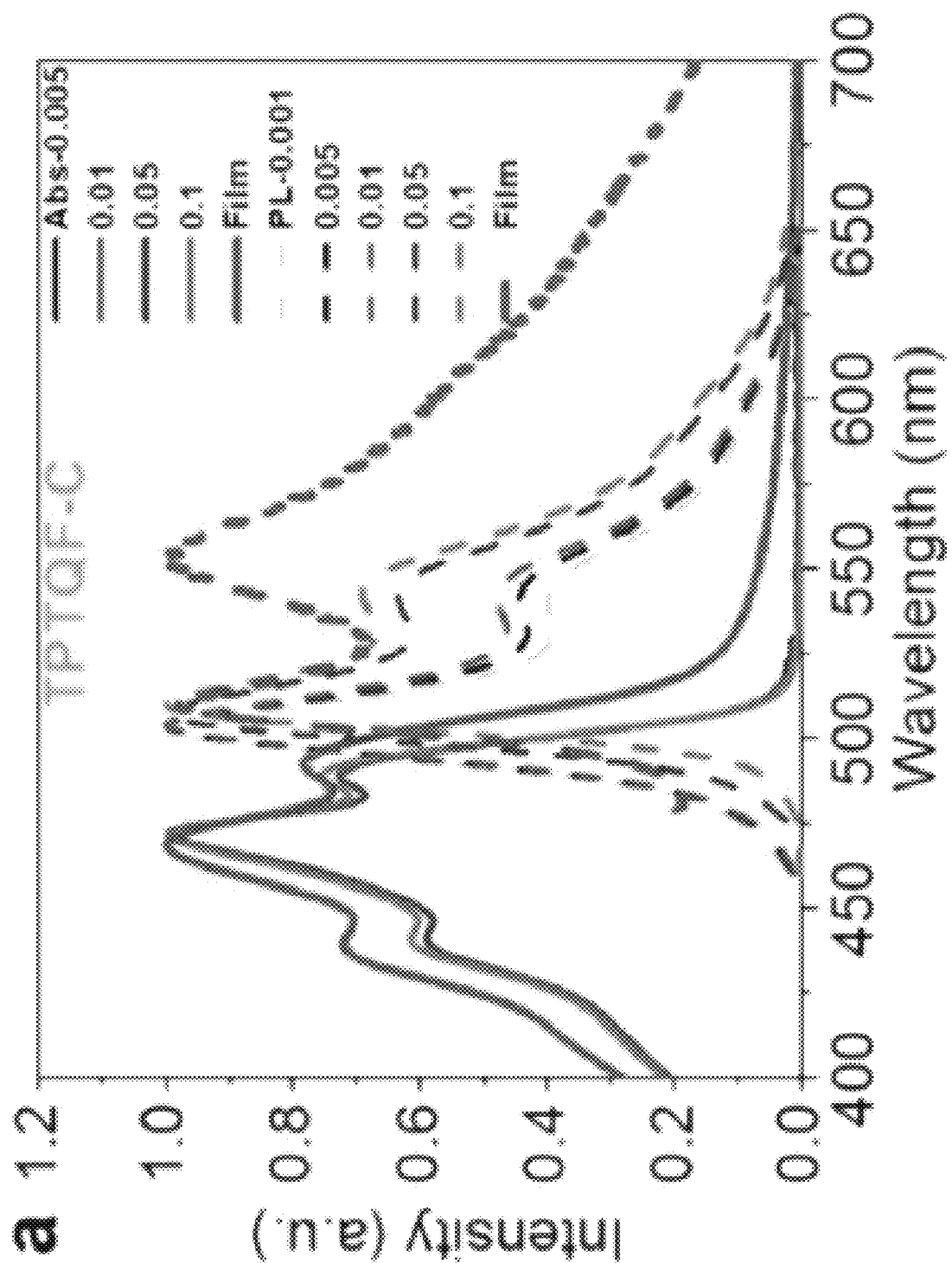
FIG. 21A is an exemplary embodiment of concentration-dependent (mg/mL) UV-vis absorption (Abs, solid line) and photoluminescence (PL, dotted line) spectra of TPTQF-C in accordance with the present disclosure.
Figure 21B:
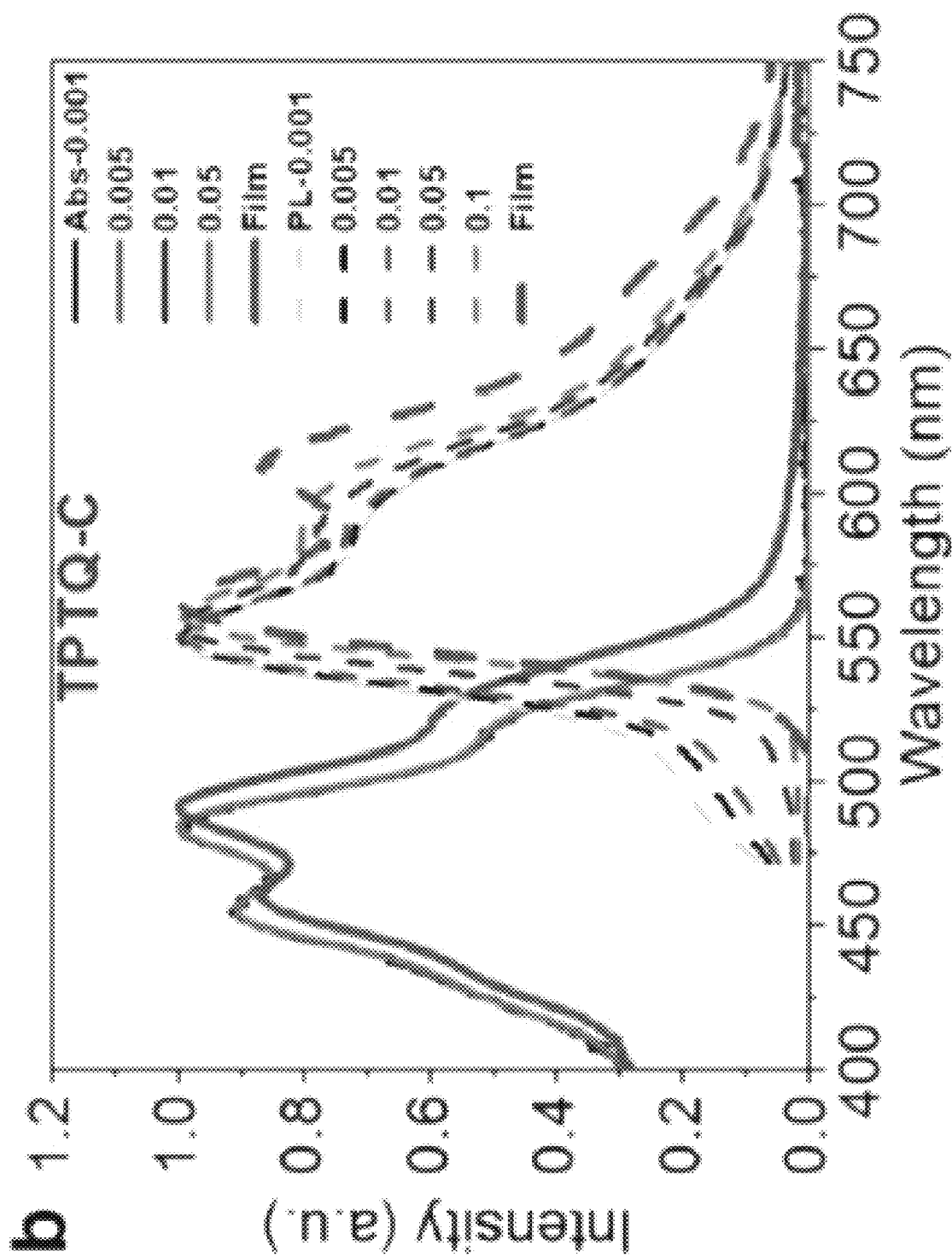
FIG. 21B is an exemplary embodiment of concentration-dependent (mg/mL) UV-vis absorption (Abs, solid line) and photoluminescence (PL, dotted line) spectra of TPTQ-C in accordance with the present disclosure.
Figure 22A:
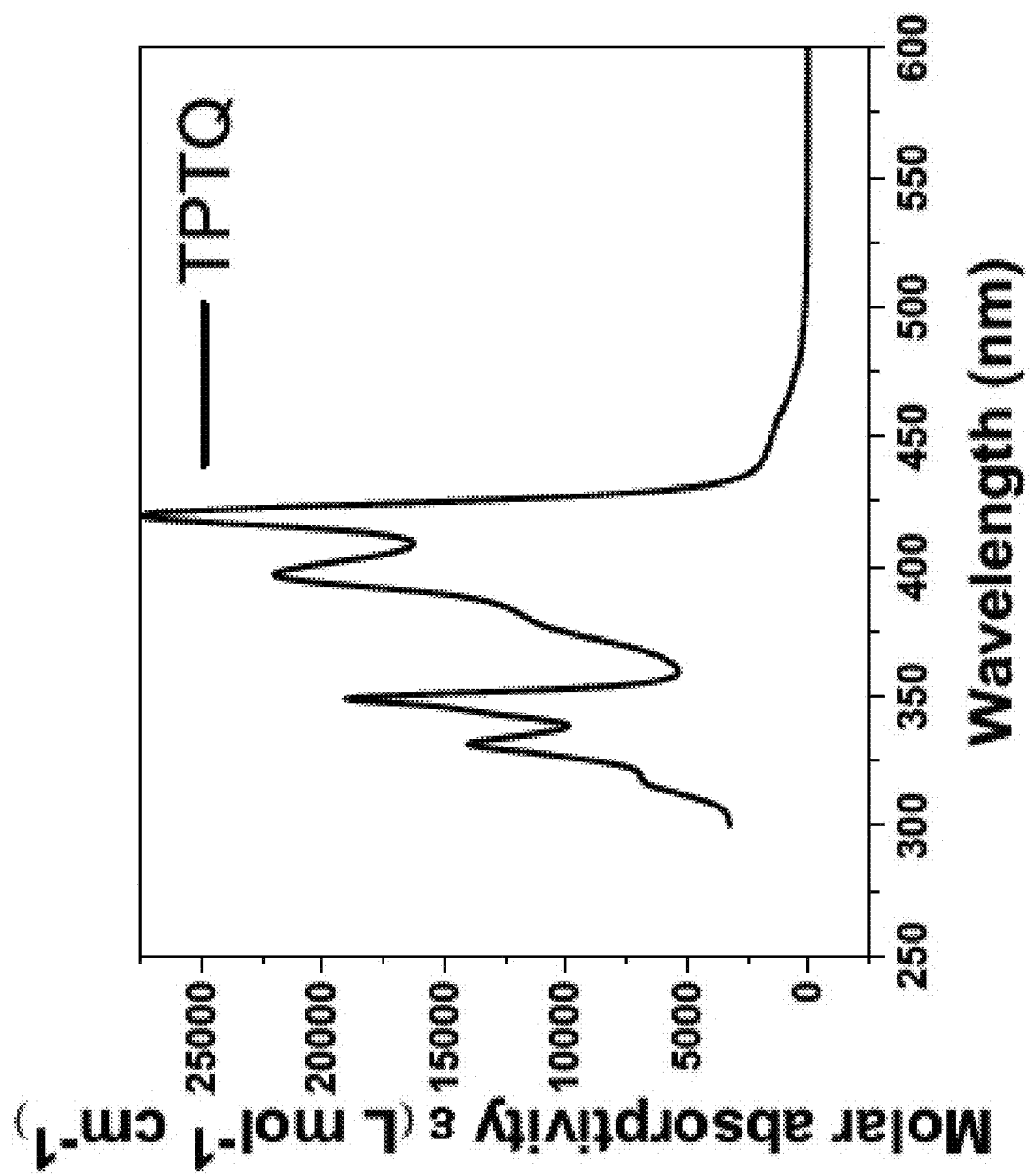
FIG. 22A is an exemplary embodiment of molar absorptivity spectra of 0.01 mg/mL solutions of TPTQ in accordance with the present disclosure.
Figure 22B:
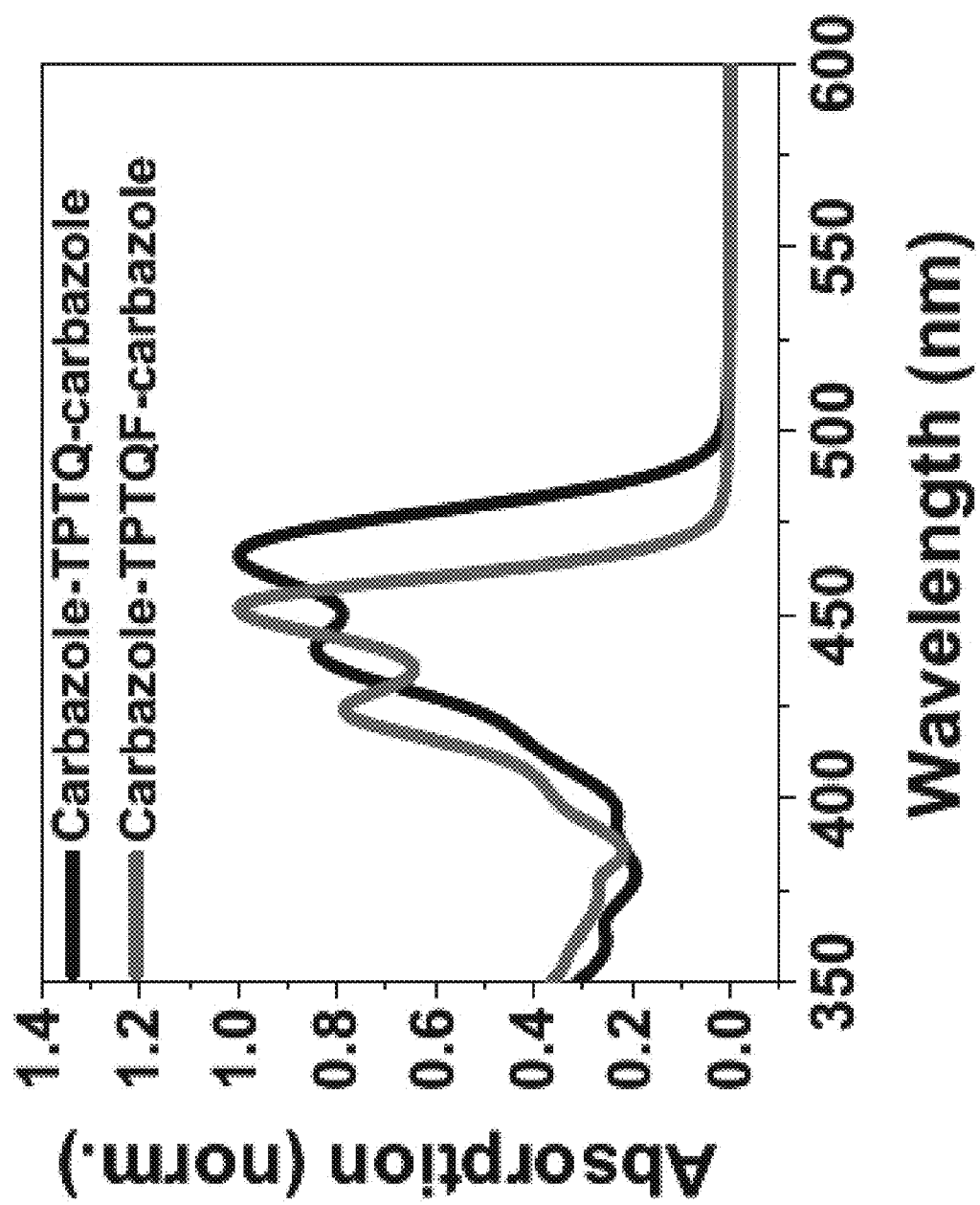
FIG. 22B is an exemplary embodiment of dimers carbazole-TPTQ-carbazole/carbazole-TPTQF-carbazole in accordance with the present disclosure.
Figure 23:
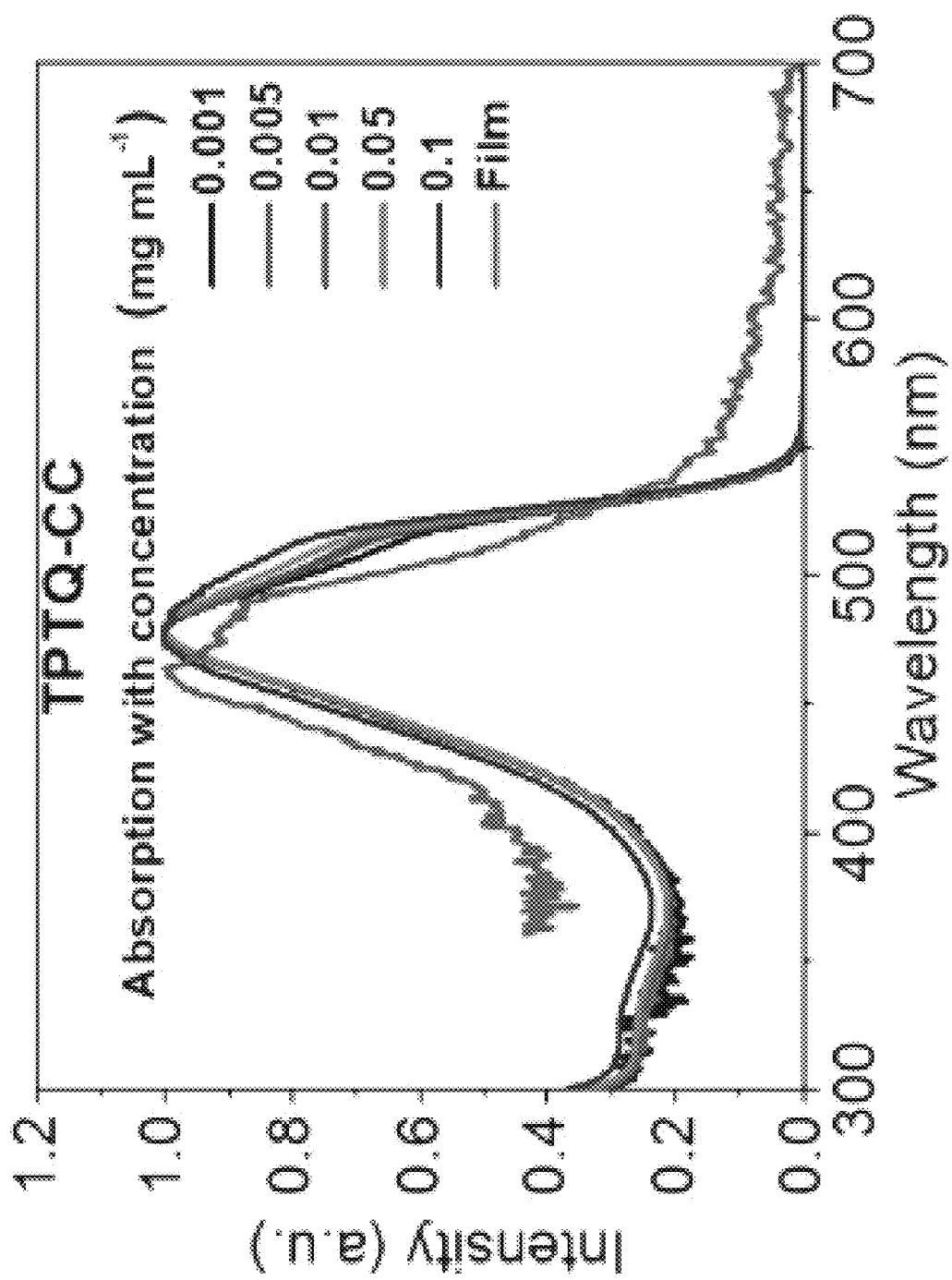
FIG. 23 is an exemplary embodiment of concentration-dependent (mg/ML) UV-vis absorption spectra of TPTQ-CC in accordance with the present disclosure.
Figure 24A:
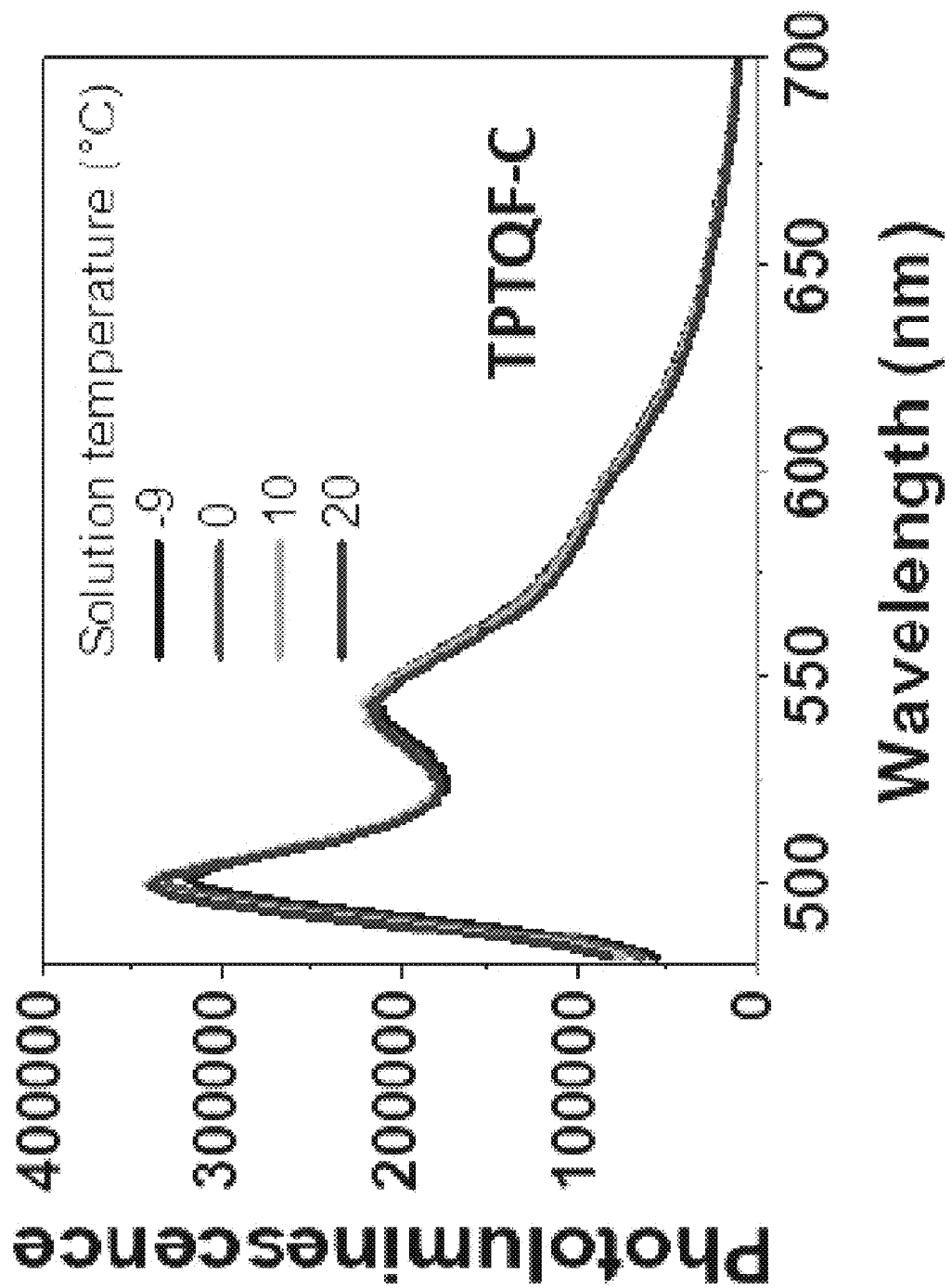
FIG. 24A is an exemplary embodiment of TPTQF-C temperature-dependent PL of polymer chloroform solution with a concentration of 0.01 mg/mL in accordance with the present disclosure.
Figure 24B:
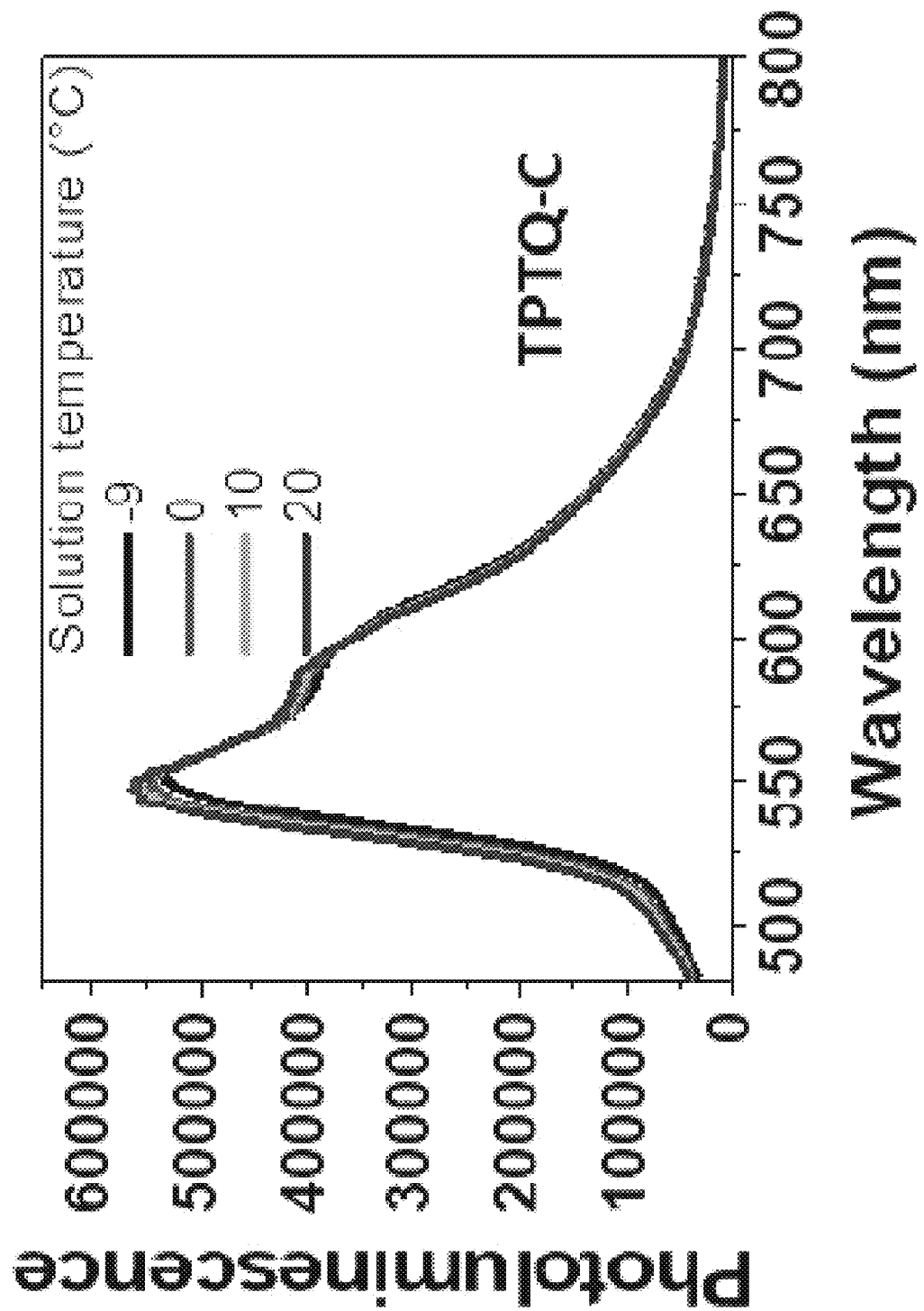
FIG. 24B is an exemplary embodiment of TPTQ-C temperature-dependent PL of polymer chloroform solution with a concentration of 0.01 mg/mL in accordance with the present disclosure.
Figure 24C:
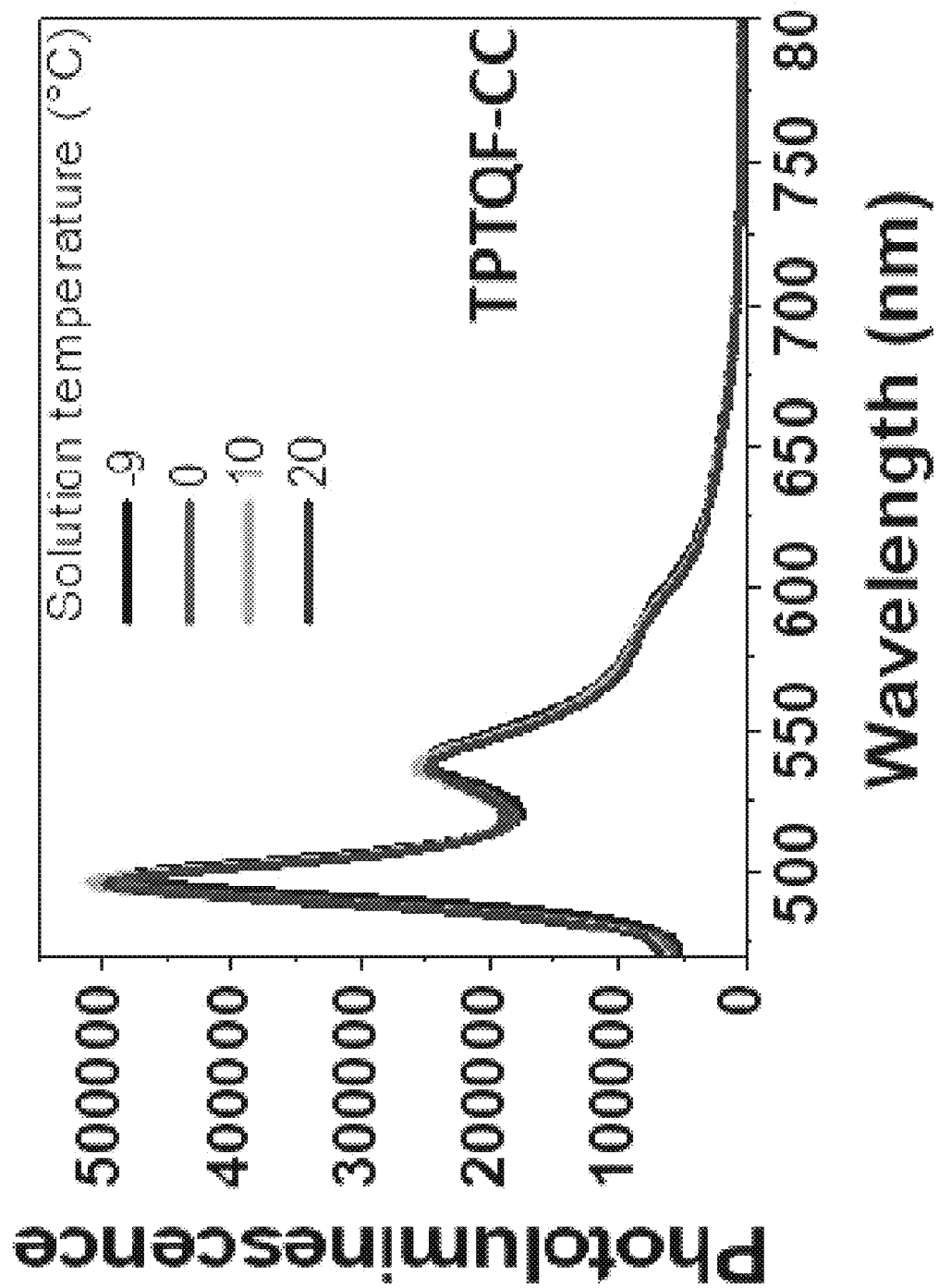
FIG. 24C is an exemplary embodiment of TPTQF-CC temperature-dependent PL of polymer chloroform solution with a concentration of 0.01 mg/mL in accordance with the present disclosure.
Figure 24D:
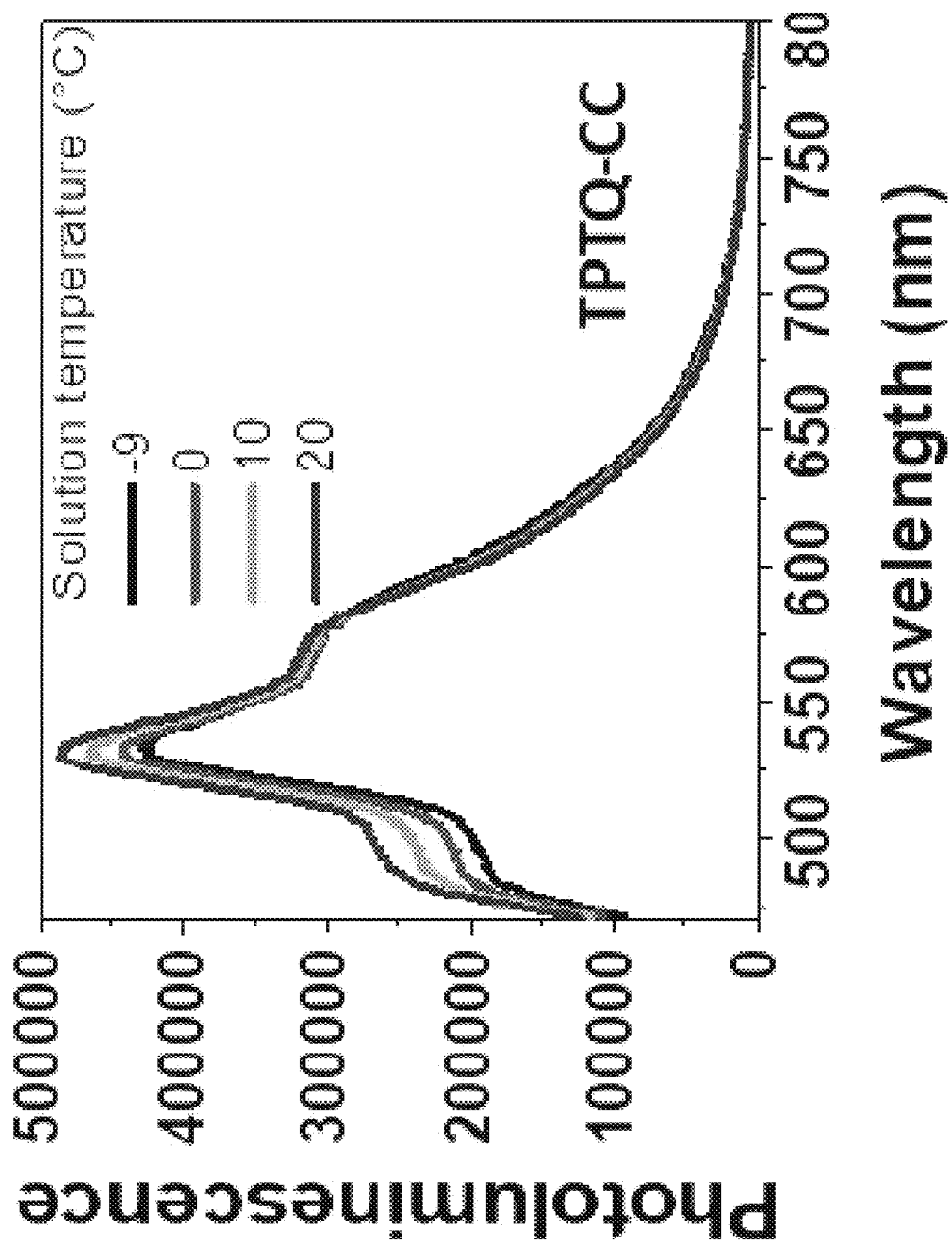
FIG. 24D is an exemplary embodiment of TPTQ-CC temperature-dependent PL of polymer chloroform solution with a concentration of 0.01 mg/mL in accordance with the present disclosure.

Optical Properties and Aggregations. The optical transitions in these cross conjugated polymers, monomers, and model compounds (carbazole-TPTQ(TPTQF)-carbazole) were investigated in detail by employing UV-vis spectrometer and the results are shown in FIG. 21A and FIG. 22A-B. The absorption spectra of the TPTQ monomer and model compound exhibited a strong 0-0 transition and weaker 0-1 transition. However, polymers TPTQ-C and TPTQF-C show a significant difference in spectral shape, where the 0-0 transition intensity is reduced and 0-1 transition becomes the strongest, indicating the formation of H-aggregates. Normalized absorption spectra showed almost no change in the spectral shape with decreasing concentration (FIG. 21A-B), indicating that H aggregation exists even at the level of a single polymer chain. This is evidence for polymer folding. In comparison, 0-0 transition intensity was reduced gradually and the whole absorption spectrum was blue shifted with increasing concentrations, as shown in linear polymer, TPTQ-CC (FIG. 23), which exhibited unfolded H-aggregation. Fluorescence spectra under varied temperatures provided further evidence for polymer aggregation formation. It is known that the ratio of intensities of the $I_{0-0}$ peak to the $I_{0-1}$ peak will increase as the temperature increases for H-aggregation, and decrease for J-aggregation. As shown in FIG. 24A-D and Table 6, TPTQF-C exhibited an increased $I_{0-0}/I_{0-1}$ ratio from 2.03 to 2.18 when the solution temperature increased from −9 to 20° C. which is consistent with H-aggregation (given the temperature range of the instrumentation). Similar trends were observed for polymer TPTQ-C. It was proposed that the formation of H-aggregates in normal semiconducting polymers is due to strong inter-chain interactions. The H-aggregation in these polymers, however, must be due to intra-chain folding as concluded from the spectral analysis above. Due to intrachain H-aggregation, these foldamers exhibit modest PLQY in dilute chloroform solution (0.001 mg mL$^{-1}$).

TABLE 6

Summary of the ratio of 0.01 mg mL$^{-1}$ polymer solutions PL peaks $I_{0-0}/I_{0-1}$ at different temperatures.

| T (° C.) | TPTQF-C | TPTQ-C | TPTQF-CC | TPTQ-CC |
|---|---|---|---|---|
| −9 | 2.03 | 1.35 | 1.95 | 0.47 |
| 0  | 2.15 | 1.36 | 2.00 | 0.48 |
| 10 | 2.18 | 1.41 | 2.00 | 0.50 |
| 20 | 2.18 | 1.38 | 2.02 | 0.50 |

Figure 25A:
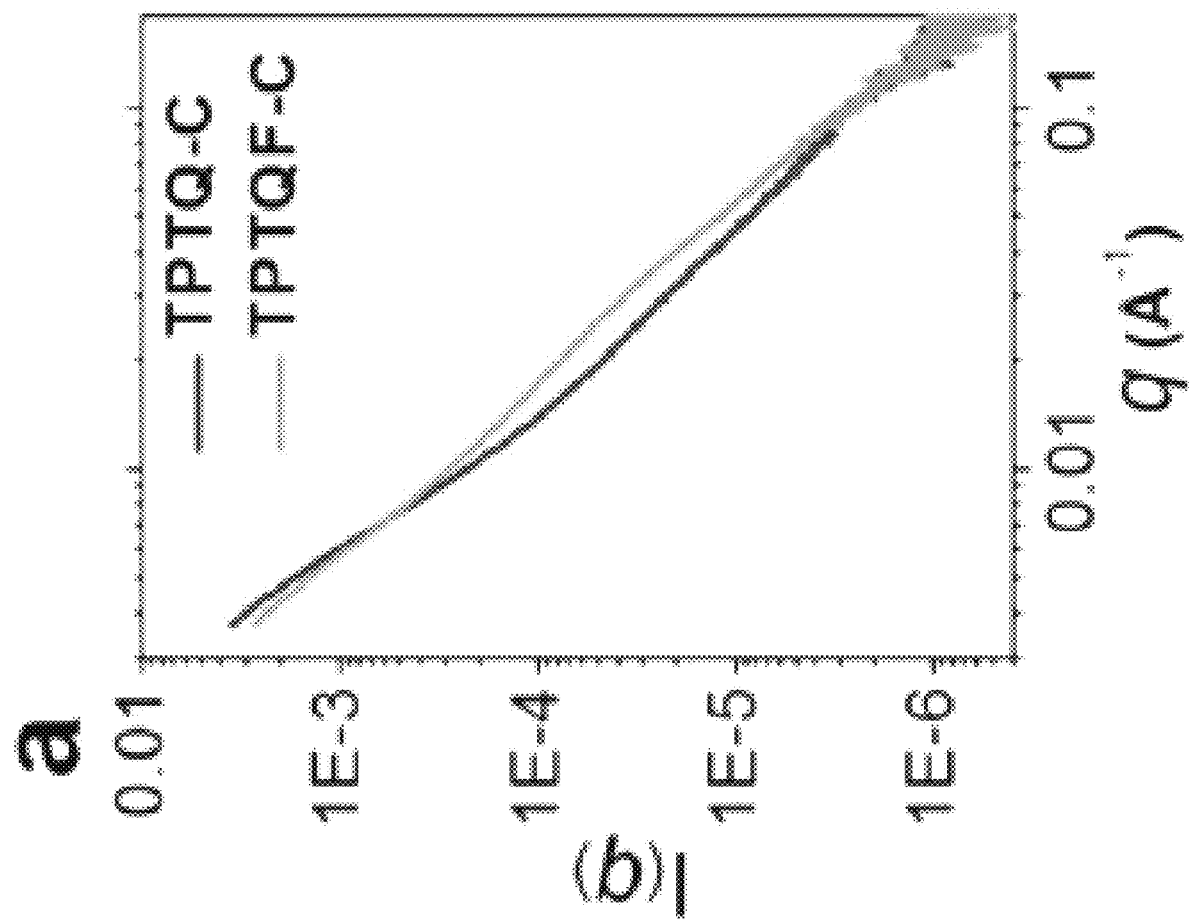
FIG. 25A is an exemplary embodiment of SAXS scattering intensity I(q) of TPTQ-C (blue) and TPTQF-C (orange) versus scattering vector q in THF solution (5 mg/mL) in accordance with the present disclosure.
Figure 25B:
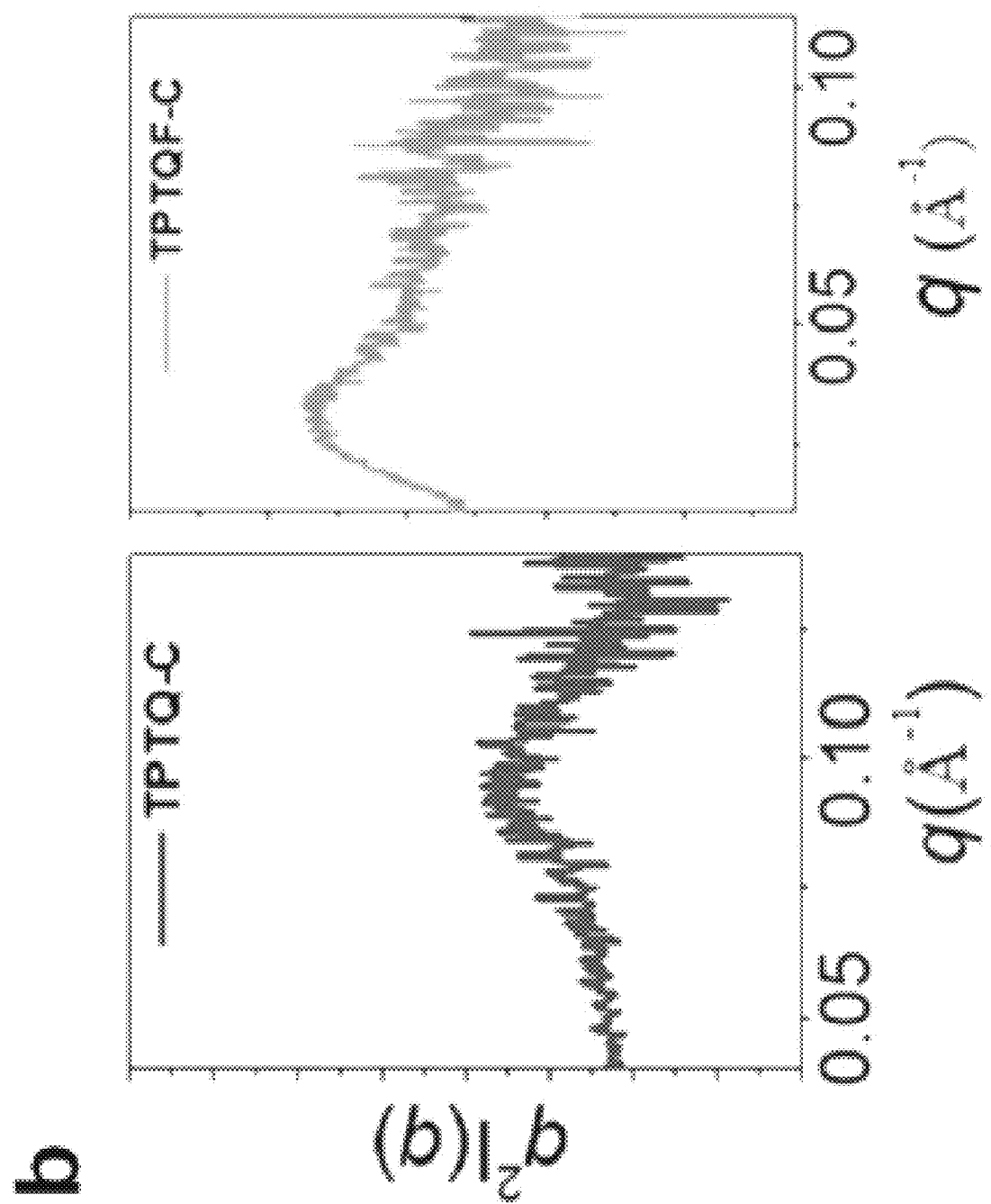
FIG. 25B is an exemplary embodiment of Kratky plots, $q^2 \times I(q)$–q showing the folded peaks in small q-range in accordance with the present disclosure.
Figure 25C:
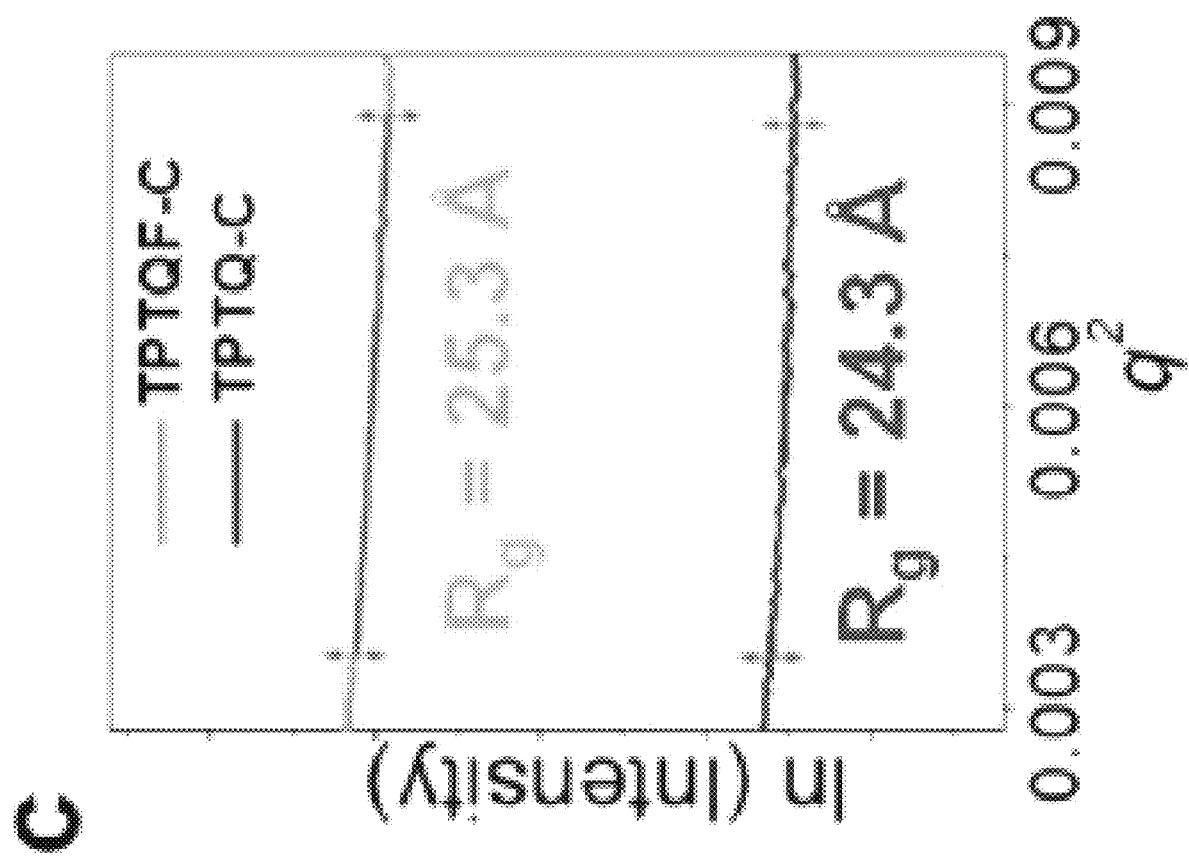
FIG. 25C is an exemplary embodiment of fitting $\ln[I(q)]$–q2 to Guinier relationship to calculate the radius of gyration, $R_g$ in accordance with the present disclosure.
Figure 25D:
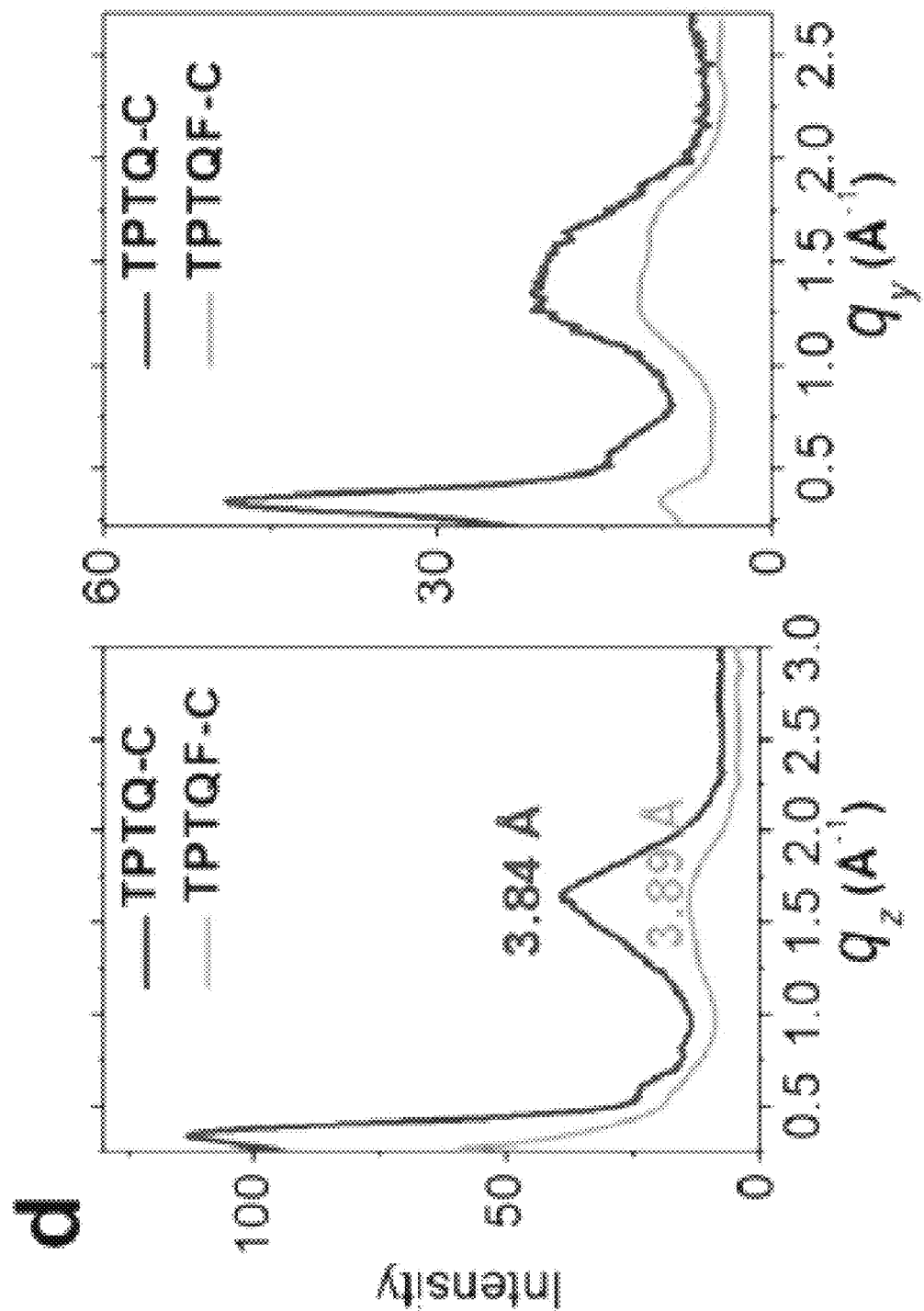
FIG. 25D is an exemplary embodiment of GIWAXS profile along $q_z$ (out-of-plane) and $q_y$ (in-plane) in thin-films in accordance with the present disclosure.
Figure 26A:
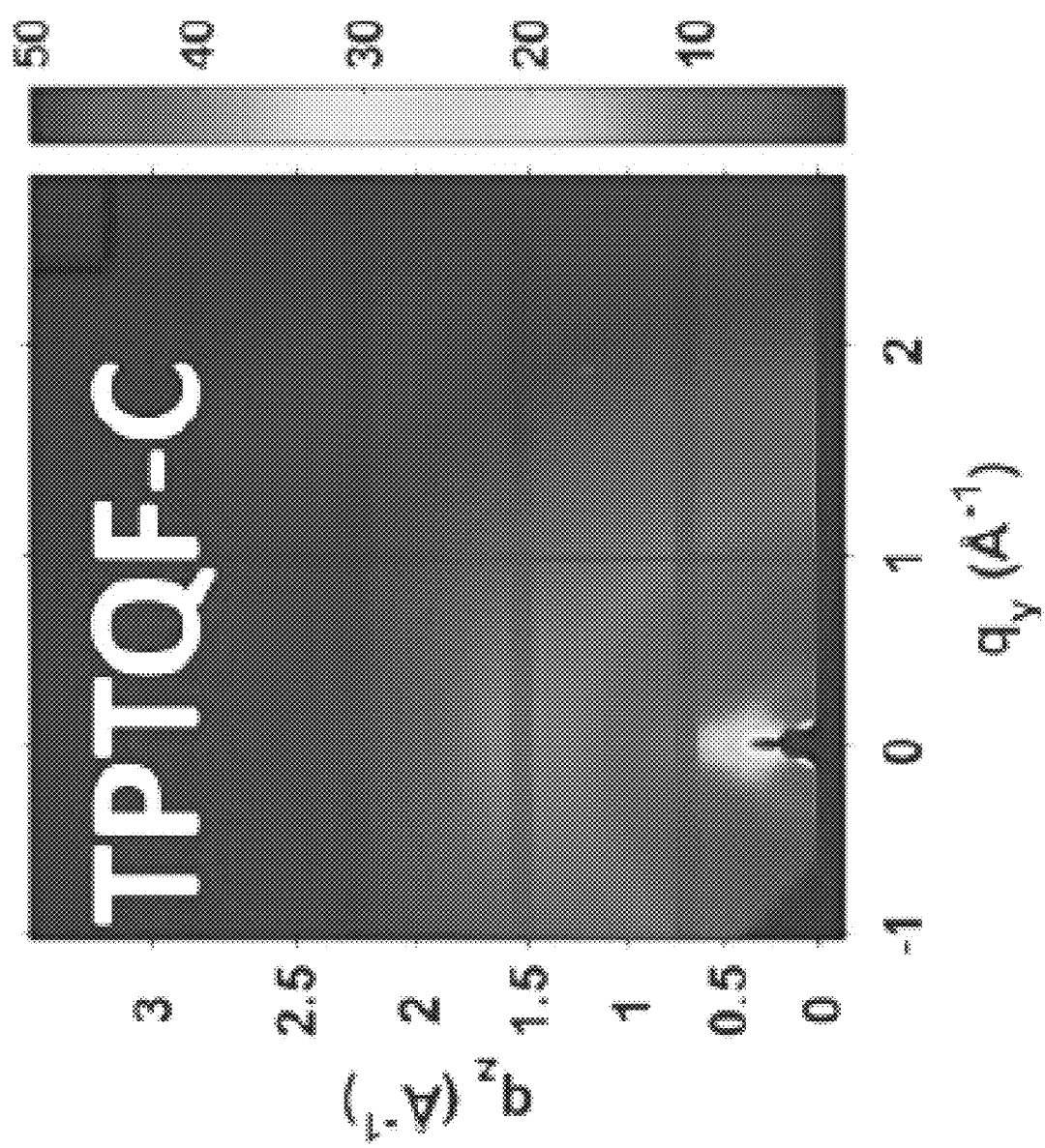
FIG. 26A is an exemplary embodiment of 2D GIWAXS scattering patterns of the polymer films TPTQF-C in accordance with the present disclosure.
Figure 26B:
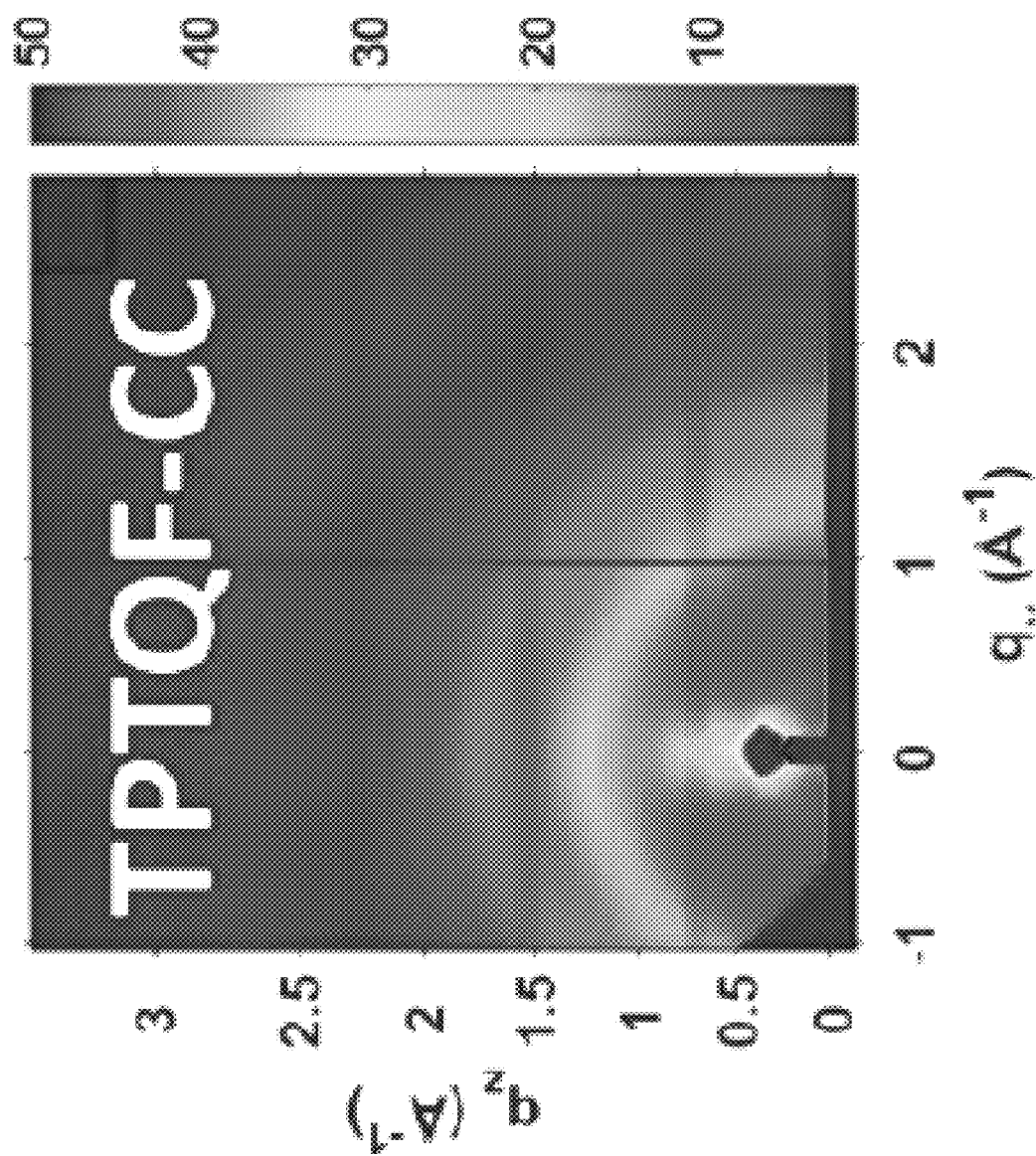
FIG. 26B is an exemplary embodiment of 2D GIWAXS scattering patterns of the polymer films TPTQF-CC in accordance with the present disclosure.
Figure 26C:
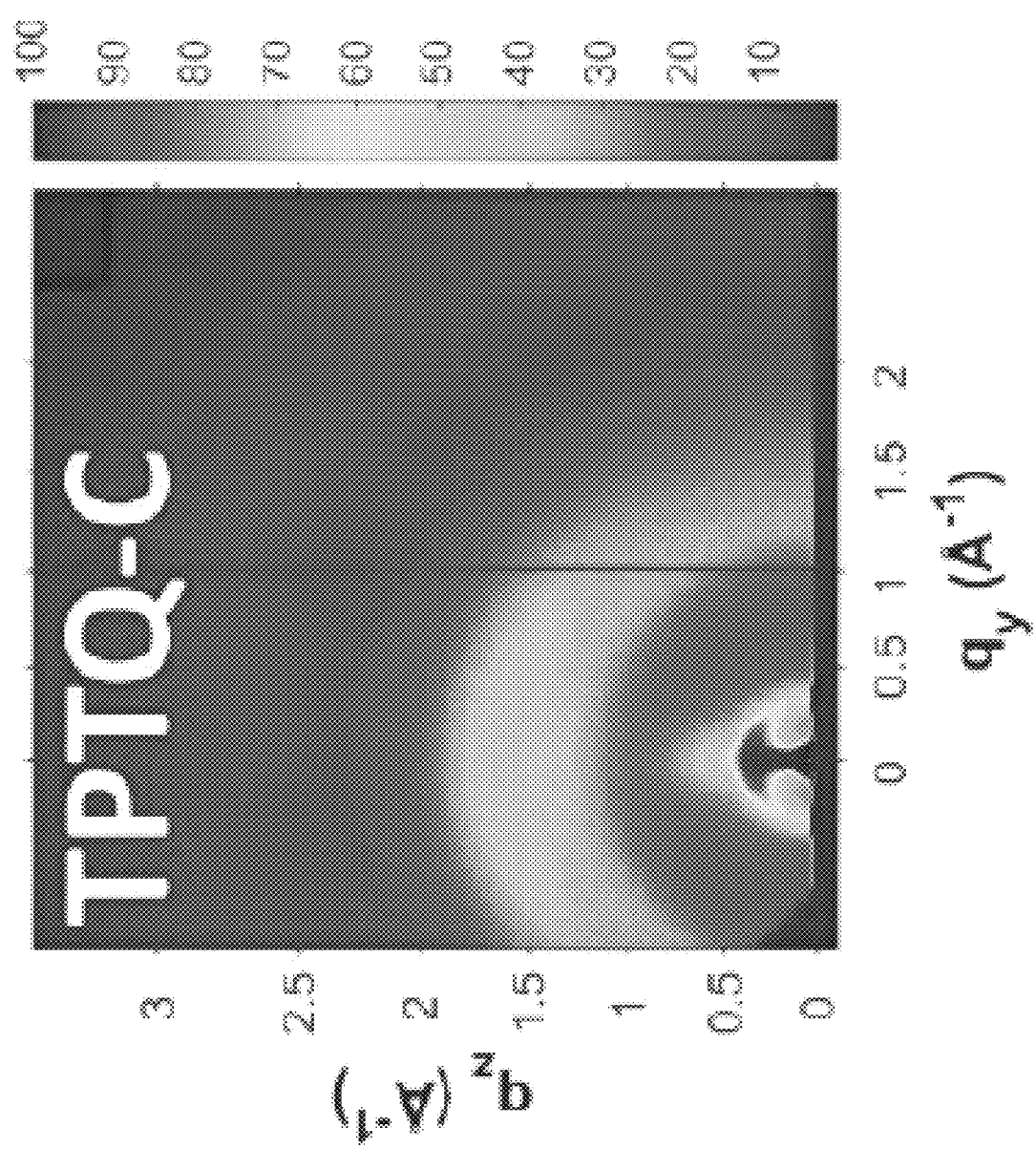
FIG. 26C is an exemplary embodiment of 2D GIWAXS scattering patterns of the polymer films TPTQ-C in accordance with the present disclosure.
Figure 26D:
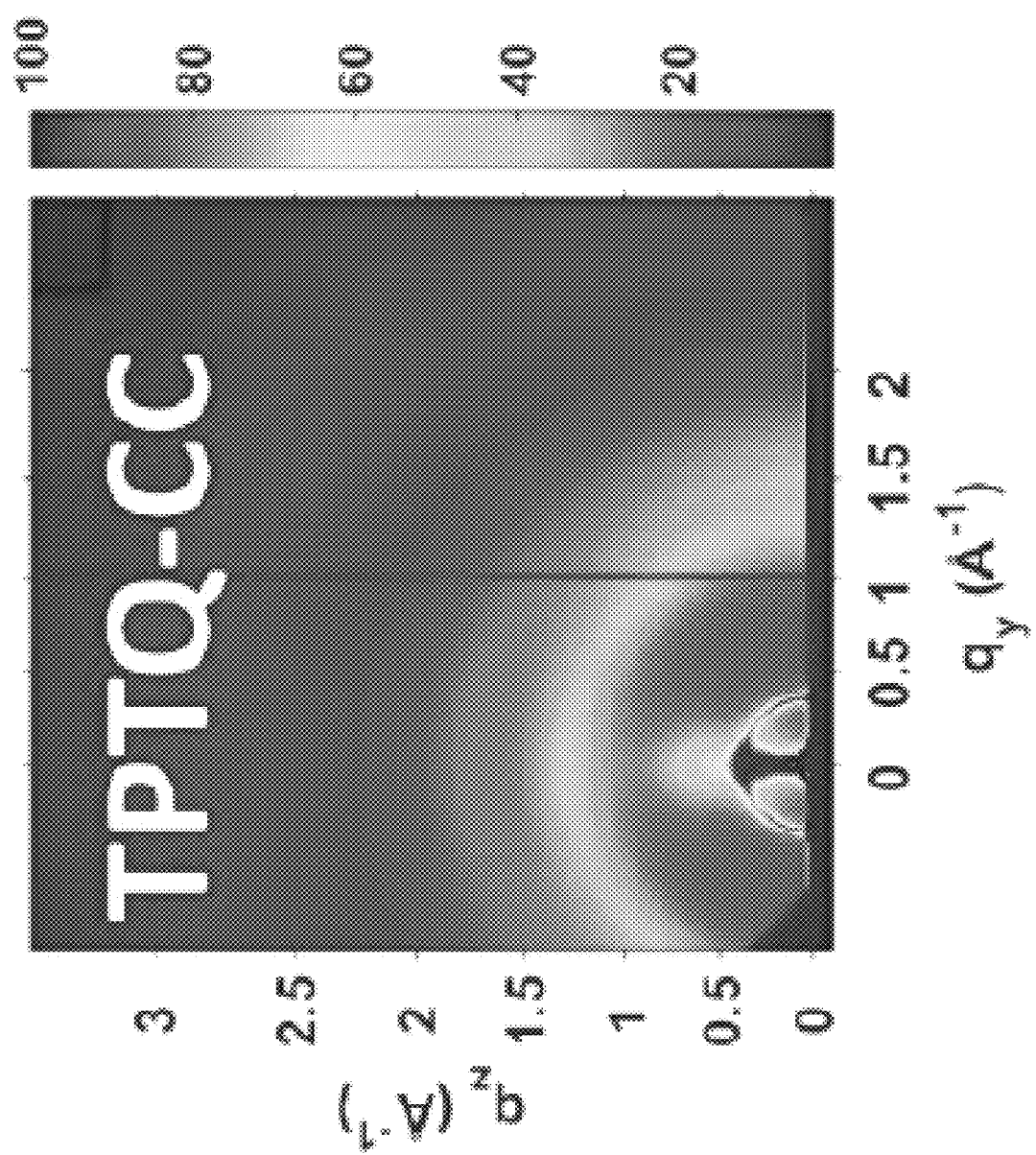
FIG. 26D is an exemplary embodiment of 2D GIWAXS scattering patterns of the polymer films TPTQ-CC in accordance with the present disclosure.
Figure 27A:
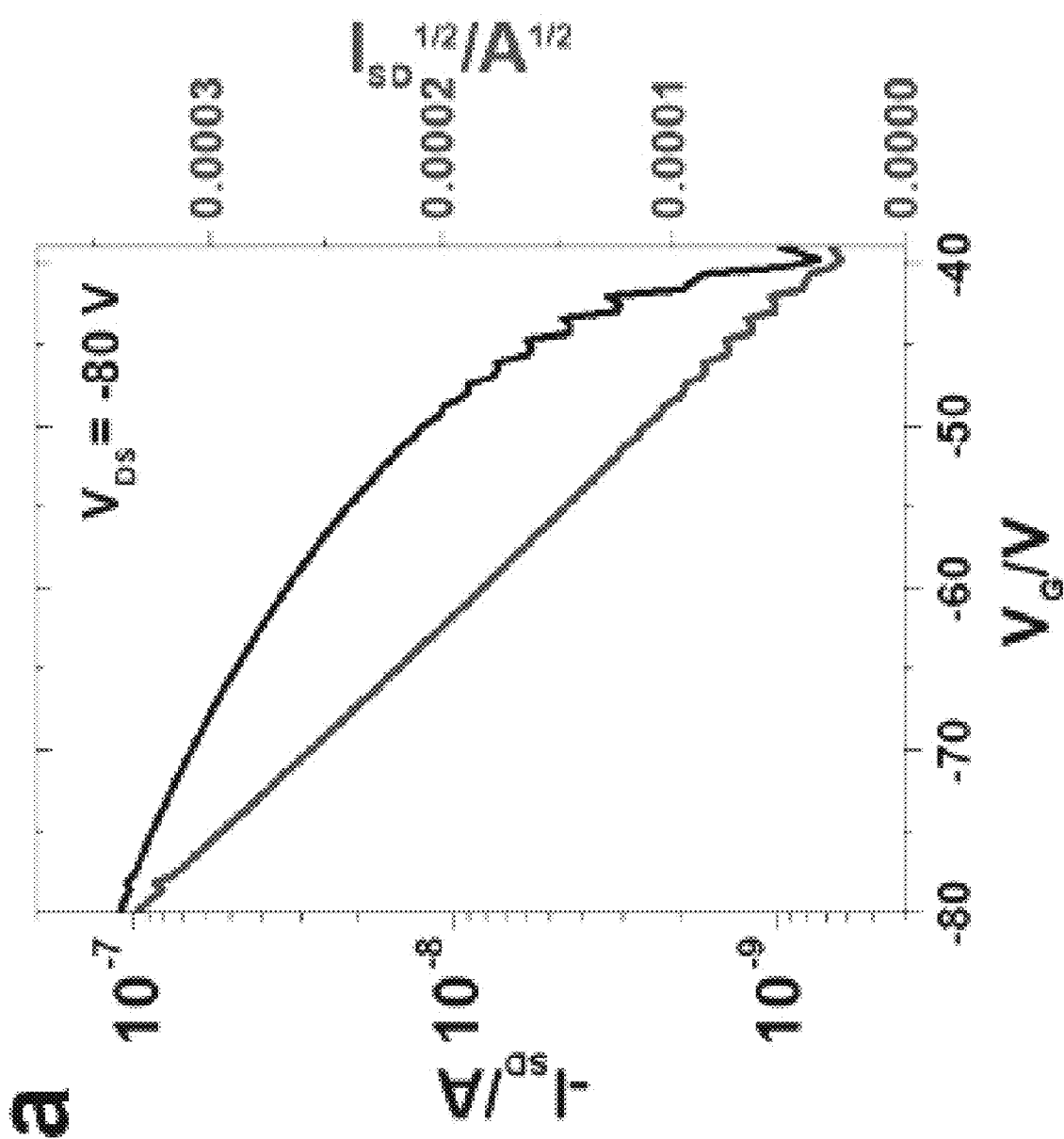
FIG. 27A is an exemplary embodiment of OFET properties of the cross-conjugated polymers including transfer curves of TPTQF-C in accordance with the present disclosure.
Figure 27B:
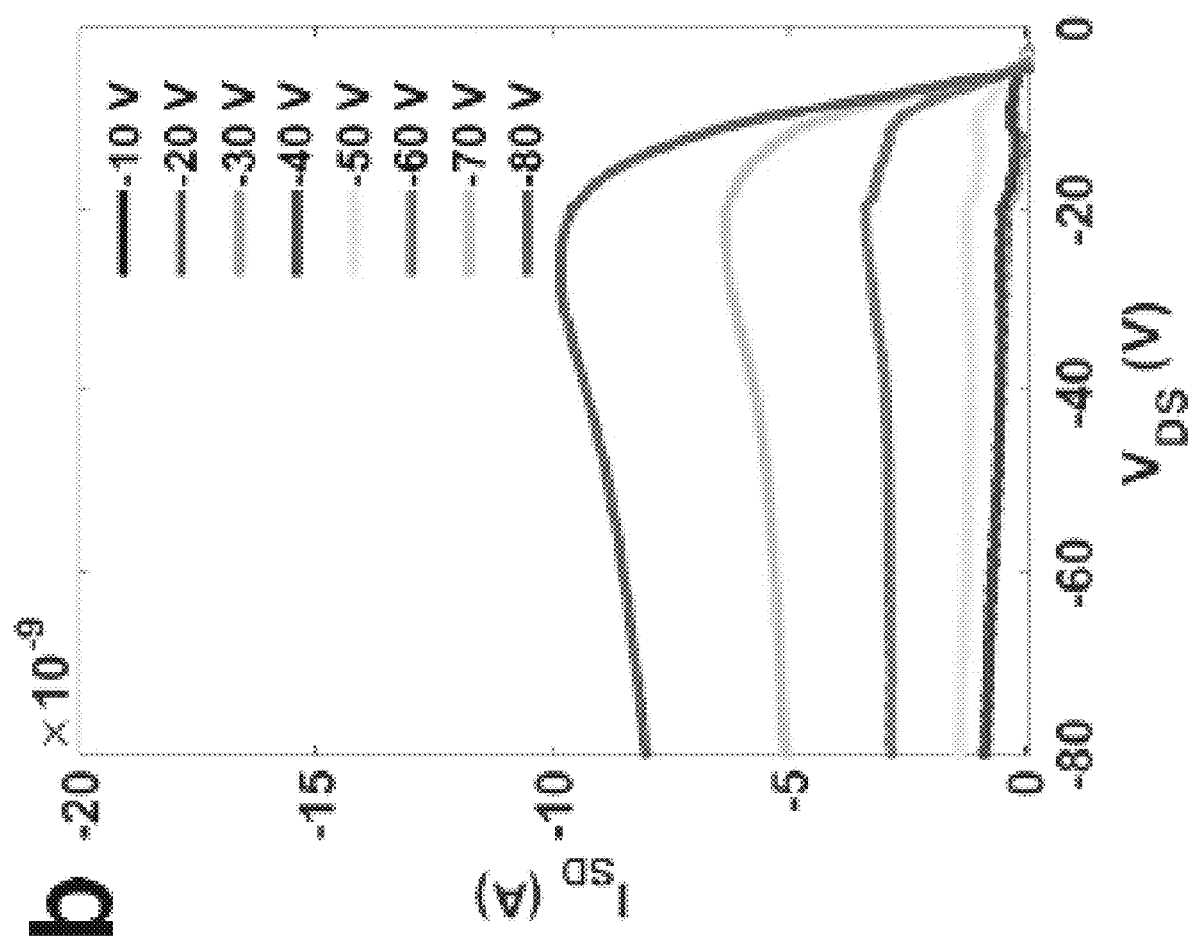
FIG. 27B is an exemplary embodiment of OFET properties of the cross-conjugated polymers including output curves of TPTQF-C in accordance with the present disclosure.
Figure 27C:
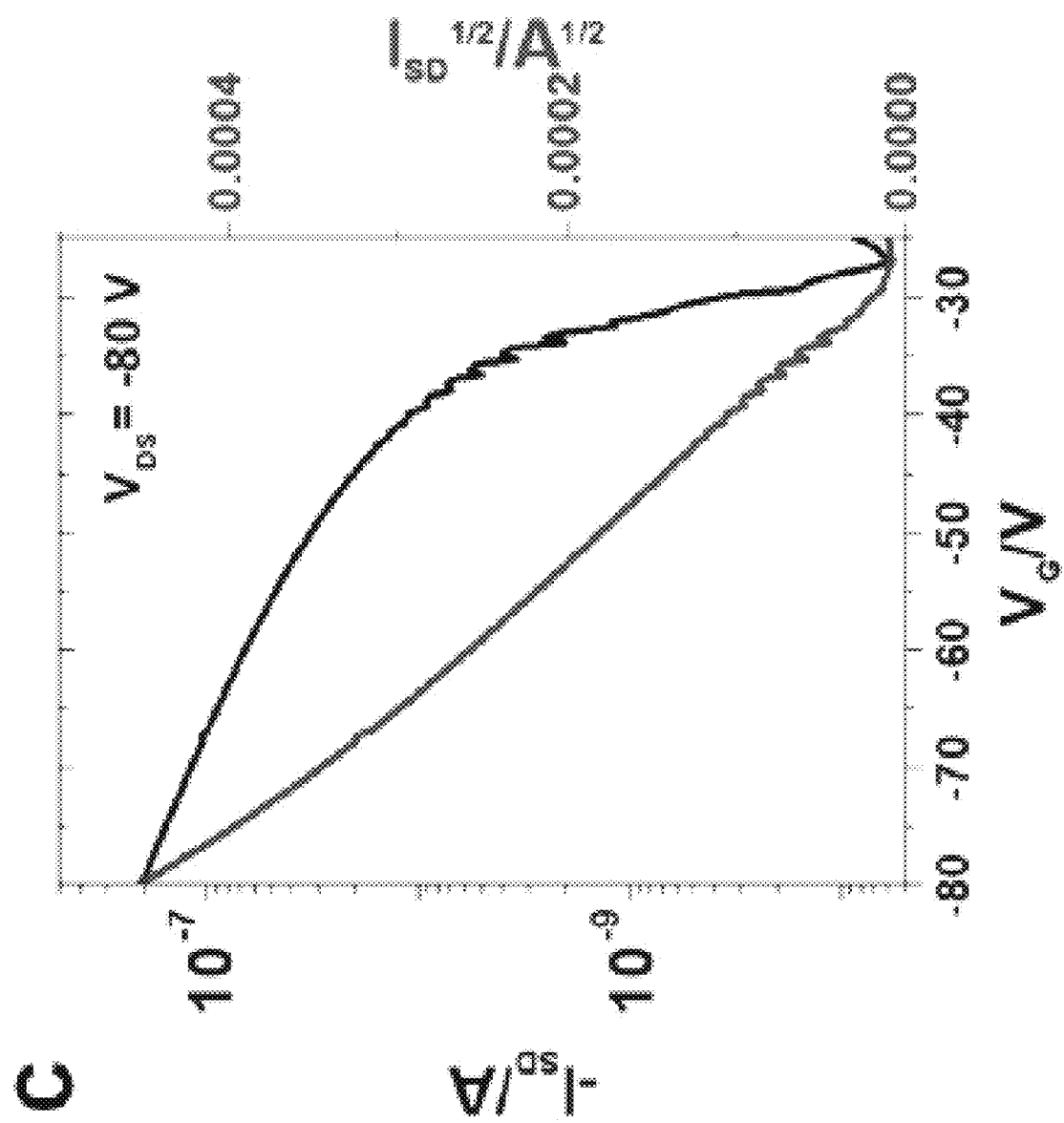
FIG. 27C is an exemplary embodiment of OFET properties of the cross-conjugated polymers including transfer curves of TPTQ-C in accordance with the present disclosure.
Figure 27D:
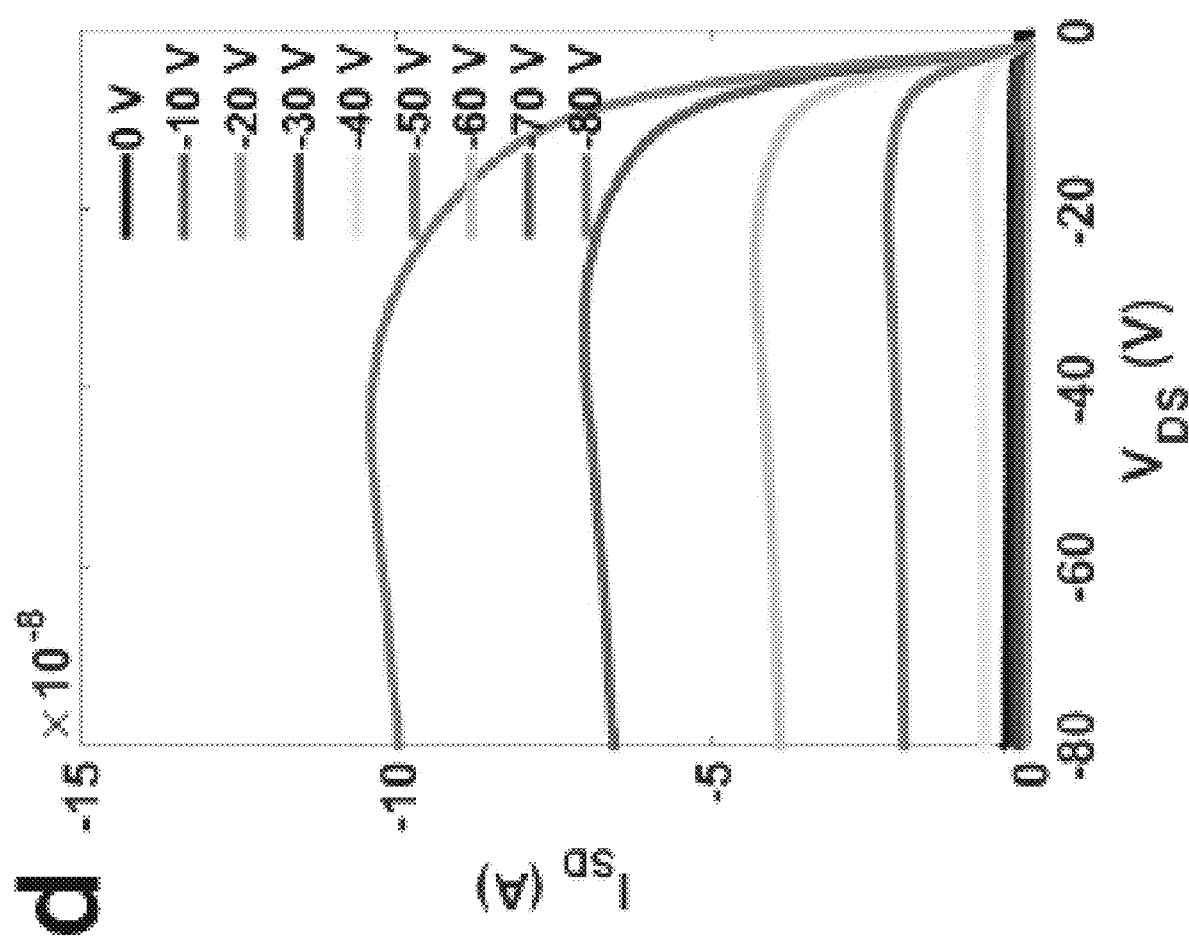
FIG. 27D is an exemplary embodiment of OFET properties of the cross-conjugated polymers including output curves of TPTQ-C in accordance with the present disclosure.
Figure 28A:
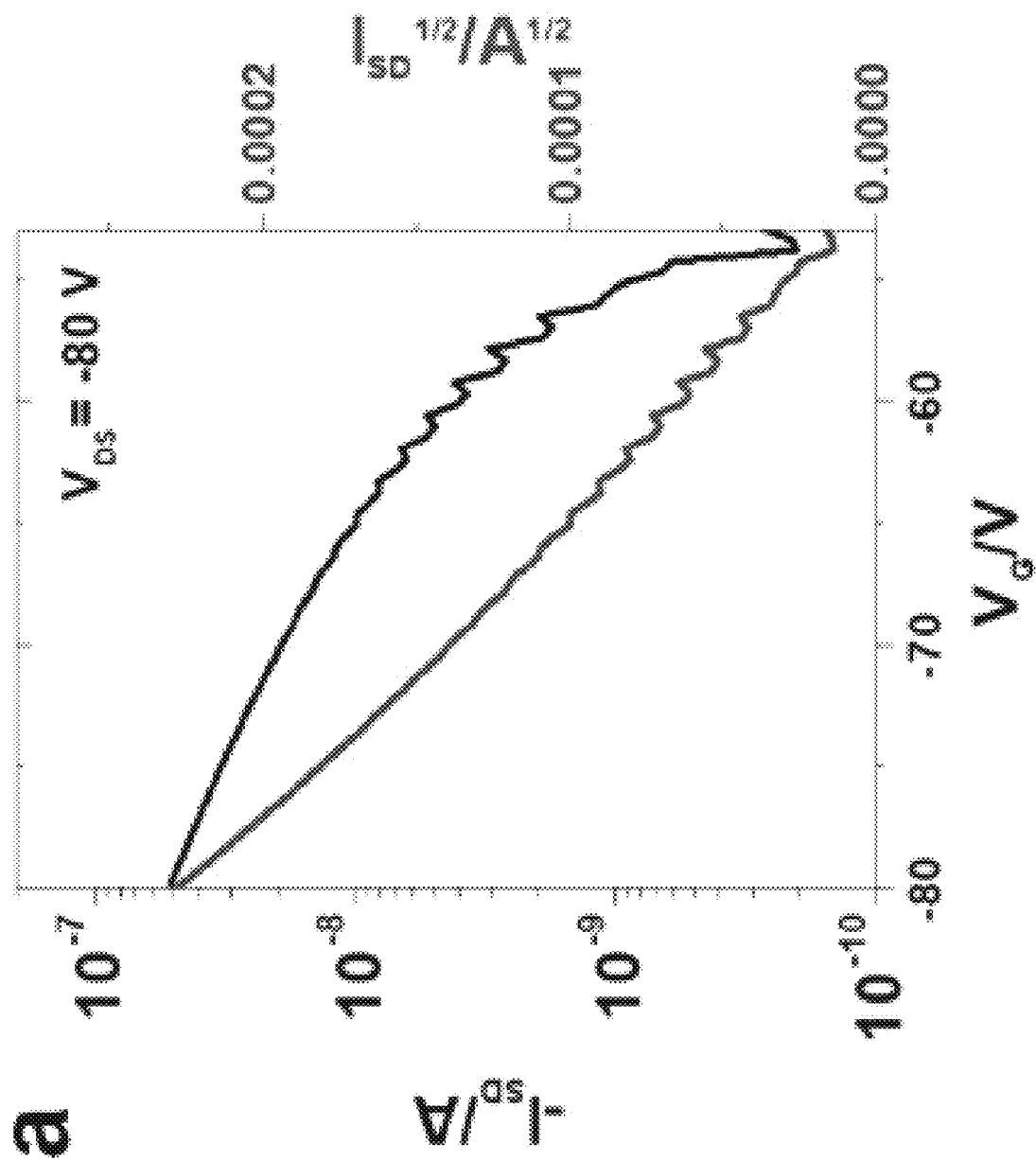
FIG. 28A is an exemplary embodiment of OFET properties of the linear polymer including transfer curves of TPTQF-CC in accordance with the present disclosure.
Figure 28B:
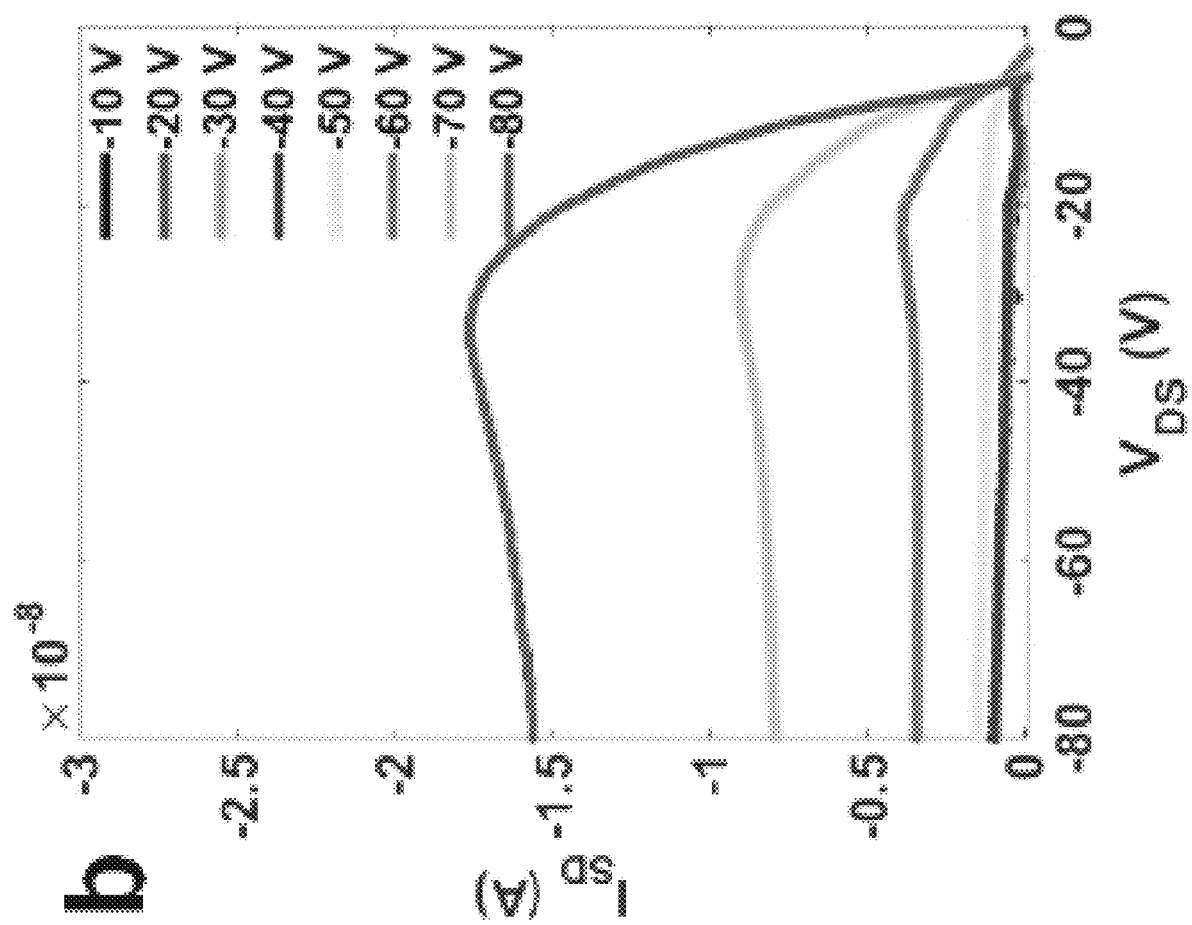
FIG. 28B is an exemplary embodiment of OFET properties of the linear polymer including output curves of TPTQF-CC in accordance with the present disclosure.

The direct evidence for folded structures came from small angle X-ray scattering (SAXS) measurements using advanced synchrotron light source. The SAXS profiles of TPTQF-C and TPTQ-C were obtained in THF solutions with a concentration of 5 mg mL$^{-1}$, which were used to analyze the structure of the foldamer. As shown in FIG. 25A-D, the two polymers showed strong scattering intensity I(q) at small scattering vector (q<0.3 Å$^{-1}$). After plotting the characteristic Kratky plots: $q^2 \times I(q)$ vs. q, folded peaks were observed. Unlike the unfolded samples which have a plateau, the folded structures of TPTQF-C and TPTQ-C could be unambiguously identified in FIG. 25B. To calculate the particle size for the foldamers, the plots of ln[I(q)] vs. $q^2$, were fitted with Guinier relationship: $\ln[I(q)] = \ln[I_0] - \frac{1}{3}q^2 R_g^2$, where $I_0$ is proportional $M_W$ and $R_g$ is the size of the particle (FIG. 25C). The calculated particle size of TPTQF-C (25.3° A) was relatively larger than that of TPTQ-C (24.3 Å) which is consistent with the simulated coiled structures (FIG. 17B).

The film photoluminescence spectra for the polymers showed a slight redshift in comparison with corresponding solution spectra. To understand these observations, concentration-dependent photoluminescence spectra were measured (FIG. 21A-B). The range of concentrations used was from 0.001 mg mL$^{-1}$ to 0.1 mg mL$^{-1}$. The polymers showed a gradual redshift of fluorescence upon concentration increase. The shoulder peaks ($I_{0-1}$) were present even in the most dilute solution for all the polymers and their intensity increased with the increasing concentration. This is in contradiction with H-aggregates which are known to exhibit a blueshift. However, polymers containing quadrupole interactions have been shown to exhibit a redshift in H-aggregates. As shown in FIG. 17A, the D-A$^-$-D$^+$ resonant structures indeed demonstrate a compound exhibiting quadrupole interactions. Thus, these polymers are special cases with quadrupole interactions that exhibit a redshift in H-aggregates. It is different from typical blue-shifted H-aggregate for small molecules, in which aggregates are mainly influenced by intermolecular interaction, while in polymers, the aggregation states are contributed from both interchain and intrachain interaction.

To gain deeper insight into photophysical properties, time-resolved fluorescence decay measurements were performed with polymer solutions (Table 7). Fluorescence decay curves were fitted with exponential decay equation and fluorescence lifetimes were calculated. It was found that polymer TPTQ-C exhibits the fluorescence lifetime (τ) of 2.14 ns with a single exponential decay curve. TPTQ-F showed double exponential decay behavior with $\tau_1$ (25%)= 0.77 ns, and $\tau_2$ (75%)=2.44 ns, which may indicate the presence of different relaxation pathways in comparison with TPTQ-C. This value seemed to be consistent with folded H-aggregates in which exciton delocalization elongates the fluorescence lifetimes (Table 7).

TABLE 7

Fluorescence lifetimes of TPTQ-C, TPTQF-C chloroform solutions (0.01 mg/mL).

| Polymer | τ1(ns) | Fraction 1 (%) | τ2 (ns) | Fraction 2 (%) |
|---|---|---|---|---|
| TPTQF-C | 0.77 | 25 | 2.44 | 75 |
| TPTQ-C | 2.14 | 100 | — | — |
| TPTQF-CC | 0.84 | 57 | 1.8 | 43 |
| TPTQ-CC | 0.67 | 48 | 1.98 | 52 |

Microstructures and Charge Transporting Properties. As shown in the two-dimensional (2D) grazing-incidence wide-angle X-ray scattering (GIWAXS) images (FIG. 26A-D) and profiles (FIG. 25D) of the polymer thin films, it was found that the polymers were almost amorphous, with a slight preference face-on orientation. TPTQ-C and TPTQF-C exhibited similar intermolecular π-π stacking distances of 3.84 and 3.89 Å respectively. Moreover, TPTQF-C and TPTQ-C showed p-type transport behavior and hole mobilities (μh) of $5.2\times10^{-6}$ and $6.9\times10^{-5}$ cm$^2$ V$^{-1}$ s$^{-1}$ respectively (Tables 8 and 9) in bottom gate top contact FET devices with gold as source and drain electrodes (FIG. 27A-D and FIG. 28A-B). The modest charge mobilities and amorphous characters in the thin films, may be due to the tight intrachain folding. Expectedly, no electroluminescence was observed in single-layer FET devices, because of the large injection energy barrier (using the same drain-source electrodes) and low charge mobility in pristine films.

Figure 29A:
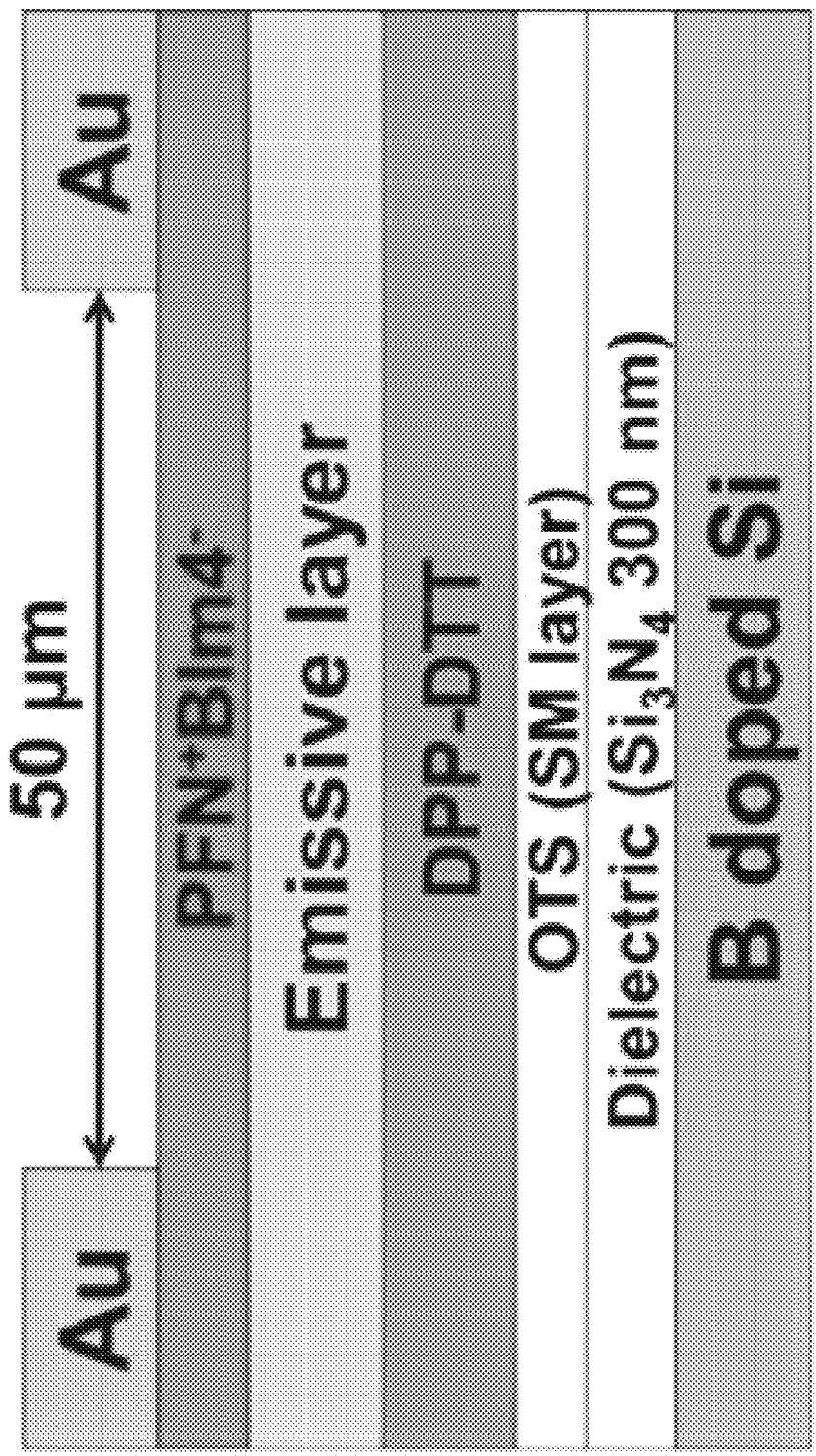
FIG. 29A is an exemplary embodiment of a device configuration of tri-layered OLET in accordance with the present disclosure.
Figure 29B:
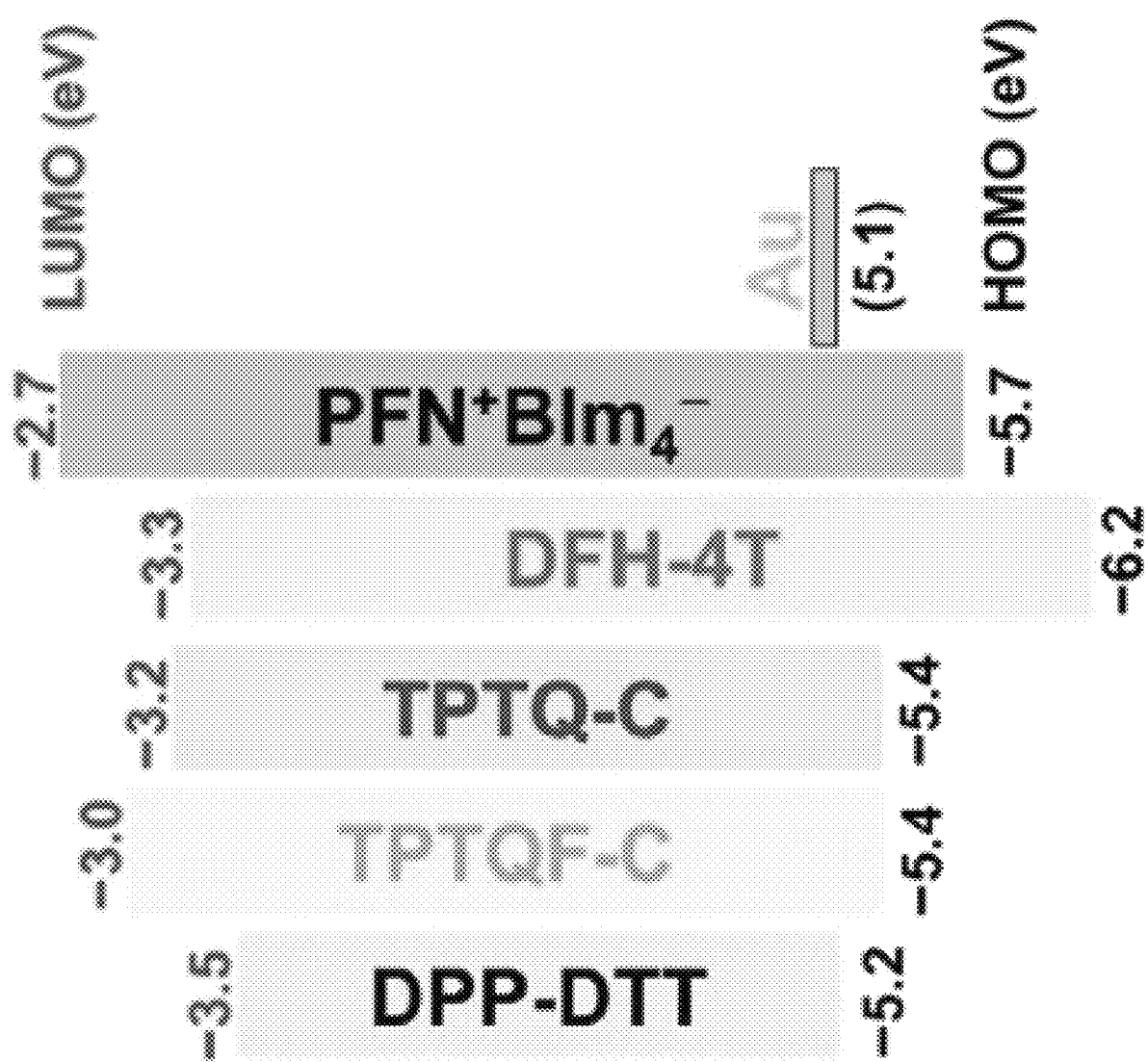
FIG. 29B is an exemplary embodiment of an energy diagram corresponding to layers shown in FIG. 29A in accordance with the present disclosure.
Figure 29C:
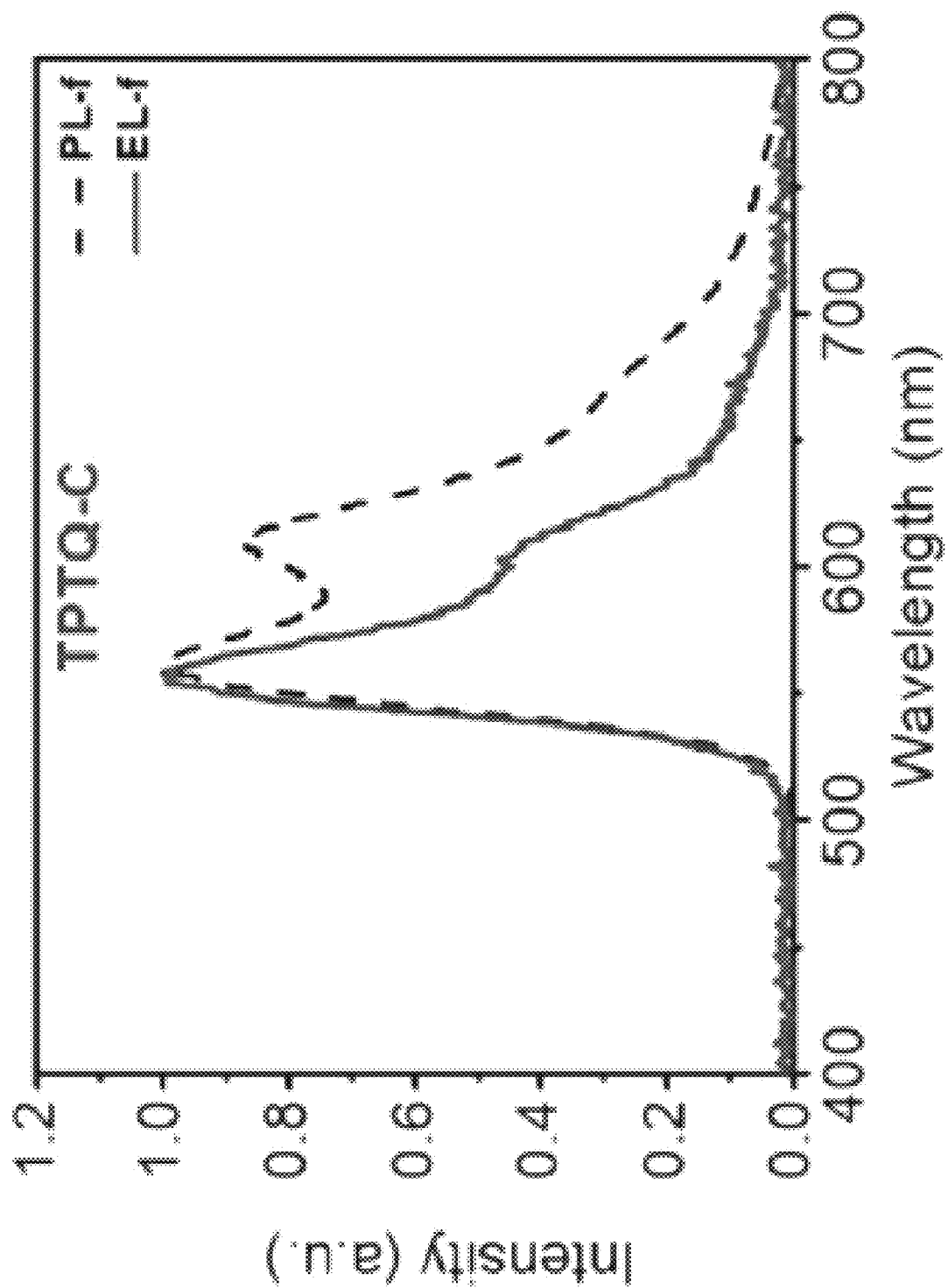
FIG. 29C is an exemplary embodiment of photoluminescent (PL, dotted line) and electroluminescent (EL, solid line) spectra of TPTQ-C in accordance with the present disclosure.
Figure 29D:
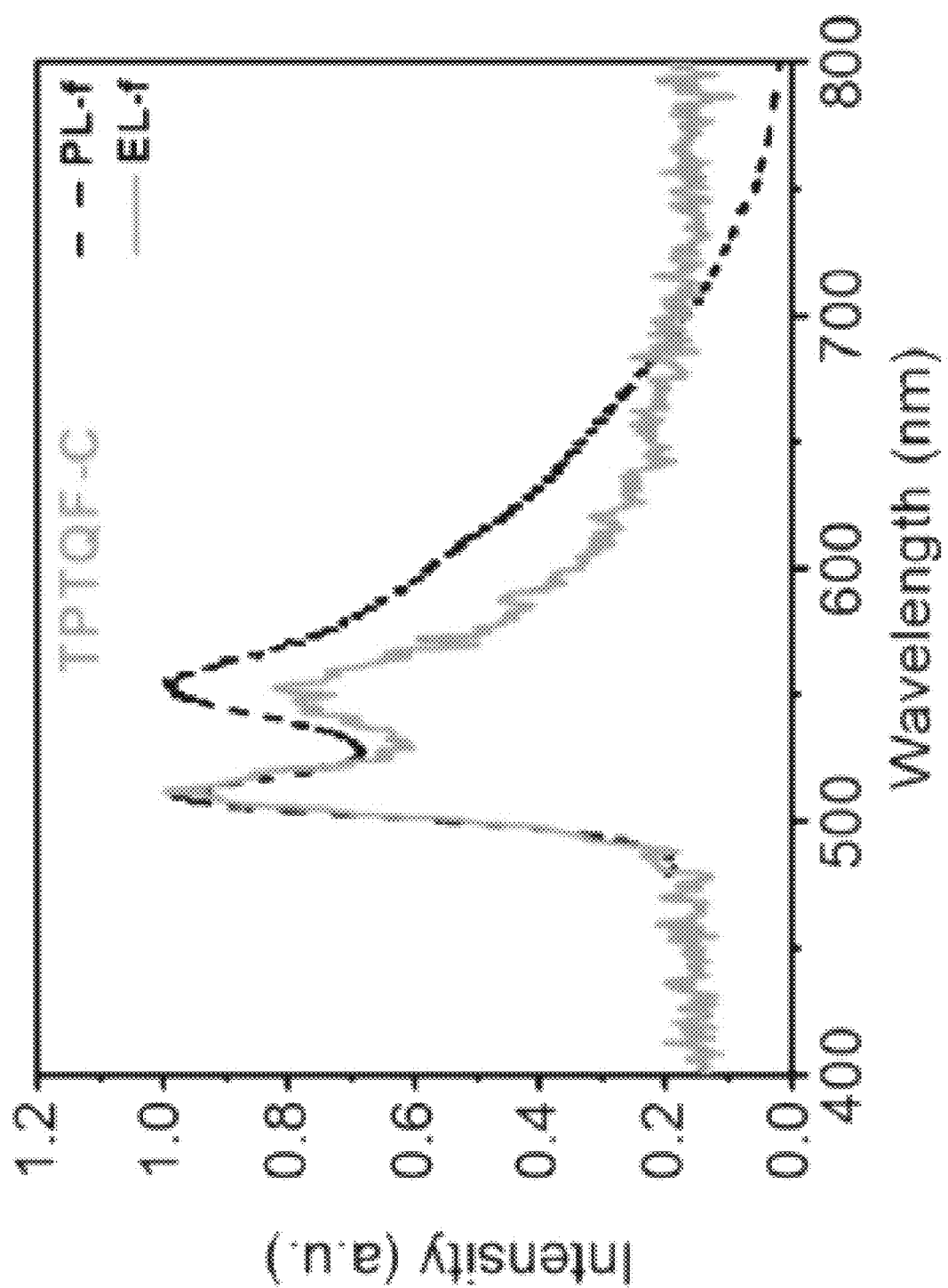
FIG. 29D is an exemplary embodiment of photoluminescent (PL, dotted line) and electroluminescent (EL, solid line) spectra of TPTQF-C in accordance with the present disclosure. Channel length (L) of the devices is 50 μm and channel width (W) is 18.2 mm.

Fabrication of Multi-Layered OLET and Device Performance. To address the issue about unbalanced charge injection, multi-layers including an electron injection layer, a charge transporting layer, an emissive layer, and a self-assembled mono-layer (SAM) were integrated as a device configuration of (Si$_3$N$_4$/OTS/DPP-DTT/emissive layer/PFN$^+$BIm$_4^-$/Au). SAM (n-octade-cyltrichlorosilane, OTS) was vapor-deposited on SiN$_x$ as a modification layer at 120° C. in a vacuum oven to reduce charge trapping and to improve molecular stacking. From the energy level diagram (FIG. 29A-D), the LUMO energy levels of these polymers were aligned too high relative to Au (workfunction, W$_{Au}$=5.1 eV) with the electron injection barrier as high as 2.0 eV. Therefore, a thin conjugated polyelectrolyte (CPE) PFN+BIm4 with a thickness of around 10 nm was inserted between gold (Au) and the emissive layer as an electron injection layer. The ionic effect of PFN$^+$BIm$_4^-$ effectively lowered the electron injection energy barrier. Since the thin film PFN$^+$BIm$_4^-$ was spin-coated from a methanol solution, the dissolution of the emissive layer was avoided. The low charge mobility of pristine polymer films would impede the recombination of electron/hole pairs which dramatically decreases the electroluminescent efficiency. To address this issue, a charge transporting layer was inserted between the gate electrode and the emissive layer. After carefully testing different high mobility FET polymers, DPP-DTT was found suitable for the material of the present disclosure (FIG. 29A-D). DPP-DTT does not dissolve in p-xylene and exhibits high hole and electron mobility. Moreover, the HOMO (−5.2 eV) and LUMO (−3.5 eV) of DPP-DTT matches well with that of the emissive layer which should facilitate hole or electron transport from DPP-DTT back to the emissive polymers (FIG. 29B). The polymer emissive layer was then spin-coated from p-xylene to avoid the dissolution of DPP-DTT and then annealed at 120° C. To simplify device fabrication, symmetric drain/source electrodes were employed.

Transfer and output curves were measured at positive and negative source-drain voltages (V$_{DS}$) to test for n-channel and p-channel in the presently disclosed device respectively. FIG. 30A-F shows that the presently disclosed OLET devices exhibit ambipolar behavior with V-shaped transfer curves. It is evident that the charge transport occurs predominantly at the DPP-DTT/dielectric interface. The calculated mobilities of TPTQF-C (μ$_h$=2.5×10$^{-2}$ cm$^2$ V$^{-1}$ s$^{-1}$; μe=3.2×10$^{-2}$ cm$^2$ V$^{-1}$ s$^{-1}$), and TPTQ-C (μh=3.5×10$^{-1}$ cm$^2$ V$^{-1}$ s$^{-1}$; μe=5.1×10$^{-1}$ cm$^2$ V$^{-1}$ s$^{-1}$), from transfer curves and I$_{on/off}$ for tri-layered devices are several orders of magnitude larger than for single-layered devices (Table 8). The presently disclosed OLET devices for TPTQF-C and TPTQ-C exhibited strong yellow-green and yellow emission respectively, although the emission zone was fixed near the electrodes (FIG. 30A-F). A detailed investigation into light emission revealed that the electroluminescence spectra of the polymers were very close to the 0-0 transition band in the film photoluminescence spectrum (FIG. 29C and FIG. 29D), indicating the identical nature of emissive centers for both PL and EL processes.

TABLE 8

Properties of OFET and OLET for cross-conjugated polymers.

| | μ$_h$ (cm$^2$ V$^{-1}$ s$^{-1}$) average | μ$_e$ (cm$^2$ V$^{-1}$ s$^{-1}$) average | I$_{on/off}$ average | EQE$^{Maximum}$ |
|---|---|---|---|---|
| TPTQF-C[a] | 5.2 × 10$^{-6}$ | — | 10$^2$ | |
| TPTQ-C[a] | 6.9 × 10$^{-5}$ | — | 10$^1$ | |
| TPTQF-C[b] | 2.5 × 10$^{-2}$ | 3.2 × 10$^{-2}$ | 10$^4$/10$^4$ | 3.5% |
| TPTQF-C[c] | 2.4 × 10$^{-1}$ | 1.9 × 10$^{-1}$ | 10$^5$/10$^4$ | 6.9% |
| TPTQ-C[b] | 3.5 × 10$^{-1}$ | 5.1 × 10$^{-1}$ | 10$^4$/10$^3$ | 0.0047% |

[a]Single-layered OFET devices.
[b]Tri-layered OLET devices.
[c]Multi-layered OLET with DFH-4T as a charge transporting layer.

Figure 30A:
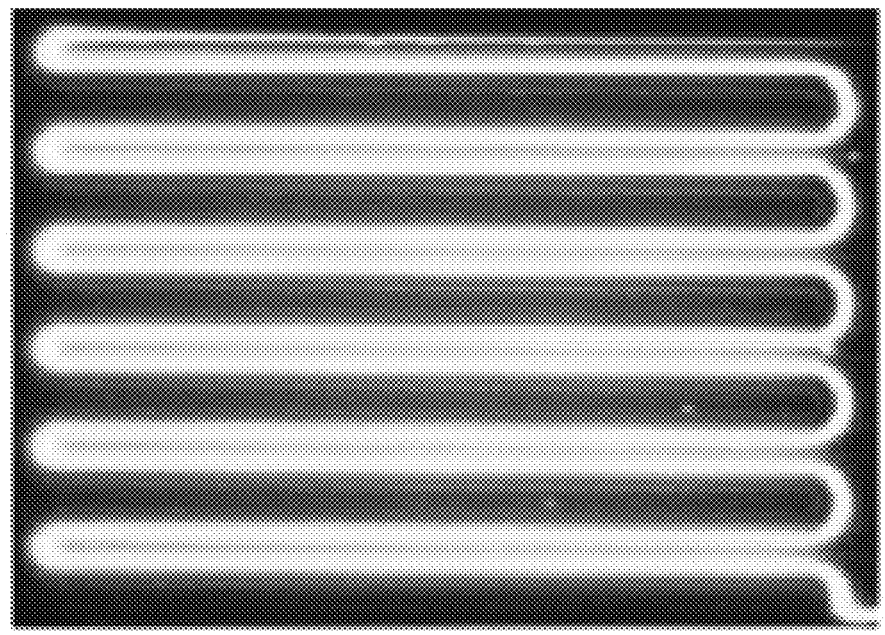
FIG. 30A is an exemplary embodiment of OLET transfer curves of TPTQ-C in accordance with the present disclosure.
Figure 30B:
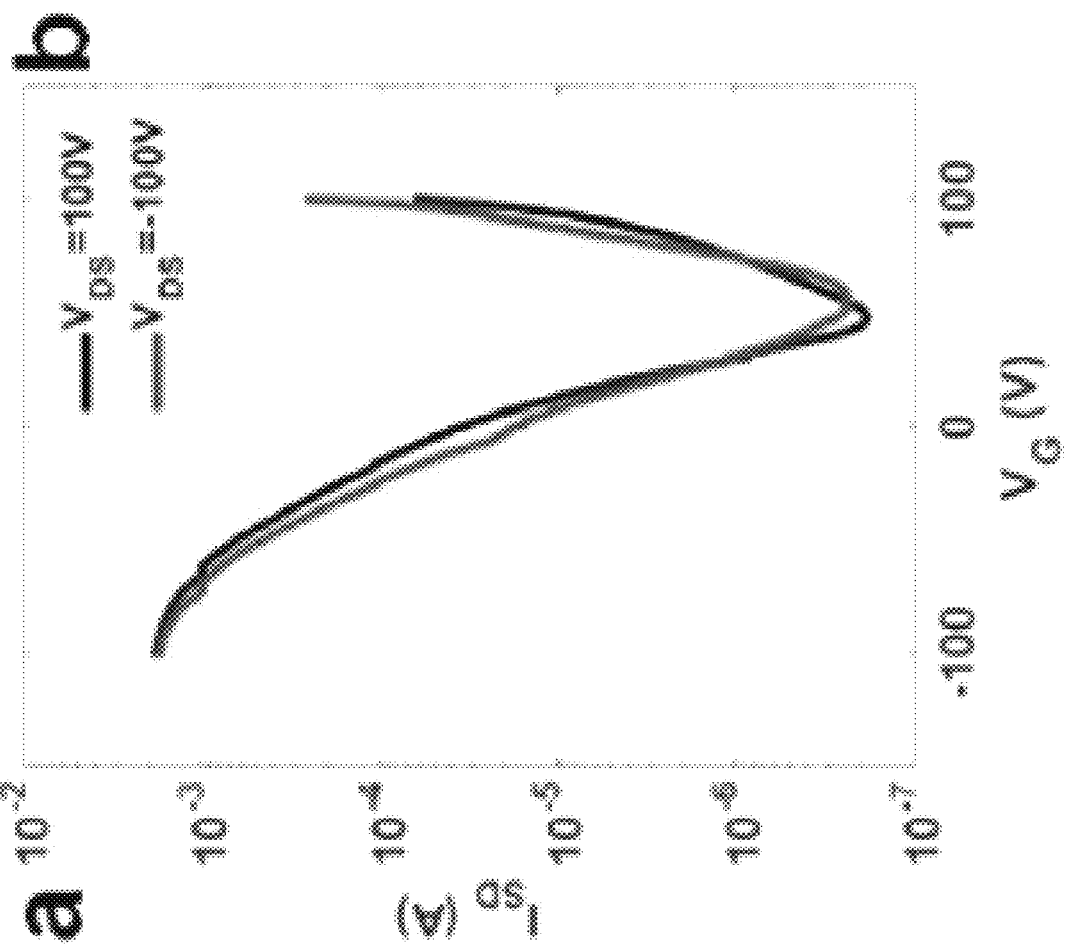
FIG. 30B is an exemplary embodiment of microscope photographs of OLET devices for TPTQ-C in accordance with the present disclosure.
Figure 30C:
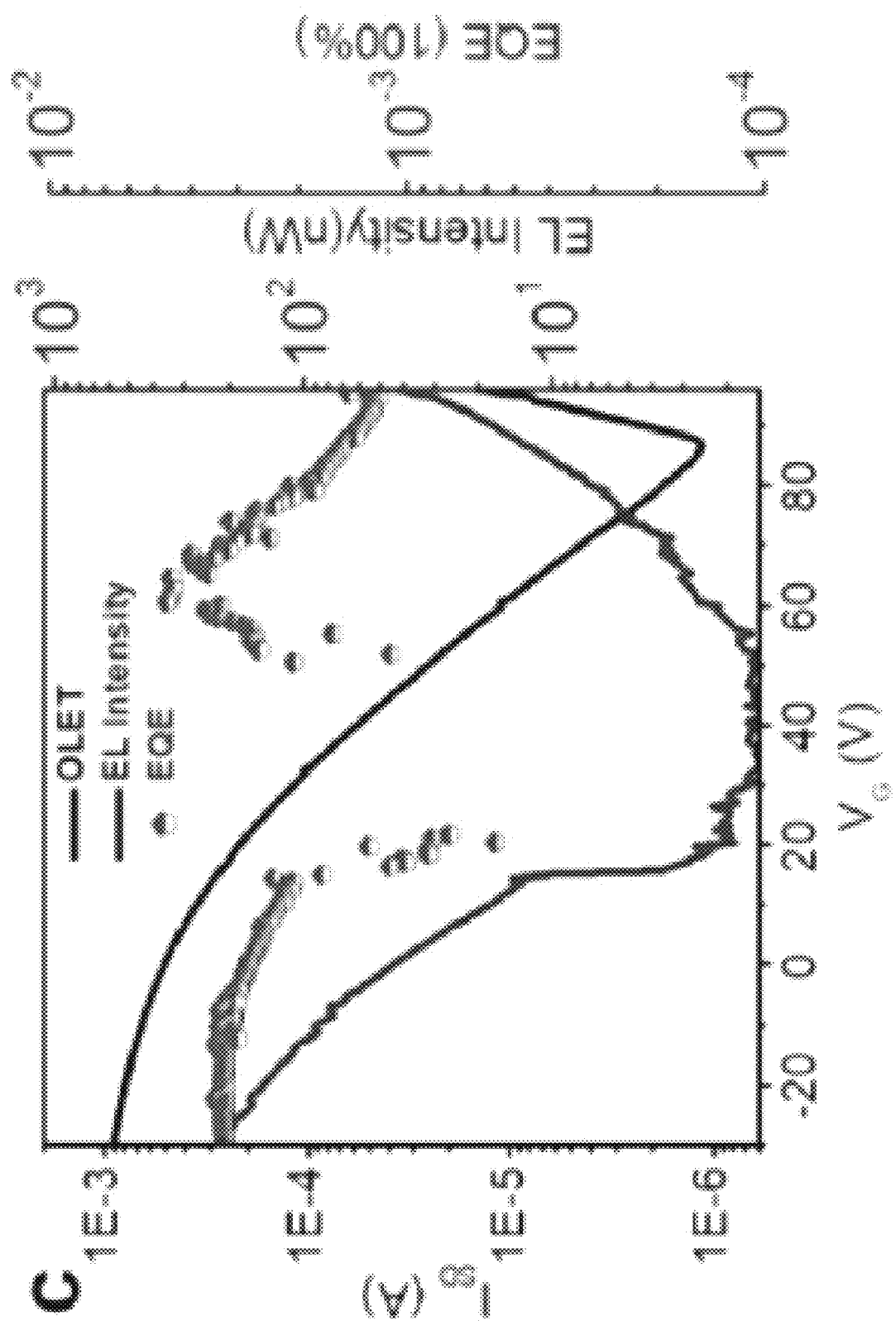
FIG. 30C is an exemplary embodiment of source-drain current ($I_{SD}$), electroluminescent intensity (EL intensity), and EQE of TPTQ-C ($V_{DS}$=90 V) changing with gate voltage in accordance with the present disclosure.
Figure 30D:
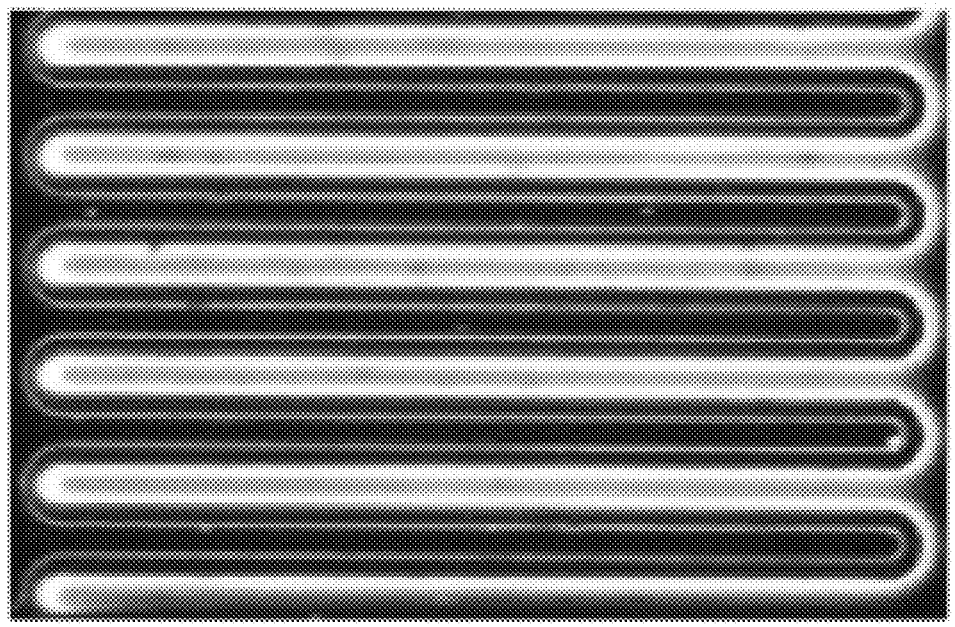
FIG. 30D is an exemplary embodiment of OLET transfer curves of TPTQF-C in accordance with the present disclosure.
Figure 30E:
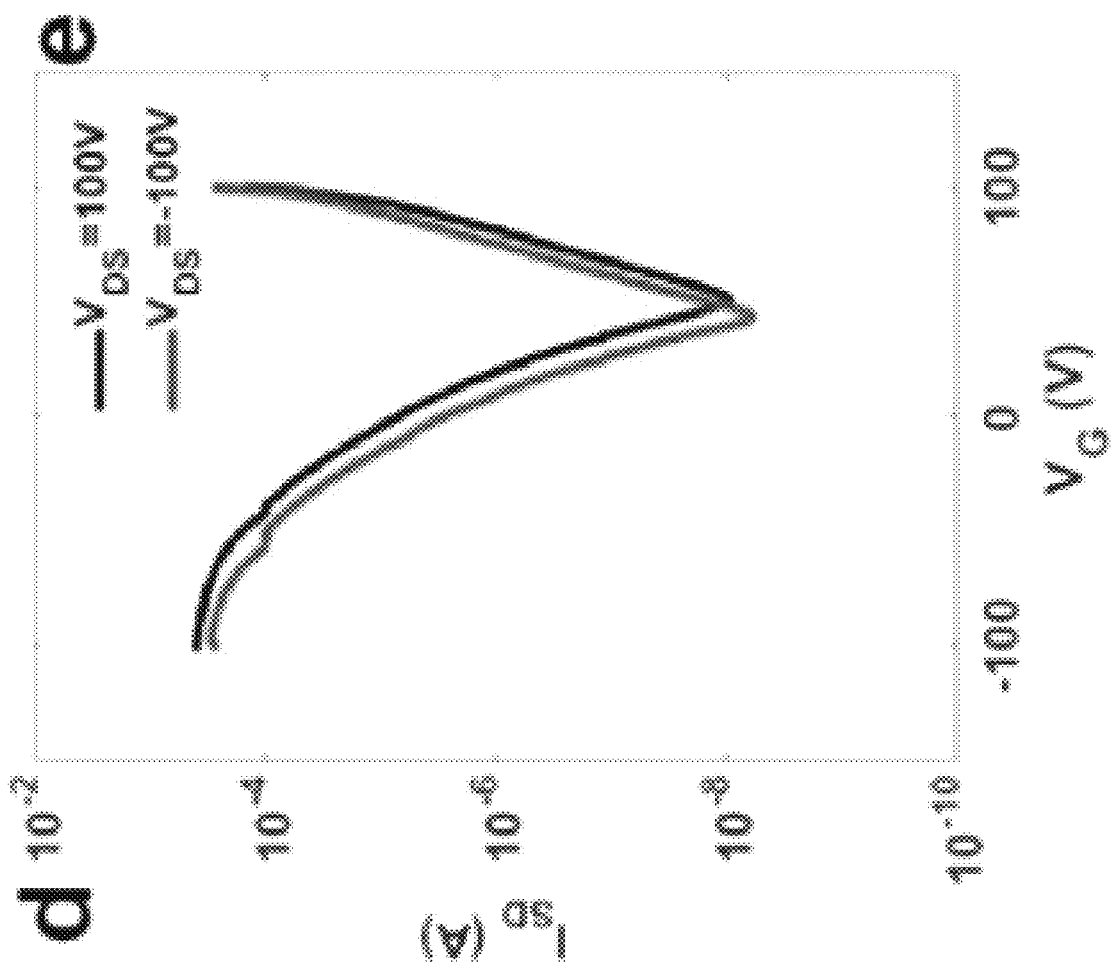
FIG. 30E is an exemplary embodiment of microscope photographs of OLET devices for TPTQF-C in accordance with the present disclosure.
Figure 30F:
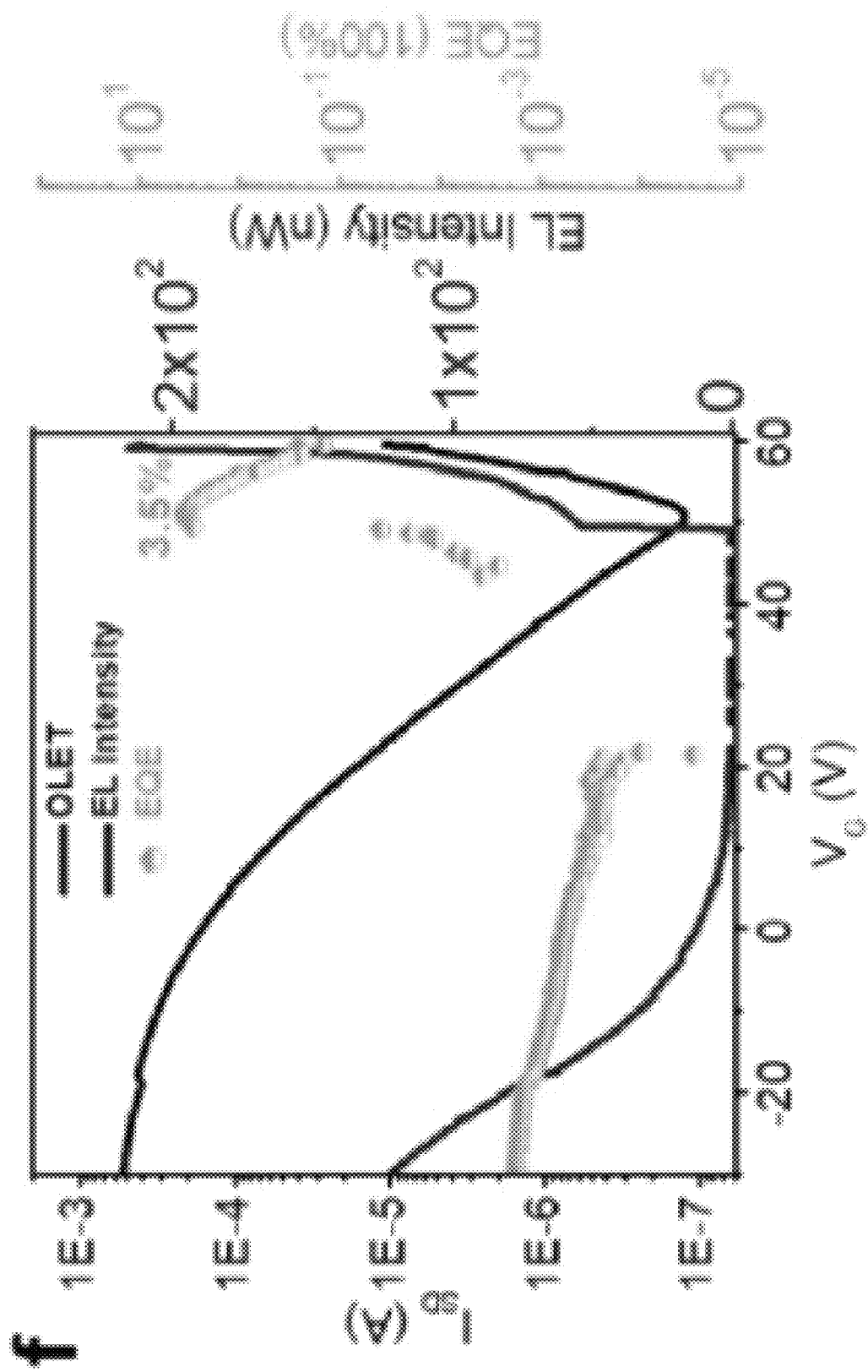
FIG. 30F is an exemplary embodiment of source-drain current ($I_{SD}$), electroluminescent intensity (EL intensity), and EQE of TPTQF-C ($V_{DS}$=60 V) changing with gate voltage in accordance with the present disclosure.
Figure 31A:
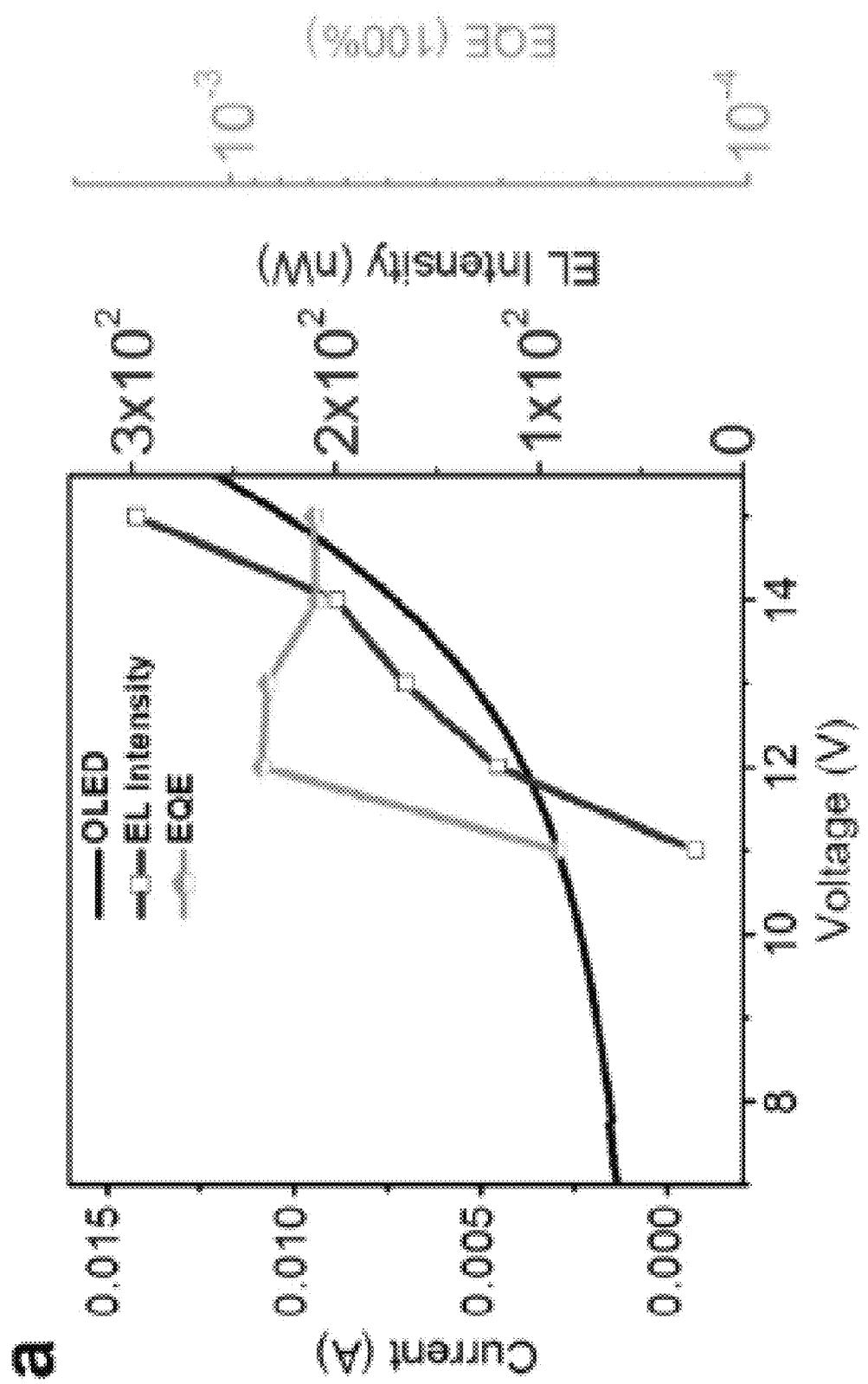
FIG. 31A is an exemplary embodiment of a tri-layer OLED of TPTQF-C in accordance with the present disclosure.
Figure 31B:
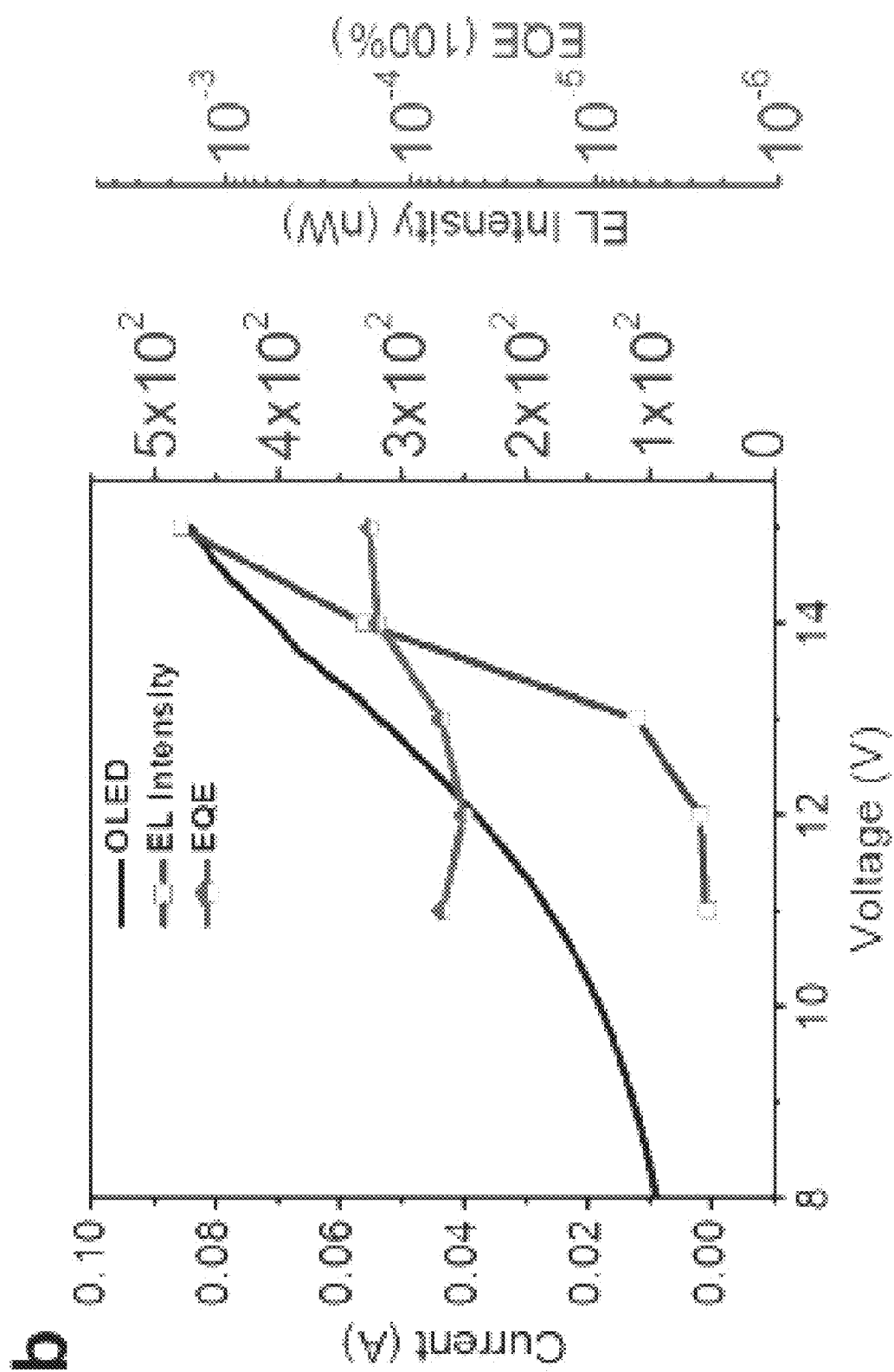
FIG. 31B is an exemplary embodiment of a tri-layer OLED of TPTQ-C in accordance with the present disclosure.
Figure 32A:
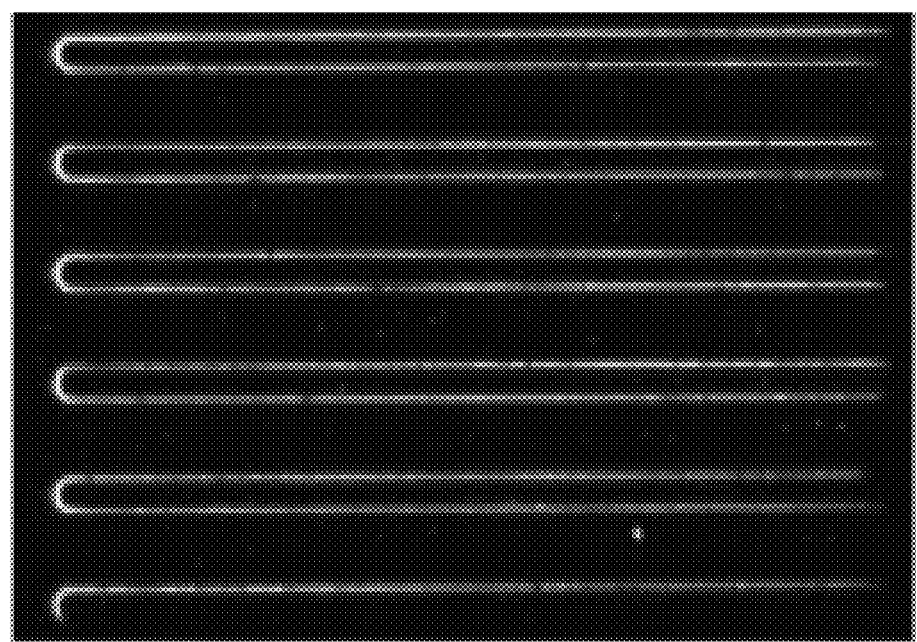
FIG. 32A is an exemplary embodiment of transfer curves of TPTQF-CC in accordance with the present disclosure.
Figure 32B:
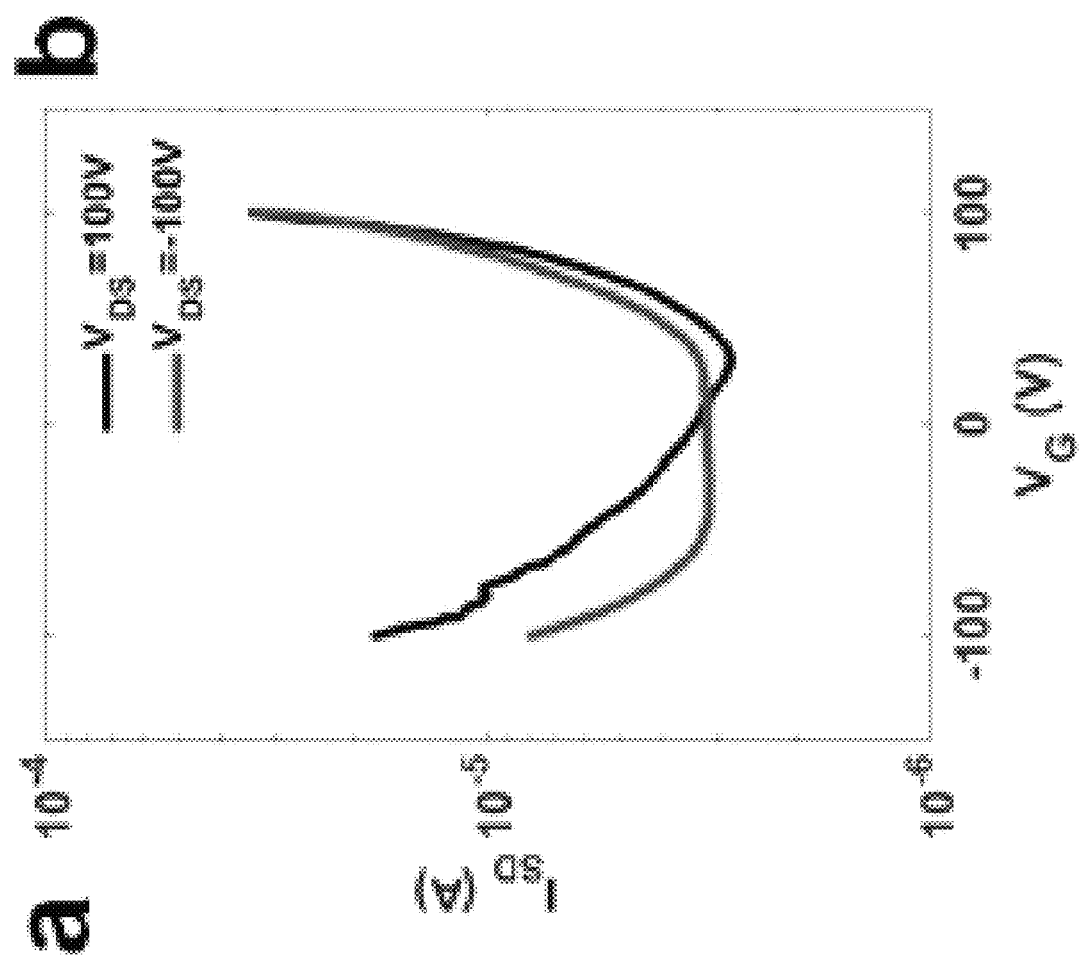
FIG. 32B is an exemplary embodiment of microscope photographs of OLET devices for TPTQF-CC at $V_{DS}$=100 V in accordance with the present disclosure.
Figure 32C:
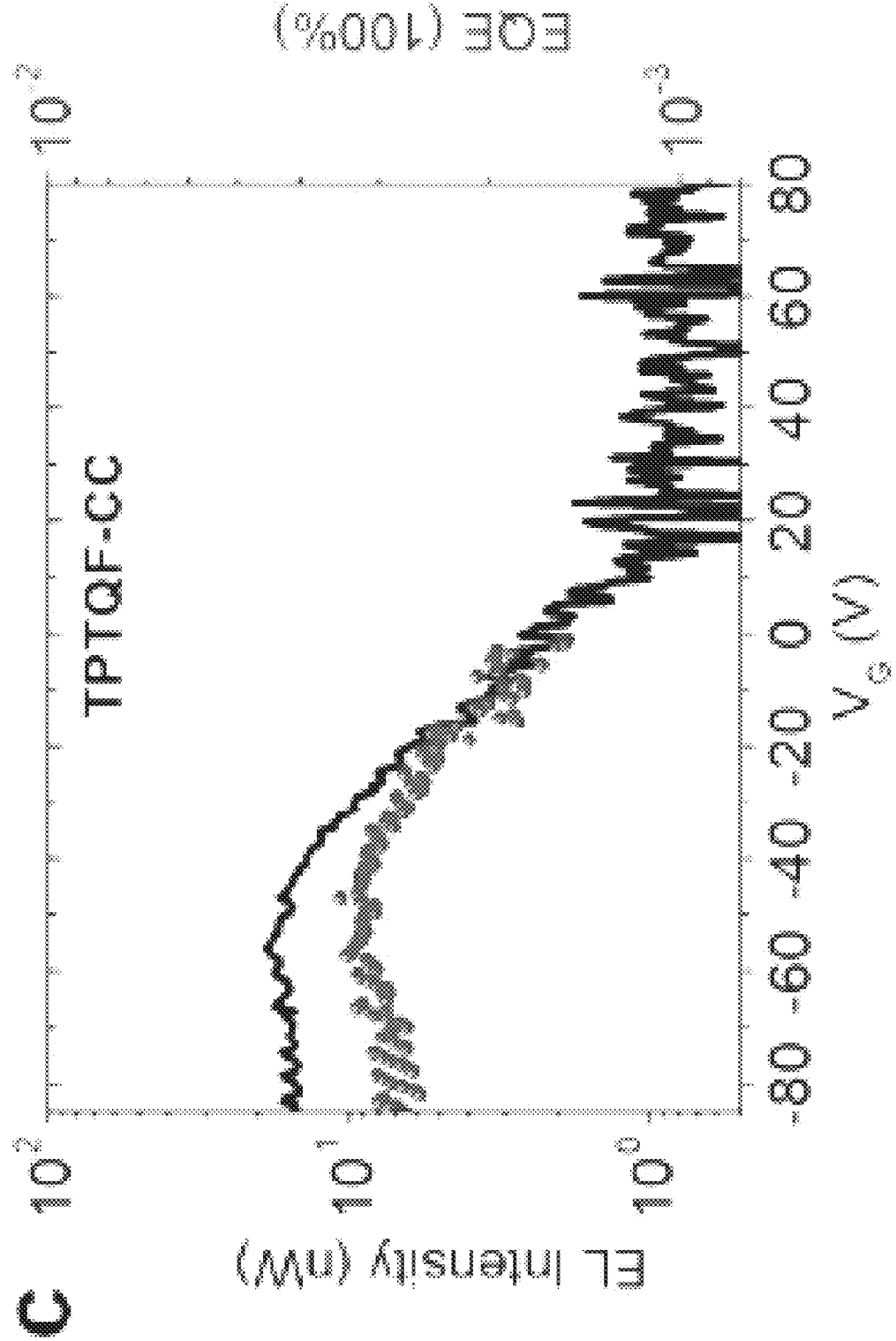
FIG. 32C is an exemplary embodiment of electroluminescent intensity (EL intensity), and EQE of TPTQF-CC ($V_{DS}$=90 V) in accordance with the present disclosure.
Figure 32E:
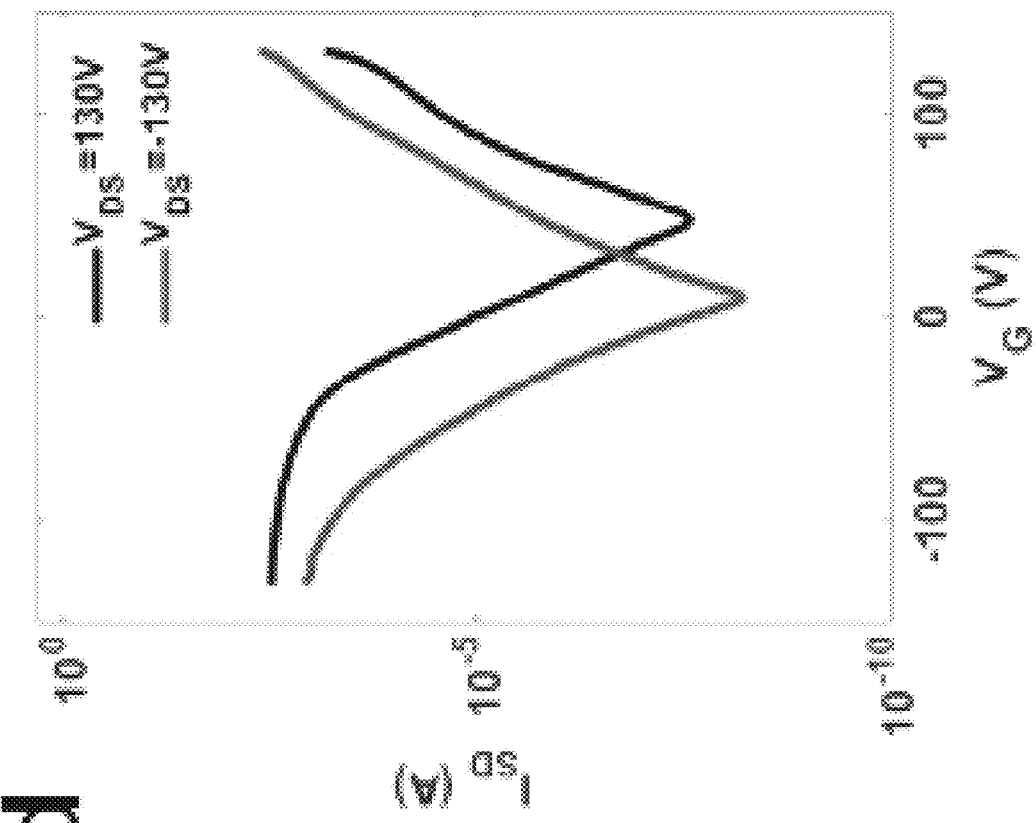
FIG. 32E is an exemplary embodiment of microscope photographs of OLET devices for TPTQ-CC at $V_{DS}$=100 V in accordance with the present disclosure.
Figure 32D:
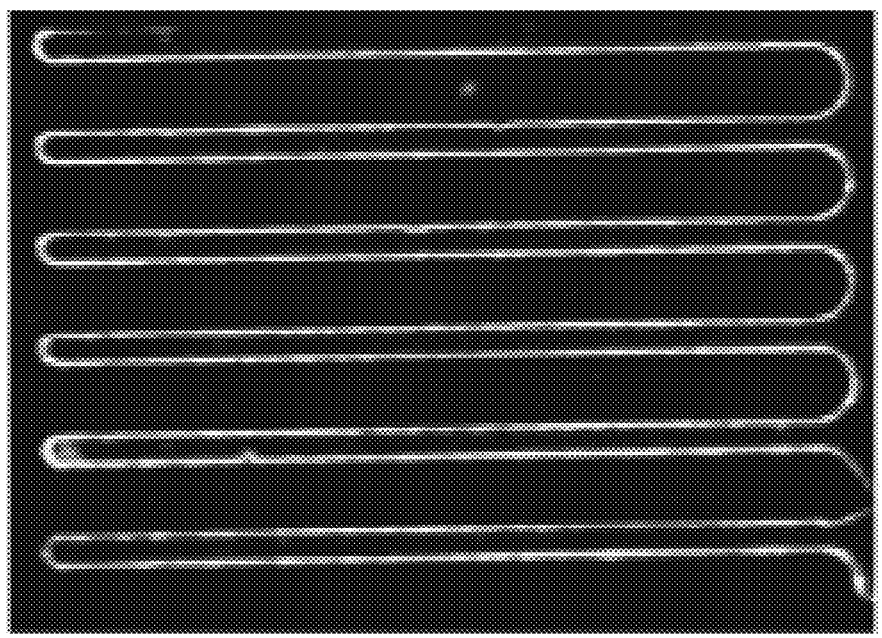
FIG. 32D is an exemplary embodiment of transfer curves of TPTQ-CC in accordance with the present disclosure.
Figure 32F:
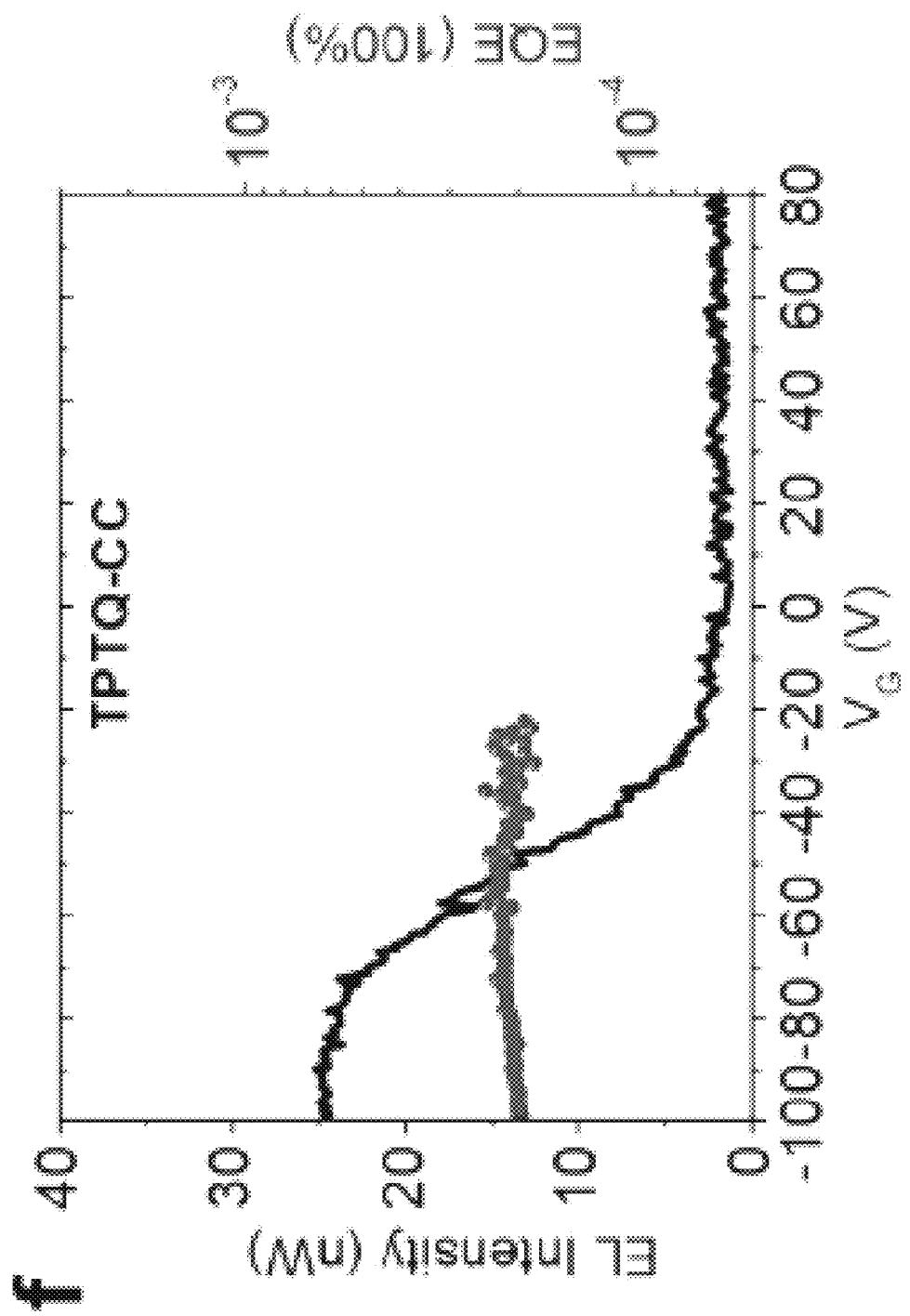
FIG. 32F is an exemplary embodiment of TPTQ-CC ($V_{DS}$=100 V) changing with gate voltage in accordance with the present disclosure.

The transfer curves for the OLET device and the photocurrent for the reverse-biased photodiode were simultaneously measured by placing calibrated photodiode right in front of the device and observing the response. Based on the photocurrent obtained from photodiodes and source-drain current in OLET devices, the EL intensity and EQE of the OLET devices described herein can be measured. As shown in FIG. 30C and FIG. 30F, the EL intensity decreased with decreasing gate voltages from negative to positive, and then increased with increasing gate voltages starting from around V$_G$=40 V. The EL intensity achieved for TPTQ-C (200 nW) and TPTQF-C (216 nW) were comparable to other, previously disclosed tri-layered OLET devices. TPTQF-C showed the highest EQE of 3.5% at low applied voltages (V$_{DS}$=60 V, V$_G$=51 V) which was more than three orders of magnitude higher than that of the corresponding tri-layered OLED (FIG. 31A-B). In comparison, the intrinsically low PLQY in TPTQ-C, and larger source-drain current due to higher charge mobilities in tri-layered OLET devices (Table 8), limited the electroluminescence efficiency, and led to an EQE of only 0.0050%. The same tri-layered OLETs of linear polymers, TPTQF-CC and TPTQ-CC, were fabricated and measured as shown in the ESI (FIG. 32A-F and Table 9) for comparison. EL intensity (~10$^{-1}$ nW) and EQE obtained in OLET devices of TPTQF-CC (0.0032%) and TPTQ-CC (0.00022%) were much lower than the corresponding cross-conjugated coiled foldamers, TPTQF-C and TPTQ-C.

TABLE 9

Properties of OFET and OLET for linear polymers.

| | $\mu_h$ (cm$^2$ V$^{-1}$ s$^{-1}$) average | $\mu_e$ (cm$^2$ V$^{-1}$ s$^{-1}$) average | $I_{on/off}$ average | EQE$^{Maximum}$ |
|---|---|---|---|---|
| TPTQF-CC[a] | $1.6 \times 10^{-5}$ | — | $10^2$ | — |
| TPTQ-CC[a] | — | — | — | — |
| TPTQF-CC[b] | $4.7 \times 10^{-2}$ | $6.4 \times 10^{-2}$ | $10^1/10^1$ | 0.0032% |
| TPTQ-CC[b] | $2.0 \times 10^{-2}$ | $6.5 \times 10^{-2}$ | $10^4/10^4$ | 0.00022% |

[a]Single-layered OFET devices.
[b]Tri-layered OLET devices.

Figure 33A:
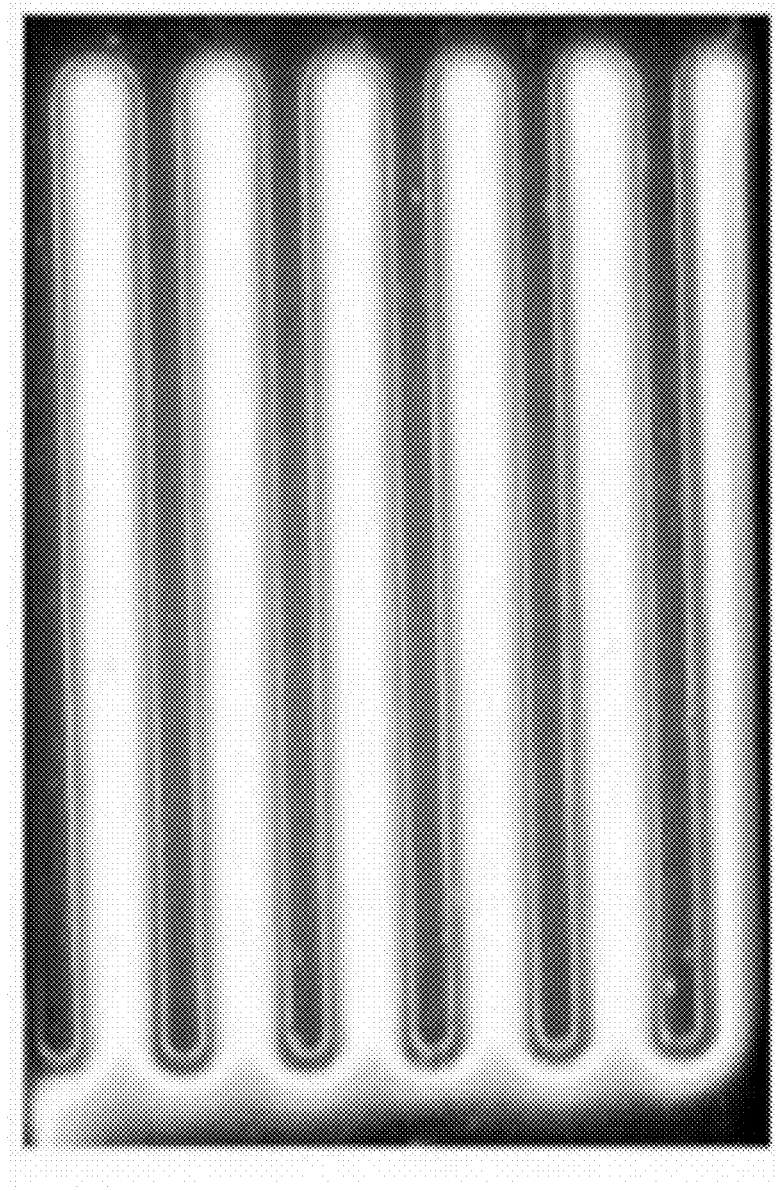
FIG. 33A is an exemplary embodiment of a microscope photograph of optimized OLET device for TPTQF-C at $V_{DS}$=100 V in accordance with the present disclosure.
Figure 33B:
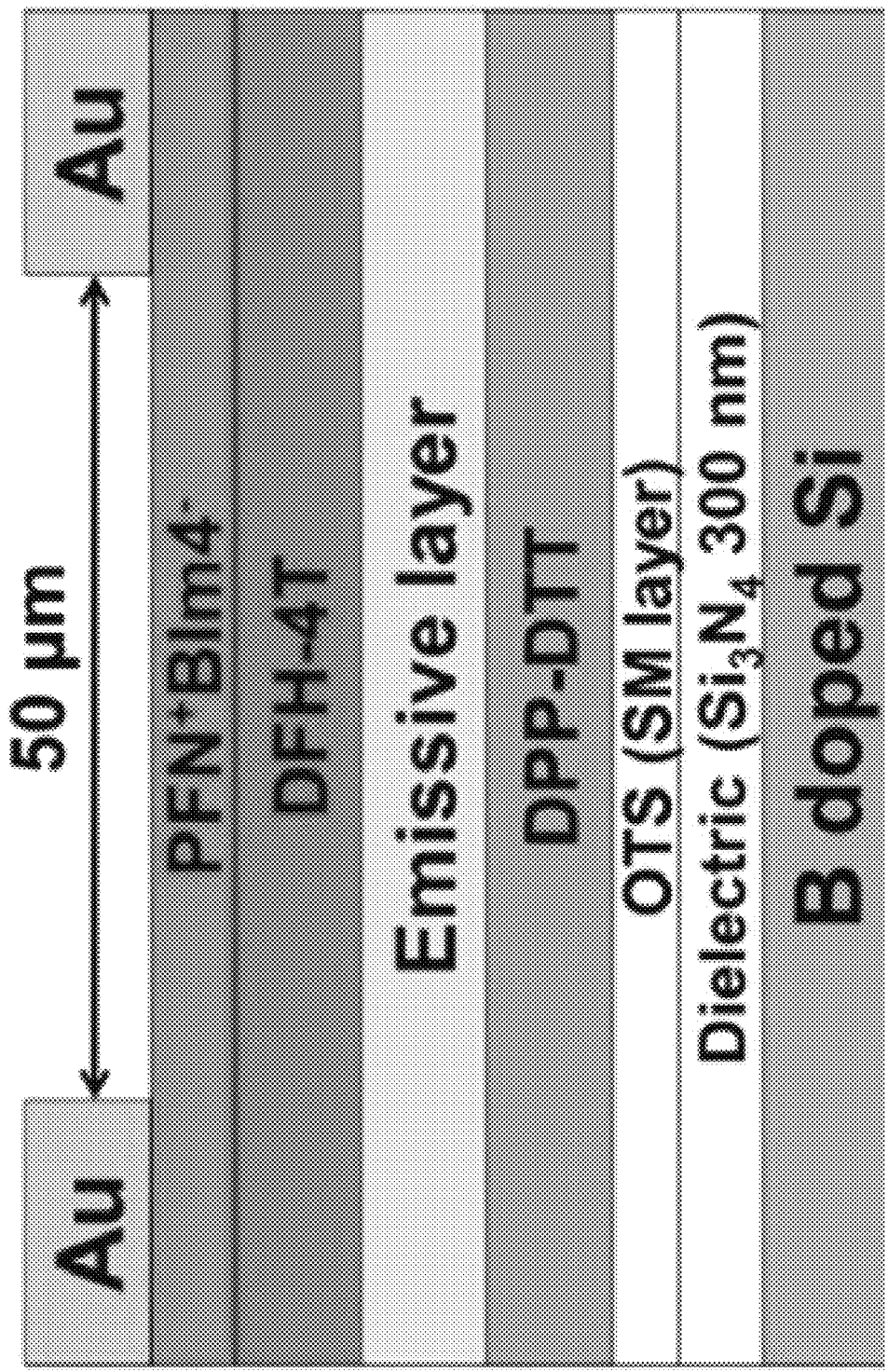
FIG. 33B is an exemplary embodiment of an optimized OLET device structure in accordance with the present disclosure. 33C is an exemplary embodiment of transfer curves in accordance with the present disclosure.
Figure 33C:
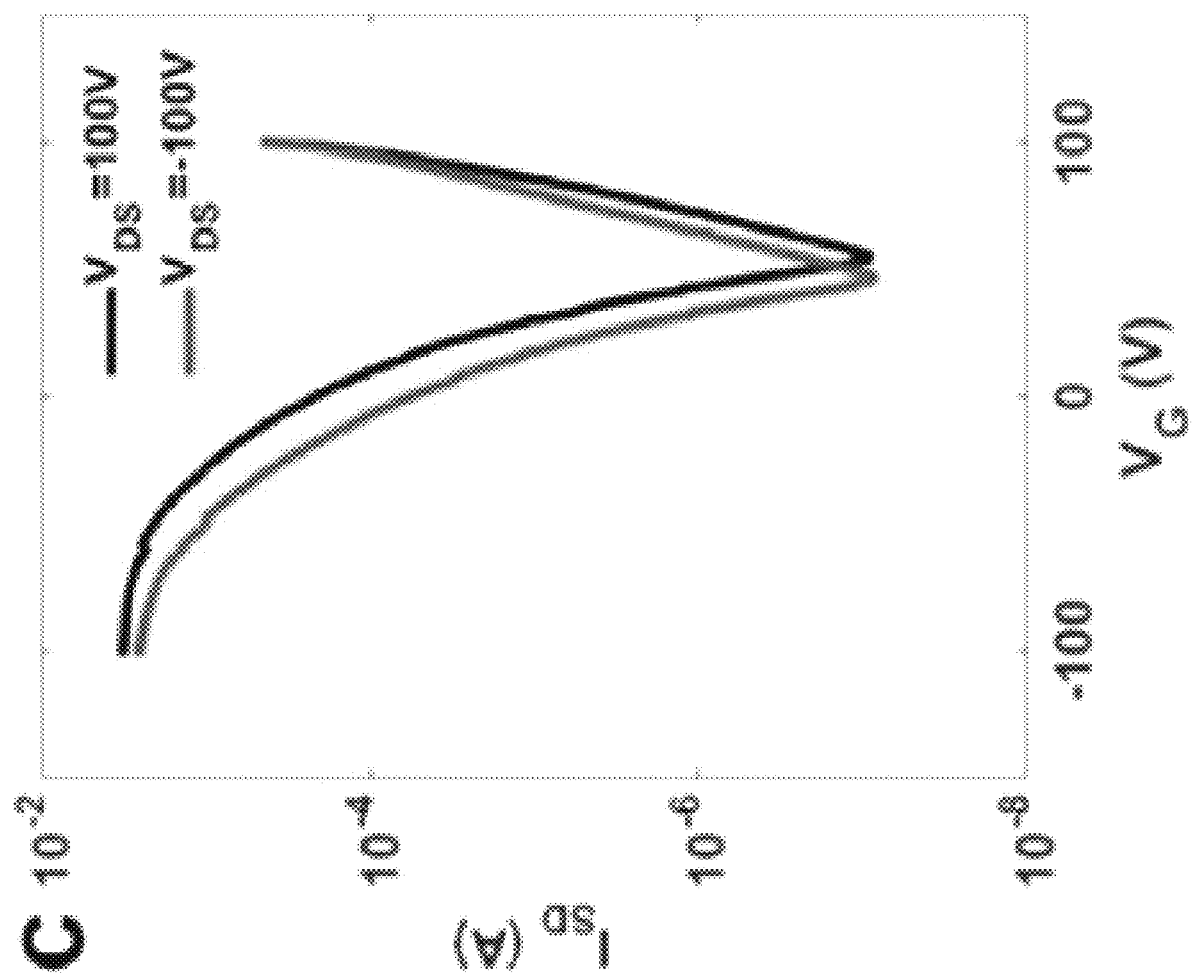
FIG. 33D is an exemplary embodiment of and $I_{SD}$, EL intensity, and EQE changing with gate voltage at $V_{DS}$=60 V (FIG. 33D) in accordance with the present disclosure.
Figure 33D:
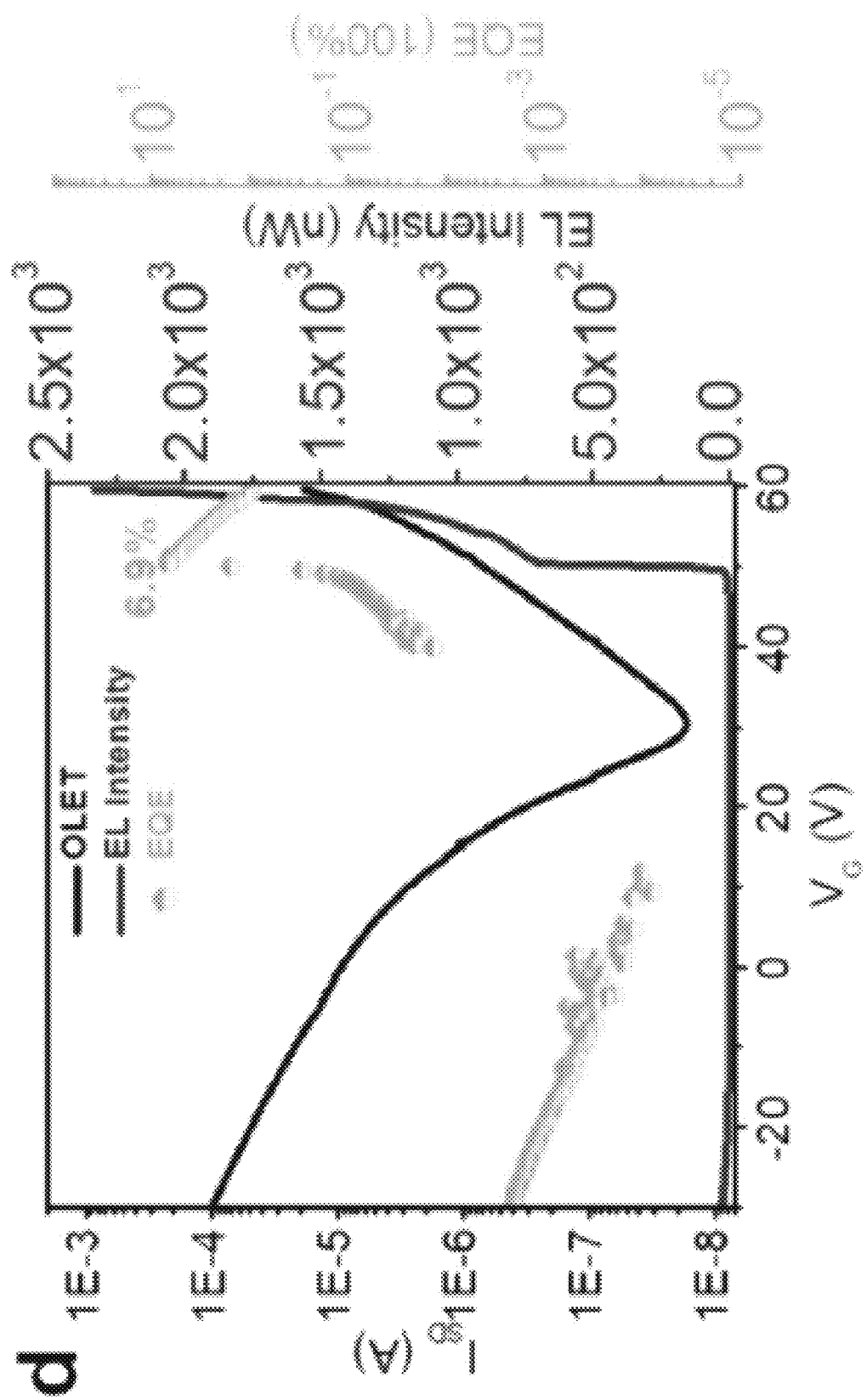
Figure 34:
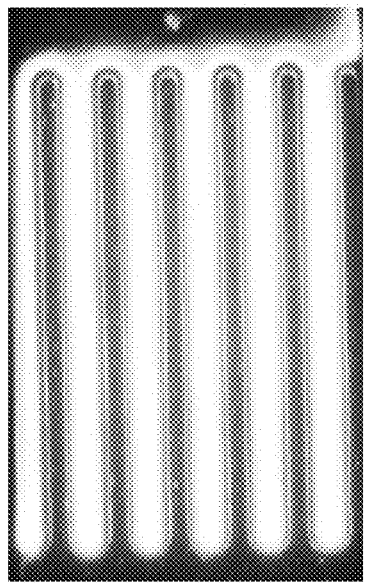
FIG. 34 is an exemplary embodiment of a microscope photograph of an optimized OLET device for TPTQF-C with increasing gate voltages ($V_{DS}$=100 V) in accordance with the present disclosure.
Figure 34:
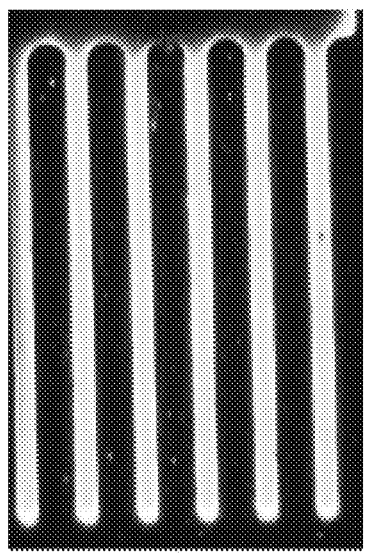
Figure 34:
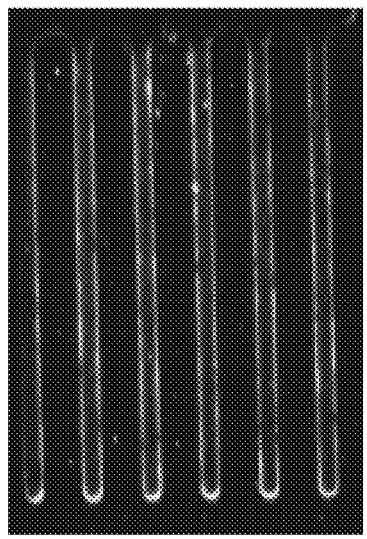

Since the highly fluorescent foldamer, TPTQF-C exhibited good performance in tri-layered OLET devices, further optimization of the device structure was essential. As shown in FIG. 30E, the charge carriers in the DPP-DTT layer recombined with the injection charge carriers from PFN+ BIm$_4^-$ near the electrodes and displayed a narrow emission zone, which behaved more like an OLED and limited the EQE. It was because the thin PFN$^+$BIm$_4^-$ layer was unable to transport charge carriers that led to the exciton quenching on gold. Thus, another charge transporting layer DFH-4T was inserted between the emissive layer and the charge injection layer as shown in FIG. 33A-D and FIG. 29B. The energy levels of this layer matched well with those of TPTQF-C. The LUMO (−3.3 eV) of DFH-4T aligns closely with the LUMO of TPTQF-C. The HOMO (−6.3 eV), however, was much lower than that of TPTQF-C. Moreover, DFH-4T showed high charge mobility of 0.5 cm$^2$ V$^{-1}$ s$^{-1}$ which is comparable with that of DPP-DTT. As shown in FIG. 33A and FIG. 34, the much stronger yellow-green emission zone in these new devices extended significantly and nearly covered the whole channel. This is in sharp contrast to the device shown in FIG. 30E. This demonstrated that the injection charge carriers in the DFH-4T layer can transport efficiently and recombine with charge carriers from DPP-DTT bottom layer in the middle of the emissive layer. Here, impressive EL intensity (2332 nW) and EQE (6.9%) were observed as shown in FIG. 33D. Notably, an interesting observation is that the emission zone is not a narrow line as observed in those single-layer devices. This may have complicated reasons. One explanation is likely due to multilayers so that the gating field sensed by the emission layer was broadened. A more detailed device investigation is in progress to elucidate this point.

Conclusions

The semi-ladder copolymers TPTQ-C and TPTQF-C exhibiting a foldamer structure show balanced electrical and light-emitting properties. It is known that foldamers are well studied in biological macromolecules or synthetic polymers (oligomers) that adopt highly ordered helical-like self-assembling structures by non-covalent interactions. The investigation of foldamers provides insight into biological systems and is of great importance when developing new self-assembling materials. Artificial foldamers have shown promising applications in chiral recognition, circularly polarized luminescence, asymmetric catalysis, etc. Though chemists have proposed strategies for dye self-assembly, synthetic and design protocols for functional foldamers such as light-emitting materials are rare, if any. This is the first demonstration that coiled donor-acceptor semi-ladder polymers can form folded structures exhibiting superior device performance. The observed high EQE is remarkable considering that the polymer exhibits only modest PLQY and low mobility. There are three factors that enhanced the EQE of the OLET device. The first is the unique structures of the foldamer that allows an optimal compromise in light emission and charge transport, leading to high EQEs. The second one is the inserted charge-transporting layers which balanced charge injection and transport so that excitons are formed away from the edge of electrodes, which is evident from the EL image. The third one is that emitted light can be extracted from top side in the bottom gate top contact configuration, and don't need to pass through the highly refractive transparent electrodes like OLED, which can achieve higher outcoupling efficiency. This design strategy may pave the way for the development of even more efficient polymers that can be used in the next generation of high-efficiency OLETs.

Exemplary Materials and Methods

The following materials and methods are exemplary in nature, and the present disclosure is not limited the specific materials and methods described in this section.

Materials Used. Polymers TPTQ-C, TPTQF-C and their monomers and precursors were synthesized. Polymers DPP-DTT and PFN-Br were purchased from 1 Material, Inc. Bromide counter ion was replaced with BIm$_4^-$ in PFN-Br using a method described elsewhere. All solvents utilized, including p-xylene, methanol, and chloroform were anhydrous and used as received from Sigma Aldrich without additional purification.

Materials Properties Studies. UV-Vis absorption spectra were measured using Shimadzu UV-3600 spectrometer. Fluorescence spectra were measured using Horiba FluoroLog fluorometer at the University of Chicago MRSEC MPML. Time dependent fluorescence decay spectra were measured using ISS Chronos BH fluorometer at the University of Chicago MRSEC MPML. Instrument response function was estimated using standard 1% LUDOX solution from Sigma Aldrich. Exponential decay fitting was performed using the software provided with the instrument. Cyclic voltammetry (CV) were measured using AUTOLAB/PGSTAT12 model system with a three-electrode cell in acetonitrile solution with Bu$_4$NPF$_6$ as supporting electrolyte (0.1 M) and referenced against Fc/Fc$^+$ redox peaks (scan rate: 100 mV/s). $^1$H NMR spectra were recorded on a Bruker DRX-500 spectrometer. Molecular weights of polymers were determined by using GPC with a Waters Associates liquid chromatography equipped with a Waters 510 HPLC pump, a Waters 410 differential refractometer, and a Waters 460 tunable absorbance detector. CHC13 was used as the eluent and polystyrene as the standard.

Fabrication of OLET Devices. Devices were assembled in a bottom-gate top-contact (BG-TC) configuration. B doped silicon wafers with 300 nm silicon nitride were purchased from University Wafers and used as substrates. Wafers were cut into 14×19 mm slides and ultrasonicated in acetone and isopropanol for 15 min each. Afterward, they were dried using compressed dry nitrogen. Silicon wafers were then modified with octadecyltrichlorosilane (OTS). For OTS modification, silicon wafers were put in a glass petri dish and one drop of octadecyltrichlorosilane was added. It was kept in a vacuum oven at 120° C. for 1 hour and then cooled down to room temperature. Chloroform solution (5 mg mL$^{-1}$) of DPP-DTT was spin-coated on a rotating substrate at 1500 rpm/60 seconds and annealed at 120° C. for 30 min in a glove box. The thickness of DPP-DTT layer was around 30 nm. Emissive polymers were then dissolved in p-xylene with a concentration of 12 mg mL$^{-1}$ and spin-coated on DPP-DTT at 2000 rpm for 40 seconds. The thickness of the emissive layers was determined to be around 70 nm. Polymer films were then annealed at 120° C. for 30 min in a glove box. For the optimized OLET device structure, hot chloroform solution of DFH-4T with a concentration of 2 mg mL$^{-1}$ was spin-coated on a fast-rotating emissive layer at 4000 rpm/60 seconds and then transferred to a vacuum oven to dry. Then PFN$^+$BIm$^{4-}$ was dissolved in methanol with a concentration of 2 mg mL$^{-1}$. After filtration, PFN$^+$BIm$^{4-}$ was spin-coated on the active layer at 7000 rpm for 30 seconds giving a thickness less than 10 nm. Polymer films were then annealed at 60° C. for 20 min in air and then transferred back to the glove box for thermal deposition of source-drain electrodes. 30 nm of gold was deposited in a vacuum chamber under<10$^{-6}$ Torr pressure through a shadow mask purchased from Ossila Ltd.

Fabrication of OLED Devices. The structure of the presently disclosed OLED device was as follows: ITO/PEDOT:PSS/DPP/emissive layer/PFN$^+$BIm$_4^-$/Ca/Al. ITO glass was ultrasonicated in chloroform, acetone, and isopropanol for 15 minutes each and then dried using compressed nitrogen. It was then cleaned in UV/ozone for 20 minutes. PEDOT:PSS from Heraeus was spin-coated on ITO at 6000 rpm for 60 seconds and annealed in a vacuum oven at 95° C. The coating of DPP-DTT, emissive layer, and PFN$^+$BIm$_4^-$ was identical to the protocol described for OLET. 20 nm calcium and 80 nm aluminum were thermally evaporated in a vacuum chamber under<10-$^6$ Torr pressure through a shadow mask with a defined device area of 3.14 mm$^2$.

EQE Measurements. All devices were tested in a nitrogen glovebox in dark conditions. At least ten OLET devices were fabricated and tested for each emissive polymer. Two-channel SMU Keithley 2612A was used to test the output and transfer characteristics of devices. Custom-built experimental stage was used for the measurements. Needle probes from Quater Research were used for measurements. Microscope with USB camera from AmScope was used for needle probe alignment with the device contacts. The same microscope with more sensitive camera MU530-BI-CK from AmScope was used to observe light emission from OLETs. To measure the EQE of the presently disclosed OLET device, a modified method was used as previously described elsewhere. The photodiode FDS100-CAL purchased from Thorlabs was calibrated with OLED of known irradiance based on the same emissive layer as the OLEFET. The irradiance of OLED was then measured using a calibrated integrating sphere AvaSphere-50-IRRAD and AvaSpec-ULS2048 spectrometer. The photocurrent obtained from the calibrated photodiode placed right in front of the operating device was used to calculate the brightness of OLET devices, the photon flux (PF, μmol m$^{-2}$ s$^{-1}$), and the number of photons ($N_p$). The number of electrons ($N_e$) injected into the device was calculated from the source-drain current ($I_{SD}$). EQE was calculated as the ratio of the number of photons ($N_p$=PF×A×10$^{-6}$×$N_A$, A=7.84×10$^{-5}$ m$^2$, $N_A$≈6.02×10$^{23}$) per second to the number of injected electrons ($N_e$=$I_{SD}$/e, e≈1.602×10$^{-19}$ C) per second, EQE=($N_p$/$N_e$)×100%.

GIWAXS Analysis. The GIWAXS measurements were performed at the 8ID-E beamline of Advanced Photon Source at the Argonne National Laboratory with a radiation wavelength of 1.1354 Å. The samples were prepared on a polished silicon wafer. The same solvent and annealing modes were used in the actual device fabrication process.

SAXS Analysis. The SAXS measurements were performed at the 15ID-D station of NSF's ChemMatCARS, Advanced Photon source at Argonne National Laboratory with X-rays of energy 15.2 keV. Samples, dissolved in solvent THF, were sealed in a Kapton capillary tubes of diameter 1.0 mm. The SAXS patterns from THF was also measured as a background and subtracted from the data obtained from samples.

Synthesis of Semi-Ladder Copolymers. All starting materials, solvents, reagents, and catalysts were procured from commercial sources and used without further purification. Compound TPTQ was synthesized as per previously reported methods. Compound TPTQF was synthesized in a similar protocol as TPTQ.

Br-TPTQ-Br—TPTQ (1 eq) was dissolved in Chloroform and the solution cooled to 0° C. in dark. Br$_2$ (10 eq) was then added dropwise after which the solution was warmed to room temperature and stirred for 4 hours. The reaction mixture was poured in an aqueous solution of Na$_2$SO$_3$ and extracted with Chloroform. The organic layer was dried with MgSO$_4$ and the solvent removed under reduced pressure. The crude mixture was recrystallized from dichloromethane/methanol to give a yellow solid in quantitative yield. $^1$H-NMR (500 MHz, CDCl3): δ (ppm) 7.73 (s, 2H), 7.59 (s, 2H), 4.36 (br, 4H), 1.98 (m, 2H), 1.25-1.40 (m, 32H), 0.86-0.92 (m, 12H). $^{13}$C-NMR (100 MHz, CDCl3): δ (ppm) 156.92, 144.90, 132.09, 131.89, 129.72, 118.25, 114.24, 109.58, 45.83, 36.93, 31.95, 31.63, 29.85, 29.30, 27.22, 23.22, 22.71, 14.16.

Br-TPTQF-Br—TPTQF (1 eq) was dissolved in DMF and the solution cooled to 0° C. in dark. NBS (2.2 eq) in DMF was then added dropwise after which the solution was warmed to room temperature and stirred overnight. The reaction mixture was poured in water and extracted with Chloroform. The organic layer was dried with MgSO4 and the solvent removed under reduced pressure. The crude mixture was recrystallized from dichloromethane/methanol to give a yellow solid in 70% yield. $^1$H-NMR (500 MHz, CDCl3): δ (ppm) 7.96 (s, 2H), 7.05 (s, 2H), 4.41 (br, 4H), 2.02 (m, 2H), 1.25-1.46 (m, 32H), 0.84-0.93 (m, 12H).

Cross conjugated model Compound C-TPTQ-C—Br-TPTQ-Br (1 eq), Carbazole-BPin (3 eq), K$_2$CO$_3$ (4 eq), Aliquat 336 (3 drops), and Pd(PPh3)4 (0.05 eq) were dissolved in 6 ml of Toluene/H2O (10:1). The mixture was degassed for 30 minutes and refluxed overnight. After cooling to room temperature, the mixture was poured in water and extracted with DCM. The organic layer was dried with MgSO$_4$ and the solvent removed under reduced pressure. The crude mixture was purified by column chromatography on silica gel ethyl acetate/hexane (1/9 v/v) mixture to get yellow green solid in 56% yield. $^1$H-NMR (500 MHz, CDCl3): δ (ppm) 8.27 (s, 2H), 8.06 (d, 2H). 7.94 (s, 2H), 7.73 (d, 2H), 7.59 (s, 2H), 7.47 (t, 2H), 7.33 (m, 6H), 4.43 (br, 4H), 4.03 (d, 4H), 2.06 (m 4H), 1.11-1.61 (m, 64 H), 0.86 (m, 24H). MS (MALDI-TOF) m/z 1327.94 (M$^+$), calcd 1328.06.

Cross conjugated model Compound C-TPTQF-C—Br-TPTQF-Br (1 eq), Carbazole-BPin (3 eq), K$_2$CO$_3$ (4 eq), Aliquat 336 (3 drops), and Pd(PPh$_3$)$_4$ (0.05 eq) were dissolved in 6 ml of Toluene/H$_2$O (10:1). The mixture was degassed for 30 minutes and refluxed overnight. After cooling to room temperature, the mixture was poured in water and extracted with DCM. The organic layer was dried with MgSO4 and the solvent removed under reduced pressure. The crude mixture was purified by column chromatography on silica gel ethyl acetate/hexane (1/9 v/v) mixture to get yellow green solid in 43% yield. $^1$H-NMR (500 MHz, CDCl3): δ (ppm) 8.53 (s, 2H), 8.16 (d, 2H). 8.09 (s, 2H), 7.94 (d, 2H), 7.51 (t, 2H), 7.42 (t, 4H), 7.33 (s, 2H), 7.30 (t, 2H), 4.56 (br, 4H), 4.15 (d, 4H), 2.01 (m 4H), 1.01-1.71 (m, 64 H), 0.88 (m, 24H). MS (MALDI-TOF) m/z 1295.89 (M+), calcd 1295.94.

TPTQ-C—Yield: 91%. 1H-NMR (500 MHz, C2D2Cl4): δ (ppm) 6.84-8.66 (br, 10H), 4.67-5.42 (br, 2H), 3.55-4.68 (br, 4H), 1.96-2.32 (m, 3H), 1.17-1.87 (m, 40H), 0.68-1.08 (m, 18H).

TPTQF-C—Yield: 99%. $^1$H-NMR (500 MHz, C$_2$D$_2$Cl$_4$): δ (ppm) 6.51-8.62 (m, 10H), 3.60-5.51 (m, 6H), 0.51-2.35 (m, 61H).

TPTQ-CC—Yield: 73%. Elemental Analysis calculated for [C$_{60}$H$_{79}$N$_3$O$_2$S$_2$]n: C: 76.79; H: 8.49; N: 4.48; O: 3.41; S: 6.83. Found: C: 75.01; H: 8.51; N: 4.16.

TPTQF-CC—Yield: 52%. $^1$H-NMR (500 MHz, CDCl3): δ (ppm) 6.40-8.35 (br, 10H), 3.30-5.35 (m, 6H), 0.42-2.35 (m 61H).

Definitions and methods described herein are provided to better define the present disclosure and to guide those of ordinary skill in the art in the practice of the present disclosure. Unless otherwise noted, terms are to be understood according to conventional usage by those of ordinary skill in the relevant art.

In some embodiments, numbers expressing quantities of ingredients, properties such as molecular weight, reaction conditions, and so forth, used to describe and claim certain embodiments of the present disclosure are to be understood as being modified in some instances by the term "about." In some embodiments, the term "about" is used to indicate that a value includes the standard deviation of the mean for the device or method being employed to determine the value. In some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable. The numerical values presented in some embodiments of the present disclosure may contain certain errors necessarily resulting from the standard deviation found in their respective testing measurements. The recitation of ranges of values herein is merely intended to serve as a shorthand method of referring individually to each separate value falling within the range. Unless otherwise indicated herein, each individual value is incorporated into the specification as if it were individually recited herein.

In some embodiments, the terms "a" and "an" and "the" and similar references used in the context of describing a particular embodiment (especially in the context of certain of the following claims) can be construed to cover both the singular and the plural, unless specifically noted otherwise. In some embodiments, the term "or" as used herein, including the claims, is used to mean "and/or" unless explicitly indicated to refer to alternatives only or the alternatives are mutually exclusive.

The terms "comprise," "have" and "include" are open-ended linking verbs. Any forms or tenses of one or more of these verbs, such as "comprises," "comprising," "has," "having," "includes" and "including," are also open-ended. For example, any method that "comprises," "has" or "includes" one or more steps is not limited to possessing only those one or more steps and can also cover other unlisted steps. Similarly, any composition or device that "comprises," "has" or "includes" one or more features is not limited to possessing only those one or more features and can cover other unlisted features.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the present disclosure and does not pose a limitation on the scope of the present disclosure otherwise claimed. No language in the specification should be construed as indicating any non-claimed element essential to the practice of the present disclosure.

Groupings of alternative elements or embodiments of the present disclosure disclosed herein are not to be construed as limitations. Each group member can be referred to and claimed individually or in any combination with other members of the group or other elements found herein. One or more members of a group can be included in, or deleted from, a group for reasons of convenience or patentability. When any such inclusion or deletion occurs, the specification is herein deemed to contain the group as modified thus fulfilling the written description of all Markush groups used in the appended claims. To facilitate the understanding of the embodiments described herein, a number of terms are defined below. The terms defined herein have meanings as commonly understood by a person of ordinary skill in the areas relevant to the present disclosure. Terms such as "a," "an," and "the" are not intended to refer to only a singular entity, but rather include the general class of which a specific example may be used for illustration. The terminology herein is used to describe specific embodiments of the disclosure, but their usage does not delimit the disclosure, except as outlined in the claims.

All of the compositions and/or methods disclosed and claimed herein may be made and/or executed without undue experimentation in light of the present disclosure. While the compositions and methods of this disclosure have been described in terms of the embodiments included herein, it will be apparent to those of ordinary skill in the art that variations may be applied to the compositions and/or methods and in the steps or in the sequence of steps of the method described herein without departing from the concept, spirit, and scope of the disclosure. All such similar substitutes and modifications apparent to those skilled in the art are deemed to be within the spirit, scope, and concept of the disclosure as defined by the appended claims.

All publications, patents, patent applications, and other references cited in this application are incorporated herein by reference in their entirety for all purposes to the same extent as if each individual publication, patent, patent application or other reference was specifically and individually indicated to be incorporated by reference in its entirety for all purposes. Citation of a reference herein shall not be construed as an admission that such is prior art to the present disclosure.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

Having described the present disclosure in detail, it will be apparent that modifications, variations, and equivalent embodiments are possible without departing the scope of the present disclosure defined in the appended claims. Furthermore, it should be appreciated that all examples in the present disclosure are provided as non-limiting examples.

Any non-limiting examples are provided to further illustrate the present disclosure. It should be appreciated by those of skill in the art that the techniques disclosed in the examples represent approaches the inventors have found function well in the practice of the present disclosure, and thus can be considered to constitute examples of modes for its practice. However, those of skill in the art should, in light of the present disclosure, appreciate that many changes can be made in the specific embodiments that are disclosed and still obtain a like or similar result without departing from the spirit and scope of the present disclosure.

What is claimed is:

1. A semi-ladder, luminescent polymer comprising:
   a foldamer structure;
   an electron-accepting organic chromophore selected from the group consisting of thieno [2',3':5,6] pyrido [3,4-g] thieno [3,2-c]- isoquinoline-5,11(4H,10H)-dione (TPTI), 5,11-bis(2-butyloctyl)-dihydrothieno[2',3':4,5] pyrido[2,3-g]thieno[3,2-c] quinoline-4,10-dione (TPTQ), and furo[3,2-c]furo[2',3':4,5]pyrido[2,3-g] quinoline-4,10-dione (TPTQF); and
   an electron-donating co-monomer.

2. The polymer of claim 1, wherein the chromophore is TPTI and wherein the co-monomer is carbazole such that the polymer is a cross-conjugated polymer (TPTI-C).

3. The polymer of claim 1, wherein the chromophore is TPTI and wherein the co-monomer is carbazole such that polymer is a fully-conjugated polymer (TPTI-CC).

4. The polymer of claim 1, wherein the chromophore is TPTI and wherein the co-monomer is fluorene such that polymer is a fully-conjugated polymer (TPTI-F).

5. The polymer of claim 1, wherein the chromophore is TPTQ and wherein the co-monomer is carbazole such that the polymer is a cross-conjugated polymer (TPTQ-C).

6. The polymer of claim 1, wherein the chromophore is TPTQ and wherein the co-monomer is carbazole such that the polymer is a fully-conjugated polymer (TPTQ-CC).

7. The polymer of claim 1, wherein the chromophore is TPTQF and wherein the co-monomer is carbazole such that the polymer is a cross-conjugated polymer (TPTQF-C).

8. The polymer of claim 1, wherein the chromophore is TPTQF and wherein the co-monomer is carbazole such that the polymer is a fully-conjugated polymer (TPTQF-CC).

9. An organic electronic device comprising at least one emissive layer, wherein the at least one emissive layer comprises the semi-ladder, luminescent polymer of claim 1.

10. The device of claim 9, wherein the device is a light-emitting transistor.

11. The device of claim 9, wherein the chromophore is TPTI (thieno [2', 3': 5,6] pyrido [3,4-g] thieno [3,2-c]-isoquinoline-5,11(4H,10H)-dione) and wherein the co-monomer is carbazole such that the polymer is a cross-conjugated polymer TPTI-C.

12. The device of claim 9, wherein the chromophore is TPTI (thieno [2', 3': 5,6] pyrido [3,4-g] thieno [3,2-c]-isoquinoline-5,11(4H,10H)-dione) and wherein the co-monomer is carbazole such that the polymer is a fully-conjugated polymer TPTI-CC.

13. The device of claim 9, wherein the chromophore is TPTI (5,11-bis(2-butyloctyl)-dihydrothieno[2',3': 4,5]pyrido [2,3-g]thieno[3,2-c] quinoline-4,10-dione) and wherein the co-monomer is fluorene such that the polymer is a fully-conjugated polymer TPTI-F.

14. The device of claim 9, wherein the chromophore is TPTQ (5,11-bis(2-butyloctyl)-dihydrothieno[2',3':4,5] pyrido[2,3-g]thieno[3,2-c] quinoline-4,10-dione) and wherein the co-monomer is carbazole such that the polymer is selected from the group consisting of TPTQ-C and TPTQ-CC.

15. The device of claim 9, wherein the chromophore is TPTQF (furo[3,2-c]furo[2',3':4,5]pyrido[2,3-g]quinoline-4,10-dione) and wherein the co-monomer is carbazole such that the polymer is selected from the group consisting of TPTQF-C and TPTQF-CC.

16. A multi-layer organic light-emitting transistor comprising:
   at least one dielectric layer;
   at least one self-assembled monolayer; and
   at least one emissive layer comprising the semi-ladder, luminescent polymer of claim 1, wherein the electron-donating co-monomer is selected from the group consisting of carbazole and fluorene.

17. The transistor of claim 16, wherein the at least one dielectric layer is silicon dioxide.

18. The transistor of claim 16, wherein the at least one self-assembled monolayer is n-octadecyltrichlorosilane.

19. The transistor of claim 16, further comprising at least one transporting layer.

20. The transistor of claim 16, further comprising at least one electron injection layer.

* * * * *